US011581498B2

(12) United States Patent
Lu et al.

(10) Patent No.: US 11,581,498 B2
(45) **Date of Patent: *Feb. 14, 2023**

(54) ORGANIC LUMINESCENT MATERIAL CONTAINING 6-SILYL-SUBSTITUTED ISOQUINOLINE LIGAND

(71) Applicant: BEIJING SUMMER SPROUT TECHNOLOGY CO., LTD., Beijing (CN)

(72) Inventors: Nannan Lu, Beijing (CN); Zhihong Dai, Beijing (CN); Cuifang Zhang, Beijing (CN); Qi Zhang, Beijing (CN); Chi Yuen Raymond Kwong, Beijing (CN); Chuanjun Xia, Beijing (CN)

(73) Assignee: BEIJING SUMMER SPROUT TECHNOLOGY CO., LTD., Beijing (CN)

( * ) Notice: Subject to any disclaimer, the term of this patent is extended or adjusted under 35 U.S.C. 154(b) by 361 days.

This patent is subject to a terminal disclaimer.

(21) Appl. No.: 16/869,770

(22) Filed: May 8, 2020

(65) Prior Publication Data

US 2020/0358011 A1 Nov. 12, 2020

(30) Foreign Application Priority Data

May 9, 2019 (CN) ............................ 201910373305

(51) Int. Cl.

| | |
|---|---|
| ***C07F 15/00*** | (2006.01) |
| ***H01L 51/00*** | (2006.01) |
| ***C09K 11/06*** | (2006.01) |
| *H01L 51/50* | (2006.01) |

(52) U.S. Cl.

CPC ...... *H01L 51/0094* (2013.01); *C07F 15/0033* (2013.01); *C09K 11/06* (2013.01); *H01L 51/0085* (2013.01); *C09K 2211/104* (2013.01); *C09K 2211/185* (2013.01); *H01L 51/5016* (2013.01)

(58) Field of Classification Search

CPC ... C07F 15/0033; C07F 15/0086; H01L 51/50
USPC ............................................ 546/10; 313/504
See application file for complete search history.

(56) References Cited

U.S. PATENT DOCUMENTS

| | | | |
|---|---|---|---|
| 5,703,436 A | 12/1997 | Forrest et al. | |
| 5,707,745 A | 1/1998 | Forrest et al. | |
| 5,844,363 A | 12/1998 | Gu et al. | |
| 6,097,147 A | 8/2000 | Baldo et al. | |
| 6,303,238 B1 | 10/2001 | Thompson et al. | |
| 7,279,704 B2 | 10/2007 | Walters et al. | |
| 7,968,146 B2 | 6/2011 | Wagner et al. | |
| 9,512,355 B2 * | 12/2016 | Ma | C09K 11/06 |
| 2003/0072964 A1 | 4/2003 | Kwong et al. | |
| 2003/0096138 A1 | 5/2003 | Lecloux et al. | |
| 2003/0230980 A1 | 12/2003 | Forrest et al. | |
| 2004/0174116 A1 | 9/2004 | Lu et al. | |
| 2004/0241495 A1 | 12/2004 | Kwong et al. | |
| 2006/0008671 A1 | 1/2006 | Kwong et al. | |
| 2006/0008673 A1 | 1/2006 | Kwong et al. | |
| 2007/0259205 A1 | 11/2007 | Tonkin et al. | |
| 2007/0278936 A1 | 12/2007 | Herron et al. | |
| 2008/0001515 A1 | 1/2008 | Iwanaga et al. | |
| 2008/0074033 A1 | 3/2008 | Ionkin et al. | |
| 2008/0194853 A1 | 8/2008 | Kim et al. | |
| 2008/0261076 A1 | 10/2008 | Kwong et al. | |
| 2010/0051869 A1 | 3/2010 | Chichak et al. | |
| 2010/0090591 A1 | 4/2010 | Alleyne et al. | |
| 2010/0270916 A1 | 10/2010 | Xia et al. | |
| 2012/0119190 A1 | 5/2012 | Alleyne et al. | |
| 2012/0181511 A1 | 7/2012 | Ma et al. | |
| 2012/0217868 A1 | 8/2012 | Ma et al. | |
| 2013/0146848 A1 | 6/2013 | Ma et al. | |
| 2013/0299795 A1 | 11/2013 | Xia et al. | |
| 2013/0328019 A1 | 12/2013 | Xia et al. | |
| 2015/0001472 A1 | 1/2015 | Boudreault et al. | |
| 2015/0171348 A1 | 6/2015 | Stoessel et al. | |
| 2015/0188061 A1 | 7/2015 | Xia et al. | |
| 2015/0214494 A1 | 7/2015 | Xia et al. | |
| 2015/0236277 A1 | 8/2015 | Boudreault et al. | |
| 2015/0287933 A1 | 10/2015 | Kottas et al. | |

(Continued)

FOREIGN PATENT DOCUMENTS

| | | |
|---|---|---|
| CN | 103159798 A | 6/2013 |
| CN | 103204880 A | 7/2013 |

(Continued)

OTHER PUBLICATIONS

C.W. Tang et al.; Organic Electroluminescent Diodes; Applied Physics Letters; 1987, 51 (12): pp. 913-915.

(Continued)

*Primary Examiner* — Charanjit Aulakh
(74) *Attorney, Agent, or Firm* — Sandberg Phoenix & von Gontard PC

(57) ABSTRACT

An organic light-emitting material contains a 6-silyl-substituted isoquinoline ligand. The organic light-emitting material is a metal complex containing a 6-silyl-substituted isoquinoline ligand and may be used as a light-emitting material in a light-emitting layer of an organic electroluminescent device. These new complexes can provide redder and saturated emission and meanwhile demonstrate a significantly improved lifetime and efficient and excellent device performance. Further disclosed are an electroluminescent device and a compound formulation including the metal complex.

23 Claims, 2 Drawing Sheets

(56) References Cited

U.S. PATENT DOCUMENTS

| | | | |
|---|---|---|---|
| 2015/0295187 | A1 | 10/2015 | Boudreault et al. |
| 2015/0315222 | A1 | 11/2015 | Boudreault et al. |
| 2015/0349273 | A1 | 12/2015 | Hung et al. |
| 2015/0357587 | A1 | 12/2015 | Kishino et al. |
| 2015/0364701 | A1 | 12/2015 | Horiuchi et al. |
| 2016/0028023 | A1 | 1/2016 | Boudreault et al. |
| 2016/0093808 | A1 | 3/2016 | Adamovich et al. |
| 2016/0104848 | A1 | 4/2016 | Boudreault et al. |
| 2016/0111661 | A1 | 4/2016 | Boudreault et al. |
| 2016/0190486 | A1 | 6/2016 | Lin et al. |
| 2016/0359122 | A1 | 12/2016 | Boudreault et al. |
| 2017/0084849 | A1 | 3/2017 | Tsai et al. |
| 2017/0092880 | A1 | 3/2017 | Boudreault et al. |
| 2017/0098788 | A1 | 4/2017 | Lee et al. |
| 2017/0098789 | A1 | 4/2017 | Boudreault et al. |
| 2017/0229663 | A1 | 8/2017 | Tsai et al. |
| 2017/0288157 | A1 | 10/2017 | Joseph et al. |
| 2017/0365799 | A1 | 12/2017 | Ji et al. |
| 2017/0365800 | A1 | 12/2017 | Tsai et al. |
| 2017/0365801 | A1 | 12/2017 | Margulies et al. |
| 2018/0013077 | A1 | 1/2018 | Boudreault et al. |
| 2018/0134954 | A1 | 5/2018 | Tsai et al. |
| 2018/0190914 | A1 | 7/2018 | Tsai et al. |
| 2018/0190915 | A1 | 7/2018 | Ji et al. |
| 2018/0277774 | A1 | 9/2018 | Boudreault et al. |
| 2019/0067598 | A1 | 2/2019 | Li et al. |
| 2019/0077818 | A1 | 3/2019 | Xia |
| 2019/0103574 | A1 | 4/2019 | Xia |
| 2019/0127406 | A1 | 5/2019 | Xia |
| 2019/0194234 | A1 | 6/2019 | Xia |
| 2019/0237683 | A1 | 8/2019 | Boudreault et al. |
| 2019/0248818 | A1 | 8/2019 | Boudreault |
| 2019/0251619 | A1 | 8/2019 | Kuchenski et al. |
| 2019/0252627 | A1 | 8/2019 | Joseph et al. |
| 2020/0099000 | A1 | 3/2020 | Zhang et al. |
| 2020/0251666 | A1 | 8/2020 | Cai et al. |
| 2020/0354391 | A1 | 11/2020 | Zhang et al. |
| 2020/0358010 | A1 | 11/2020 | Lu et al. |
| 2020/0358011 | A1 | 11/2020 | Lu et al. |
| 2021/0115069 | A1 | 4/2021 | Dai et al. |
| 2021/0242411 | A1 | 8/2021 | Liu et al. |
| 2022/0131093 | A1 | 4/2022 | Zhang et al. |

FOREIGN PATENT DOCUMENTS

| | | | |
|---|---|---|---|
| CN | 104022232 | | 9/2014 |
| CN | 108191916 | A | 6/2018 |
| CN | 109438521 | A | 3/2019 |
| CN | 109467575 | A | 3/2019 |
| CN | 109575083 | A | 4/2019 |
| CN | 109651444 | A | 4/2019 |
| CN | 109721628 | | 5/2019 |
| CN | 109956977 | | 7/2019 |
| CN | 110283216 | A | 9/2019 |
| CN | 112679548 | | 4/2021 |
| EP | 2907820 | A1 | 8/2015 |
| EP | 2940098 | A1 | 11/2015 |
| EP | 3007244 | A1 | 4/2016 |
| JP | 10158639 | | 6/1998 |
| JP | 2005508437 | A | 3/2005 |
| JP | 2008532998 | A | 8/2008 |
| JP | 2009-539768 | A | 11/2009 |
| JP | 2010516622 | A | 5/2010 |
| JP | 2012525405 | | 10/2012 |
| JP | 2013121957 | A | 6/2013 |
| JP | 2015010093 | A | 1/2015 |
| JP | 2015530982 | A | 10/2015 |
| JP | 2020186235 | A | 11/2020 |
| JP | 2020186236 | A | 11/2020 |
| KR | 20060097320 | A | 9/2006 |
| KR | 10-2009-0039464 | A | 4/2009 |
| KR | 10-2011-0077350 | A | 7/2011 |
| KR | 20130110934 | A | 10/2013 |
| KR | 10-2016-0041771 | A | 4/2016 |
| KR | 20170142949 | | 12/2017 |
| KR | 20180065353 | A | 6/2018 |
| KR | 10-2020-0130661 | A | 11/2020 |
| WO | 0244189 | A1 | 6/2002 |
| WO | 2006095951 | A1 | 9/2006 |
| WO | 2007143201 | | 12/2007 |
| WO | 2018084189 | A1 | 5/2018 |
| WO | 2018105986 | A1 | 6/2018 |
| WO | 2018124697 | A1 | 7/2018 |

OTHER PUBLICATIONS

Office Action for Corresponding Japanese App. No. 2020-082875, dated May 27, 2021.

Office Action for Corresponding Japanese App. No. 2020-082875, dated Mar. 1, 2022.

Office Action for Corresponding German App. No. is 10 2020 205 832.6, dated Mar. 23, 2022.

Office Action for Corresponding Korean office App. No. 10-2020-0055237 dated May 24, 2022.

Search report for Corresponding Chinese App. No. 201910373302.X dated May 13, 2022.

Office Action for Corresponding Chinese App. No. 201910373302.X dated May 18, 2022.

Yuji Kawanishi, Tetsu Miyazawa, Taichi Abe, Deuterium Compound for Electronic Devices, Walp Organic Square No. 36 (2011), pp. 2-3 (21 Pages total).

Koko Sugiyama, Development of Deuterated Phosphorescent Probe, Taiyo Nippon Sanso Technical Report, No. 36 (2017), pp. 1-4 (8 pages total).

* cited by examiner

ORGANIC LUMINESCENT MATERIAL CONTAINING 6-SILYL-SUBSTITUTED ISOQUINOLINE LIGAND

CROSS-REFERENCE TO RELATED APPLICATION(S)

This application claims priority to Chinese Patent Application No. CN201910373305.X filed on May 9, 2019, the disclosure of which is incorporated herein by reference in its entirety.

TECHNICAL FIELD

The present disclosure relates to compounds for organic electronic devices, for example, organic light-emitting devices. More particularly, the present disclosure relates to a metal complex containing a 6-silyl-substituted isoquinoline ligand, and an electroluminescent device and a compound formulation including the metal complex.

BACKGROUND

Organic electronic devices include, but are not limited to, the following types: organic light-emitting diodes (OLEDs), organic field-effect transistors (O-FETs), organic light-emitting transistors (OLETs), organic photovoltaic devices (OPVs), dye-sensitized solar cells (DSSCs), organic optical detectors, organic photoreceptors, organic field-quench devices (OFQDs), light-emitting electrochemical cells (LECs), organic laser diodes and organic plasmon emitting devices.

In 1987, Tang and Van Slyke of Eastman Kodak reported a bilayer organic electroluminescent device, which comprises an arylamine hole transporting layer and a tris-8-hydroxyquinolato-aluminum layer as the electron and emitting layer (Applied Physics Letters, 1987, 51 (12): 913-915). Once a bias is applied to the device, green light was emitted from the device. This device laid the foundation for the development of modern organic light-emitting diodes (OLEDs). State-of-the-art OLEDs may comprise multiple layers such as charge injection and transporting layers, charge and exciton blocking layers, and one or multiple emissive layers between the cathode and anode. Since the OLED is a self-emitting solid state device, it offers tremendous potential for display and lighting applications. In addition, the inherent properties of organic materials, such as their flexibility, may make them well suited for particular applications such as fabrication on flexible substrates.

The OLED can be categorized as three different types according to its emitting mechanism. The OLED invented by Tang and van Slyke is a fluorescent OLED. It only utilizes singlet emission. The triplets generated in the device are wasted through nonradiative decay channels. Therefore, the internal quantum efficiency (IQE) of the fluorescent OLED is only 25%. This limitation hindered the commercialization of OLED. In 1997, Forrest and Thompson reported phosphorescent OLED, which uses triplet emission from heavy metal containing complexes as the emitter. As a result, both singlet and triplets can be harvested, achieving 100% IQE. The discovery and development of phosphorescent OLED contributed directly to the commercialization of active-matrix OLED (AMOLED) due to its high efficiency. Recently, Adachi achieved high efficiency through thermally activated delayed fluorescence (TADF) of organic compounds. These emitters have small singlet-triplet gap that makes the transition from triplet back to singlet possible. In the TADF device, the triplet excitons can go through reverse intersystem crossing to generate singlet excitons, resulting in high IQE.

OLEDs can also be classified as small molecule and polymer OLEDs according to the forms of the materials used. A small molecule refers to any organic or organometallic material that is not a polymer. The molecular weight of the small molecule can be large as long as it has well defined structure. Dendrimers with well-defined structures are considered as small molecules. Polymer OLEDs include conjugated polymers and non-conjugated polymers with pendant emitting groups. Small molecule OLED can become the polymer OLED if post polymerization occurred during the fabrication process.

There are various methods for OLED fabrication. Small molecule OLEDs are generally fabricated by vacuum thermal evaporation. Polymer OLEDs are fabricated by solution process such as spin-coating, inkjet printing, and slit printing. If the material can be dissolved or dispersed in a solvent, the small molecule OLED can also be produced by solution process.

The emitting color of the OLED can be achieved by emitter structural design. An OLED may comprise one emitting layer or a plurality of emitting layers to achieve desired spectrum. In the case of green, yellow, and red OLEDs, phosphorescent emitters have successfully reached commercialization. Blue phosphorescent device still suffers from non-saturated blue color, short device lifetime, and high operating voltage. Commercial full-color OLED displays normally adopt a hybrid strategy, using fluorescent blue and phosphorescent yellow, or red and green. At present, efficiency roll-off of phosphorescent OLEDs at high brightness remains a problem. In addition, it is desirable to have more saturated emitting color, higher efficiency, and longer device lifetime.

Phosphorescent metal complexes can be used as phosphorescent doping materials of light-emitting layers and applied to the field of organic electroluminescence lighting or display. To meet needs in different cases, the color of a material can be adjusted on a certain basis by adjusting different substituents on a ligand of the material, so that phosphorescent metal complexes with different emission wavelengths are obtained.

KR20130110934A has disclosed an organic optical device, which includes an organic layer including an organic optical compound represent by Formula A:

A

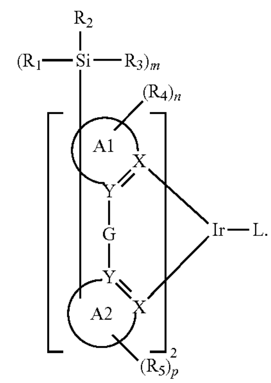

One of various disclosed structures is a structure represented by Formula B:

B

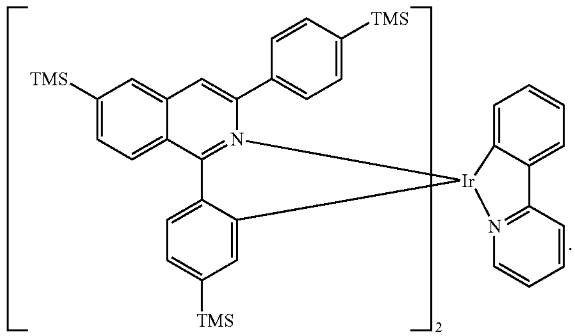

This metal complex uses two phenylisoquinolines and one phenylpyridine to coordinate with a metal instead of using 1,3-dione as an auxiliary ligand. Such structures will result in a very high sublimation temperature, which is not conducive to use. Meanwhile, phenyl or silylphenyl substituted at position 3 of isoquinoline will cause excessive red-shift and decrease current efficiency and power efficiency. In addition, such complexes will widen the emission spectrum and are not conducive to obtaining saturated colors, which limits their applications in OLED devices.

US2013146848A1 has disclosed an organic optical device, which includes an organic layer including an organic optical compound represented by Formula C:

C

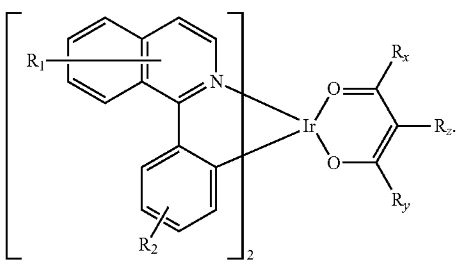

It is defined that $R_1$ cannot be mono-substitution. A preferred embodiment defines that $R_1$ is di-substitution. More preferably, $R_1$ is di-alkyl substitution. Various disclosed structures include a ligand including two silyl substituents or a ligand including one silyl substituent and one alkyl substituent. However, a metal complex having mono-silyl substitution at a particular position has not been disclosed.

US2017098788A1 has disclosed an organic optical device, which includes an organic layer including an organic optical compound represented by Formula D:

D

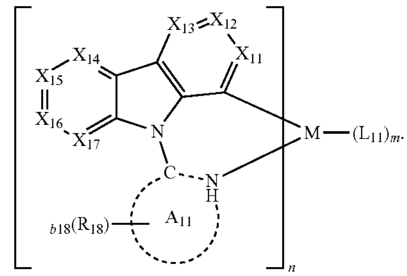

One of various disclosed structures is:

E

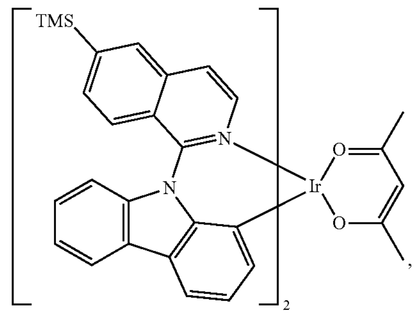

which discloses an iridium complex containing a 6-trimethylsilyl-substituted isoquinoline ligand. However, the ligand has to include a carbazole substituent at position 2 of isoquinoline.

US2018190915A1 has disclosed an organic optical device, which includes an organic layer including a formula $Pt(L)_n$. Among many compounds mentioned explicitly, the following complex (compound 30) is shown:

Compound 30

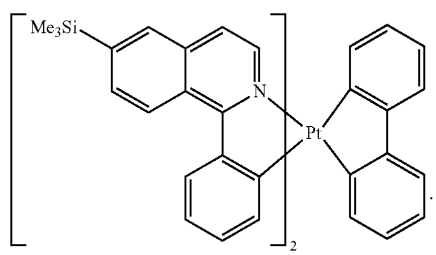

The other ligand is a biphenyl group.

Compounds based on this structure need to be improved in stability.

US20160190486A1 has disclosed an organic optical device, which includes an organic layer including an organic optical compound represented by Formula $M(L^1)_x(L^2)_y(L^3)_z$. A preferred embodiment of the ligand includes structures represented by Formula G and Formula H:

G

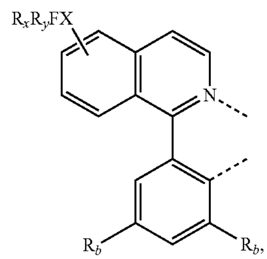

H

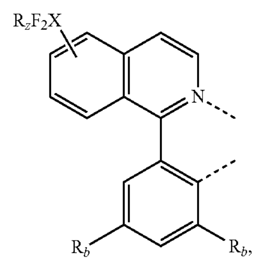

wherein X is independently selected from Si or Ge. However, it is defined that the above-mentioned ligand has to include at least one X—F bond, and neither related complex including a ligand that has a silyl substituent at a particular position has been disclosed nor any valid data on synthesis examples has been disclosed. The stability of an Si—F bond has not been verified in OLED devices, and its effect on the emission spectrum is unknown.

SUMMARY

The present disclosure aims to provide a series of metal complexes containing a 6-silyl-substituted isoquinoline ligand to solve at least part of the above-mentioned problems. The metal complexes may be used as light-emitting materials in organic electroluminescent devices. When applied to electroluminescent devices, these metal complexes can provide redder and saturated luminescence, and achieve a significantly improved lifetime and efficient and excellent device performance.

According to an embodiment of the present disclosure, disclosed is a metal complex having a general formula of $M(L_a)_m(L_b)_n(L_c)_q$, wherein $L_a$, $L_b$ and $L_c$ are a first ligand, a second ligand and a third ligand coordinated to the metal M respectively;

wherein $L_a$, $L_b$ and $L_c$ may be optionally joined to form a multidentate ligand;

wherein m is 1 or 2, n is 1 or 2, q is 0 or 1, and m+n+q equals to the oxidation state of the metal M;

when m is greater than 1, the $L_a$ may be the same or different; and when n is greater than 1, the $L_b$ may be the same or different;

wherein the first ligand $L_a$ is represented by Formula 1:

Formula 1

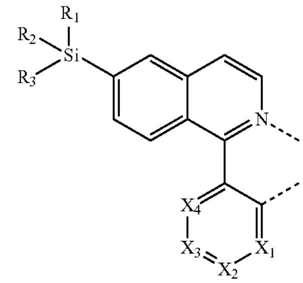

wherein, $R_1$ to $R_3$ are each independently selected from the group consisting of: substituted or unsubstituted alkyl having 1 to 20 carbon atoms, substituted or unsubstituted aryl having 6 to 30 carbon atoms, substituted or unsubstituted heteroaryl having 3 to 30 carbon atoms, substituted or unsubstituted arylalkyl having 7 to 30 carbon atoms and substituted or unsubstituted cycloalkyl having 3 to 20 ring carbon atoms, and combinations thereof;

$X_1$ to $X_4$ are each independently selected from $CR_4$ or N; and $R_4$ is independently selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a thiol group, a sulfinyl group, a sulfonyl group and a phosphino group, and combinations thereof;

in Formula 1, adjacent substituents can be optionally joined to form a ring;

hydrogen in the ligand $L_a$ can be optionally partially or fully substituted by deuterium;

wherein $L_b$ has a structure represented by Formula 2:

Formula 2

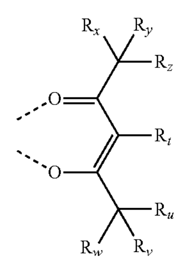

wherein $R_t$ to $R_z$ are each independently selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a thiol group, a sulfinyl group, a sulfonyl group and a phosphino group, and combinations thereof;

in Formula 2, adjacent substituents can be optionally joined to form a ring; and wherein $L_c$ is a monoanionic bidentate ligand.

According to another embodiment of the present disclosure, further disclosed is an electroluminescent device including an anode, a cathode and an organic layer disposed between the anode and the cathode, wherein the organic layer includes the metal complex described above.

According to another embodiment of the present disclosure, further disclosed is a compound formulation which includes the metal complex described above.

The present disclosure provides a metal complex containing a 6-silyl-substituted isoquinoline ligand. A phosphorescent metal complex including such ligand can obtain a more red-shift emission wavelength than phosphorescent metal complexes that have been reported while improving device performance.

The novel metal complex containing a 6-silyl-substituted isoquinoline ligand disclosed by present disclosure may be used as a light-emitting material in an electroluminescent device. The substitution of a single silyl group at position 6 may effectively control redshift and allows a wavelength of close to 640 nm, an International Commission on Illumination (CIE) (x, y) where x is greater than or equal to 0.695 and y is less than or equal to 0.304, and a narrow half-peak width, thereby providing redder and saturated emission, such that such complex is very suitable for crimson applications, such as alarm lights, vehicle tail lights, etc. Meanwhile, the compound of the present disclosure can also exhibit excellent device performances including a significantly improved lifetime and an improved efficiency.

DETAILED DESCRIPTION

Figure 1:
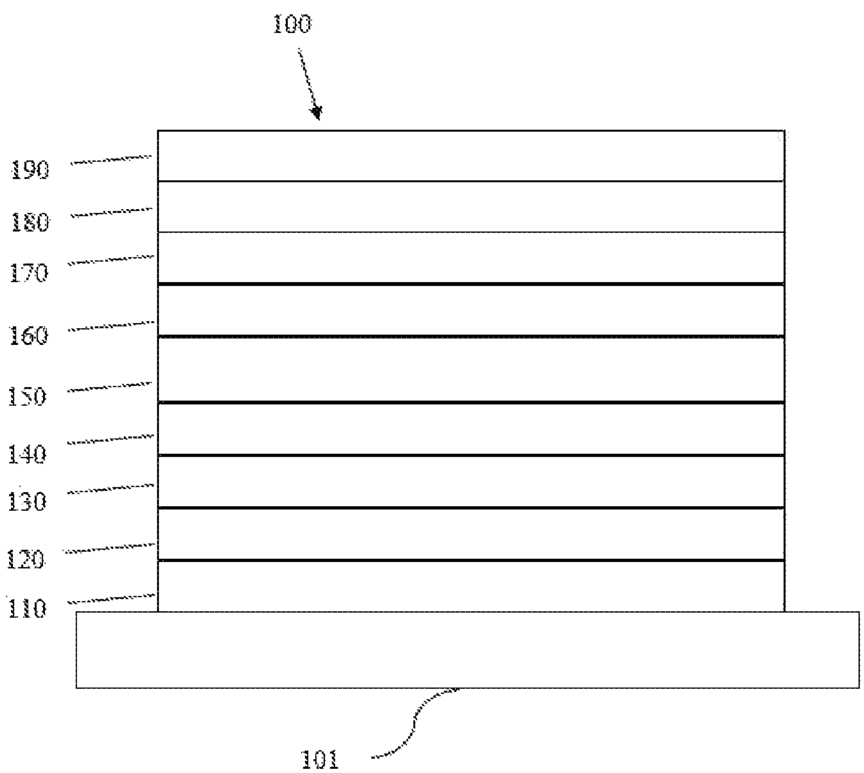
FIG. 1 is a schematic diagram of an organic light-emitting apparatus that may include a compound and a compound formulation disclosed by the present disclosure.

OLEDs can be fabricated on various types of substrates such as glass, plastic, and metal foil. FIG. 1 schematically shows an organic light emitting device 100 without limitation. The figures are not necessarily drawn to scale. Some of the layers in the figures can also be omitted as needed. Device 100 may include a substrate 101, an anode 110, a hole injection layer 120, a hole transport layer 130, an electron blocking layer 140, an emissive layer 150, a hole blocking layer 160, an electron transport layer 170, an electron injection layer 180 and a cathode 190. Device 100 may be fabricated by depositing the layers described in order. The properties and functions of these various layers, as well as example materials, are described in more detail in U.S. Pat. No. 7,279,704 at cols. 6-10, the contents of which are incorporated by reference herein in its entirety.

More examples for each of these layers are available. For example, a flexible and transparent substrate-anode combination is disclosed in U.S. Pat. No. 5,844,363, which is incorporated by reference herein in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference herein in its entirety. Examples of host materials are disclosed in U.S. Pat. No. 6,303,238 to Thompson et al., which is incorporated by reference herein in its entirety. An example of an n-doped electron transport layer is BPhen doped with Li at a molar ratio of 1:1, as disclosed in U.S. Patent Application Publication No. 2003/0230980, which is incorporated by reference herein in its entirety. U.S. Pat. Nos. 5,703,436 and 5,707,745, which are incorporated by reference herein in their entireties, disclose examples of cathodes including composite cathodes having a thin layer of metal such as Mg:Ag with an overlying transparent, electrically-conductive, sputter-deposited ITO layer. The theory and use of blocking layers are described in more detail in U.S. Pat. No. 6,097,147 and U.S. Patent Application Publication No. 2003/0230980, which are incorporated by reference herein in their entireties. Examples of injection layers are provided in U.S. Patent Application Publication No. 2004/0174116, which is incorporated by reference herein in its entirety. A description of protective layers may be found in U.S. Patent Application Publication No. 2004/0174116, which is incorporated by reference herein in its entirety.

The layered structure described above is provided by way of non-limiting examples. Functional OLEDs may be achieved by combining the various layers described in different ways, or layers may be omitted entirely. It may also include other layers not specifically described. Within each layer, a single material or a mixture of multiple materials can be used to achieve optimum performance. Any functional layer may include several sublayers. For example, the emissive layer may have two layers of different emitting materials to achieve desired emission spectrum.

In one embodiment, an OLED may be described as having an "organic layer" disposed between a cathode and an anode. This organic layer may comprise a single layer or multiple layers.

Figure 2:
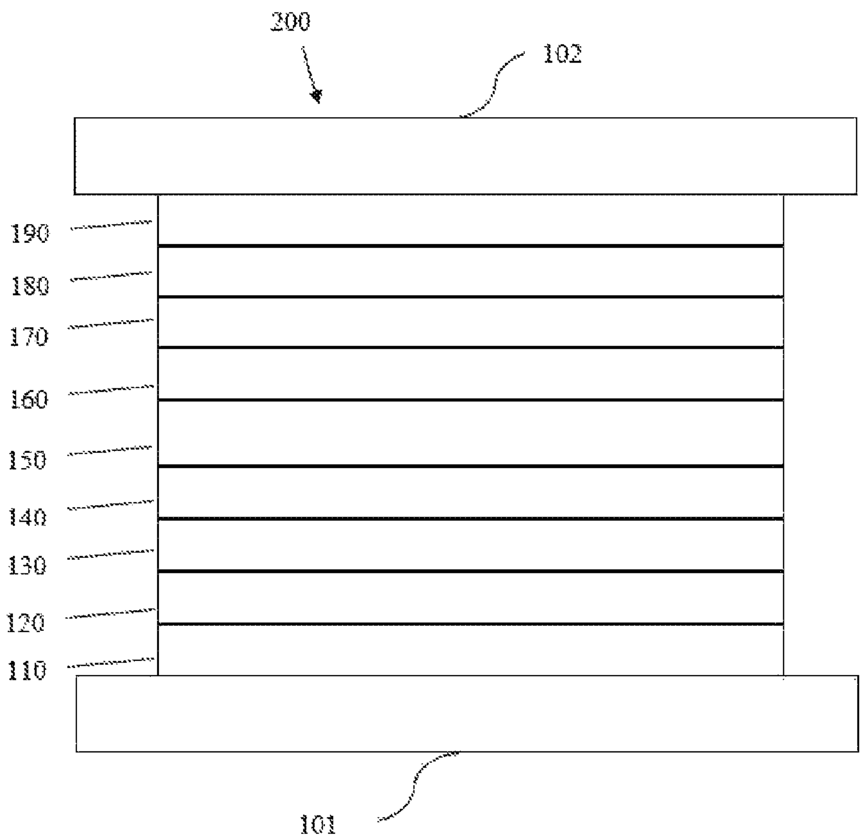
FIG. 2 is a schematic diagram of another organic light-emitting apparatus that may include a compound and a compound formulation disclosed by the present disclosure.

An OLED can be encapsulated by a barrier layer. FIG. 2 schematically shows an organic light emitting device 200 without limitation. FIG. 2 differs from FIG. 1 in that the organic light emitting device include a barrier layer 102, which is above the cathode 190, to protect it from harmful species from the environment such as moisture and oxygen. Any material that can provide the barrier function can be used as the barrier layer such as glass or organic-inorganic hybrid layers. The barrier layer should be placed directly or indirectly outside of the OLED device. Multilayer thin film encapsulation was described in U.S. Pat. No. 7,968,146, which is incorporated by reference herein in its entirety.

Devices fabricated in accordance with embodiments of the present disclosure can be incorporated into a wide variety of consumer products that have one or more of the electronic component modules (or units) incorporated therein. Some examples of such consumer products include flat panel displays, monitors, medical monitors, televisions, billboards, lights for interior or exterior illumination and/or signaling, heads-up displays, fully or partially transparent displays, flexible displays, smart phones, tablets, phablets, wearable devices, smart watches, laptop computers, digital cameras, camcorders, viewfinders, micro-displays, 3-D displays, vehicles displays, and vehicle tail lights.

The materials and structures described herein may be used in other organic electronic devices listed above.

As used herein, "top" means furthest away from the substrate, while "bottom" means closest to the substrate. Where a first layer is described as "disposed over" a second layer, the first layer is disposed further away from the substrate. There may be other layers between the first and second layers, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the transition between the triplet states and the singlet excited states. Compounds that are capable of generating E-type delayed fluorescence are required to have very small singlet-triplet gaps to convert between energy states. Thermal energy can activate the transition from the triplet state back to the singlet state. This type of delayed fluorescence is also known as thermally activated delayed fluorescence (TADF). A distinctive feature of TADF is that the delayed component increases as temperature rises. If the reverse intersystem crossing rate is fast enough to minimize the non-radiative decay from the triplet state, the fraction of back populated singlet excited states can potentially reach 75%. The total singlet fraction can be 100%, far exceeding 25% of the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap ($\Delta E_{S-T}$). Organic, non-metal containing, donor-acceptor luminescent materials may be able to achieve this. The emission in these materials is generally characterized as a donor-acceptor charge-transfer (CT) type emission. The spatial separation of the HOMO and LUMO in these donor-acceptor type compounds generally results in small $\Delta E_{S-T}$. These states may involve CT states. Generally, donor-acceptor luminescent materials are constructed by connecting an electron donor moiety such as amino- or carbazole-derivatives and an electron acceptor moiety such as N-containing six-membered aromatic rings.

Definition of Terms of Substituents

Halogen or halide—as used herein includes fluorine, chlorine, bromine, and iodine.

Alkyl—contemplates both straight and branched chain alkyl groups. Examples of the alkyl group include methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, 1-methylpentyl group, 2-methylpentyl group, 1-pentylhexyl group, 1-butylpentyl group, 1-heptyloctyl group, and 3-methylpentyl group. Additionally, the alkyl group may be optionally substituted. The carbons in the alkyl chain can be replaced by other hetero atoms. Of the above, preferred are methyl group, ethyl group, propyl group, isopropyl group, n-butyl group, s-butyl group, isobutyl group, t-butyl group, n-pentyl group, and neopentyl group.

Cycloalkyl—as used herein contemplates cyclic alkyl groups. Preferred cycloalkyl groups are those containing 4 to 10 ring carbon atoms and includes cyclobutyl, cyclopentyl, cyclohexyl, 4-methylcyclohexyl, 4,4-dimethylcyclohexyl, 1-adamantyl, 2-adamantyl, 1-norbornyl, 2-norbornyl and the like. Additionally, the cycloalkyl group may be optionally substituted. The carbons in the ring can be replaced by other hetero atoms.

Alkenyl—as used herein contemplates both straight and branched chain alkene groups. Preferred alkenyl groups are those containing 2 to 15 carbon atoms. Examples of the alkenyl group include vinyl group, allyl group, 1-butenyl group, 2-butenyl group, 3-butenyl group, 1,3-butandienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl 1-butenyl group, and 3-phenyl-1-butenyl group. Additionally, the alkenyl group may be optionally substituted.

Alkynyl—as used herein contemplates both straight and branched chain alkyne groups. Preferred alkynyl groups are those containing 2 to 15 carbon atoms. Additionally, the alkynyl group may be optionally substituted.

Aryl or aromatic group—as used herein includes noncondensed and condensed systems. Preferred aryl groups are those containing six to sixty carbon atoms, preferably six to twenty carbon atoms, more preferably six to twelve carbon atoms. Examples of the aryl group include phenyl, biphenyl, terphenyl, triphenylene, tetraphenylene, naphthalene, anthracene, phenalene, phenanthrene, fluorene, pyrene, chrysene, perylene, and azulene, preferably phenyl, biphenyl, terphenyl, triphenylene, fluorene, and naphthalene. Additionally, the aryl group may be optionally substituted. Examples of the non-condensed aryl group include phenyl group, biphenyl-2-yl group, biphenyl-3-yl group, biphenyl-4-yl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 4'-methylbiphenylyl group, 4"-t-butyl p-terphenyl-4-yl group, o-cumenyl group, m-cumenyl group, p-cumenyl group, 2,3-xylyl group, 3,4-xylyl group, 2,5-xylyl group, mesityl group, and m-quarterphenyl group.

Heterocyclic group or heterocycle—as used herein includes aromatic and non-aromatic cyclic groups. Hetero-aromatic also means heteroaryl. Preferred non-aromatic heterocyclic groups are those containing 3 to 7 ring atoms which include at least one hetero atom such as nitrogen, oxygen, and sulfur. The heterocyclic group can also be an aromatic heterocyclic group having at least one heteroatom selected from nitrogen atom, oxygen atom, sulfur atom, and selenium atom.

Heteroaryl—as used herein includes noncondensed and condensed hetero-aromatic groups that may include from one to five heteroatoms. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Alkoxy—it is represented by —O-Alkyl. Examples and preferred examples thereof are the same as those described above. Examples of the alkoxy group having 1 to 20 carbon atoms, preferably 1 to 6 carbon atoms include methoxy group, ethoxy group, propoxy group, butoxy group, pentyloxy group, and hexyloxy group. The alkoxy group having 3 or more carbon atoms may be linear, cyclic or branched.

Aryloxy—it is represented by —O-Aryl or —O-heteroaryl. Examples and preferred examples thereof are the same as those described above. Examples of the aryloxy group having 6 to 40 carbon atoms include phenoxy group and biphenyloxy group.

Arylalkyl—as used herein contemplates an alkyl group that has an aryl substituent. Additionally, the arylalkyl group may be optionally substituted. Examples of the arylalkyl group include benzyl group, 1-phenylethyl group, 2-phenylethyl group, 1-phenylisopropyl group, 2-phenylisopropyl group, phenyl-t-butyl group, alpha.-naphthylmethyl group, 1-alpha.-naphthylethyl group, 2-alpha-naphthylethyl group, 1-alpha-naphthylisopropyl group, 2-alpha-naphthylisopropyl group, beta-naphthylmethyl group, 1-beta-naphthylethyl group, 2-beta-naphthylethyl group, 1-beta-naphthylisopropyl group, 2-beta-naphthylisopropyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group, and 1-chloro-2-phenylisopropyl group. Of the above, preferred are benzyl group, p-cyanobenzyl group, m-cyanobenzyl group, o-cyanobenzyl group, 1-phenylethyl group, 2-phenylethyl group, 1-phenylisopropyl group, and 2-phenylisopropyl group.

The term "aza" in azadibenzofuran, aza-dibenzothiophene, etc. means that one or more of the C—H groups in the respective aromatic fragment are replaced by a nitrogen atom. For example, azatriphenylene encompasses dibenzo[f,h]quinoxaline, dibenzo[f,h]quinoline and other analogues with two or more nitrogens in the ring system. One of ordinary skill in the art can readily envision other nitrogen analogs of the aza-derivatives described above, and all such analogs are intended to be encompassed by the terms as set forth herein.

In the present disclosure, unless otherwise defined, when any term of the group consisting of substituted alkyl, substituted cycloalkyl, substituted heteroalkyl, substituted arylalkyl, substituted alkoxy, substituted aryloxy, substituted alkenyl, substituted aryl, substituted heteroaryl, substituted alkylsilyl, substituted arylsilyl, substituted amine, substituted acyl, substituted carbonyl, substituted carboxylic acid group, substituted ester group, substituted sulfinyl, substituted sulfonyl and substituted phosphino is used, it means that any group of alkyl, cycloalkyl, heteroalkyl, arylalkyl, alkoxy, aryloxy, alkenyl, aryl, heteroaryl, alkylsilyl, arylsilyl, amine, acyl, carbonyl, carboxylic acid group, ester group, sulfinyl, sulfonyl and phosphino may be substituted with one or more groups selected from the group consisting of deuterium, a halogen, an unsubstituted alkyl group having 1 to 20 carbon atoms, an unsubstituted cycloalkyl group having 3 to 20 ring carbon atoms, an unsubstituted heteroalkyl group having 1 to 20 carbon atoms, an unsubstituted arylalkyl group having 7 to 30 carbon atoms, an unsubstituted alkoxy group having 1 to 20 carbon atoms, an unsubstituted aryloxy group having 6 to 30 carbon atoms, an unsubstituted alkenyl group having 2 to 20 carbon atoms, an unsubstituted aryl group having 6 to 30 carbon atoms, an unsubstituted heteroaryl group having 3 to 30 carbon atoms, an unsubstituted alkylsilyl group having 3 to 20 carbon atoms, an unsubstituted arylsilyl group having 6 to 20 carbon atoms, an unsubstituted amino group having 0 to 20 carbon atoms, an acyl group, a carbonyl group, a carboxylic acid group, an ester group, a nitrile group, an isonitrile group, a thiol group, a sulfinyl group, a sulfonyl group and a phosphino group, and combinations thereof.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In the compounds mentioned in the present disclosure, the hydrogen atoms can be partially or fully replaced by deuterium. Other atoms such as carbon and nitrogen can also be replaced by their other stable isotopes. The replacement by other stable isotopes in the compounds may be preferred due to its enhancements of device efficiency and stability.

In the compounds mentioned in the present disclosure, multiple substitutions refer to a range that includes a double substitution, up to the maximum available substitutions. When a substitution in the compounds mentioned in the present disclosure represents multiple substitutions (including di, tri, tetra substitutions etc.), that means the substituent may exist at a plurality of available substitution positions on its linking structure, the substituents present at a plurality of available substitution positions may be the same structure or different structures.

In the compounds mentioned in the present disclosure, adjacent substituents in the compounds cannot be joined to form a ring unless otherwise explicitly defined, for example, adjacent substituents can be optionally joined to form a ring. In the compounds mentioned in the present disclosure, when adjacent substituents can be optionally joined to form a ring, the ring formed may be monocyclic or polycyclic, as well as alicyclic, heteroalicyclic, aromatic or heteroaromatic. In such expression, adjacent substituents may refer to substituents bonded to the same atom, substituents bonded to carbon atoms which are directly bonded to each other, or substituents bonded to carbon atoms which are more distant from each other. Preferably, adjacent substituents refer to substituents bonded to the same carbon atom and substituents bonded to carbon atoms which are directly bonded to each other.

The expression that adjacent substituents can be optionally joined to form a ring is also intended to mean that two substituents bonded to the same carbon atom are joined to each other via a chemical bond to form a ring, which can be exemplified by the following formula:

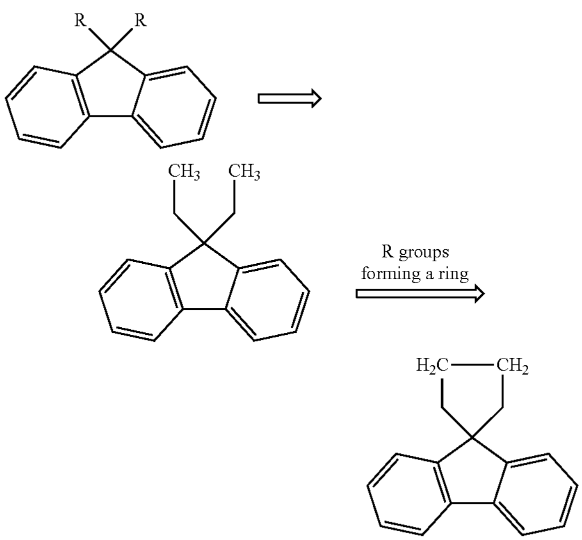

The expression that adjacent substituents can be optionally joined to form a ring is also intended to mean that two substituents bonded to carbon atoms which are directly bonded to each other are joined to each other via a chemical bond to form a ring, which can be exemplified by the following formula:

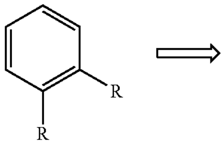

-continued

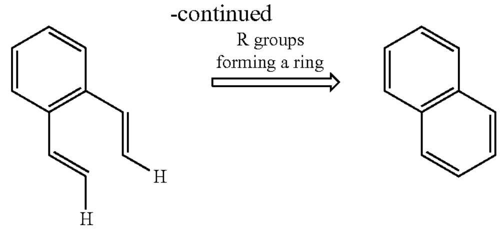

Furthermore, the expression that adjacent substituents can be optionally joined to form a ring is also intended to mean that, in the case where one of the two substituents bonded to carbon atoms which are directly bonded to each other represents hydrogen, the second substituent is bonded at a position at which the hydrogen atom is bonded, thereby forming a ring. This is exemplified by the following formula:

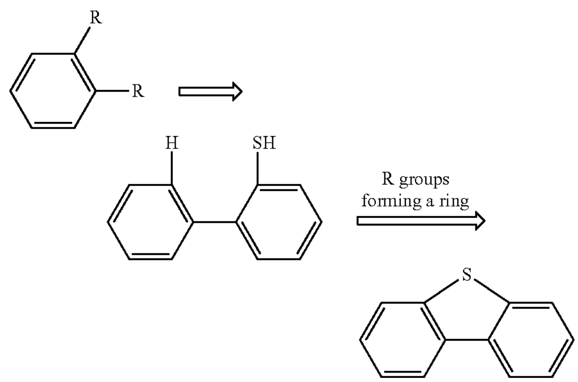

According to an embodiment of the present disclosure, disclosed is a metal complex having a general formula of $M(L_a)_m(L_b)_n(L_c)_q$, wherein $L_a$, $L_b$ and $L_c$ are a first ligand, a second ligand and a third ligand coordinated to the metal M respectively;

wherein $L_a$, $L_b$ and $L_c$ may be optionally joined to form a multidentate ligand;

wherein m is 1 or 2, n is 1 or 2, q is 0 or 1, and m+n+q equals to the oxidation state of the metal M;

when m is greater than 1, the $L_a$ may be the same or different; and when n is greater than 1, the $L_b$ may be the same or different;

wherein the first ligand $L_a$ is represented by Formula 1:

Formula 1

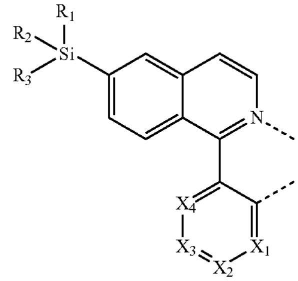

wherein, $R_1$ to $R_3$ are each independently selected from the group consisting of: substituted or unsubstituted alkyl having 1 to 20 carbon atoms, substituted or unsubstituted aryl having 6 to 30 carbon atoms, substituted or unsubstituted heteroaryl having 3 to 30 carbon atoms, substituted or unsubstituted arylalkyl having 7 to 30 carbon atoms and substituted or unsubstituted cycloalkyl having 3 to 20 ring carbon atoms, and combinations thereof;

$X_1$ to $X_4$ are each independently selected from $CR_4$ or N;

wherein $R_4$ is independently selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a thiol group, a sulfinyl group, a sulfonyl group and a phosphino group, and combinations thereof; in Formula 1, adjacent substituents can be optionally joined to form a ring; hydrogen in the ligand $L_a$ can be optionally partially or fully substituted by deuterium;

wherein $L_b$ has a structure represented by Formula 2:

Formula 2

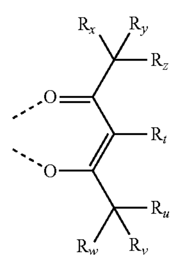

wherein $R_t$ to $R_z$ are each independently selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a thiol group, a sulfinyl group, a sulfonyl group and a phosphino group, and combinations thereof;

in Formula 2, for substituents $R_x$, $R_y$, $R_z$, $R_t$, $R_u$, $R_v$ and $R_w$, adjacent substituents can be optionally joined to form a ring; and wherein $L_c$ is a monoanionic bidentate ligand.

In this embodiment, the expression "in Formula 1, adjacent substituents can be optionally joined to form a ring" refers to that in the structure of Formula 1, adjacent substituents $R_1$, $R_2$ and $R_3$ can be optionally joined to one another to form a ring, and/or adjacent substituents $R_4$ can be optionally joined to form a ring. At the same time, the following case is also included: adjacent substituents $R_4$ are not joined to form a ring and merely substituents $R_1$, $R_2$ and $R_3$ can be joined to one another to form a ring. At the same time, the following case is also included: in Formula 1, adjacent substituents are not joined to form a ring.

In this embodiment, the expression that "hydrogen in the ligand $L_a$ can be optionally partially or fully substituted by deuterium" refers to that hydrogen in the ligand $L_a$ represented by Formula 1 including hydrogens at positions 3, 4, 5, 7 and 8 of isoquinoline and hydrogens in $R_1$ to $R_4$ may all be hydrogen, or one, more or all of the hydrogens in the ligand $L_a$ may be substituted by deuterium.

According to an embodiment of the present disclosure, the metal M is selected from the group consisting of Cu, Ag, Au, Ru, Rh, Pd, Os, Ir and Pt.

According to an embodiment of the present disclosure, the metal M is selected from Pt or Ir.

According to an embodiment of the present disclosure, $X_1$ to $X_4$ are each independently selected from $CR_4$, and $R_4$ is independently selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a thiol group, a sulfinyl group, a sulfonyl group and a phosphino group, and combinations thereof.

According to an embodiment of the present disclosure, $X_1$ to $X_4$ are each independently selected from $CR_4$, and $R_4$ is independently selected from the group consisting of: hydrogen, deuterium, halogen, substituted or unsubstituted alkyl having 1 to 20 carbon atoms and substituted or unsubstituted aryl having 6 to 30 carbon atoms, and combinations thereof.

According to an embodiment of the present disclosure, $X_1$ to $X_4$ are each independently selected from $CR_4$, and $R_4$ is independently selected from the group consisting of: hydrogen, fluorine, methyl, ethyl, 2,2,2-trifluoroethyl and 2,6-dimethylphenyl.

According to an embodiment of the present disclosure, $X_1$ and $X_3$ are each independently selected from $CR_4$, and $R_4$ is independently selected from hydrogen, halogen, substituted or unsubstituted alkyl having 1 to 20 carbon atoms, substituted or unsubstituted aryl having 6 to 30 carbon atoms or combinations thereof.

According to an embodiment of the present disclosure, $X_1$ and $X_3$ are each independently selected from $CR_4$, and $R_4$ is each independently selected from hydrogen, methyl, ethyl, 2,2,2-trifluoroethyl or phenyl.

According to an embodiment of the present disclosure, $R_1$, $R_2$ and $R_3$ are each independently selected from the group consisting of: methyl, ethyl, n-propyl, isopropyl, isobutyl, t-butyl, isopentyl, neopentyl, phenyl, pyridyl, cyclopropyl, cyclobutyl, cyclopentyl, cyclohexyl, deuterated methyl, deuterated ethyl, deuterated n-propyl, deuterated isopropyl, deuterated isobutyl, deuterated t-butyl, deuterated isopentyl, deuterated neopentyl, deuterated phenyl, deuterated pyridyl, deuterated cyclopropyl, deuterated cyclobutyl, deuterated cyclopentyl and deuterated cyclohexyl, and combinations thereof.

According to an embodiment of the present disclosure, $R_1$, $R_2$ and $R_3$ are each independently selected from substituted or unsubstituted alkyl having 1 to 20 carbon atoms.

According to an embodiment of the present disclosure, $R_1$, $R_2$ and $R_3$ are methyl.

According to an embodiment of the present disclosure, the ligand $L_a$ has any one structure or any two structures selected from the group consisting of $L_{a1}$ to $L_{a693}$ whose specific structures are referred to claim 7.

According to an embodiment of the present disclosure, in Formula 2, $R_t$ to $R_z$ are each independently selected from the group consisting of: hydrogen, deuterium, halogen, substituted or unsubstituted alkyl having 1 to 20 carbon atoms and substituted or unsubstituted cycloalkyl having 3 to 20 ring carbon atoms, and combinations thereof;

According to an embodiment of the present disclosure, in Formula 2, $R_t$ is selected from hydrogen, deuterium or methyl, and $R_u$ to $R_z$ are each independently selected from hydrogen, deuterium, fluorine, methyl, ethyl, propyl, cyclobutyl, cyclopentyl, cyclohexyl, 3-methylbutyl, 3-ethylpentyl, trifluoromethyl or combinations thereof.

According to an embodiment of the present disclosure, the second ligand $L_b$ has any one structure or any two structures independently selected from the group consisting of $L_{b1}$ to $L_{b365}$ whose specific structures are referred to claim 9.

According to an embodiment of the present disclosure, the third ligand $L_c$ has any one structure selected from the following structures:

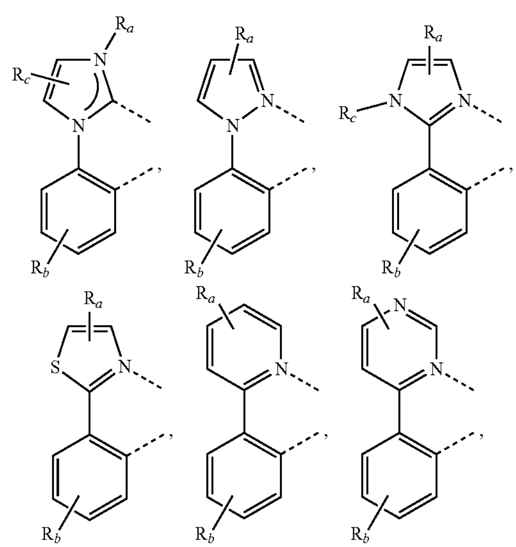

-continued

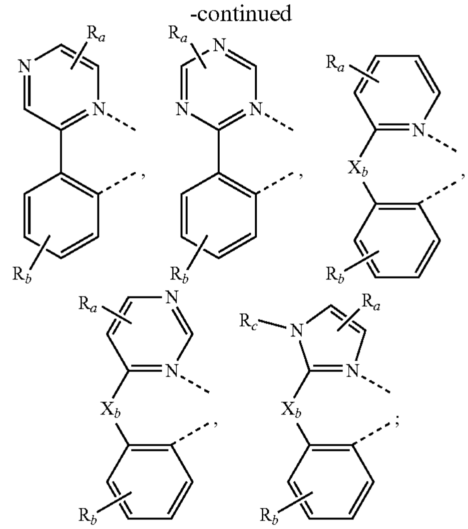

wherein $R_a$, $R_b$ and $R_c$ may represent mono-substitution, multi-substitution or non-substitution;

$X_b$ is selected from the group consisting of: O, S, Se, $NR_{N1}$ and $CR_{C1}R_{C2}$;

$R_a$, $R_b$, $R_c$, $R_{N1}$, $R_{C1}$ and $R_{C2}$ are each independently selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a thiol group, a sulfinyl group, a sulfonyl group and a phosphino group, and combinations thereof;

in the structure of $L_c$, adjacent substituents can be optionally joined to form a ring.

In this embodiment, the expression "in the structure of $L_c$, adjacent substituents can be optionally joined to form a ring" refers to that, taking

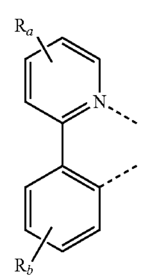

as an example, any of the following cases is included: substituents $R_a$ and $R_b$ can be optionally joined to each other to form a ring; when $R_a$ represents multi-substitution, multiple substituents $R_a$ can be optionally joined to one another to form a ring; when $R_b$ represents multi-substitution, multiple substituents $R_b$ can be optionally joined to one another to form a ring. In the preceding cases, optionally, adjacent substituents can be joined to form a ring, or adjacent substituents are not joined to form a ring. The other structures of $L_c$ can be illustrated in the same manner.

According to an embodiment of the present disclosure, the third ligand $L_c$ is independently selected from the group consisting of $L_{c1}$ to $L_{c99}$ whose specific structures are referred to claim 11.

According to an embodiment of the present disclosure, hydrogen in the ligands $L_{a1}$ to $L_{a693}$ and/or $L_{b1}$ to $L_{b365}$ may be partially or fully substituted by deuterium.

According to an embodiment of the present disclosure, the metal complex is $Ir(L_a)_2(L_b)$, wherein $L_a$ is any one or two selected from $L_{a1}$ to $L_{a693}$, and $L_b$ is any one selected from $L_{b1}$ to $L_{b365}$, wherein, optionally, hydrogen in the ligands $L_a$ and $L_b$ in the metal complex may be partially or fully substituted by deuterium.

According to an embodiment of the present disclosure, the metal complex is $Ir(L_a)(L_b)(L_c)$, wherein $L_a$ is any one selected from $L_{a1}$ to $L_{a693}$, $L_b$ is any one selected from $L_{b1}$ to $L_{b365}$, and $L_c$ is any one selected from $L_{c1}$ to $L_{c99}$, wherein, optionally, hydrogen in the ligands $L_a$ and $L_b$ in the metal complex may be partially or fully substituted by deuterium.

According to an embodiment of the present disclosure, the metal complex is selected from the group consisting of:

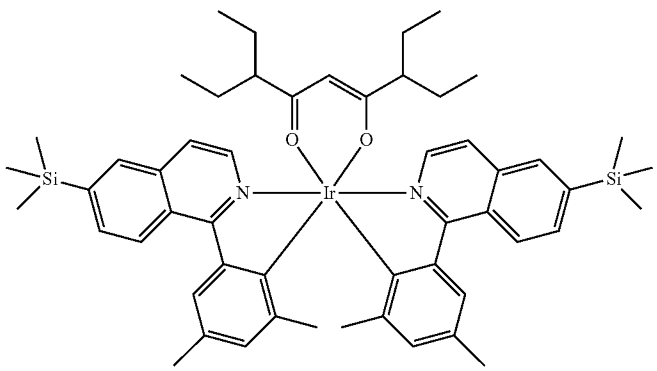

$Ir(L_{a3})_2(L_{b31})$

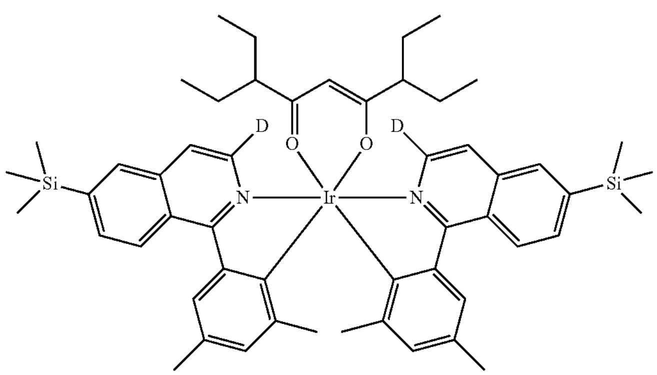

$Ir(D\text{-}L_{a3})_2(L_{b31})$

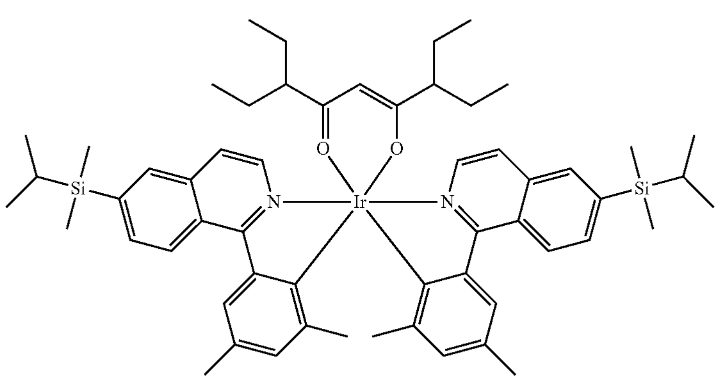

$Ir(L_{a11})_2(L_{b31})$

-continued
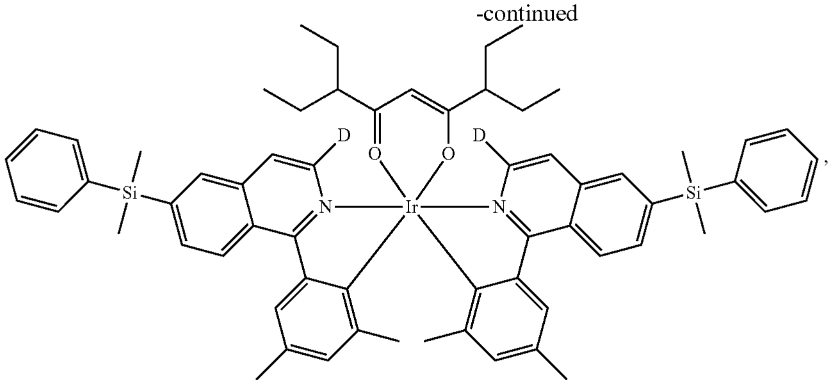
$Ir(D-L_{a54})_2(L_{b31})$
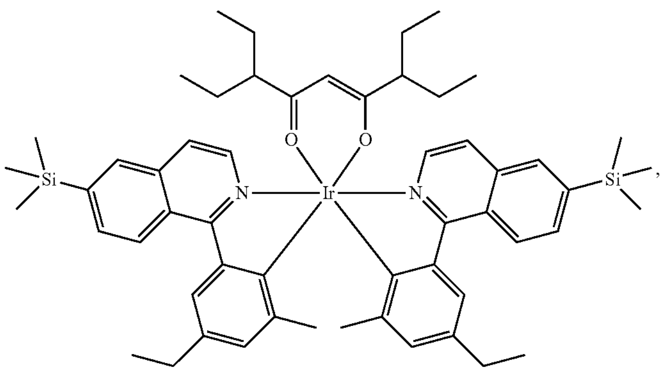
$Ir(L_{a75})_2(L_{b31})$
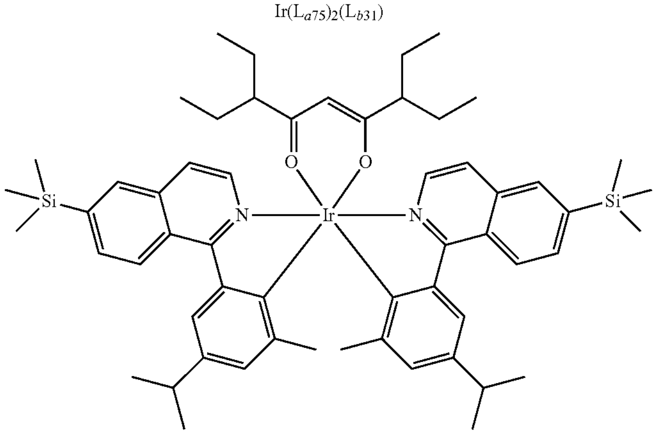
$Ir(L_{a545})_2(L_{b31})$
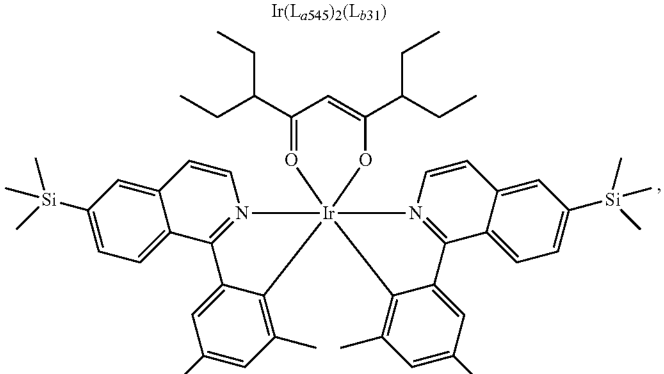

According to an embodiment of the present disclosure, further disclosed is an electroluminescent device, which includes:

an anode, a cathode, and an organic layer disposed between the anode and the cathode, wherein the organic layer includes a metal complex having a general formula of $M(L_a)_m(L_b)_n(L_c)_q$, wherein $L_a$, $L_b$ and $L_c$ are a first ligand, a second ligand and a third ligand coordinated to the metal M respectively;

wherein $L_a$, $L_b$ and $L_c$ may be optionally joined to form a multidentate ligand;

wherein m is 1 or 2, n is 1 or 2, q is 0 or 1, and m+n+q equals to the oxidation state of the metal M;

when m is greater than 1, the $L_a$ may be the same or different; and when n is greater than 1, the $L_b$ may be the same or different;

wherein the first ligand $L_a$ is represented by Formula 1:

Formula 1

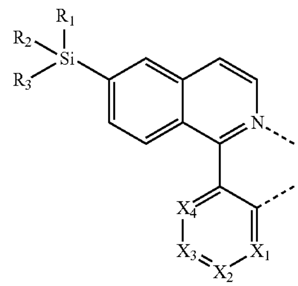

wherein, $R_1$ to $R_3$ are each independently selected from the group consisting of: substituted or unsubstituted alkyl having 1 to 20 carbon atoms, substituted or unsubstituted aryl having 6 to 30 carbon atoms, substituted or unsubstituted heteroaryl having 3 to 30 carbon atoms, substituted or unsubstituted arylalkyl having 7 to 30 carbon atoms and substituted or unsubstituted cycloalkyl having 3 to 20 ring carbon atoms, and combinations thereof;

$X_1$ to $X_4$ are each independently selected from $CR_4$ or N;

wherein $R_4$ is independently selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a thiol group, a sulfinyl group, a sulfonyl group and a phosphino group, and combinations thereof;

in Formula 1, adjacent substituents can be optionally joined to form a ring;

hydrogen in the ligand $L_a$ can be optionally partially or fully substituted by deuterium;

wherein $L_b$ has a structure represented by Formula 2:

Formula 2

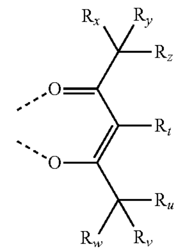

wherein $R_t$ to $R_z$ are each independently selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a thiol group, a sulfinyl group, a sulfonyl group and a phosphino group, and combinations thereof;

in Formula 2, adjacent substituents can be optionally joined to form a ring; and wherein $L_c$ is a monoanionic bidentate ligand.

According to an embodiment of the present disclosure, the device emits red light.

According to an embodiment of the present disclosure, the device emits white light.

According to an embodiment of the present disclosure, in the device, the organic layer is a light-emitting layer, and the compound is a light-emitting material.

According to an embodiment of the present disclosure, in the device, the organic layer further includes a host material.

According to an embodiment of the present disclosure, the host material includes at least one chemical group selected from the group consisting of: benzene, pyridine, pyrimidine, triazine, carbazole, azacarbazole, indolocarbazole, dibenzothiophene, aza-dibenzothiophene, dibenzofuran, azadibenzofuran, dibenzoselenophene, triphenylene, azatriphenylene, fluorene, silafluorene, naphthalene, quinoline, isoquinoline, quinazoline, quinoxaline, phenanthrene and azaphenanthrene, and combinations thereof.

According to another embodiment of the present disclosure, further disclosed is a compound formulation which includes the metal complex whose specific structure is as shown in any one of the embodiments described above.

Combination with Other Materials

The materials described in the present disclosure for a particular layer in an organic light emitting device can be used in combination with various other materials present in the device. The combinations of these materials are described in more detail in U.S. Pat. App. No. 20160359122 at paragraphs 0132-0161, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

The materials described herein as useful for a particular layer in an organic light emitting device may be used in combination with a variety of other materials present in the device. For example, dopants disclosed herein may be used in combination with a wide variety of hosts, transport layers, blocking layers, injection layers, electrodes and other layers that may be present. The combination of these materials is described in detail in paragraphs 0080-0101 of U.S. Pat. App. No. 20150349273, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

In the embodiments of material synthesis, all reactions were performed under nitrogen protection unless otherwise stated. All reaction solvents were anhydrous and used as received from commercial sources. Synthetic products were structurally confirmed and tested for properties using one or more conventional equipment in the art (including, but not limited to, nuclear magnetic resonance instrument produced by BRUKER, liquid chromatograph produced by SHIMADZU, liquid chromatograph-mass spectrometry produced by SHIMADZU, gas chromatograph-mass spectrometry produced by SHIMADZU, differential Scanning calorimeters produced by SHIMADZU, fluorescence spectrophotometer produced by SHANGHAI LENGGUANG TECH., electrochemical workstation produced by WUHAN CORRTEST, and sublimation apparatus produced by ANHUI BEQ, etc.) by methods well known to the persons skilled in the art. In the embodiments of the device, the characteristics of the device were also tested using conventional equipment in the art (including, but not limited to, evaporator produced by ANGSTROM ENGINEERING, optical testing system produced by SUZHOU FATAR, life testing system produced by SUZHOU FATAR, and ellipsometer produced by BEIJING ELLITOP, etc.) by methods well known to the persons skilled in the art. As the persons skilled in the art are aware of the above-mentioned equipment use, test methods and other related contents, the inherent data of the sample can be obtained with certainty and without influence, so the above related contents are not further described in this patent.

Material Synthesis Example

A method for preparing a compound in the present disclosure is not limited herein. Typically, the following compounds are taken as examples without limitations, and synthesis routes and preparation methods thereof are described below.

Synthesis Example 1: Synthesis of Compound $Ir(L_{a3})_2(L_{b31})$

Step 1: Synthesis of ethyl 2-ethyl-2-methylbutyrate

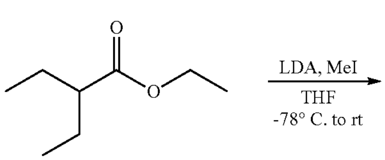

-continued

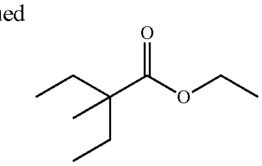

Ethyl 2-ethylbutyrate (50.0 g, 346 mmol) was dissolved in 600 mL of tetrahydrofuran, $N_2$ was bubbled into the obtained solution for 3 min, and then the solution was cooled to −78° C. 190 mL of 2 M di-isopropylamino lithium in tetrahydrofuran was added dropwise into the solution under $N_2$ protection at −78° C. After the dropwise addition was finished, the reaction solution was kept reacting at −78° C. for 30 min, and then iodomethane (58.9 g, 415 mmol) was slowly added. After the dropwise addition was finished, the reaction was slowly warmed to room temperature for overnight. Then, a saturated ammonium chloride solution was slowly added to quench the reaction, and then liquid layers were separated. The organic phase was collected, and the aqueous phase was extracted twice with dichloromethane. The organic phases were combined, dried and subjected to rotary evaporation to dryness to obtain the desired ethyl 2-ethyl-2-methylbutyrate (52.2 g with a yield of 95%).

Step 2: Synthesis of 2-ethyl-2-methylbutyric Acid

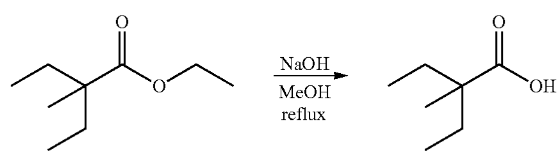

Ethyl 2-ethyl-2-methylbutyrate (52.2 g, 330 mmol) was dissolved in methanol, sodium hydroxide (39.6 g, 990 mmol) was added to the solution, and then the obtained reaction mixture was heated to reflux for 12 h and then cooled to room temperature. Methanol was removed by rotary evaporation, the pH of the reaction solution was adjusted to 1 by adding 3M hydrochloric acid, and then extraction was performed several times with dichloromethane. The organic phases were combined, dried and subjected to rotary evaporation to dryness to obtain 2-ethyl-2-methylbutyric acid (41.6 g with a yield of 97%).

Step 3: Synthesis of 3-ethyl-3-methyl-pent-2-one

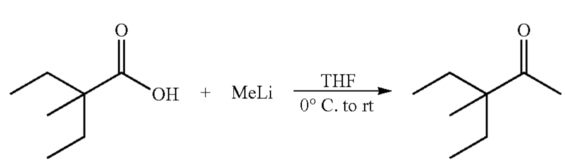

2-Ethyl-2-methylbutyric acid (13.0 g, 100 mmol) was dissolved in 200 mL of tetrahydrofuran, $N_2$ was bubbled into the obtained solution for 3 min, and then the solution was cooled to 0° C. 230 mL of 1.3 M methyl lithium in ether was added dropwise into the solution under $N_2$ protection at 0° C. After the dropwise addition was finished, the reaction solution was kept reacting at 0° C. for 2 h, and then was warmed to room temperature for overnight. After TLC displayed that the reaction was finished, 1 M hydrochloric acid was slowly added to quench the reaction, and then liquid layers were separated. The organic phase was collected, and the aqueous phase was extracted twice with dichloromethane. The organic phases were combined, dried and subjected to rotary evaporation to dryness to obtain the target product, 3-ethyl-3-methyl-pent-2-one (11.8 g with a yield of 92%).

Step 4: Synthesis of 2-ethylbutyryl Chloride

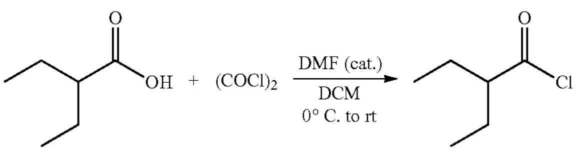

2-Ethylbutyric acid (11.6 g, 100 mmol) was dissolved in dichloromethane, 1 drop of DMF was added as a catalyst, and then $N_2$ was bubbled into the obtained solution for 3 min. The reaction was then cooled to 0° C., and oxalyl chloride (14.0 g, 110 mmol) was added dropwise thereto. After the dropwise addition was finished, the reaction was warmed to room temperature. When no gas was evolved from the reaction system, the reaction solution was subjected to rotary evaporation to dryness. The obtained crude 2-ethylbutyryl chloride was used directly in the next reaction without further purification.

Step 5: Synthesis of 3,7-diethyl-3-methylnonane-4,6-dione

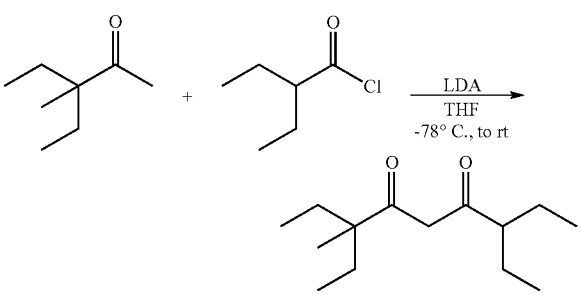

3-Ethyl-3-methyl-pent-2-one (11.8 g, 92 mmol) was dissolved in tetrahydrofuran, $N_2$ was bubbled into the obtained solution for 3 min, and then the solution was cooled to −78° C. 55 mL of 2 M di-isopropylamino lithium in tetrahydrofuran was added dropwise to the solution. After the dropwise addition was finished, the reaction solution was kept reacting at −78° C. for 30 min, and then 2-ethylbutyryl chloride (100 mmol) was slowly added. After the dropwise addition was finished, the reaction was slowly warmed to room temperature for overnight. 1 M hydrochloric acid was slowly added to quench the reaction, and then liquid layers were separated. The organic phase was collected, and the aqueous phase was extracted twice with dichloromethane. The organic phases were combined, dried and subjected to rotary evaporation to dryness to obtain a crude product. The crude product was purified by column chromatography (with an eluent of petroleum ether) and distilled under reduced pressure to obtain the target product 3,7-diethyl-3-methylnonane-4,6-dione (4.7 g with a yield of 23%).

Step 6: Synthesis of 1-(3,5-dimethylphenyl)-6-(trimethylsilyl)isoquinoline

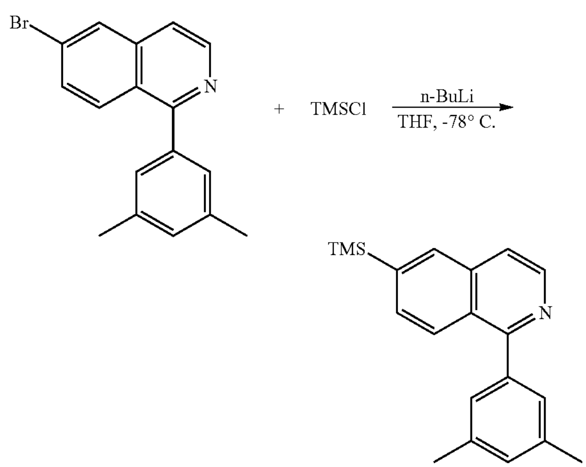

6-Bromo-1-(3,5-dimethylphenyl)isoquinoline (6.24 g, 20 mmol) was dissolved in 80 mL of tetrahydrofuran. The reaction system was evacuated and purged with nitrogen three times. The reaction flask was cooled to −78° C., and n-butyl lithium (2.5 M) (9.6 mL, 24 mmol) was slowly added dropwise to the system. After the dropwise addition was finished, the mixture was reacted for 30 min, and then trimethylchlorosilane (3.26 g, 30 mmol) was added dropwise to the system at this temperature. After the dropwise addition was finished, the reaction was slowly returned to room temperature for overnight. After TLC detected that the reaction was finished, water was added to quench the reaction. A layer of tetrahydrofuran was separated, and the aqueous phase was extracted three times with ethyl acetate. The organic phases were combined and dried, and the solvent was removed by rotary evaporation. The resultant was purified by column chromatography to obtain 5.40 g of 1-(3,5-dimethylphenyl)-6-(trimethylsilyl)isoquinoline with a yield of 88%, which is a colorless oily liquid.

Step 7: Synthesis of Compound $IR(L_{a3})_2(L_{b31})$

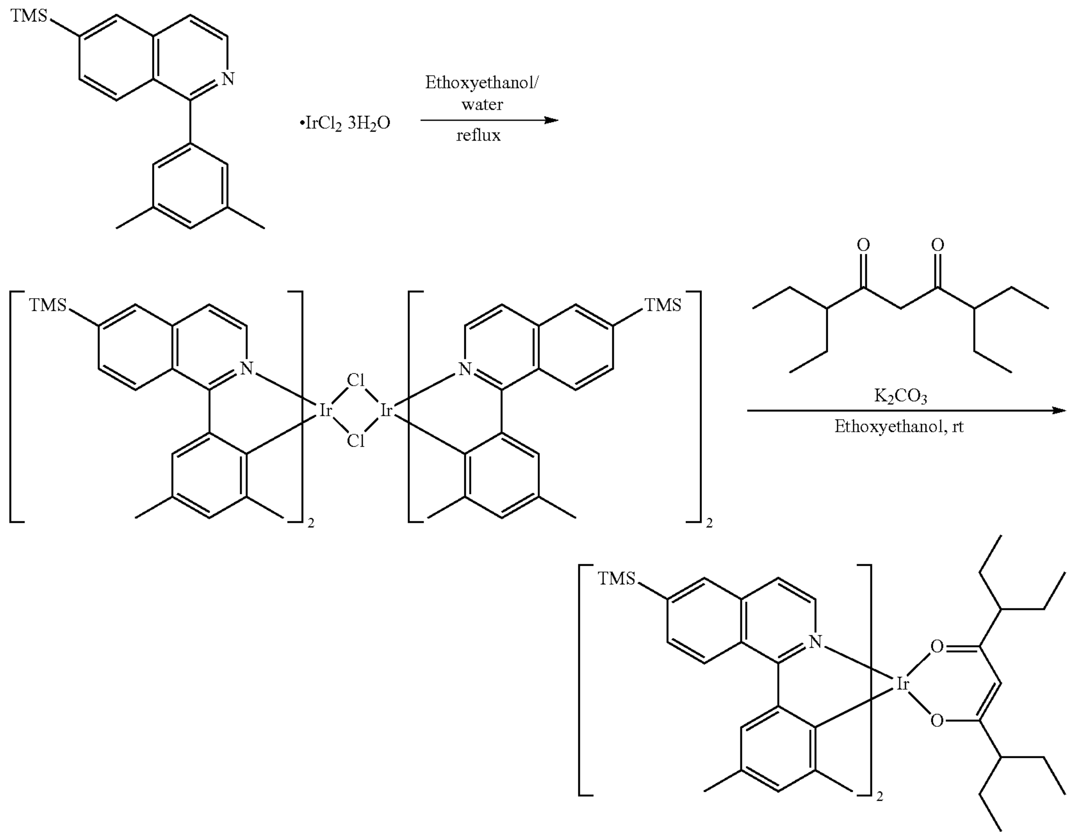

A mixture of 1-(3,5-dimethylphenyl)-6-(trimethylsilyl) isoquinoline (1.8 g, 5.89 mmol), iridium trichloride trihydrate (0.7 g, 1.98 mmol), 2-ethoxyethanol (21 mL) and water (7 mL) was refluxed under a nitrogen atmosphere for 24 h. The reaction was cooled to room temperature, and the solvent was removed by rotary evaporation. 3,7-Diethylnonane-4,6-dione (0.84 g, 3.96 mmol) and potassium carbonate (1.37 g, 9.9 mmol) were added thereto. Under a nitrogen atmosphere, the reaction was stirred in 2-ethoxyethanol (27 mL) at room temperature for 24 h. The reaction solution was filtered through Celite, the filter cake was washed with an appropriate amount of ethanol, and the crude product was washed with dichloromethane into a 250 mL eggplant-shaped bottle. Ethanol (about 30 mL) was added, and the mixture was concentrated at room temperature until a large amount of solids was precipitated. The solids were filtered and washed with an appropriate amount of ethanol to obtain 1.2 g of compound $Ir(L_{a3})_2(L_{b31})$ (1.19 mmol with a yield of 60% over two steps). The product was confirmed as a target product with a molecular weight of 1013.

Synthesis Example 2: Synthesis of Compound $Ir(L_{a3})_2(L_{b101})$

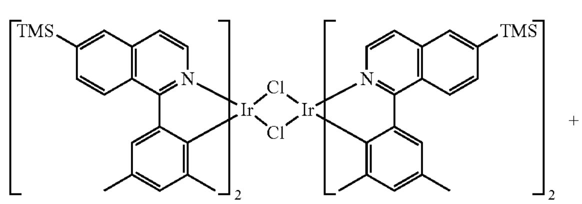

-continued

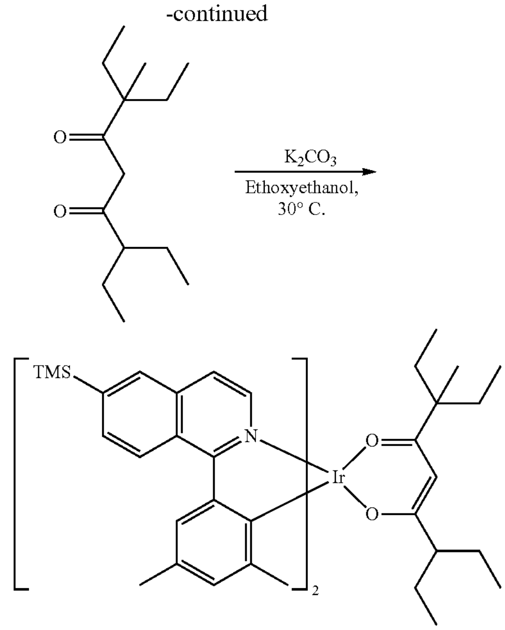

Under a nitrogen atmosphere, an iridium dimer (1.93 g, 1.15 mmol), 3,7-diethyl-3-methylnonane-4,6-dione (0.79 g, 3.5 mmol), and potassium carbonate (1.59 g, 11.5 mmol) were heated in 2-ethoxyethanol (33 mL) to 30° C. and stirred for 24 h. After TLC detected that the reaction was finished, the reaction system was naturally cooled to room temperature, and the deposit was filtered through Celite and washed with ethanol. The obtained solid was dissolved in dichloromethane, and an appropriate amount of ethanol was added. The obtained solution was concentrated until a solid was precipitated. The solid was filtered to obtain 2.2 g of compound $Ir(L_{a3})_2(L_{b101})$ (2.14 mmol with a yield of 93.2%). The obtained compound was refluxed in acetonitrile, cooled, filtered and further purified to obtain 2.0 g of compound $Ir(L_{a3})_2(L_{b101})$. The product was confirmed as a target product with a molecular weight of 1027.

Synthesis Example 3: Synthesis of Compound $Ir(L_{a11})_2(L_{b31})$

Step 1: Synthesis of 1-(3,5-dimethylphenyl)-6-(isopropyldimethylsilyl)isoquinoline

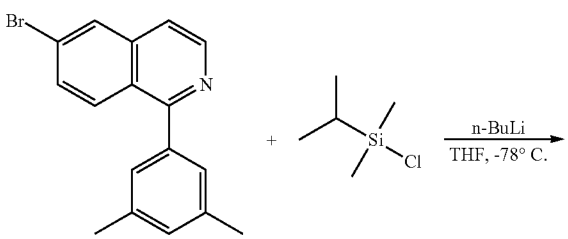

-continued

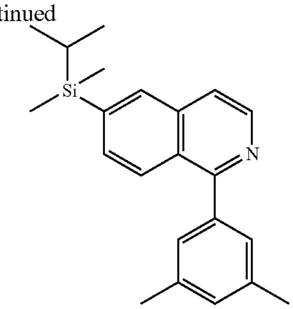

6-Bromo-1-(3,5-dimethylphenyl)isoquinoline (2.67 g, 8.56 mmol) was dissolved in 35 mL of tetrahydrofuran. The reaction system was evacuated and purged with nitrogen three times. The reaction flask was cooled to −78° C., and n-butyl lithium (2.5 M) (3.7 mL, 9.4 mmol) was slowly added dropwise to the system. After the dropwise addition, the mixture was reacted for 30 min, and then isopropyldimethylchlorosilane (1.29 g, 9.4 mmol) was added dropwise to the system at this temperature. After the dropwise addition was finished, the reaction was slowly returned to room temperature for overnight. After TLC detected that the reaction was finished, water was added to quench the reaction. A layer of tetrahydrofuran was separated, and the aqueous phase was extracted three times with ethyl acetate. The organic phases were combined, dried, concentrated and purified by column chromatography to obtain 2.40 g of 1-(3,5-dimethylphenyl)-6-(isopropyldimethylsilyl)isoquinoline (7.2 mmol with a yield of 84.1%).

Step 2: Synthesis of Compound $Ir(L_{a11})_2(L_{b31})$

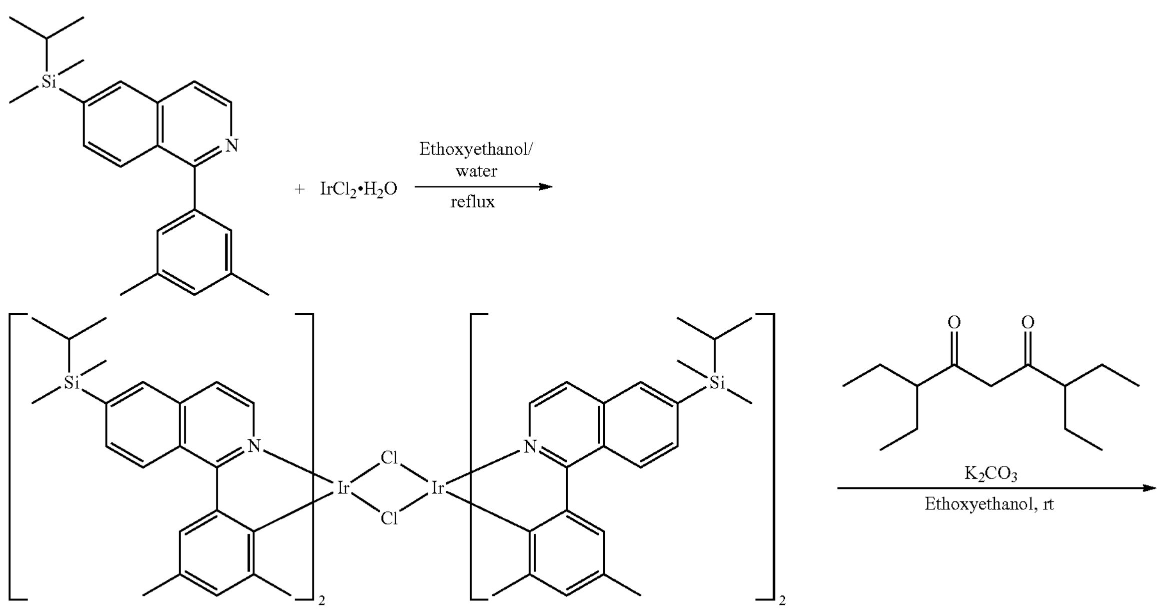

-continued

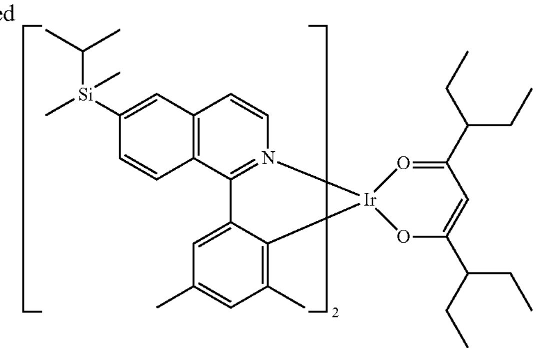

Under a nitrogen atmosphere, 1-(3,5-dimethylphenyl)-6-(isopropyldimethylsilyl)isoquinoline (2.40 g, 7.2 mmol) and iridium trichloride trihydrate (0.64 g, 1.80 mmol) were refluxed in 2-ethoxyethanol (70 mL) and water (23 mL) for 24 h. The reaction was cooled to room temperature. The solvent was removed by rotary evaporation, and then 3,7-diethylnonane-4,6-dione (774 mg, 3.6 mmol), $K_2CO_3$ (1.24 g, 9.0 mmol) and ethoxyethanol (25 mL) were added thereto. The reaction was evacuated and purged with nitrogen, and then reacted at room temperature for 24 h under $N_2$ protection. After TLC detected that the reaction was finished, the reaction solution was no longer heated, cooled to room temperature, filtered through Celite and washed with an appropriate amount of ethanol. Dichloromethane was added to the obtained solid, and the filtrate was collected. Ethanol was then added and the obtained solution was concentrated, but not to dryness. The solid was filtered and washed with ethanol to obtain 1.3 g of compound $Ir(L_{a11})_2(L_{b31})$ (1.21 mmol with a yield of 67%). The product was confirmed as a target product with a molecular weight of 1069.

Synthesis Example 4: Synthesis of Compound $Ir(L_{a54})_2(L_{b101})$

Step 1: Synthesis of 1-(3,5-dimethylphenyl)-6-(phenyldimethylsilyl)isoquinoline

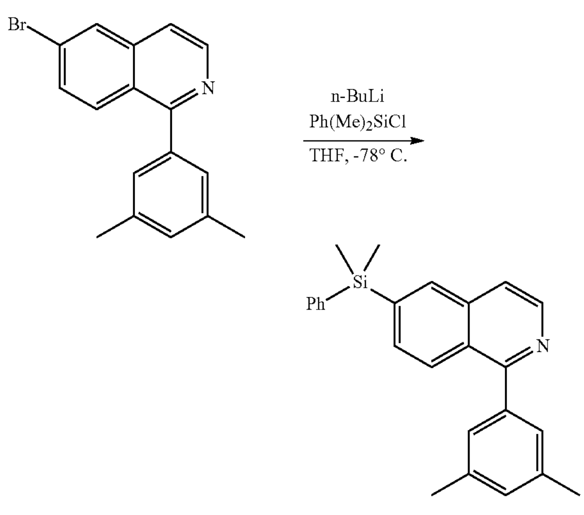

6-Bromo-1-(3,5-dimethylphenyl)isoquinoline (10.45 mmol, 3 g) was dissolved in 30 mL of tetrahydrofuran. The reaction system was evacuated and purged with nitrogen three times. The reaction flask was placed in a solid carbon dioxide-ethanol system to be cooled to −72° C., and n-BuLi (2.5 M) (5 mL, 12.51 mmol) was slowly added dropwise to the system. After the dropwise addition was finished, the mixture was reacted for 30 min, and then dimethylphenylchlorosilane (2.14 g, 12.54 mmol, 1.25 eq.) was added dropwise to the system. After the dropwise addition was finished, the reaction was slowly returned to room temperature for overnight. The reaction was monitored by TLC until it was finished. Water was added to quench the reaction. A layer of tetrahydrofuran was separated, and the aqueous phase was extracted three times with ethyl acetate. The organic phases were combined, dried, concentrated and purified by column chromatography to obtain 1-(3,5-dimethylphenyl)-6-(phenyldimethylsilyl)isoquinoline (3.46 g with a yield of 90%), which is a colorless oily liquid.

Step 2: Synthesis of an Iridium Dimer

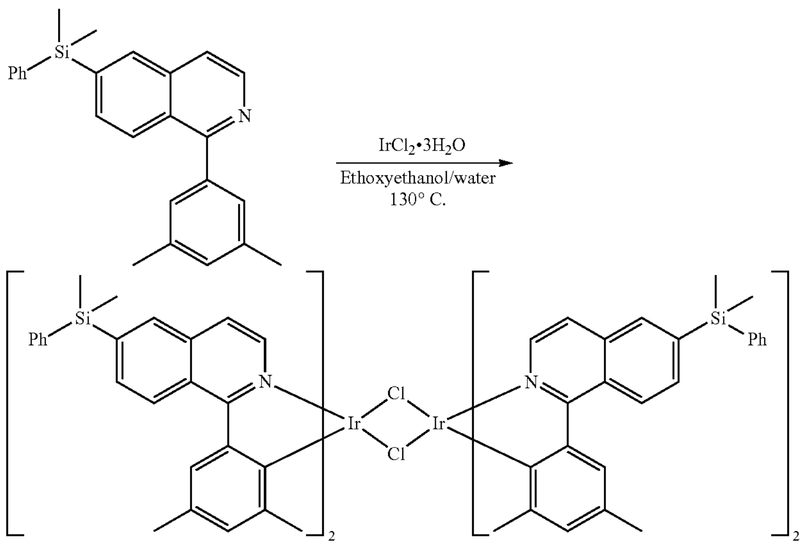

1-(3,5-Dimethylphenyl)-6-(phenyldimethylsilyl)isoquinoline (2.9 g, 7.9 mmol, 4 eq.), $IrCl_3.3H_2O$ (0.7 g, 1.97 mmol, 1 eq.), ethoxyethanol (21 mL) and water (7 mL) were added in a 100 ml single-mouth bottle. The system was degassed and purged with nitrogen, and then refluxed for 24 h. The reaction was cooled to room temperature, filtered, and the filter cake was washed with ethanol to obtain mixed iridium dimers (1.58 g, 1.33 mmol with a yield of 67%).

Step 3: Synthesis of Compound $Ir(L_{a54})_2(L_{b101})$

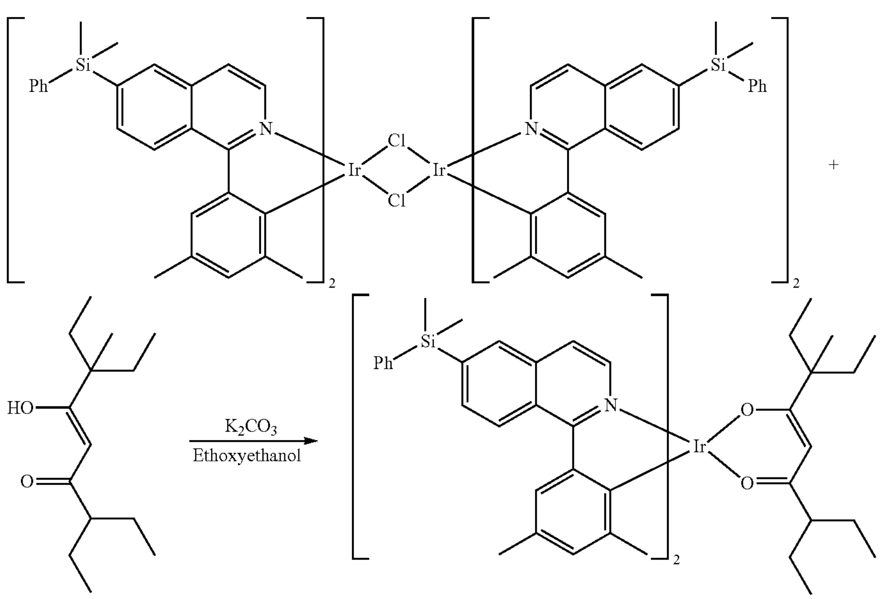

3,7-Diethyl-3-methyl-nonane-4,6-dione (1.2 g, 5.32 mmol, 4 eq.), potassium carbonate (1.84 g, 13.3 mmol, 10 eq.) and 2-ethoxyethanol (40 mL) were added to the mixed iridium dimers, and the mixture was reacted for overnight at 45° C. under $N_2$ protection. After TLC detected that the reaction was finished, the reaction solution was no longer stirred and was cooled to room temperature. The reaction solution was filtered through Celite, the filter cake was washed with an appropriate amount of ethanol, and the crude product was washed with dichloromethane into a 500 mL eggplant-shaped bottle. Ethanol (about 20 mL) was added, and dichloromethane was removed by rotary evaporation at room temperature until a large amount of solids was precipitated. The solids were filtered, washed with an appropriate amount of ethanol, and dried to obtain compound $Ir(L_{a54})_2(L_{b101})$ (1.3 g with a yield of 62%). The product was confirmed as a target product with a molecular weight of 1151.

Synthesis Example 5: Synthesis of Compound $Ir(L_{a3})(L_{b101})(L_{c41})$

Step 1: Synthesis of 1-(3,5-dimethylphenyl)-6-methylisoquinoline

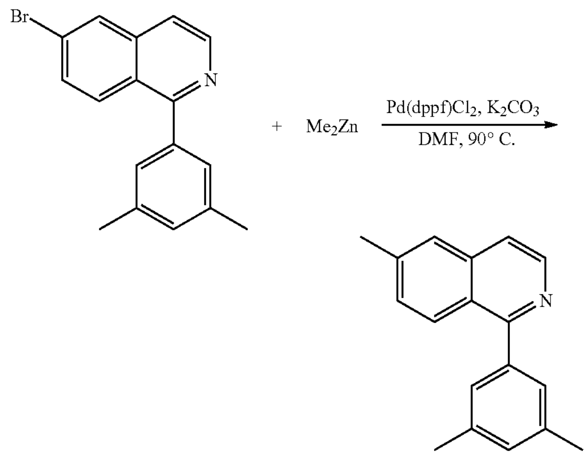

6-Bromo-1-(3,5-dimethylphenyl)isoquinoline (5 g, 16 mmol), $Pd(dppf)Cl_2$ (535 mg, 0.8 mmol), $K_2CO_3$ (5.3 g, 40 mmol) and DMF (80 mL) were added in a 500 mL three-mouth bottle. The reaction system was degassed and purged with nitrogen, added with a solution of $Me_2Zn$ in toluene (24 mL, 24 mmol), and reacted at 90° C. overnight. After GC-MS detected that the reaction was finished, water was added to quench the reaction. The organic phase was separated, and the aqueous phase was extracted with ethyl acetate. The organic phases were combined, washed with saturated brine, dried with anhydrous sodium sulfate, filtered and concentrated, mixed with Celite, and separated by column chromatography to obtain 1-(3,5-dimethylphenyl)-6-methylisoquinoline (3.2 g with a yield of 81%) which is a white solid.

Step 2: Synthesis of 1-(3,5-dimethylphenyl)-6-trimethylsilylisoquinoline

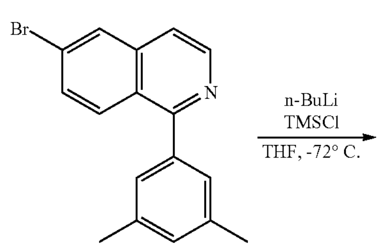

-continued

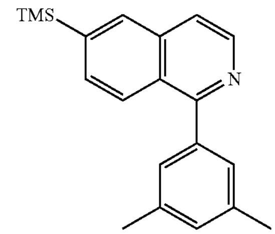

6-Bromo-1-(3,5-dimethylphenyl)isoquinoline (48.05 mmol, 15 g) was dissolved in 160 mL of tetrahydrofuran. The reaction system was evacuated and purged with nitrogen three times. The reaction flask was placed in a solid carbon dioxide-ethanol system to be cooled to −72° C., and n-BuLi (2.5 M, 23.1 mL, 57.7 mmol) was slowly added dropwise to the system. After the dropwise addition was finished, the mixture was reacted for 30 min, and then trimethylchlorosilane (7.82 g, 72.1 mmol) was added dropwise to the system. After the dropwise addition was finished, the reaction was slowly returned to room temperature for overnight. The reaction was monitored by TLC until it was finished. Water was added to quench the reaction. A layer of tetrahydrofuran was separated, and the aqueous phase was extracted three times with ethyl acetate. The organic phases were combined, dried, subjected to rotary evaporation and purified by column chromatography to obtain 1-(3,5-dimethylphenyl)-6-trimethylsilylisoquinoline (11.7 g with a yield of 79%), which is a colorless oily liquid.

Step 3: Synthesis of Compound $Ir(L_{a3})(L_{b101})(L_{c41})$

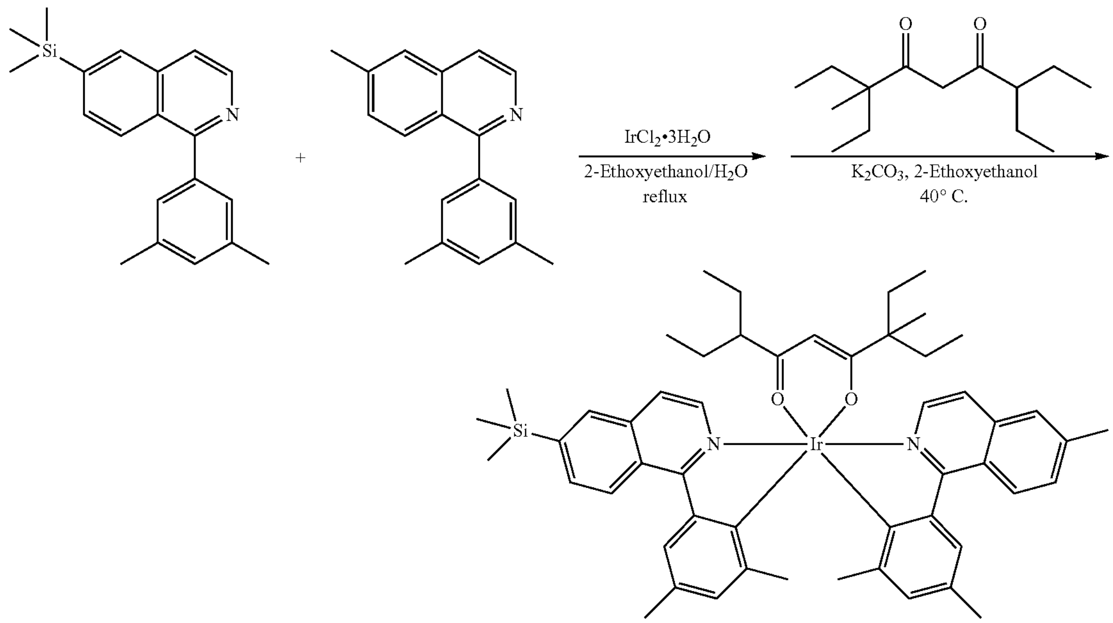

1-(3,5-Dimethylphenyl)-6-trimethylsilylisoquinoline (3.14 g, 10.3 mmol), 1-(3,5-dimethylphenyl)-6-methylisoquinoline (6.36 g, 25.7 mmol), and iridium trichloride trihydrate (3.17 g, 9.0 mmol) were refluxed in 2-ethoxyethanol (96 mL) and water (32 mL) under a nitrogen atmosphere for 40 h. The reaction solution was cooled to room temperature and filtered. The obtained solid was washed several times with methanol and dried to give an iridium dimer.

Under a nitrogen atmosphere, the iridium dimer (4.48 g) in the preceding step, 3,7-diethyl-3-methylnonane-4,6-dione (1.96 g, 8.65 mmol), and $K_2CO_3$ (3.98 g, 28.8 mmol) were heated in 2-ethoxyethanol (83 mL) to 40° C. and stirred for 24 h. After the reaction was finished, the reaction system was naturally cooled to room temperature, and the deposit was filtered through Celite and washed with ethanol. The obtained solid was added with dichloromethane, and the filtrate was collected. The solvent was removed in vacuum, and the residual was mixed with Celite and separated by column chromatography to obtain $Ir(L_{a3})$ $(L_{b101})$ $(L_{c41})$ (0.83 g with a purity of 99.4%). The product was confirmed as a target product with a molecular weight of 968.

Those skilled in the art will appreciate that the above preparation method is merely illustrative, and those skilled in the art can obtain other compound structures of the present disclosure through the improvements of the preparation method.

Device Example 1

First, a glass substrate having an Indium Tin Oxide (ITO) anode with a thickness of 120 nm was cleaned, and then treated with oxygen plasma and UV ozone. After the treatment, the substrate was dried in a glovebox to remove water. The substrate was mounted on a substrate support and placed in a vacuum chamber. Organic layers specified below were sequentially deposited through vacuum thermal evaporation on the ITO anode at a rate of 0.2 to 2 Angstroms per second at a vacuum degree of about $10^8$ torr. Compound HI was used as a hole injection layer (HIL). Compound HT was used as a hole transporting layer (HTL). Compound EB was used as an electron blocking layer (EBL). The compound $Ir(L_{a3})_2(L_{b31})$ of the present disclosure was doped in a host compound RH to be used as an emissive layer (EML). Compound HB was used as a hole blocking layer (HBL). On the HBL, a mixture of Compound ET and 8-hydroxyquinolinolato-lithium (Liq) was deposited for use as an electron transporting layer (ETL). Finally, Liq with a thickness of 1 nm was deposited as an electron injection layer, and Al with a thickness of 120 nm was deposited as a cathode. The device was transferred back to the glovebox and encapsulated with a glass lid and a moisture getter to complete the device.

Device Example 2

The preparation method in Device Example 2 was the same as that in Device Example 1, except that the compound $Ir(L_{a3})_2(L_{b31})$ of the present disclosure in the emissive layer (EML) was substituted by the compound $Ir(L_{a3})_2(L_{b101})$ of the present disclosure.

Device Example 3

The preparation method in Device Example 3 was the same as that in Device Example 1, except that the compound $Ir(L_{a3})_2(L_{b31})$ of the present disclosure in the emissive layer (EML) was substituted by the compound $Ir(L_{z3})$ $(L_{b101})$ $(L_{c41})$ of the present disclosure.

Device Comparative Example 1

The preparation method in device Comparative Example 1 was the same as that in Device Example 1, except that the compound $Ir(L_{a3})_2(L_{b31})$ of the present disclosure in the emissive layer (EML) was substituted by a comparative compound RD1.

Device Comparative Example 2

The preparation method in device Comparative Example 2 was the same as that in Device Example 1, except that the compound $Ir(L_{a3})_2(L_{b31})$ of the present disclosure in the emissive layer (EML) was substituted by a comparative compound RD2.

Device Comparative Example 3

The preparation method in device Comparative Example 3 was the same as that in Device Example 1, except that the compound $Ir(L_{a3})_2(L_{b31})$ of the present disclosure in the emissive layer (EML) was substituted by a comparative compound RD3.

Detail structures and thicknesses of part of layers of the device are shown in the following table. The more than one materials used in one layer are obtained by doping different compounds in their weight proportions as described.

TABLE 1

| Part of device structures | | | | | | |
|---|---|---|---|---|---|---|
| Device No. | HIL | HTL | EBL | EML | HBL | ETL |
| Example 1 | Compound HI (100 Å) | Compound HT (400 Å) | Compound EB (50 Å) | Compound RH: compound $Ir(L_{a3})_2(L_{b31})$ (97:3) (400 Å) | Compound HB (50 Å) | Compound ET: Liq (40:60) (350 Å) |
| Example 2 | Compound HI (100 Å) | Compound HT (400 Å) | Compound EB (50 Å) | Compound RH: compound $Ir(L_{a3})_2(L_{b101})$ (97:3) (400 Å) | Compound HB (50 Å) | Compound ET: Liq (40:60) (350 Å) |
| Example 3 | Compound HI (100 Å) | Compound HT (400 Å) | Compound EB (50 Å) | Compound RH: compound $Ir(L_{a3})_2(L_{b101})(L_{c41})$ (97:3) (400 Å) | Compound HB (50 Å) | Compound ET: Liq (40:60) (350 Å) |
| Comparative Example 1 | Compound HI (100 Å) | Compound HT (400 Å) | Compound EB (50 Å) | Compound RH: compound RD1 (97:3) (400 Å) | Compound HB (50 Å) | Compound ET: Liq (40:60) (350 Å) |
| Comparative Example 2 | Compound HI (100 Å) | Compound HT (400 Å) | Compound EB (50 Å) | Compound RH: compound RD2 (97:3) (400 Å) | Compound HB (50 Å) | Compound ET: Liq (40:60) (350 Å) |
| Comparative Example 3 | Compound HI (100 Å) | Compound HT (400 Å) | Compound EB (50 Å) | Compound RH: compound RD3 (97:3) (400 Å) | Compound HB (50 Å) | Compound ET: Liq (40:60) (350 Å) |

Structures of the materials used in the device are shown as follows:

Compound HI

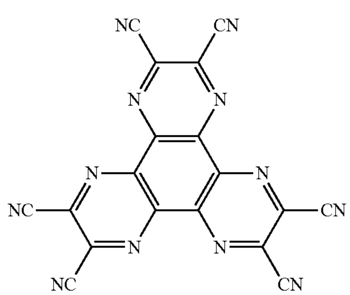

-continued

Compound HT

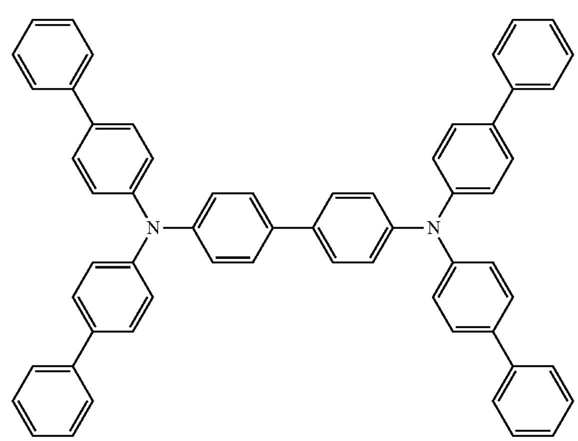

-continued
Compound EB
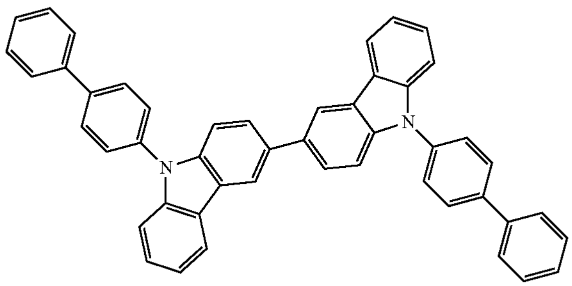
Compound HB
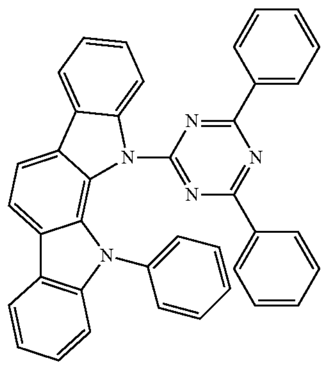
Compound RH
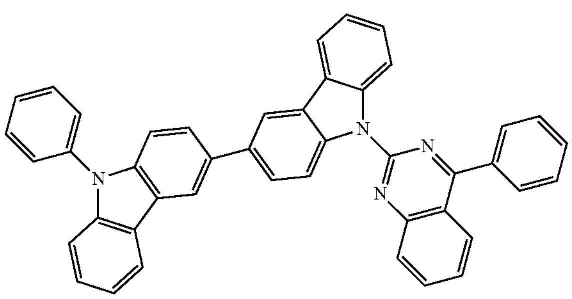
Compound ET
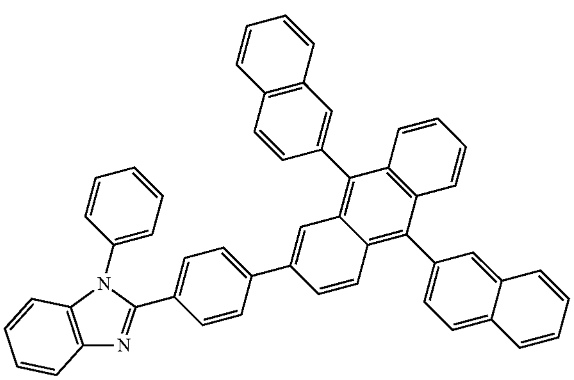
-continued
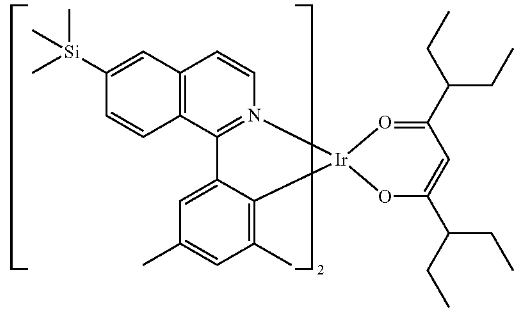
Compound Ir($L_{a3}$)$_2$($L_{b31}$)
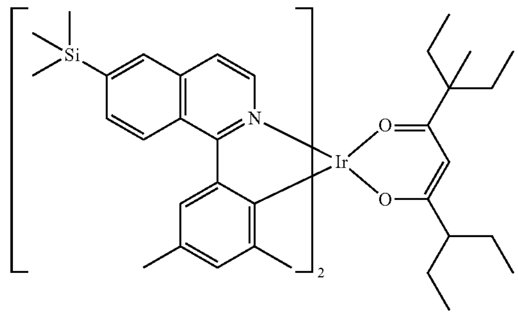
Compound Ir($L_{a3}$)$_2$($L_{b101}$)
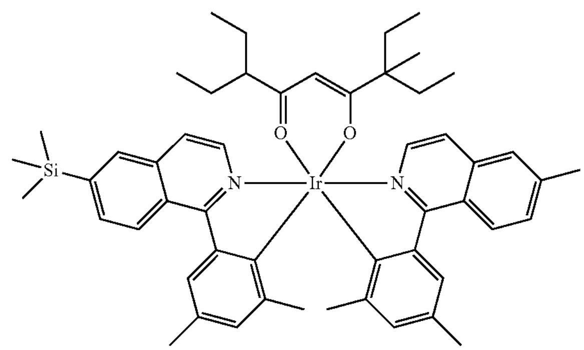
Ir($L_{a3}$)($L_{b101}$)($L_{c41}$)
Compound RD1
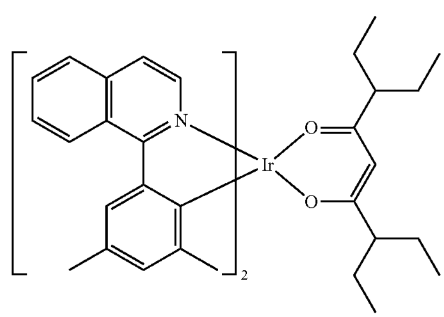

-continued

Compound RD2

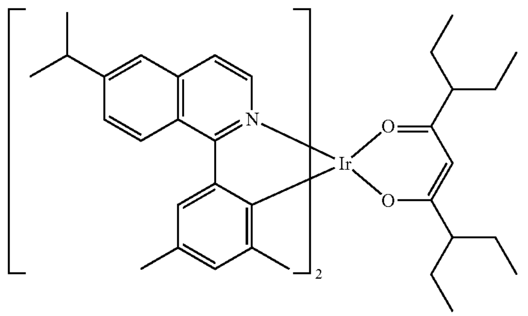

Compound RD3

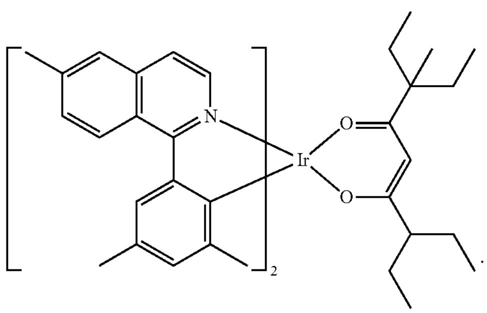

Current-voltage-luminance (IVL) and lifetime characteristics of the device were measured at different current densities and voltages. Table 2 lists measured data about external quantum efficiency (EQE), $\lambda_{max}$, full width at half maximum (FWHM), and CIE at 1000 nits. Lifetime LT97 was measured at 15 mA/cm$^2$.

TABLE 2

Device data

| Device No. | CIE (x, y) | λmax (nm) | FWHM (nm) | EQE (%) | LT97 (h) |
|---|---|---|---|---|---|
| Example 1 | (0.696, 0.302) | 639 | 48.8 | 24.59 | 1748 |
| Comparative Example 1 | (0.693, 0.306) | 632 | 49.0 | 23.66 | 1264 |
| Comparative Example 2 | (0.683, 0.316) | 625 | 49.5 | 25.64 | 1623 |
| Example 2 | (0.699, 0.300) | 639 | 49.6 | 24.75 | 1744 |
| Example 3 | (0.695, 0.304) | 635 | 57.4 | 24.12 | 1670 |
| Comparative Example 3 | (0.685, 0.314) | 625 | 51.4 | 24.47 | 1430 |

The data in Table 2 shows that the compound in Device Example 1 that includes a ligand having a mono-silyl-substituted isoquinoline structure disclosed by the present disclosure emits saturated crimson light. Compared with the compound in Comparative Example 1 which has no substitution on the isoquinoline ligand, the compound of the present disclosure allows an emission wavelength close to 640 nm, CIE of (0.696, 0.302), and a narrower half-peak width, thereby providing redder and saturated emission and greatly improved lifetime. While, though the compound in Comparative Example 2 which has alkyl substitution on the isoquinoline ligand shows slightly higher efficiency, its maximum wavelength is merely 625 nm, which obviously cannot reach the crimson color as in Example 1. At the same time, compared with Comparative Example 2, the device in Example 1 has a longer lifetime and a narrower half-peak width.

In addition, the comparison between Example 3 and Comparative Example 3 also shows the effect of the mono-silyl-substituted isoquinoline structure. Comparative Example 3 uses a complex including two 6-methylisoquinoline ligands, and Example 3 uses a complex including one 6-methylisoquinoline ligand and one 6-trimethylsilylisoquinoline ligand. Example 3 has a red-shift of 10 nm and a greatly improved lifetime than Comparative Example 3, and has CIE close to that of Example 2, indicating that the complex with merely one mono-silyl-substituted isoquinoline ligand already has a significant effect. Furthermore, the complex in Example 2 that includes two 6-trimethylsilylisoquinoline ligands has a more significant red-shift and a narrower half-peak width, and provides redder and saturated emission and longer lifetime. Therefore, the device has better performance.

In summary, the compound of the present disclosure can display crimson light with a high efficiency, a longer lifetime and a narrow spectrum, which highlights the uniqueness and importance of the present disclosure.

It should be understood that various embodiments described herein are merely examples and not intended to limit the scope of the present disclosure. Therefore, it is apparent to those skilled in the art that the present disclosure as claimed may include variations from specific embodiments and preferred embodiments described herein. Many of materials and structures described herein may be substituted with other materials and structures without departing from the spirit of the present disclosure. It should be understood that various theories as to why the present disclosure works are not intended to be limitative.

What is claimed is:

1. A metal complex, having a general formula of $M(L_a)_m(L_b)_n(L_c)_q$, wherein $L_a$, $L_b$ and $L_c$ are a first ligand, a second ligand and a third ligand coordinated to the metal M respectively;

wherein $L_a$, $L_b$ and $L_c$ may be optionally joined to form a multidentate ligand;

wherein m is 1 or 2, n is 1 or 2, q is 0 or 1, and m+n+q equals to the oxidation state of the metal M;

when m is greater than 1, the $L_a$ may be the same or different; and when n is greater than 1, the $L_b$ may be the same or different;

wherein the first ligand $L_a$ is represented by Formula 1:

Formula 1

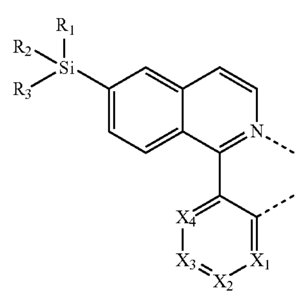

wherein, $R_1$ to $R_3$ are each independently selected from the group consisting of: substituted or unsubstituted alkyl having 1 to 20 carbon atoms, substituted or unsubstituted aryl having 6 to 30 carbon atoms, substituted or unsubstituted heteroaryl having 3 to 30 carbon atoms, substituted or unsubstituted arylalkyl having 7 to 30 carbon atoms, substituted or unsubstituted cycloalkyl having 3 to 20 ring carbon atoms, and combinations thereof;

$X_1$ to $X_4$ are each independently selected from $CR_4$ or N;

wherein $R_4$ is independently selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a thiol group, a sulfinyl group, a sulfonyl group, a phosphino group, and combinations thereof;

in Formula 1, adjacent substituents can be optionally joined to form a ring;

hydrogen in the ligand $L_a$ can be optionally partially or fully substituted by deuterium;

wherein $L_b$ has a structure represented by Formula 2:

Formula 2

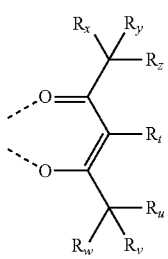

wherein $R_t$ to $R_z$ are each independently selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a thiol group, a sulfinyl group, a sulfonyl group, a phosphino group, and combinations thereof;

in Formula 2, for substituents $R_x$, $R_y$, $R_z$, $R_t$, $R_u$, $R_v$ and $R_w$, adjacent substituents can be optionally joined to form a ring; and wherein $L_c$ is a monoanionic bidentate ligand.

2. The metal complex of claim 1, wherein the metal M is selected from the group consisting of Cu, Ag, Au, Ru, Rh, Pd, Os, Ir and Pt.

3. The metal complex of claim 1, wherein $X_1$ to $X_4$ are each independently selected from $CR_4$, and $R_4$ is independently selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a thiol group, a sulfinyl group, a sulfonyl group and a phosphino group, and combinations thereof.

4. The metal complex of claim 1, wherein $X_1$ and/or $X_3$ are(is) each independently selected from $CR_4$, and $R_4$ is independently selected from hydrogen, halogen, substituted or unsubstituted alkyl having 1 to 20 carbon atoms, substituted or unsubstituted aryl having 6 to 30 carbon atoms, or combinations thereof.

5. The metal complex of claim 1, wherein $R_1$, $R_2$ and $R_3$ are each independently selected from the group consisting of: methyl, ethyl, n-propyl, isopropyl, isobutyl, t-butyl, isopentyl, neopentyl, phenyl, pyridyl, cyclopropyl, cyclobutyl, cyclopentyl, cyclohexyl, deuterated methyl, deuterated ethyl, deuterated n-propyl, deuterated isopropyl, deuterated isobutyl, deuterated t-butyl, deuterated isopentyl, deuterated neopentyl, deuterated phenyl, deuterated pyridyl, deuterated cyclopropyl, deuterated cyclobutyl, deuterated cyclopentyl, deuterated cyclohexyl, and combinations thereof.

6. The metal complex of claim 1, wherein $R_1$, $R_2$ and $R_3$ are each independently selected from substituted or unsubstituted alkyl having 1 to 20 carbon atoms.

7. The metal complex of claim 1, wherein $L_a$ has any one structure or any two structures selected from the group consisting of $L_{a1}$ to $L_{a693}$:

$L_{a1}$

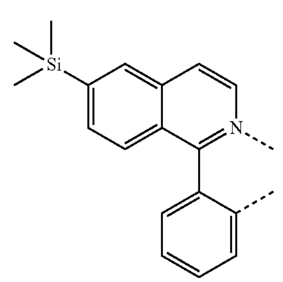

-continued
$L_{a2}$
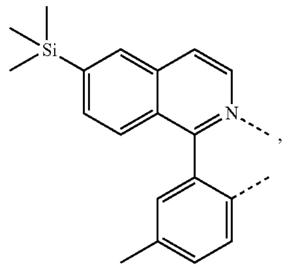
$L_{a3}$
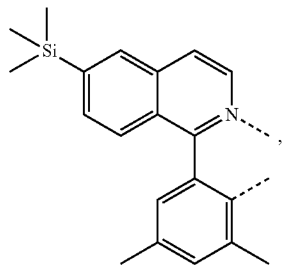
$L_{a4}$
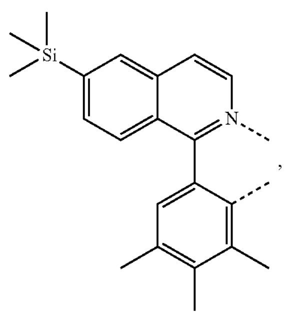
$L_{a5}$
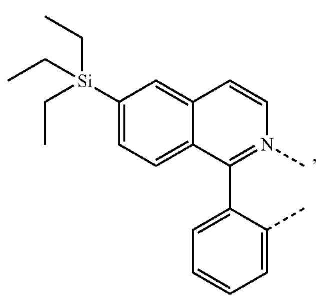
$L_{a6}$
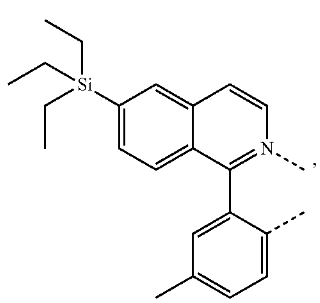
-continued
$L_{a7}$
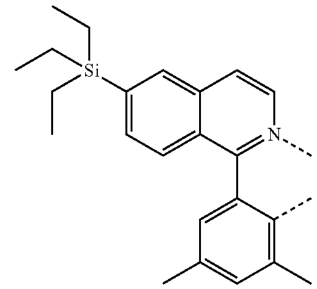
$L_{a8}$
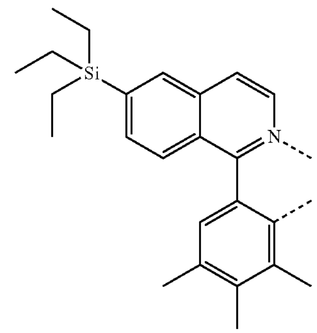
$L_{a9}$
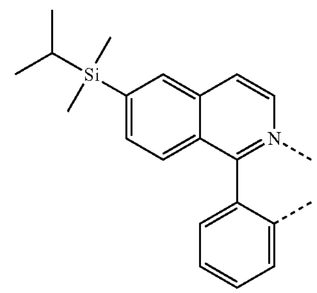
$L_{a10}$
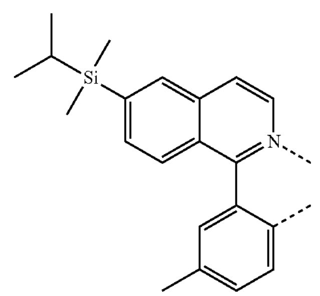
$L_{a11}$
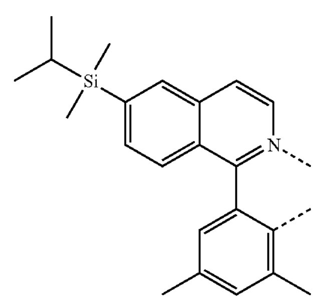

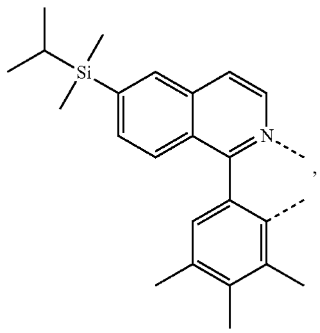
$L_{a12}$
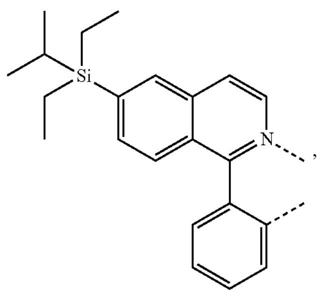
$L_{a13}$
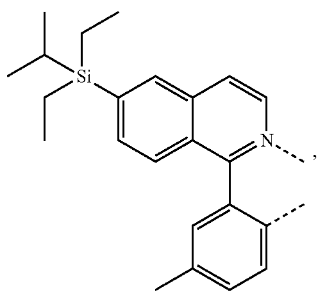
$L_{a14}$
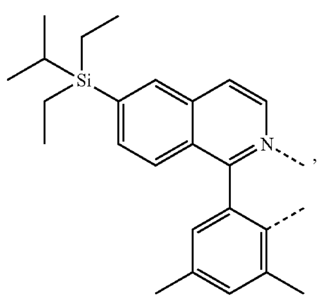
$L_{a15}$
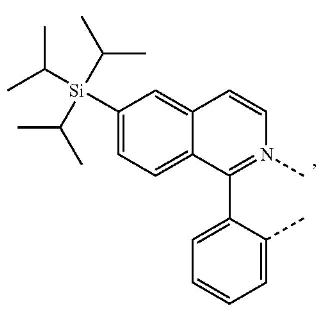
$L_{a16}$
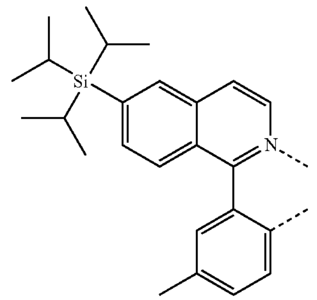
$L_{a17}$
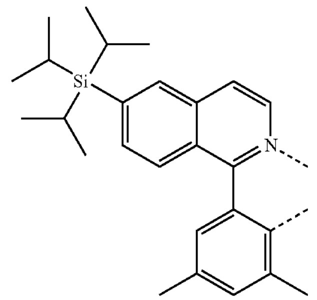
$L_{a18}$
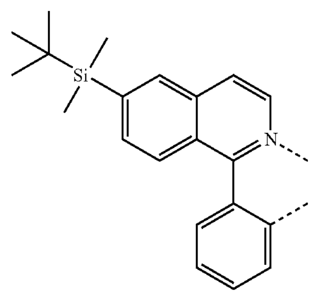
$L_{a19}$
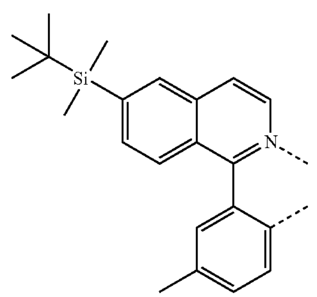
$L_{a20}$
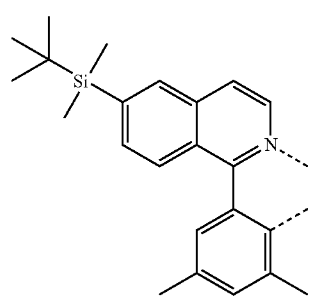
$L_{a21}$ -continued
L$_{a22}$
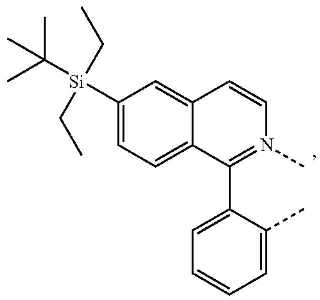
L$_{a23}$
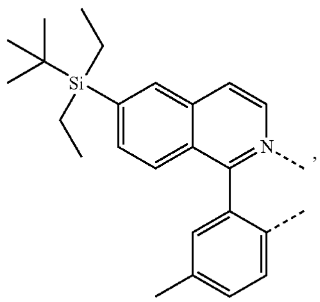
L$_{a24}$
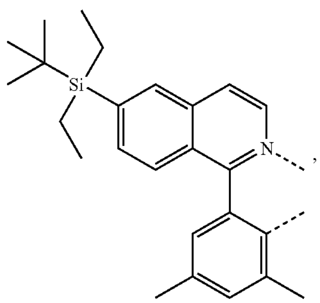
L$_{a25}$
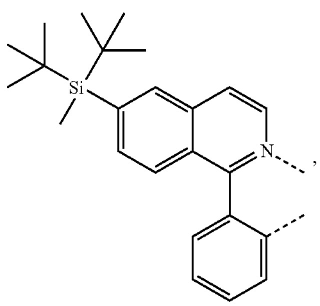
L$_{a26}$
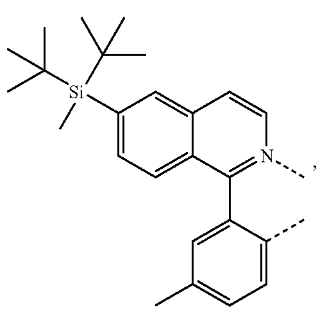
-continued
L$_{a27}$
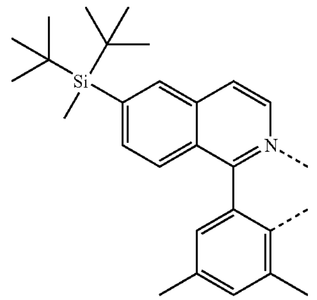
L$_{a28}$
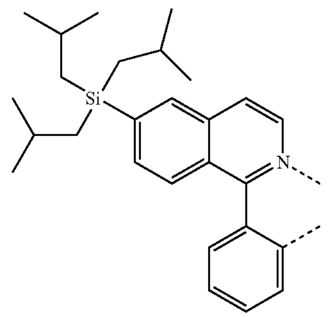
L$_{a29}$
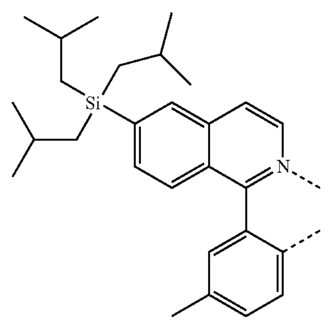
L$_{a30}$
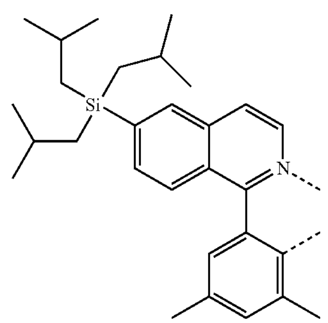
L$_{a31}$
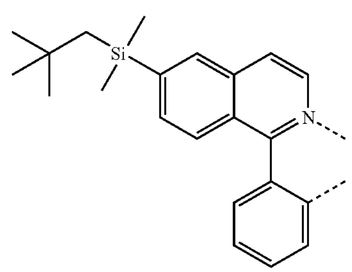

-continued
L$_{a32}$
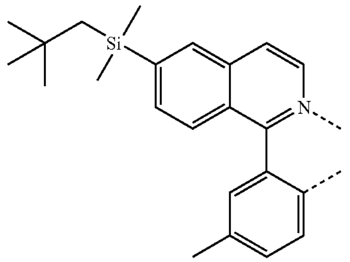
L$_{a33}$
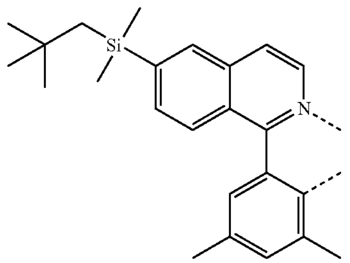
L$_{a34}$
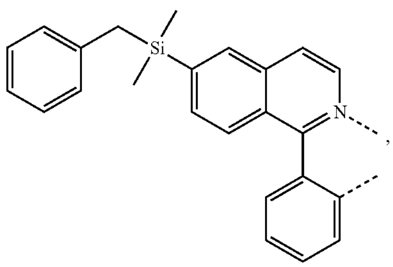
L$_{a35}$
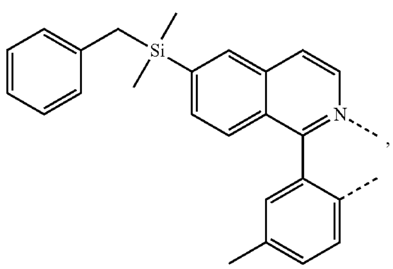
L$_{a36}$
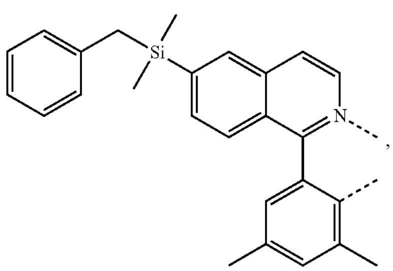
L$_{a37}$
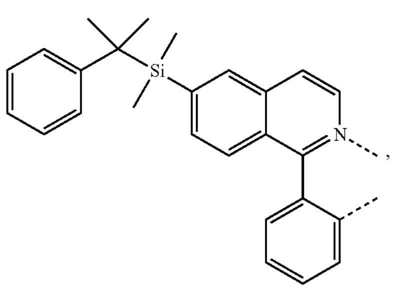
-continued
L$_{a38}$
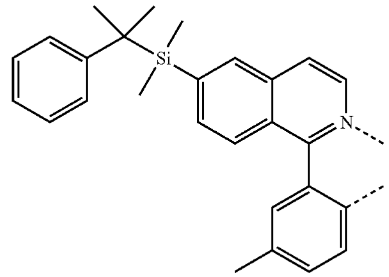
L$_{a39}$
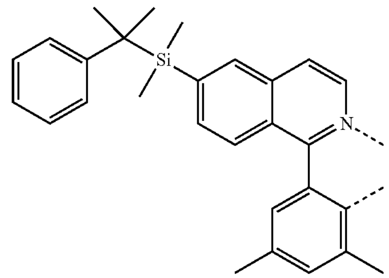
L$_{a40}$
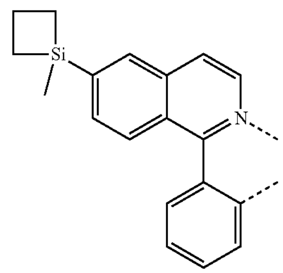
L$_{a41}$
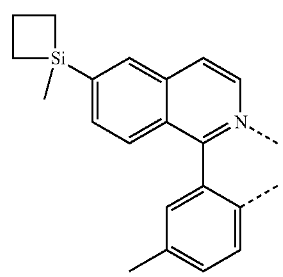
L$_{a42}$
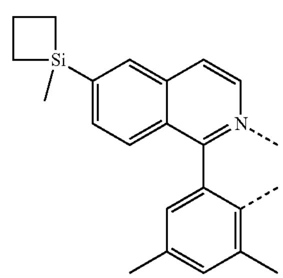

-continued
$L_{a43}$
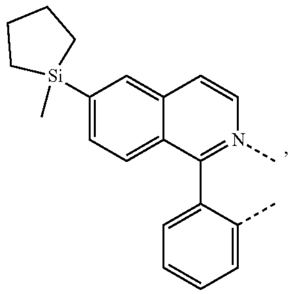
$L_{a44}$
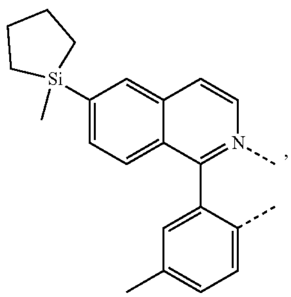
$L_{a45}$
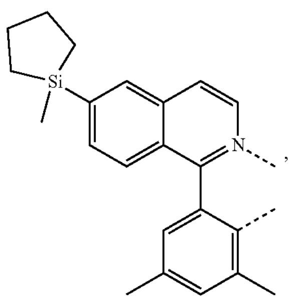
$L_{a46}$
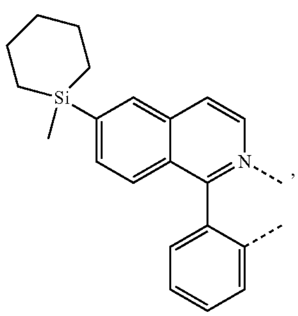
$L_{a47}$
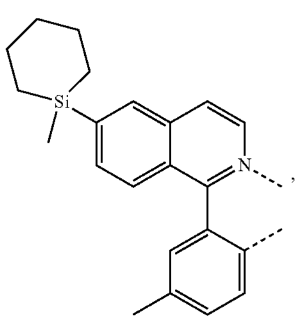
-continued
$L_{a48}$
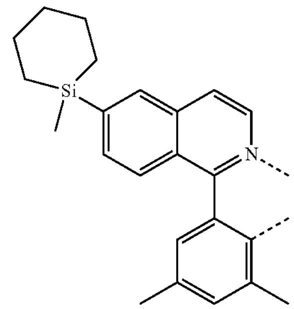
$L_{a49}$
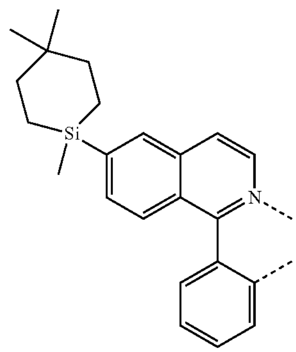
$L_{a50}$
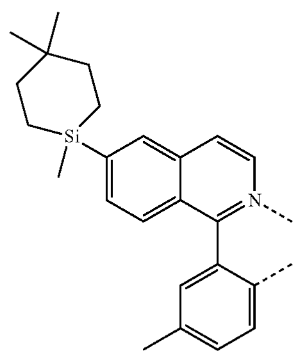
$L_{a51}$
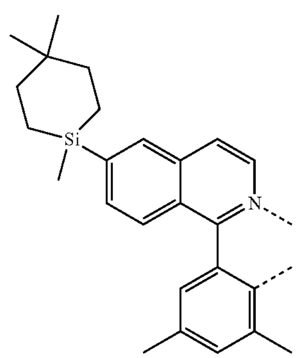

-continued
$L_{a52}$
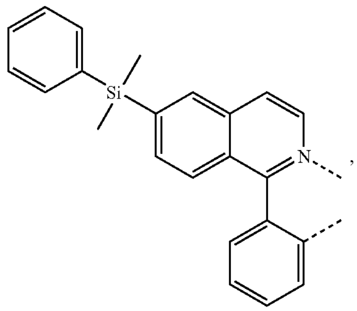
$L_{a53}$
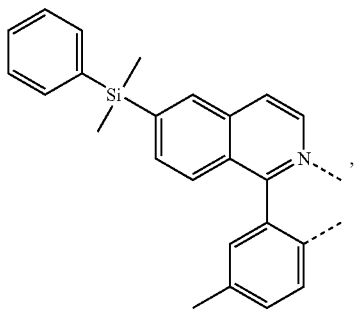
$L_{a54}$
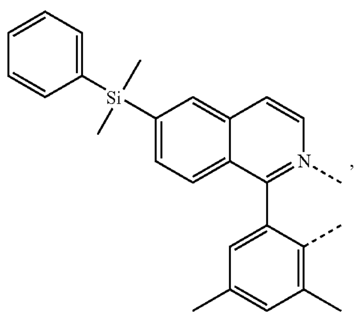
$L_{a55}$
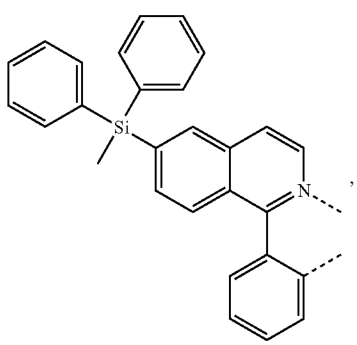
$L_{a56}$
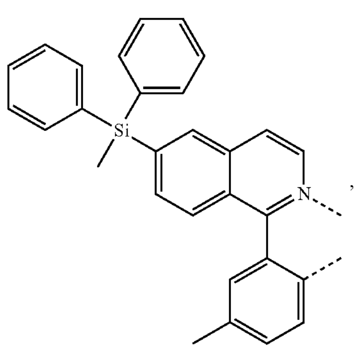
-continued
$L_{a57}$
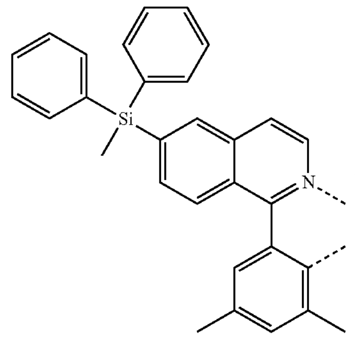
$L_{a58}$
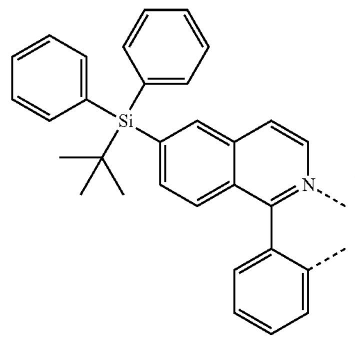
$L_{a59}$
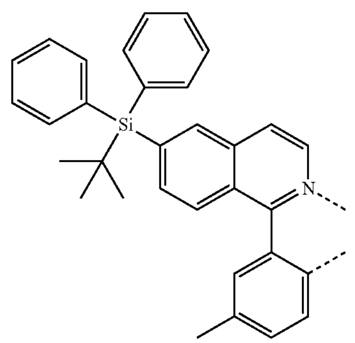
$L_{a60}$
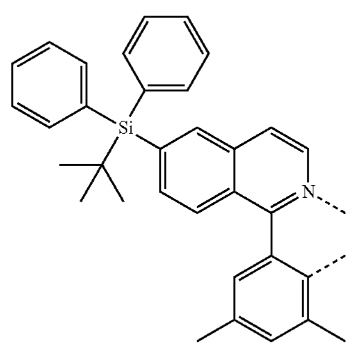

-continued
$L_{a61}$
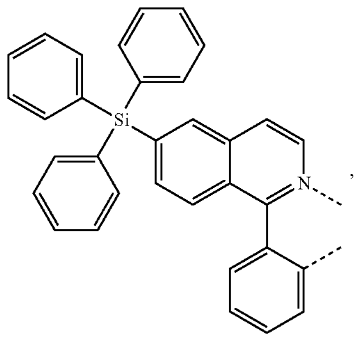
$L_{a62}$
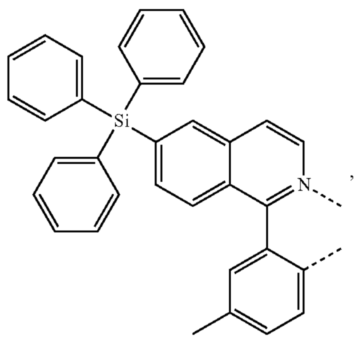
$L_{a63}$
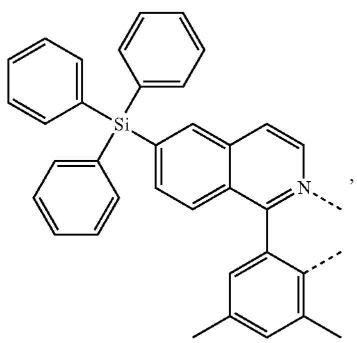
$L_{a64}$
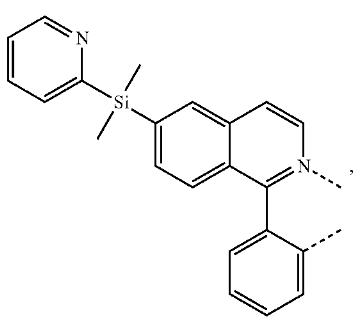
-continued
$L_{a65}$
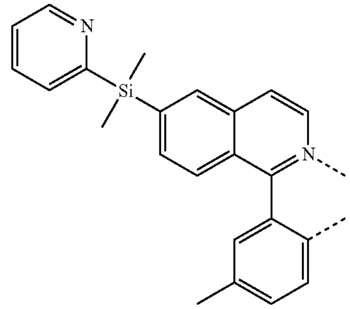
$L_{a66}$
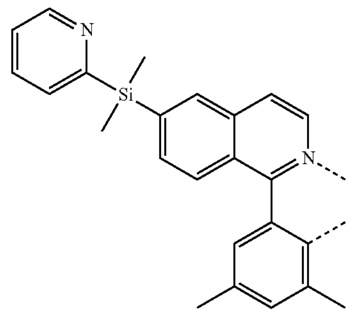
$L_{a67}$
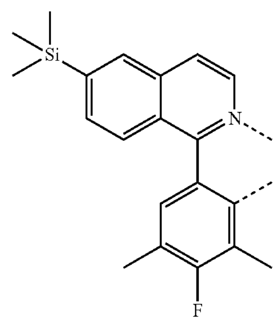
$L_{a68}$
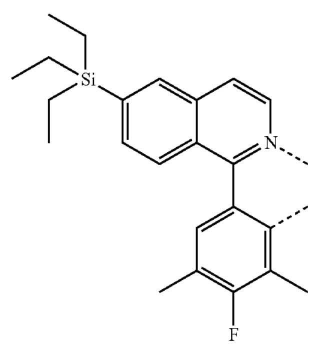
$L_{a69}$
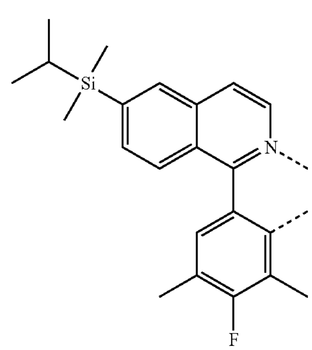

L$_{a70}$
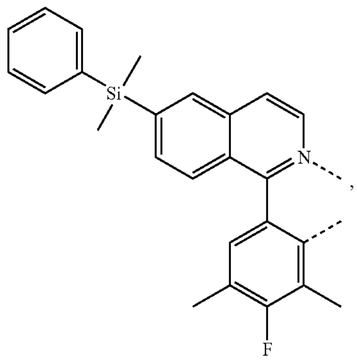
L$_{a71}$
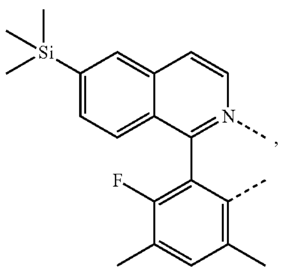
L$_{a72}$
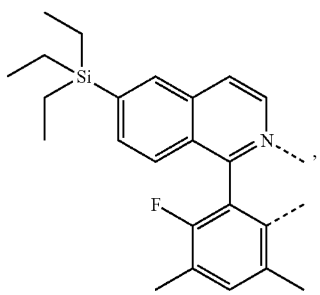
L$_{a73}$
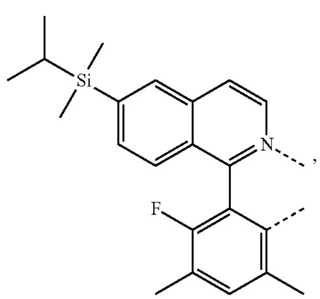
L$_{a74}$
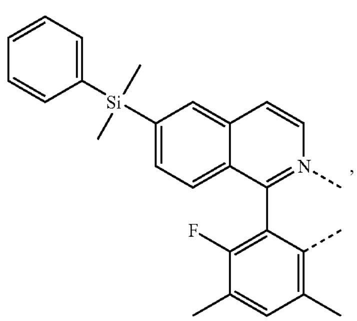
L$_{a75}$
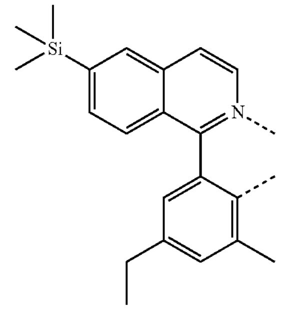
L$_{a76}$
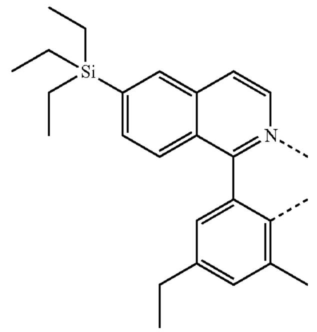
L$_{a77}$
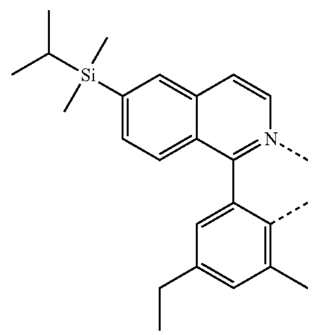
L$_{a78}$
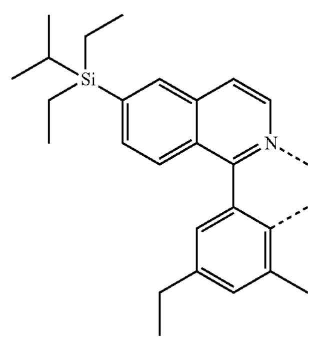

-continued
$L_{a79}$
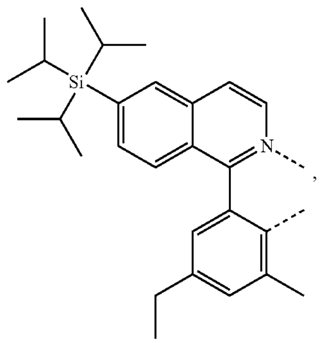
$L_{a80}$
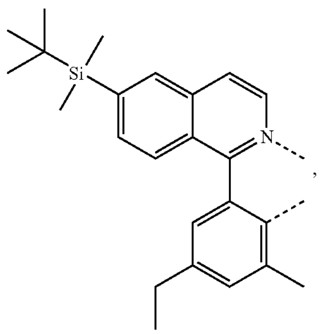
$L_{a81}$
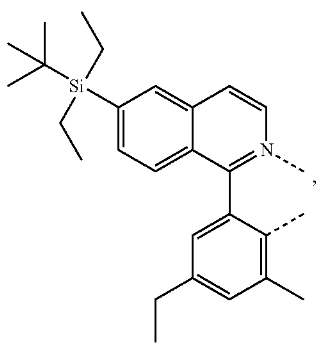
$L_{a82}$
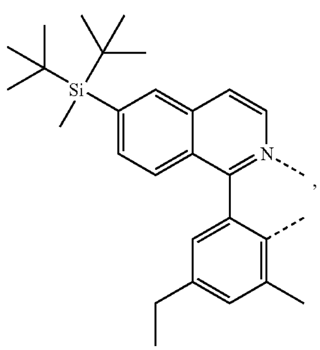
-continued
$L_{a83}$
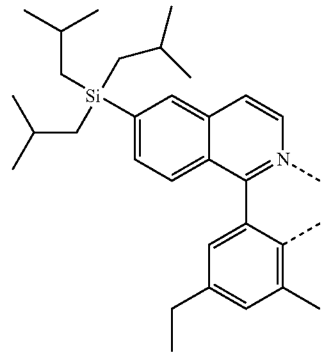
$L_{a84}$
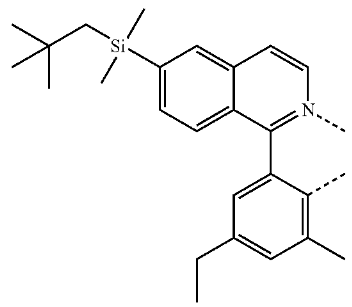
$L_{a85}$
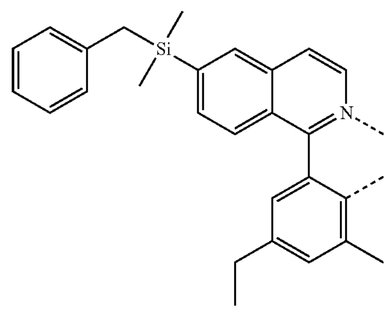
$L_{a86}$
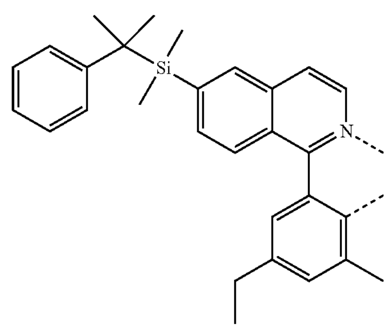
$L_{a87}$
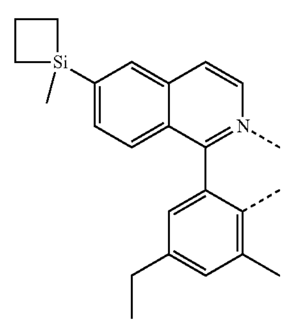

-continued
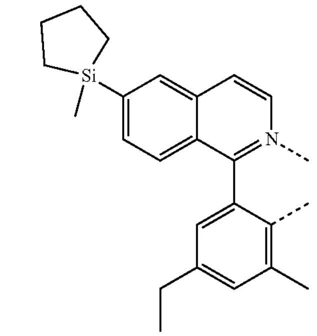
$L_{a88}$
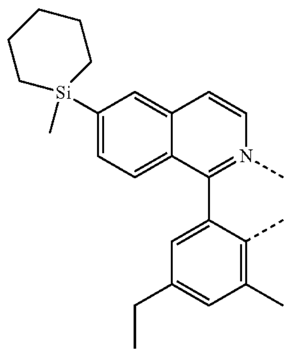
$L_{a89}$
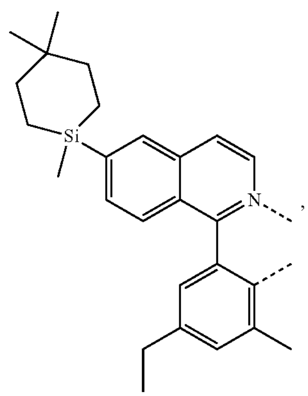
$L_{a90}$
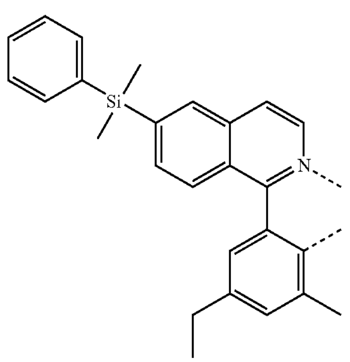
$L_{a91}$
-continued
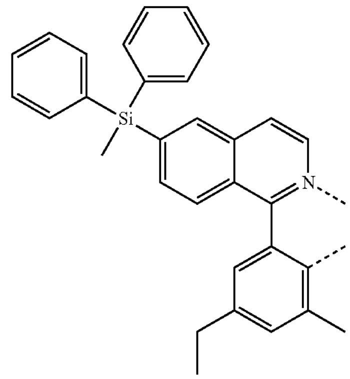
$L_{a92}$
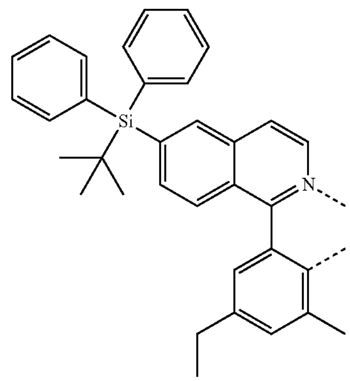
$L_{a93}$
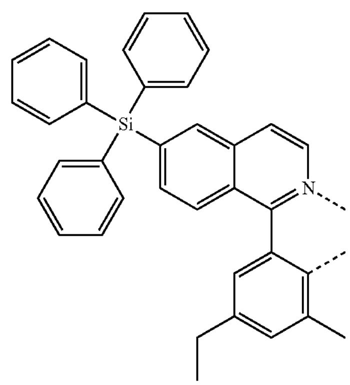
$L_{a94}$
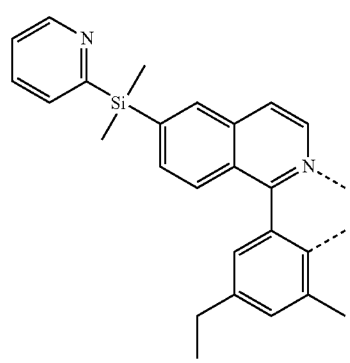
$L_{a95}$ -continued
$L_{a96}$
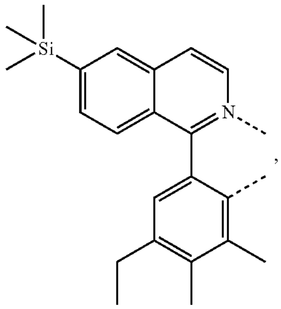
$L_{a97}$
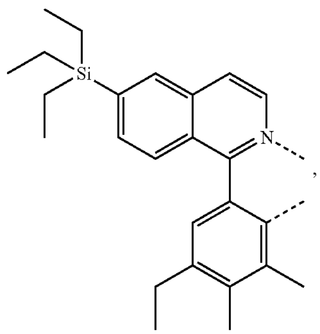
$L_{a98}$
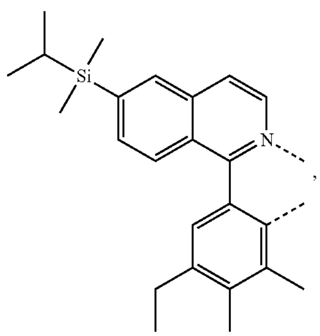
$L_{a99}$
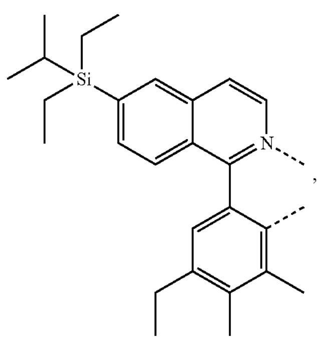
-continued
$L_{a100}$
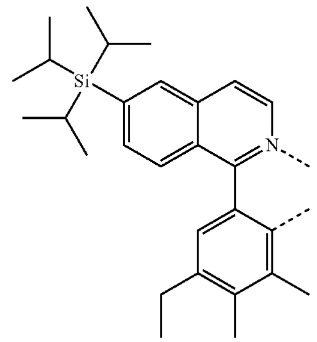
$L_{a101}$
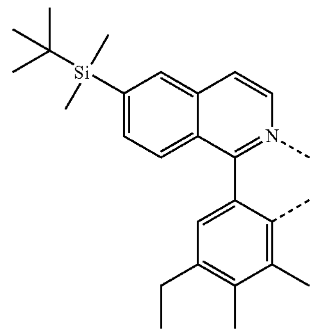
$L_{a102}$
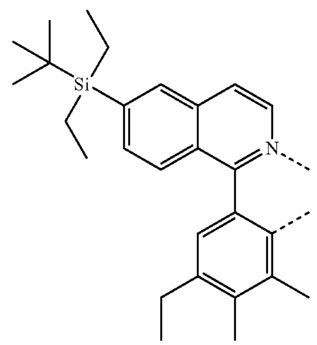
$L_{a103}$
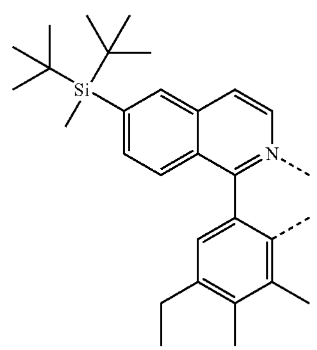

-continued
$L_{a104}$
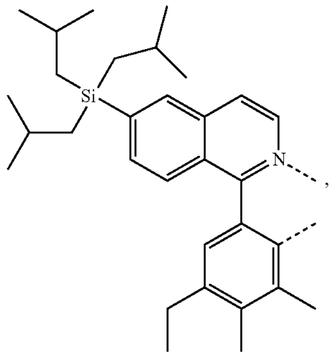
$L_{a105}$
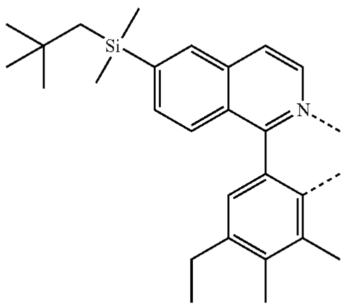
$L_{a106}$
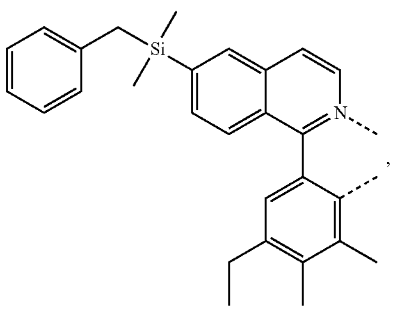
$L_{a107}$
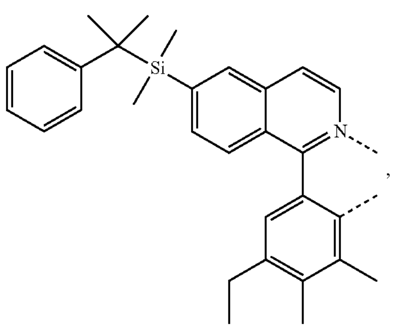
$L_{a108}$
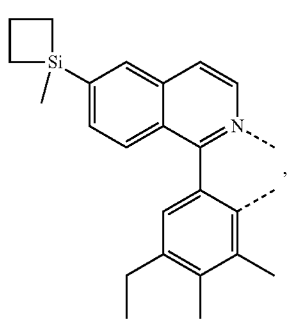
-continued
$L_{a109}$
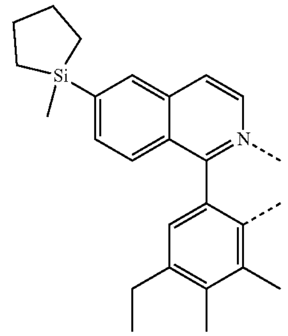
$L_{a110}$
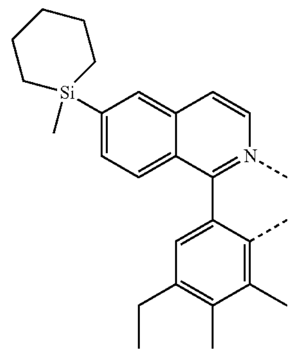
$L_{a111}$
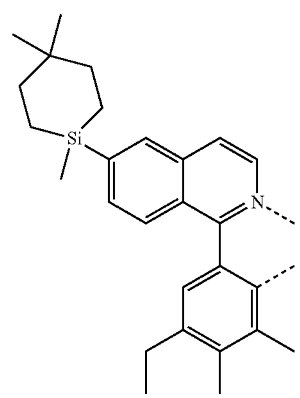
$L_{a112}$
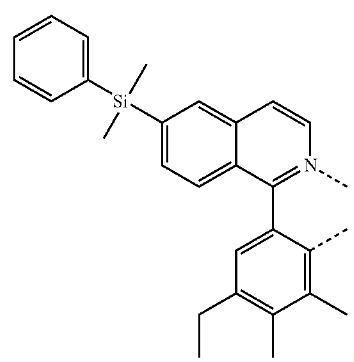

-continued
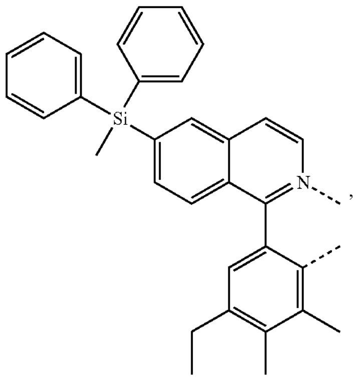
$L_{a113}$
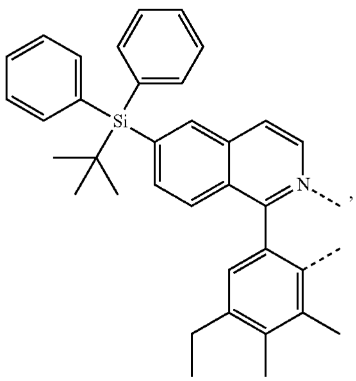
$L_{a114}$
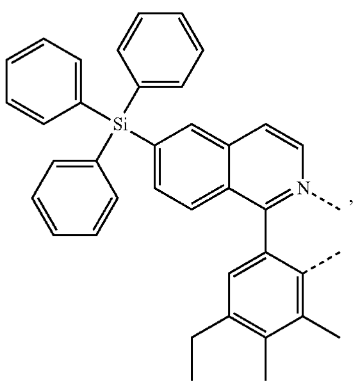
$L_{a115}$
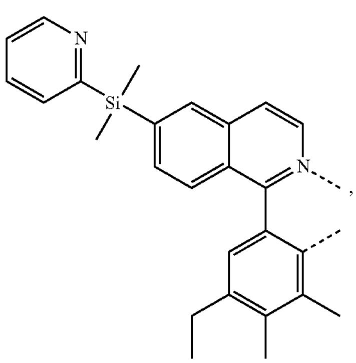
$L_{a116}$
-continued
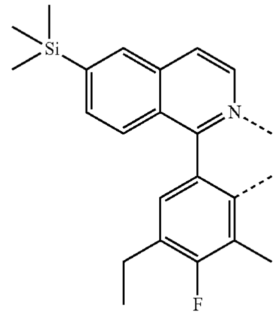
$L_{a117}$
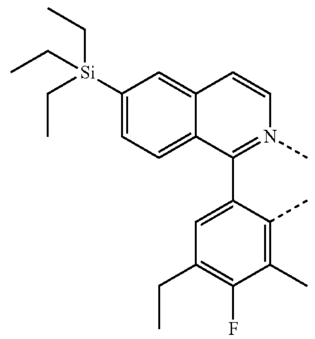
$L_{a118}$
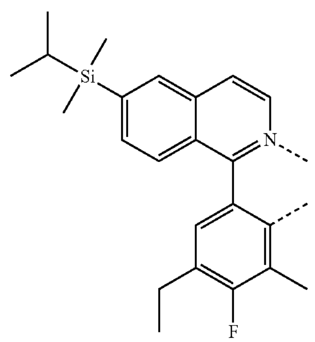
$L_{a119}$
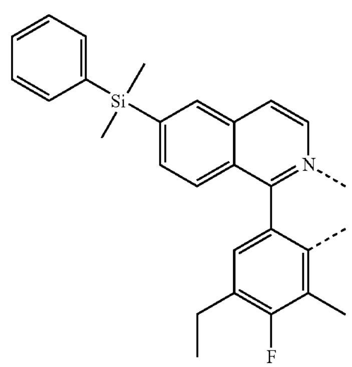
$L_{a120}$ -continued
$L_{a121}$
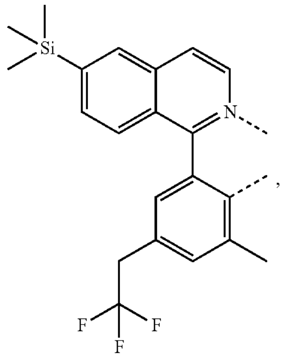
$L_{a122}$
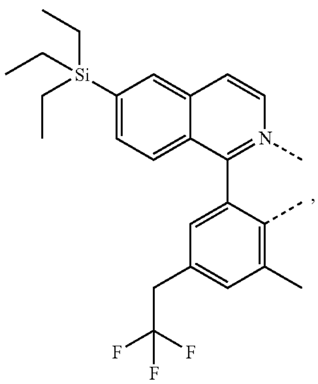
$L_{a123}$
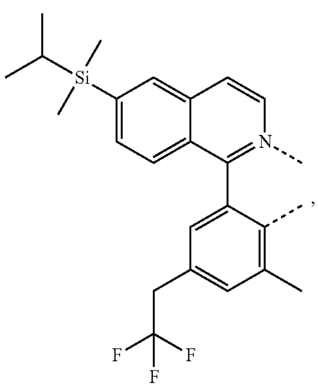
$L_{a124}$
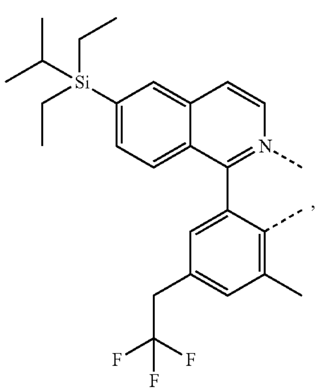
-continued
$L_{a125}$
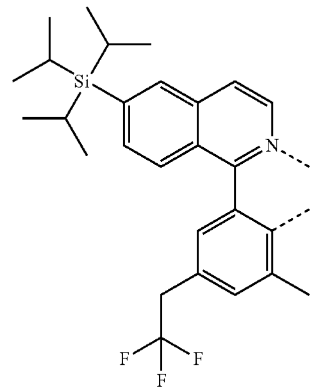
$L_{a126}$
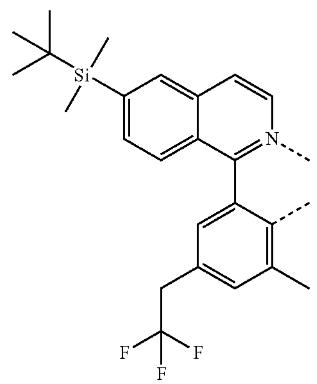
$L_{a127}$
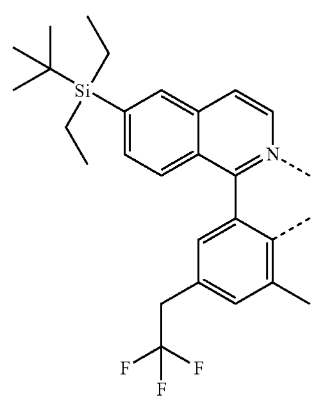
$L_{a128}$
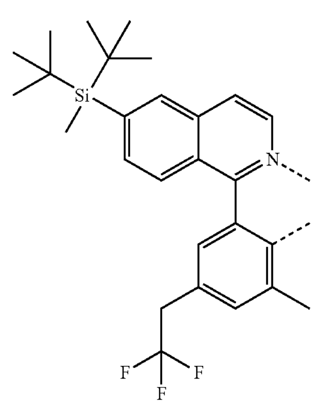

$L_{a129}$
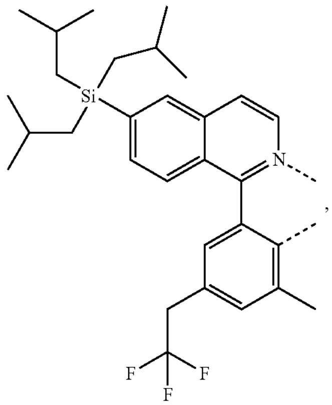
$L_{a130}$
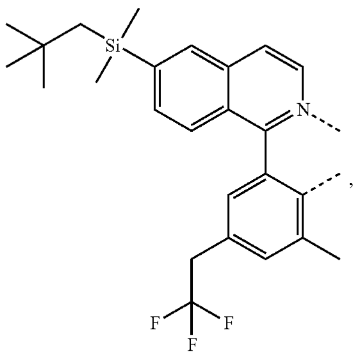
$L_{a131}$
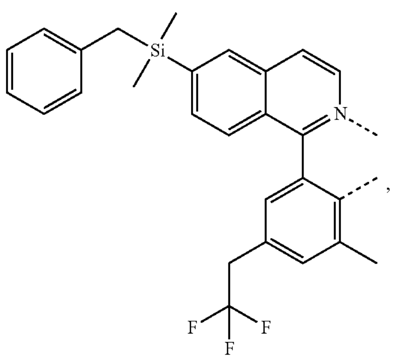
$L_{a132}$
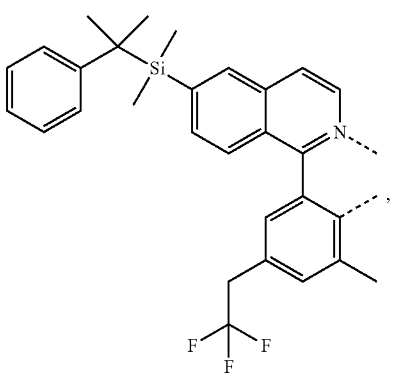
$L_{a133}$
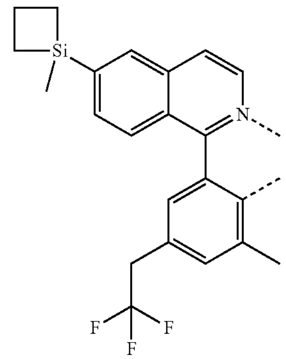
$L_{a134}$
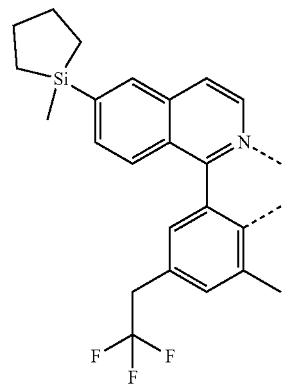
$L_{a135}$
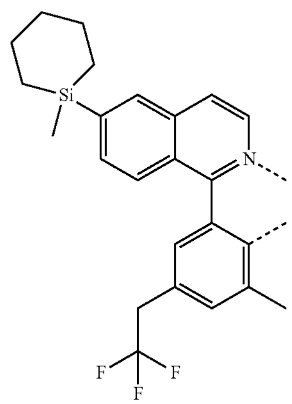
$L_{a136}$
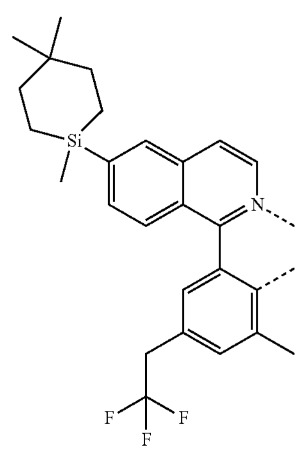

$L_{a137}$
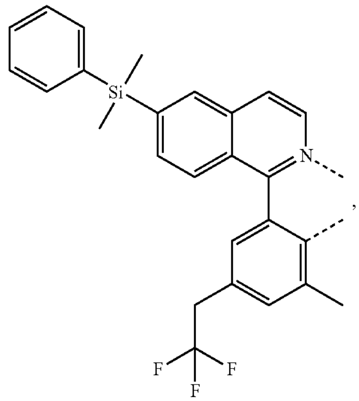
$L_{a138}$
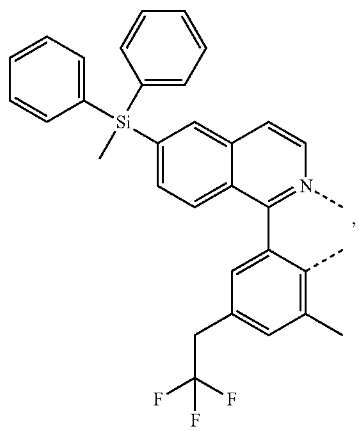
$L_{a139}$
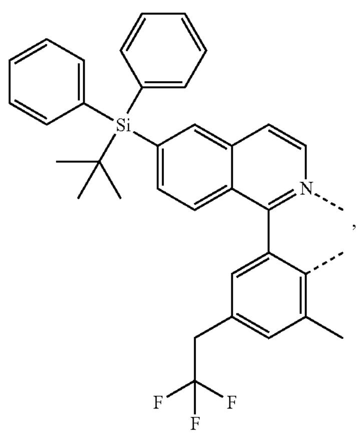
$L_{a140}$
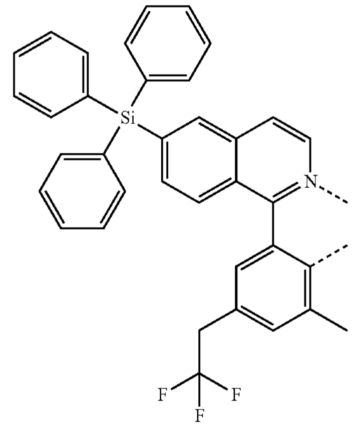
$L_{a141}$
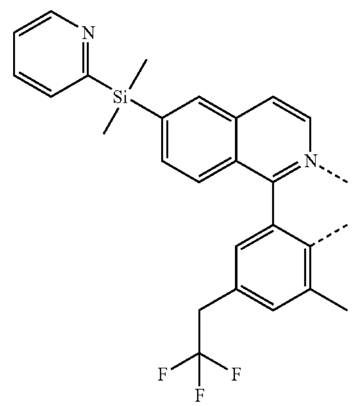
$L_{a142}$
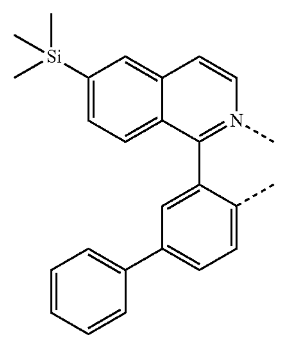
$L_{a143}$
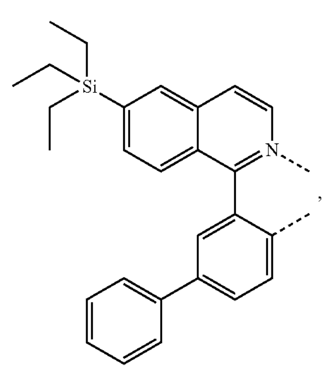

-continued
$L_{a144}$
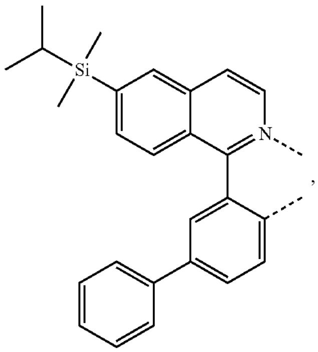
$L_{a145}$
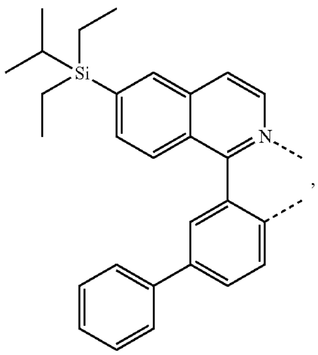
$L_{a146}$
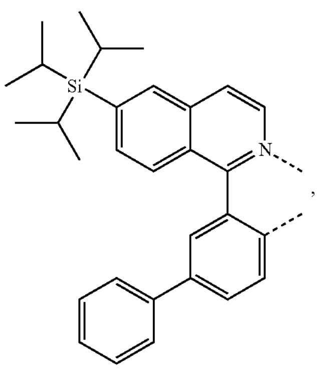
$L_{a147}$
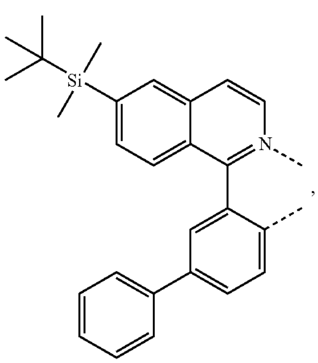
-continued
$L_{a148}$
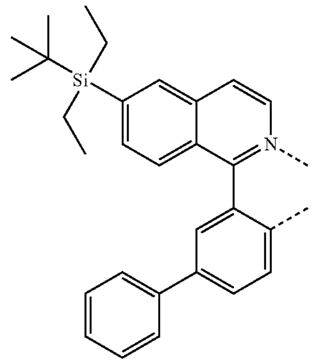
$L_{a149}$
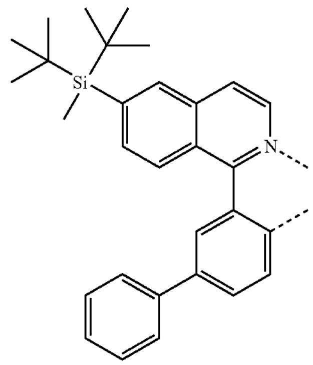
$L_{a150}$
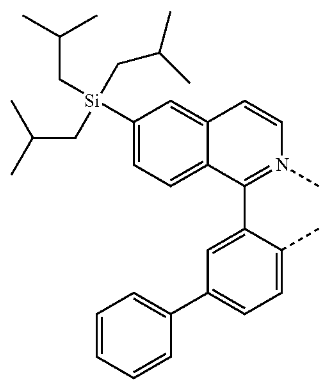
$L_{a151}$
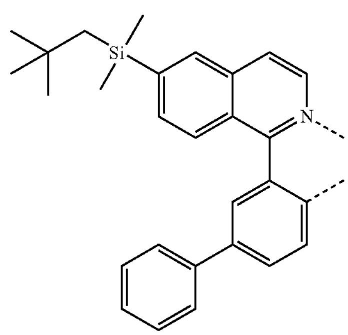

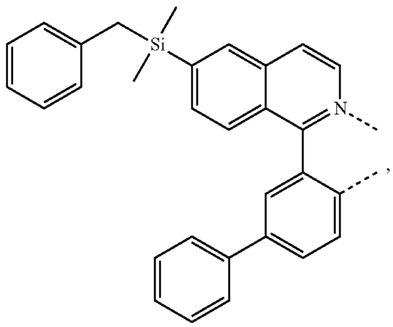
$L_{a152}$
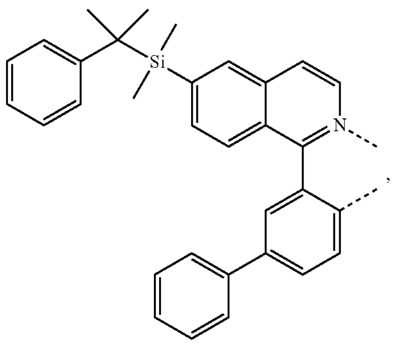
$L_{a153}$
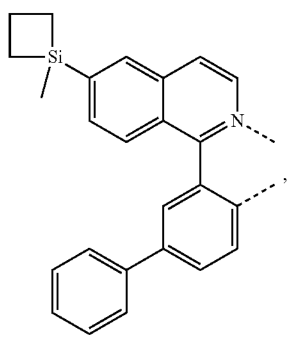
$L_{a154}$
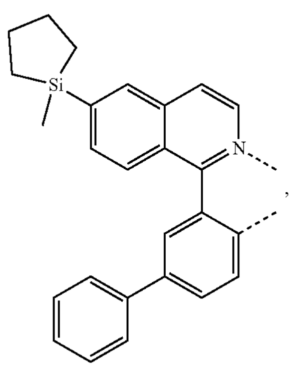
$L_{a155}$
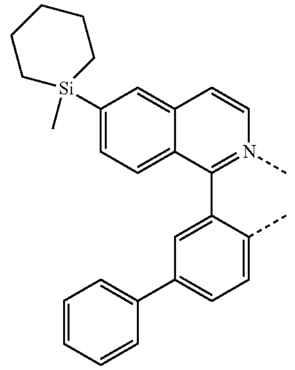
$L_{a156}$
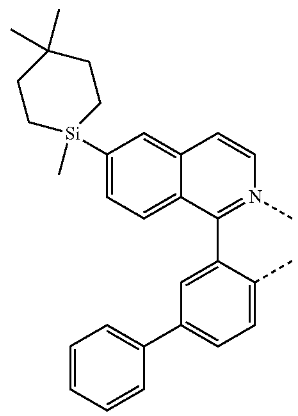
$L_{a157}$
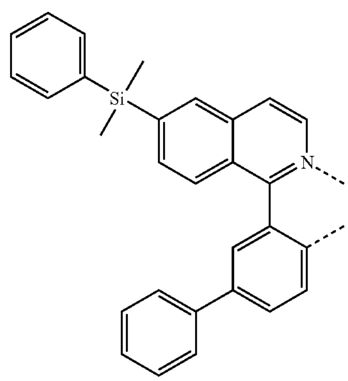
$L_{a158}$
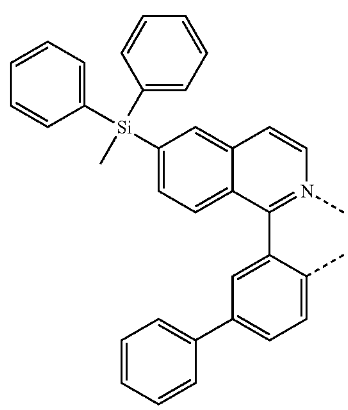
$L_{a159}$ -continued
$L_{a160}$
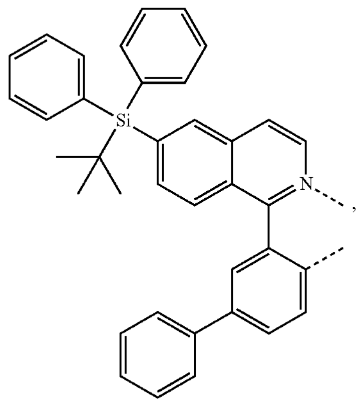
$L_{a161}$
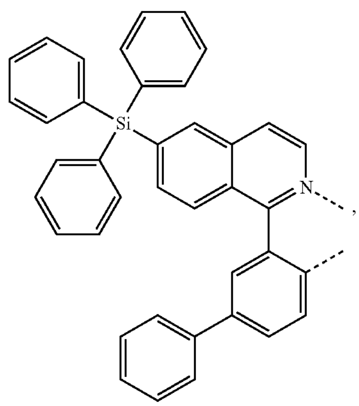
$L_{a162}$
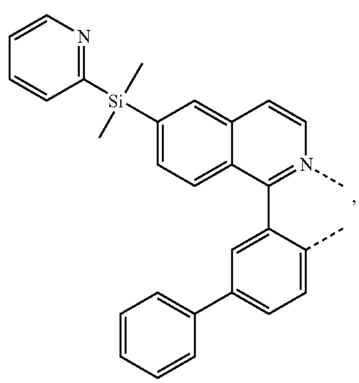
$L_{a163}$
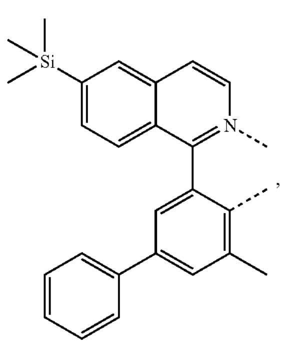
-continued
$L_{a164}$
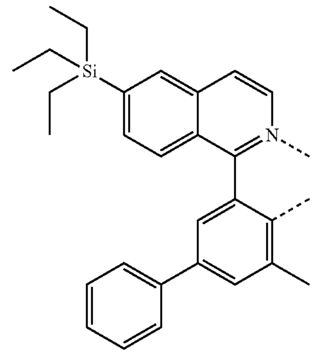
$L_{a165}$
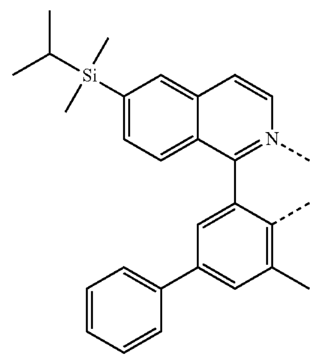
$L_{a166}$
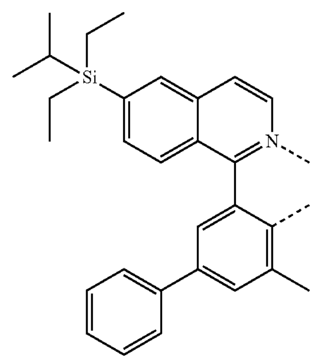
$L_{a167}$
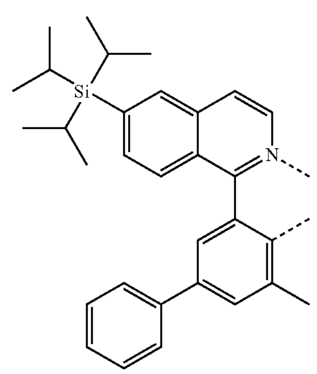

-continued
$L_{a168}$
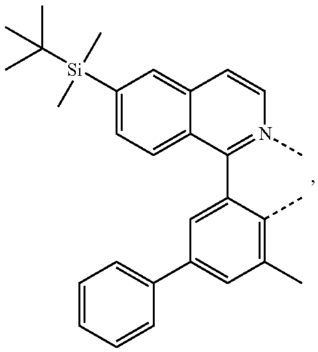
$L_{a169}$
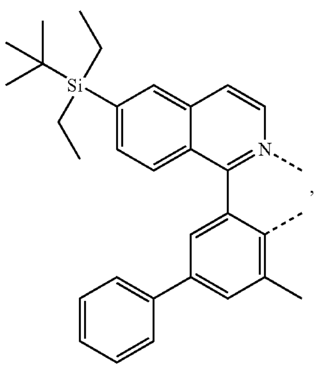
$L_{a170}$
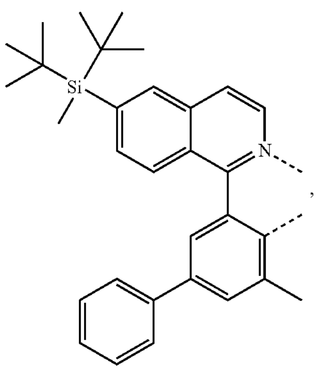
$L_{a171}$
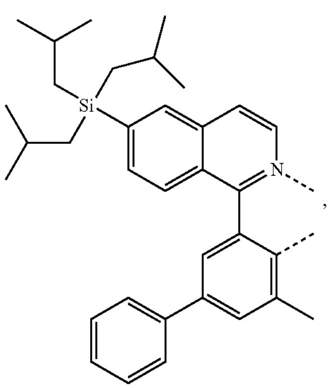
-continued
$L_{a172}$
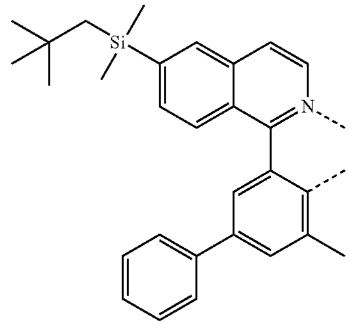
$L_{a173}$
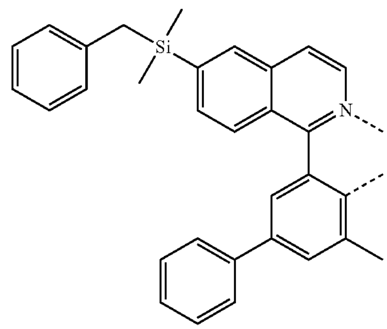
$L_{a174}$
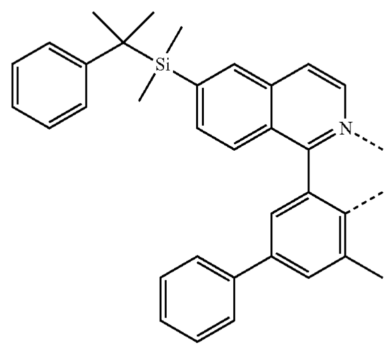
$L_{a175}$
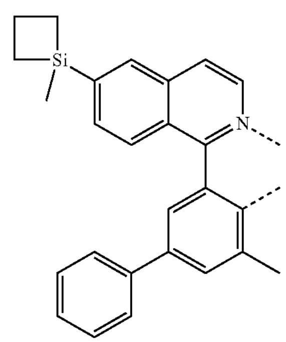

$L_{a176}$
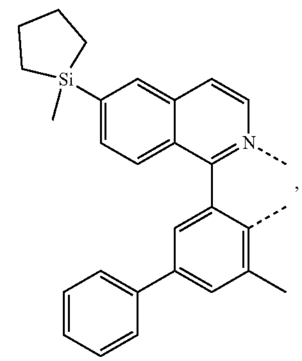
$L_{a177}$
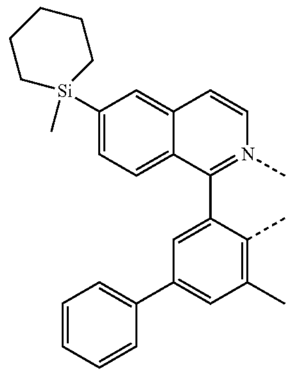
$L_{a178}$
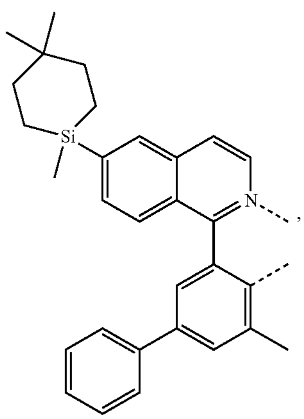
$L_{a179}$
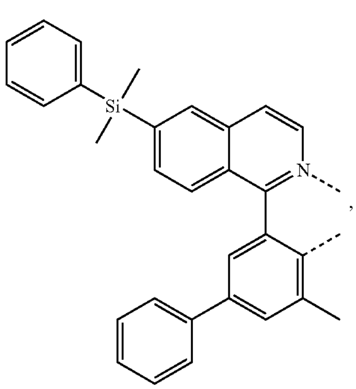
$L_{a180}$
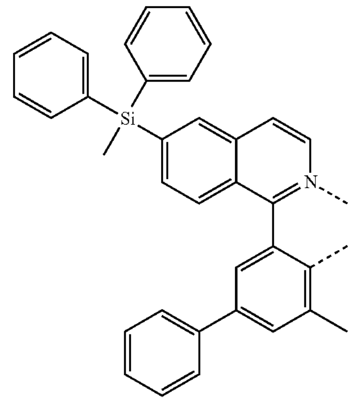
$L_{a181}$
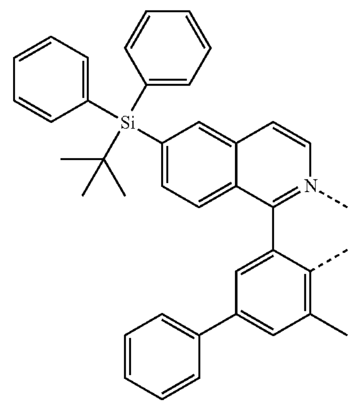
$L_{a182}$
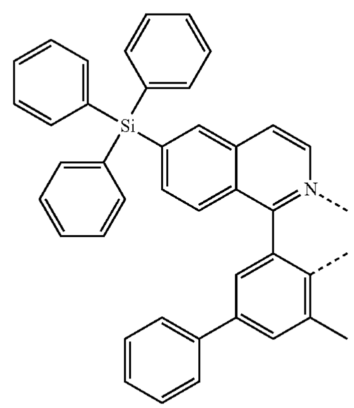
$L_{a183}$
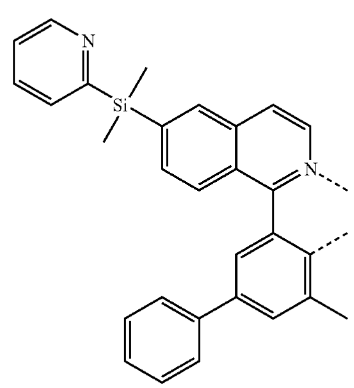

-continued
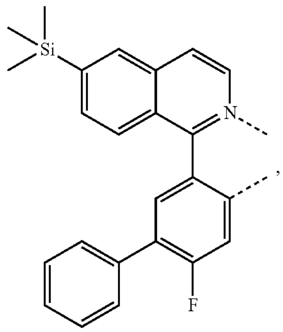
$L_{a184}$
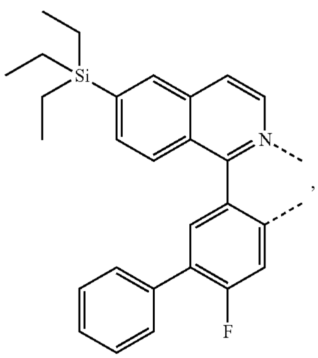
$L_{a185}$
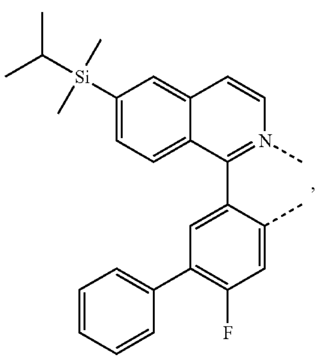
$L_{a186}$
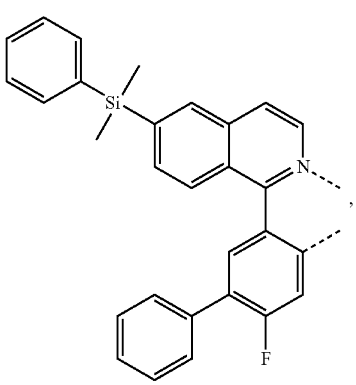
$L_{a187}$
-continued
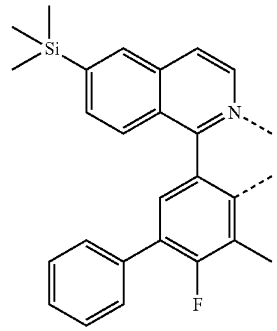
$L_{a188}$
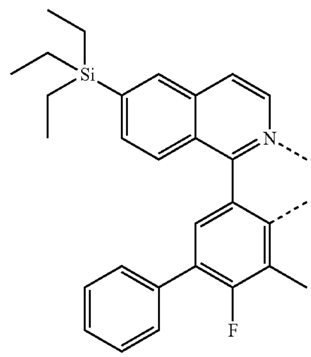
$L_{a189}$
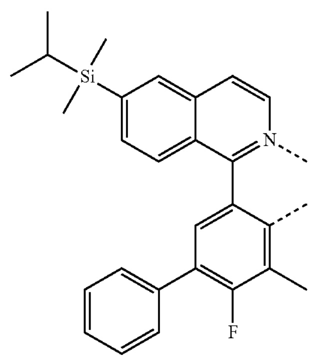
$L_{a190}$
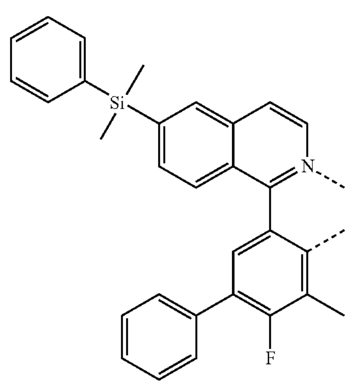
$L_{a191}$ -continued
$L_{a192}$
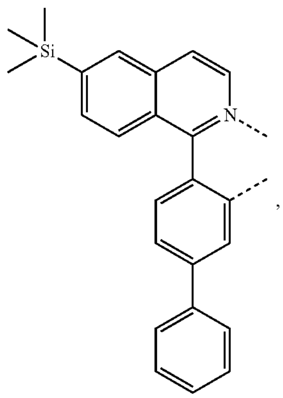
$L_{a193}$
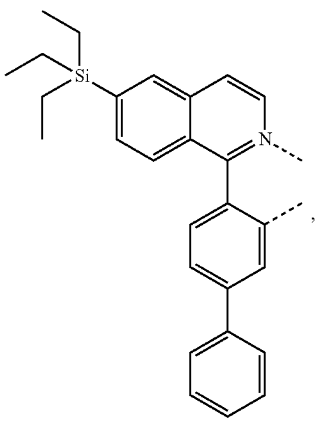
$L_{a194}$
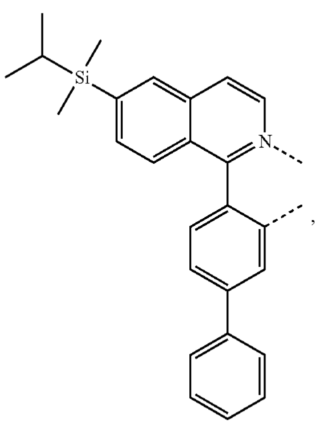
-continued
$L_{a195}$
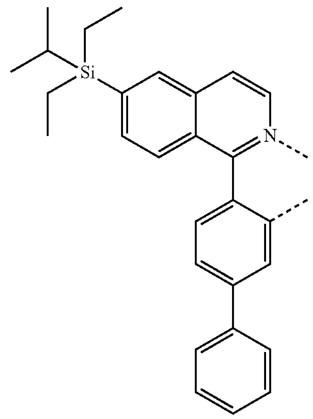
$L_{a196}$
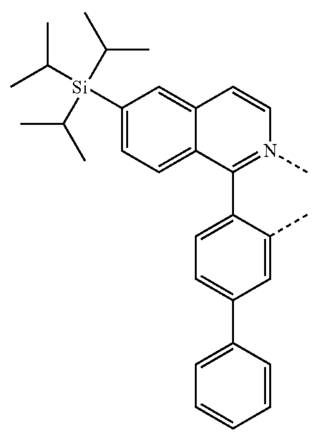
$L_{a197}$
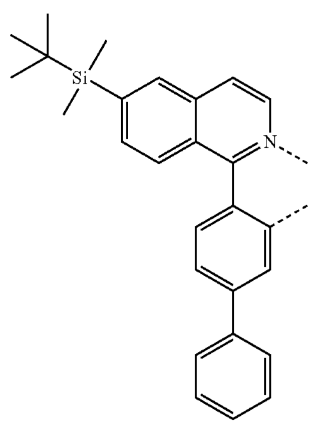

-continued
$L_{a198}$
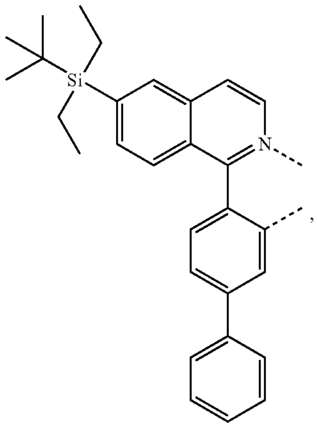
$L_{a199}$
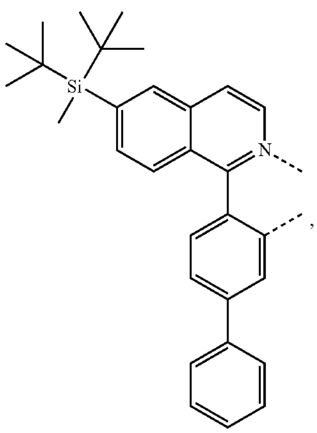
$L_{a200}$
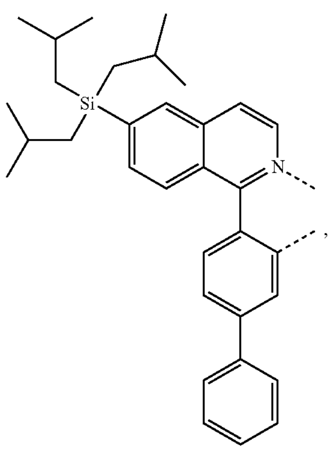
-continued
$L_{a201}$
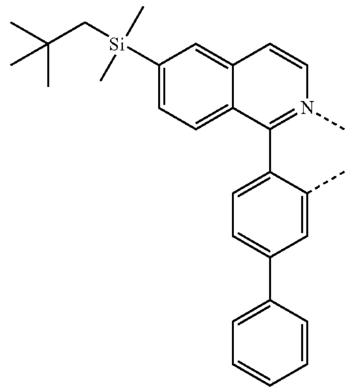
$L_{a202}$
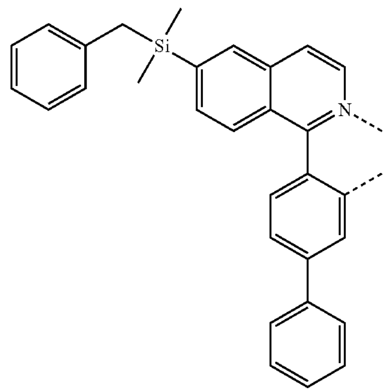
$L_{a203}$
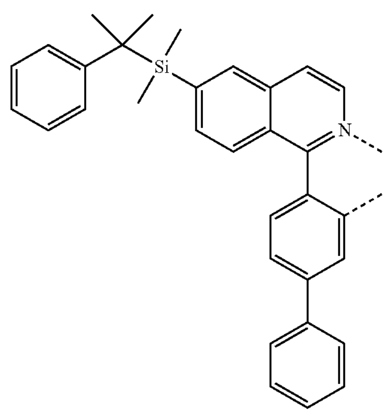
$L_{a204}$
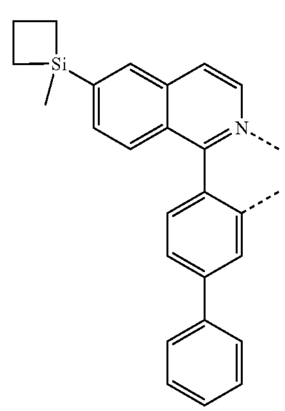

$L_{a205}$
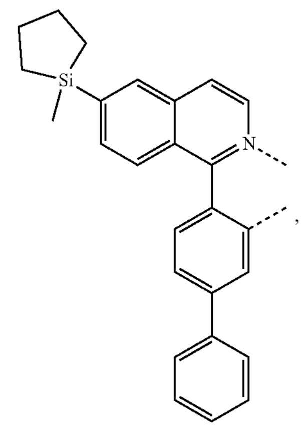
$L_{a206}$
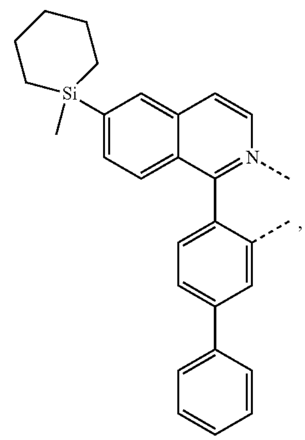
$L_{a207}$
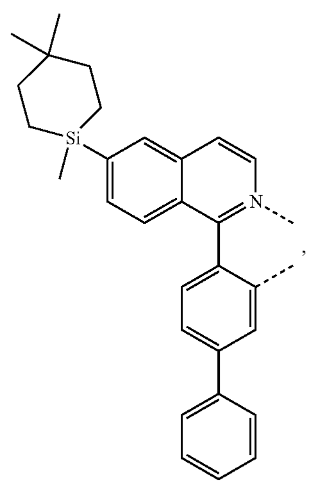
$L_{a208}$
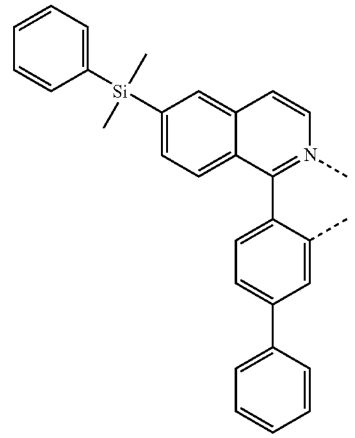
$L_{a209}$
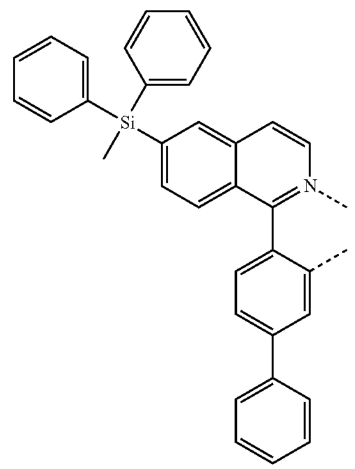
$L_{a210}$
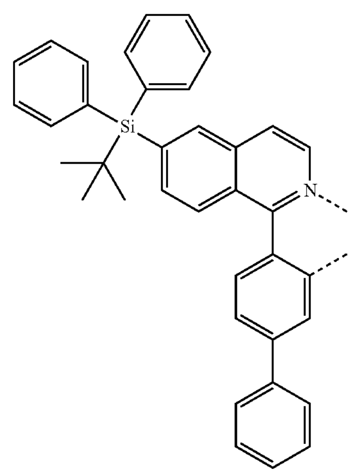

-continued
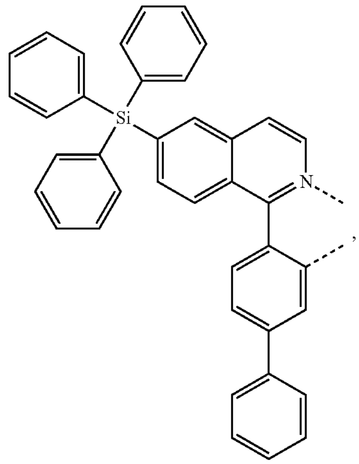
$L_{a211}$
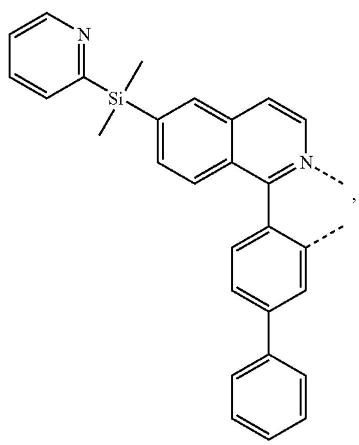
$L_{a212}$
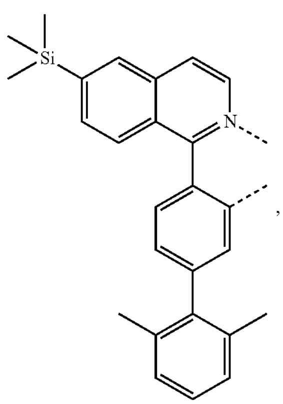
$L_{a213}$
-continued
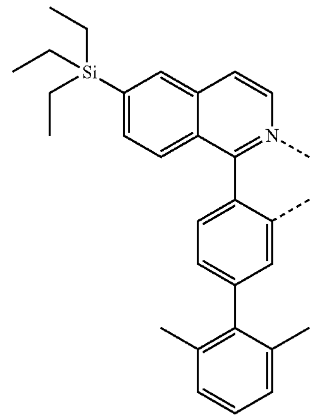
$L_{a214}$
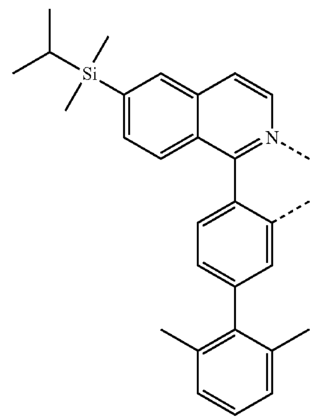
$L_{a215}$
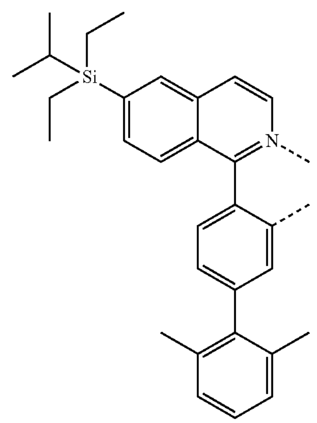
$L_{a216}$ -continued
$L_{a217}$
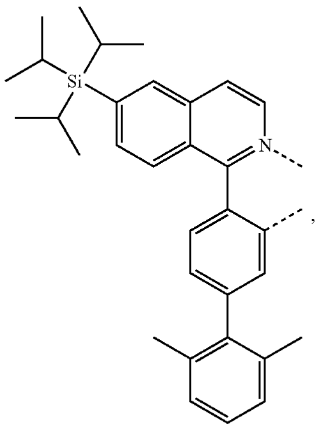
$L_{a218}$
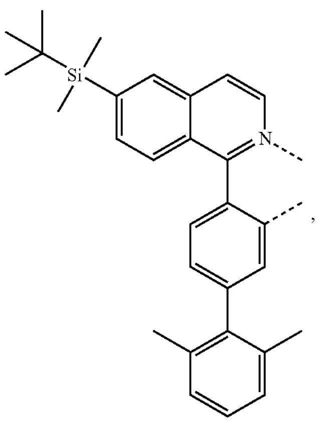
$L_{a219}$
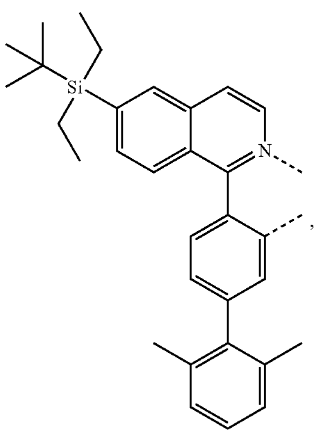
-continued
$L_{a220}$
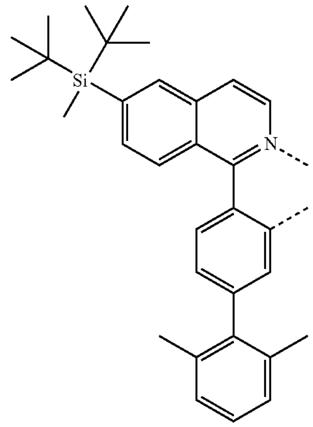
$L_{a221}$
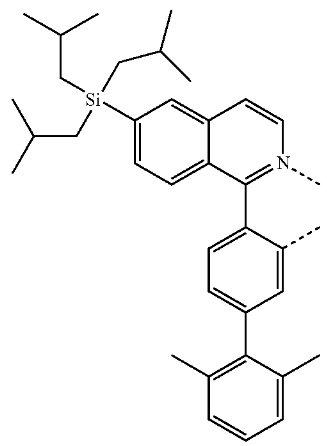
$L_{a222}$
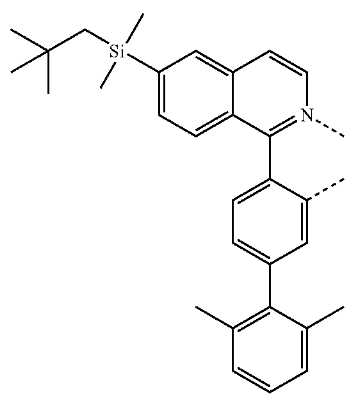

-continued
$L_{a223}$
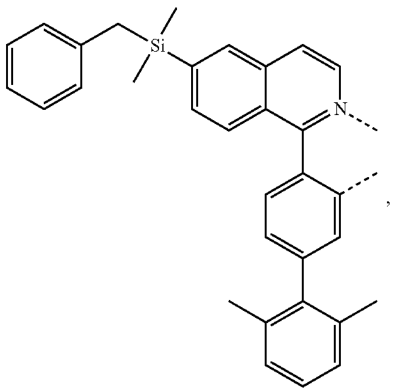
$L_{a224}$
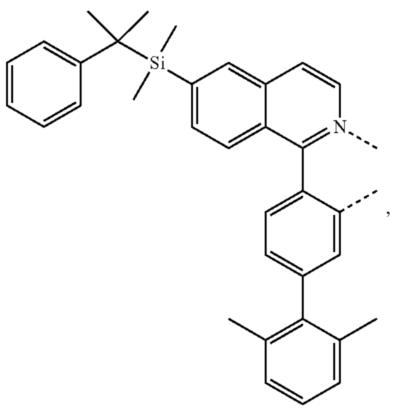
$L_{a225}$
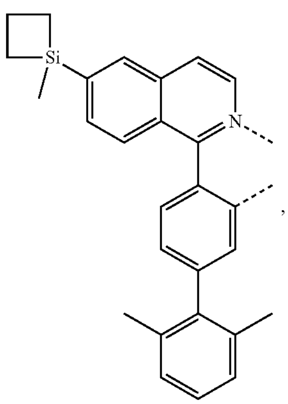
$L_{a226}$
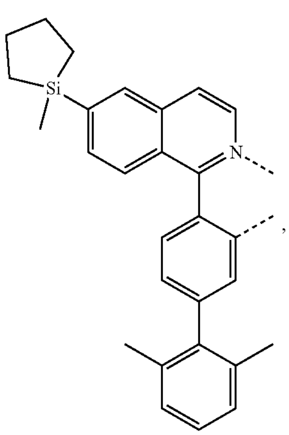
-continued
$L_{a227}$
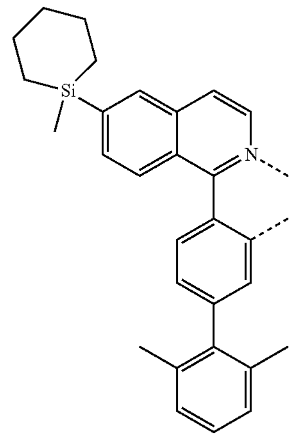
$L_{a228}$
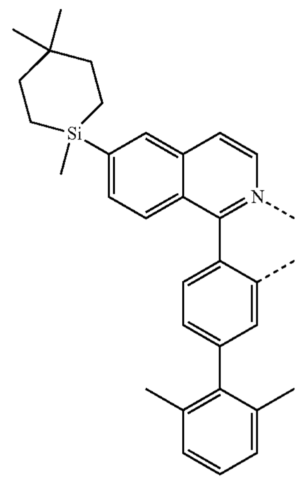
$L_{a229}$
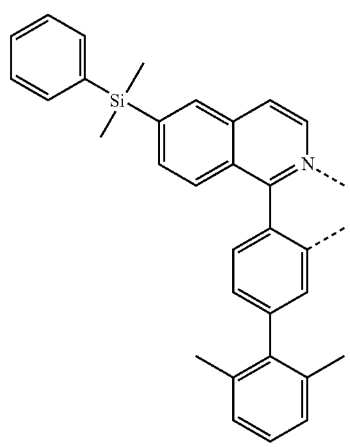

-continued
$L_{a230}$
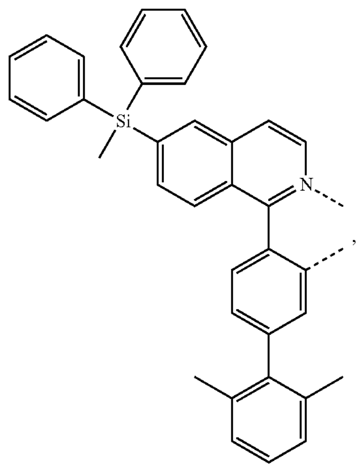
$L_{a231}$
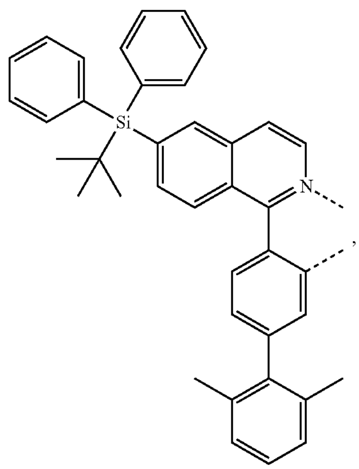
$L_{a232}$
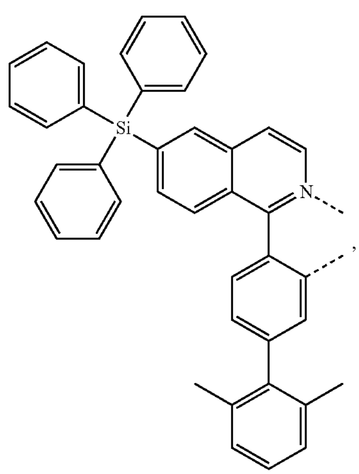
-continued
$L_{a233}$
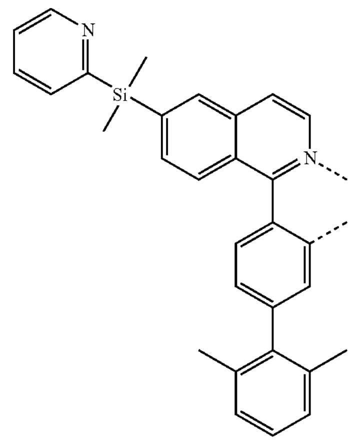
$L_{a234}$
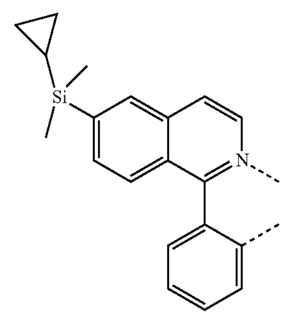
$L_{a235}$
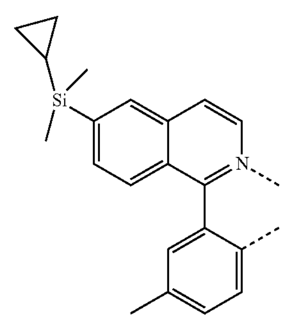
$L_{a236}$
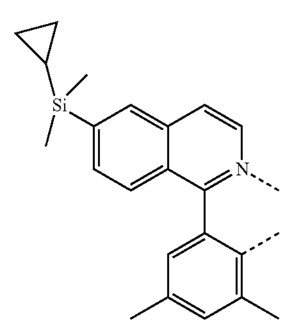

-continued
$L_{a237}$
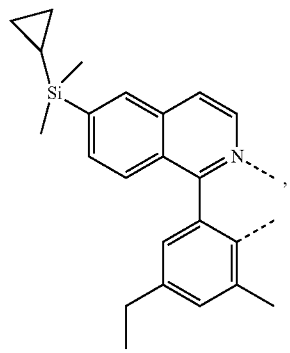
$L_{a238}$
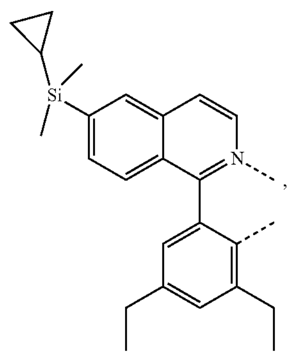
$L_{a239}$
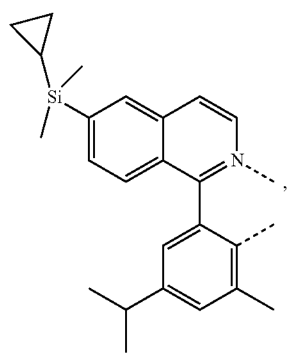
$L_{a240}$
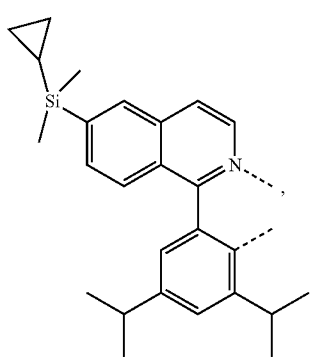
-continued
$L_{a241}$
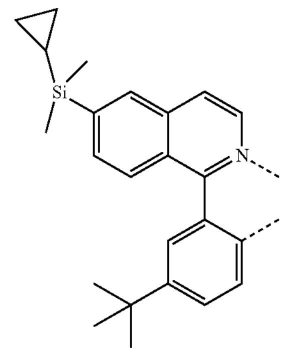
$L_{a242}$
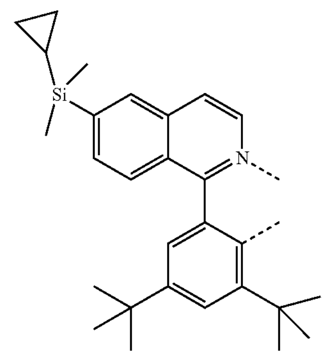
$L_{a243}$
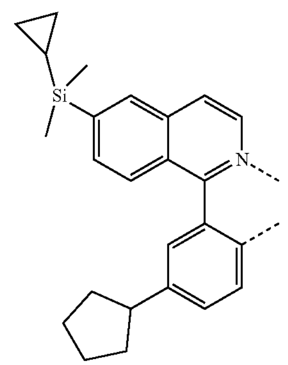
$L_{a244}$
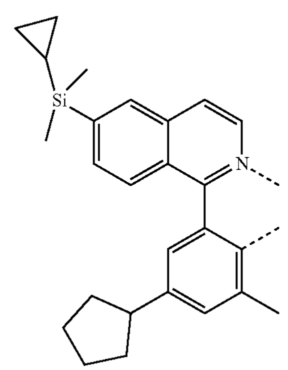

$L_{a245}$
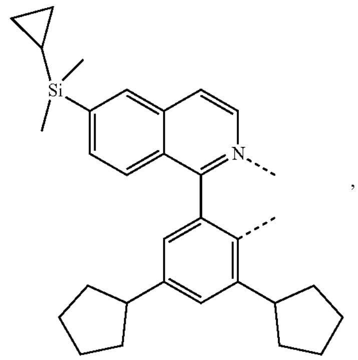
$L_{a246}$
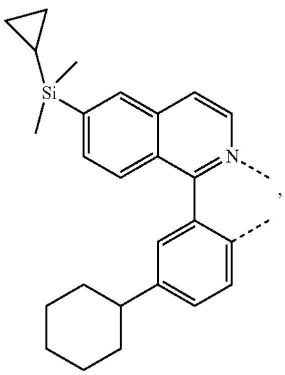
$L_{a247}$
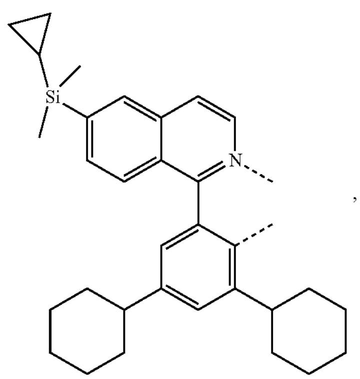
$L_{a248}$
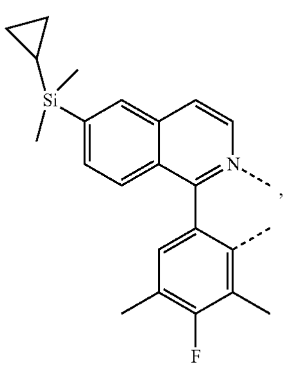
$L_{a249}$
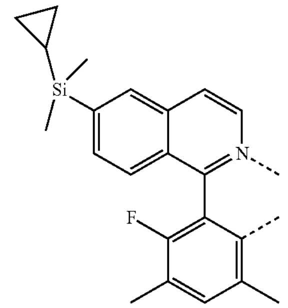
$L_{a250}$
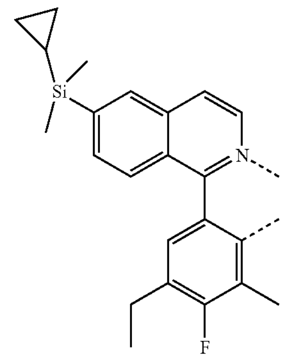
$L_{a251}$
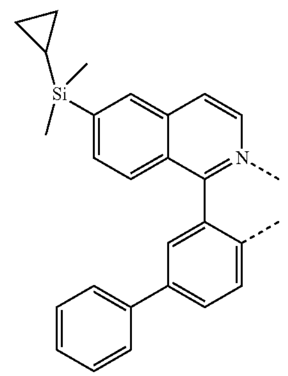
$L_{a252}$
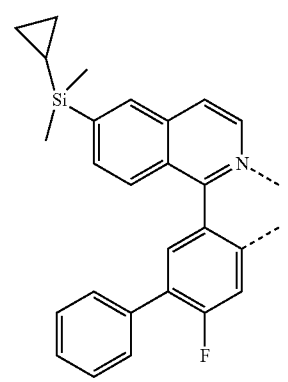

$L_{a253}$
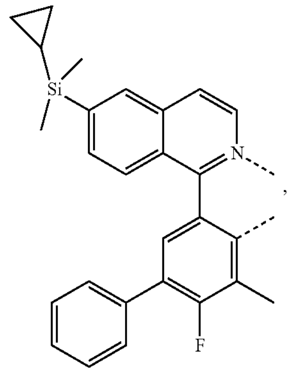
$L_{a254}$
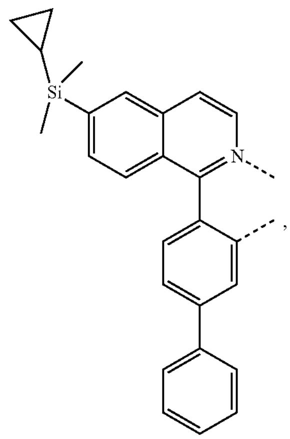
$L_{a255}$
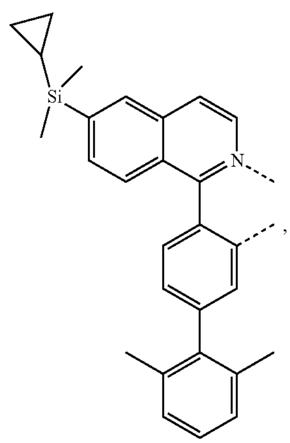
$L_{a256}$
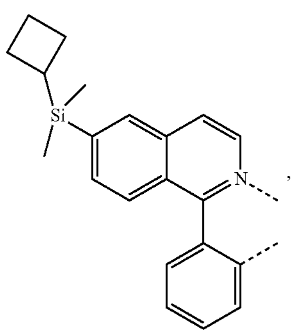
$L_{a257}$
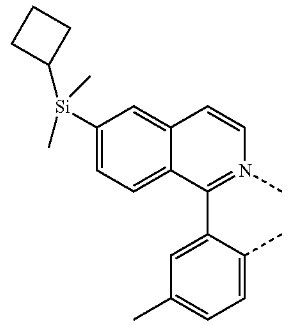
$L_{a258}$
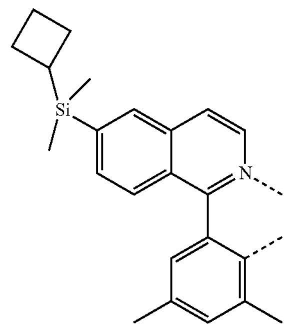
$L_{a259}$
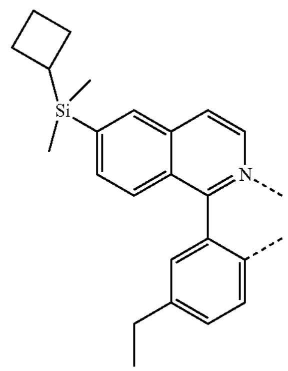
$L_{a260}$
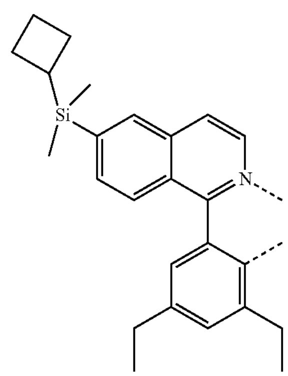

-continued
$L_{a261}$
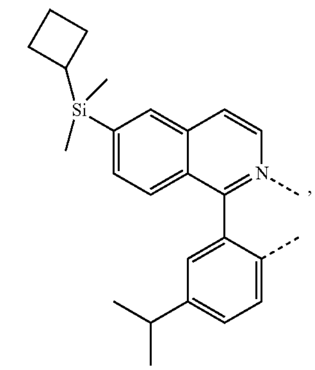
$L_{a262}$
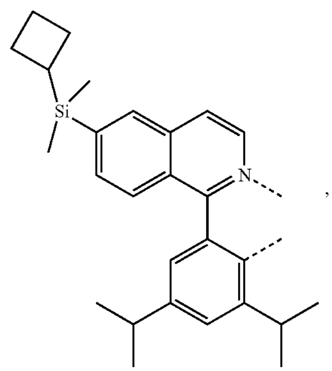
$L_{a263}$
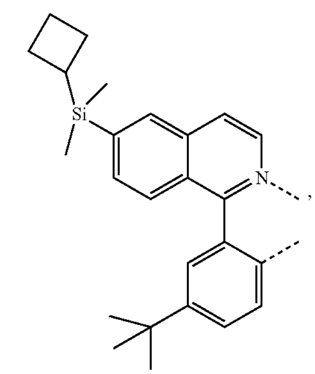
$L_{a264}$
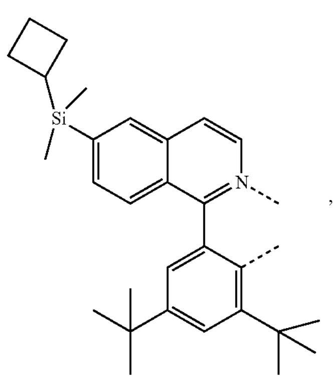
-continued
$L_{a265}$
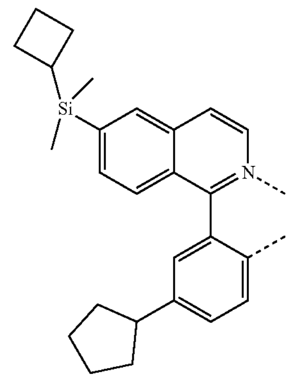
$L_{a266}$
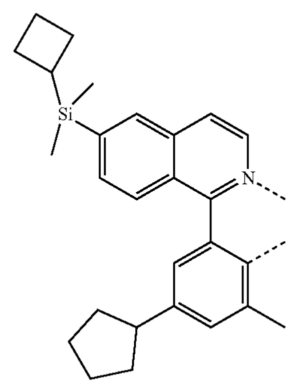
$L_{a267}$
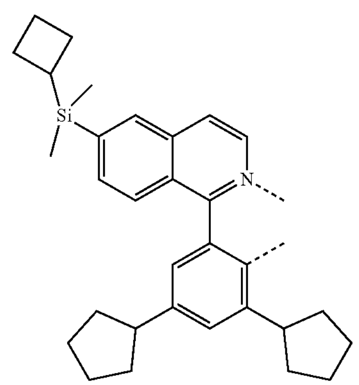
$L_{a268}$
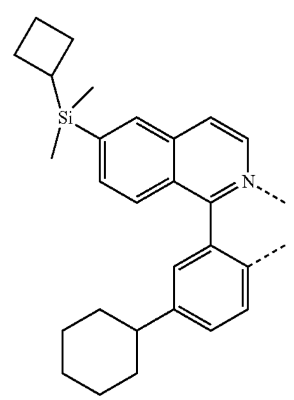

-continued
$L_{a269}$
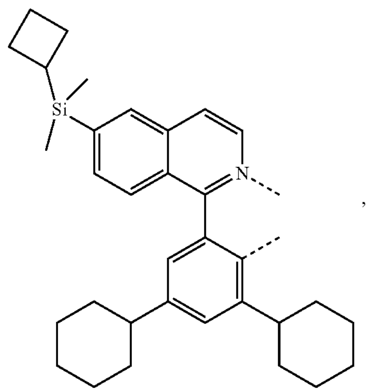
$L_{a270}$
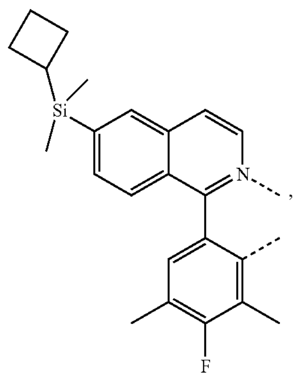
$L_{a271}$
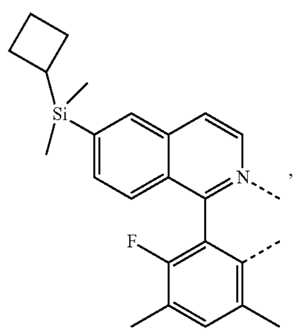
$L_{a272}$
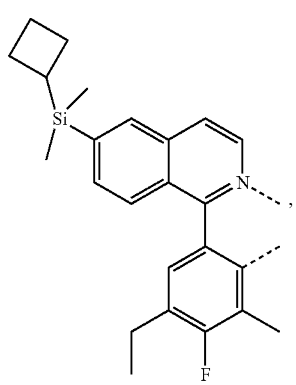
-continued
$L_{a273}$
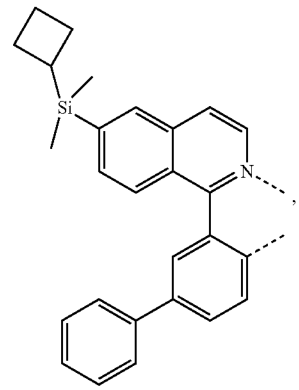
$L_{a274}$
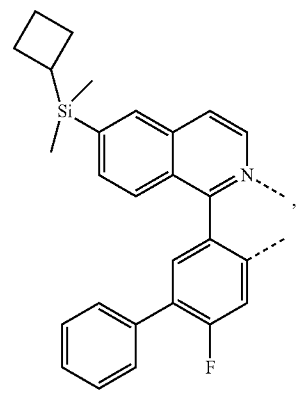
$L_{a275}$
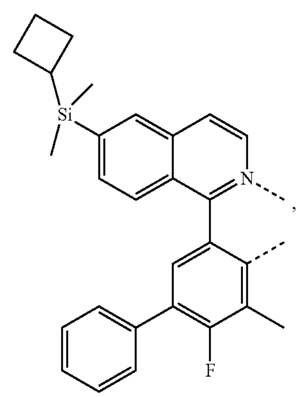
$L_{a276}$
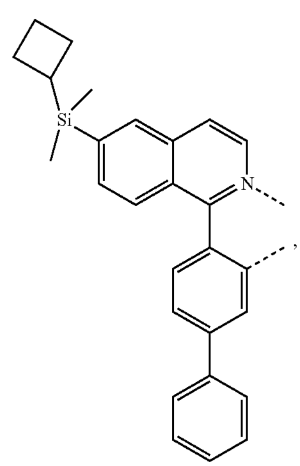

-continued
$L_{a277}$
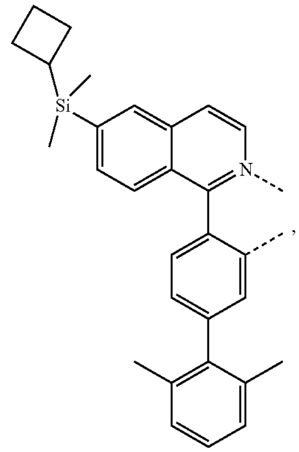
$L_{a278}$
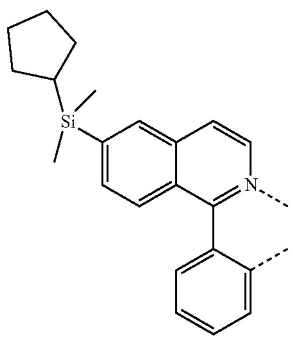
$L_{a279}$
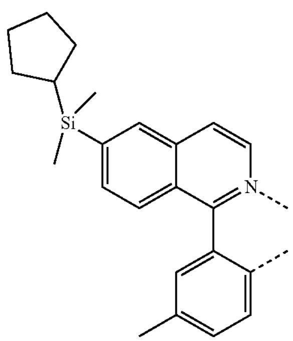
$L_{a280}$
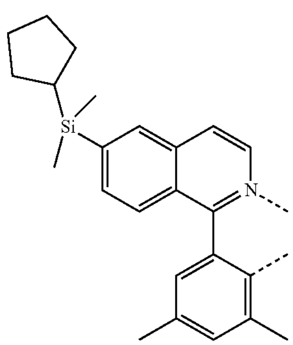
-continued
$L_{a281}$
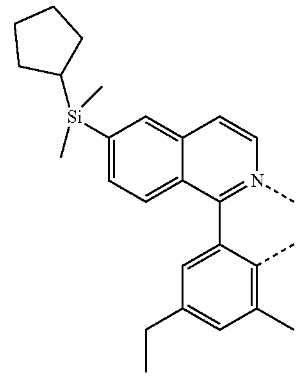
$L_{a282}$
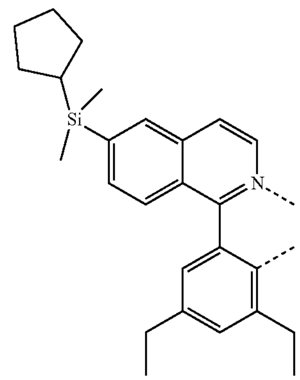
$L_{a283}$
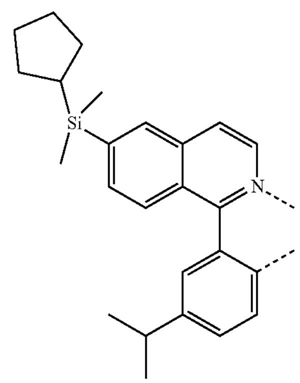
$L_{a284}$
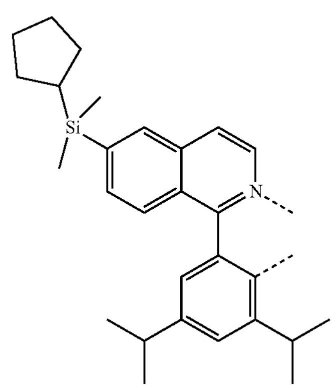

-continued
$L_{a285}$
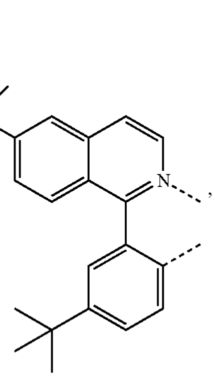
$L_{a286}$
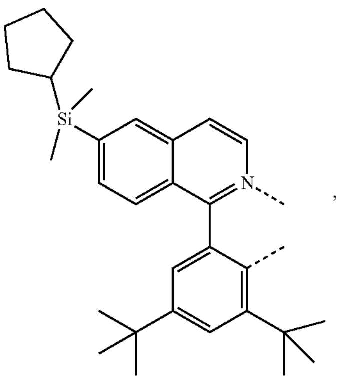
$L_{a287}$
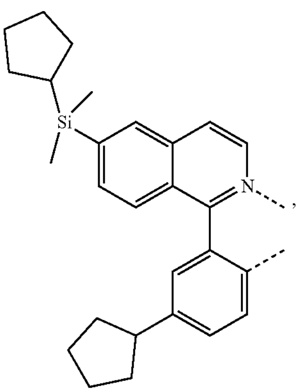
$L_{a288}$
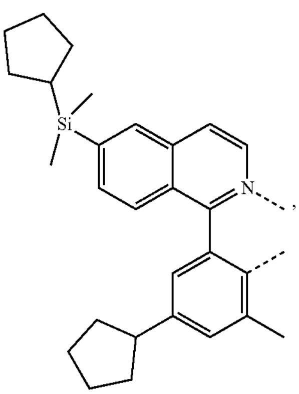
-continued
$L_{a289}$
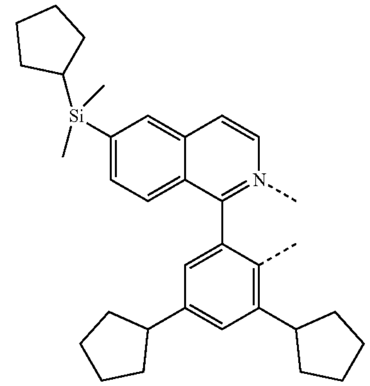
$L_{a290}$
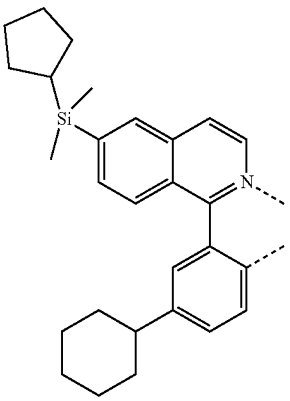
$L_{a291}$
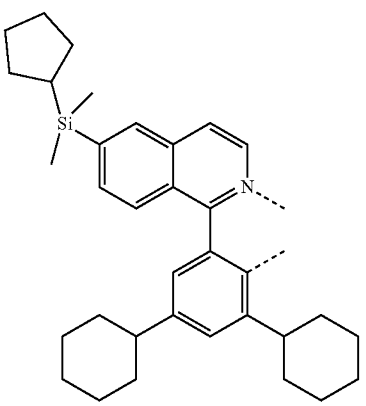

-continued
$L_{a292}$
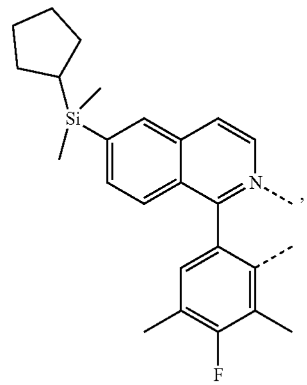
$L_{a293}$
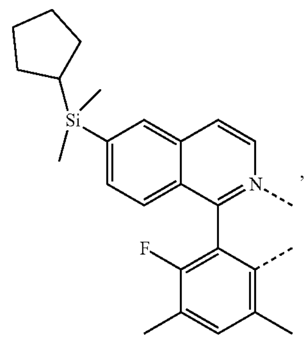
$L_{a294}$
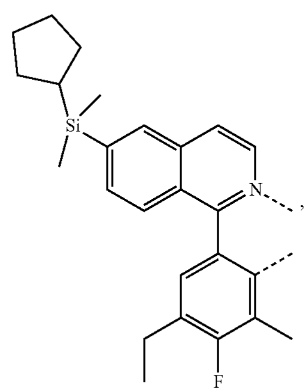
$L_{a295}$
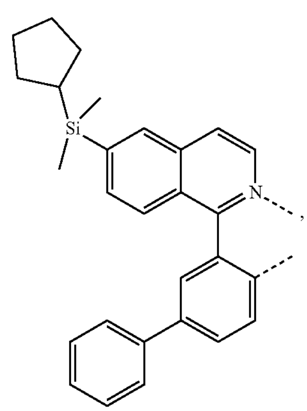
$L_{a296}$
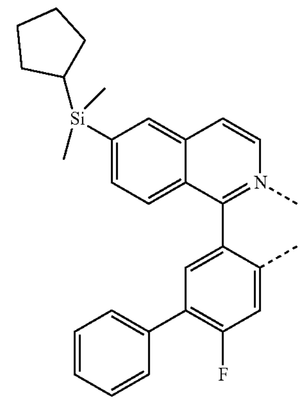
$L_{a297}$
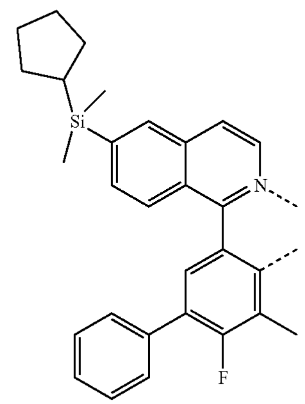
$L_{a298}$
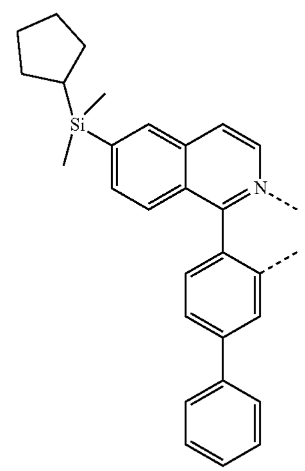

-continued
L$_{a299}$
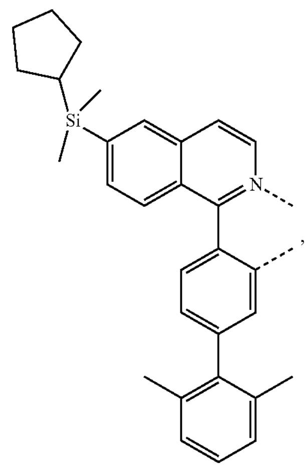
L$_{a300}$
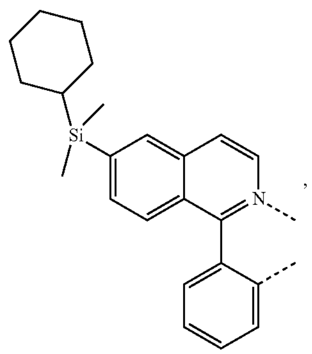
L$_{a301}$
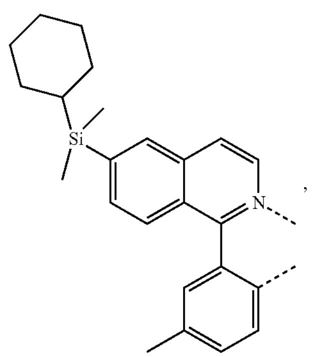
L$_{a302}$
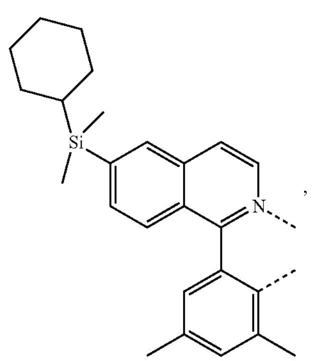
L$_{a303}$
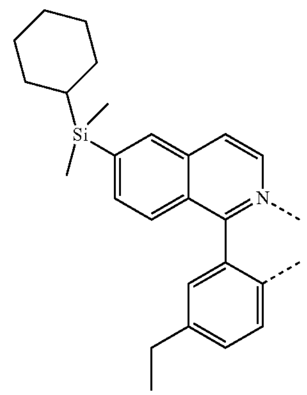
L$_{a304}$
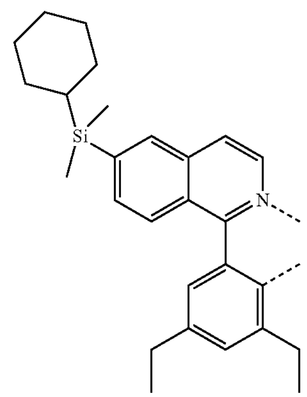
L$_{a305}$
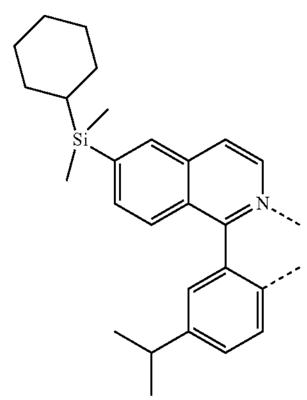
L$_{a306}$
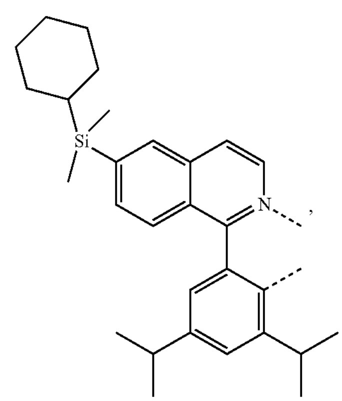

-continued
$L_{a307}$
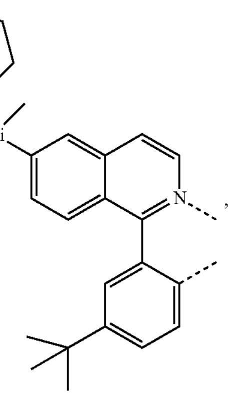
$L_{a308}$
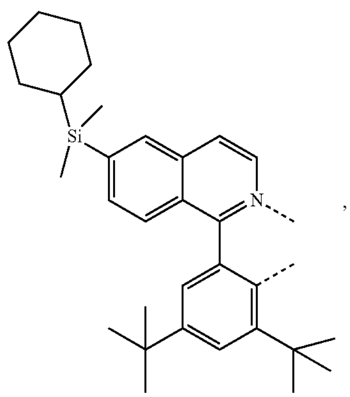
$L_{a309}$
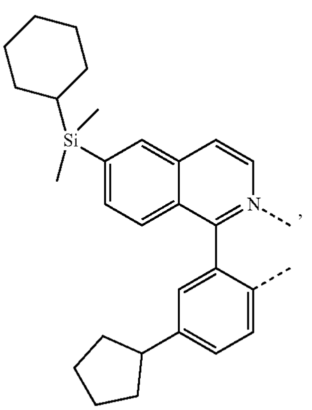
$L_{a310}$
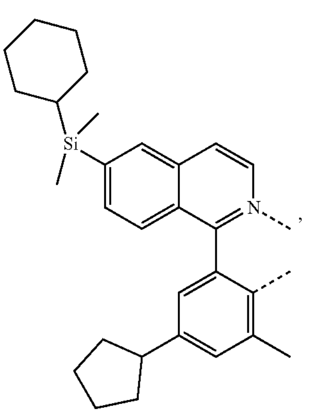
-continued
$L_{a311}$
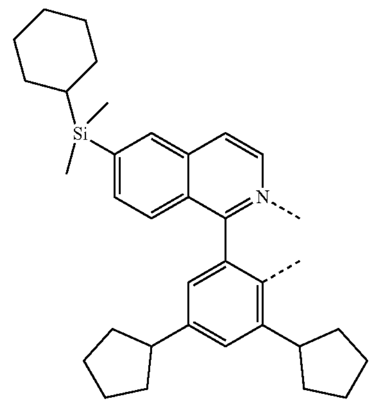
$L_{a312}$
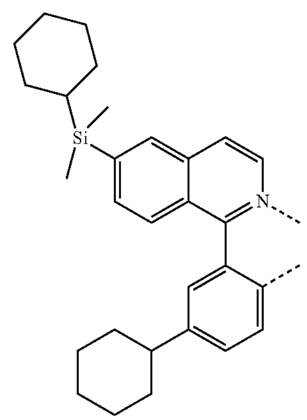
$L_{a313}$
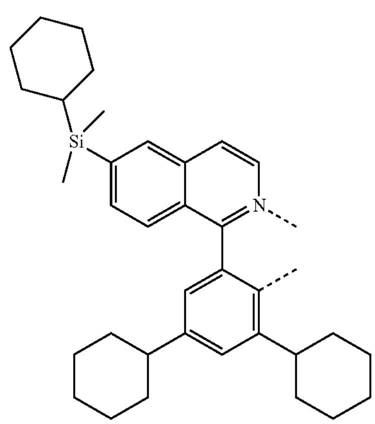
$L_{a314}$
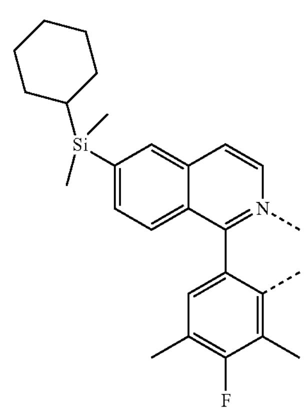

$L_{a315}$
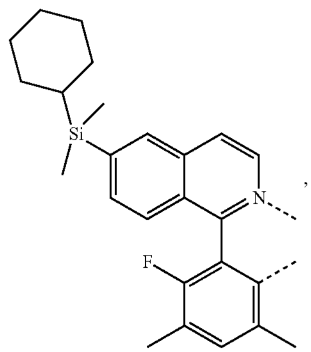
$L_{a316}$
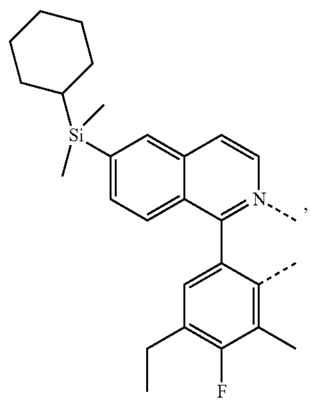
$L_{a317}$
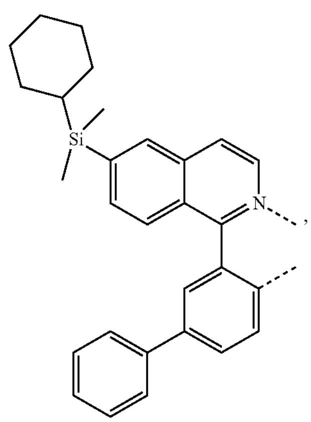
$L_{a318}$
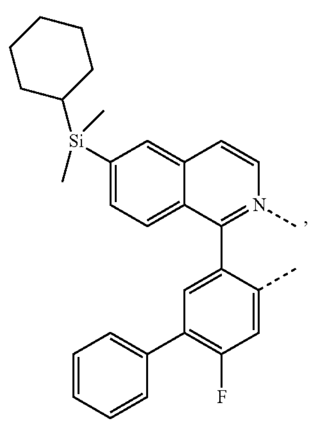
$L_{a319}$
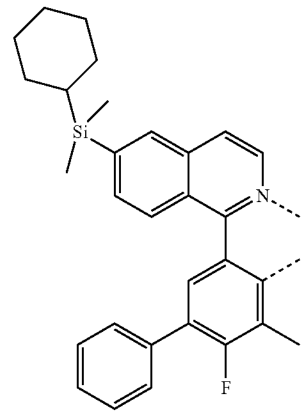
$L_{a320}$
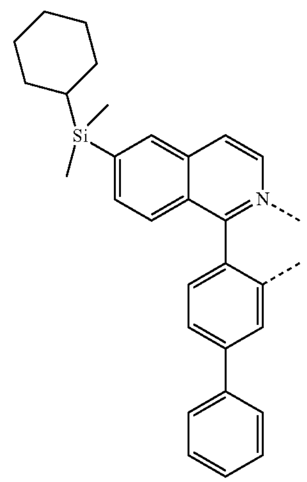
$L_{a321}$
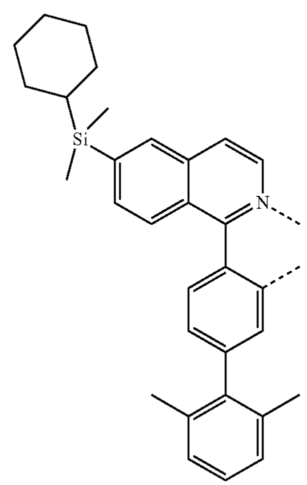

-continued
$L_{a322}$
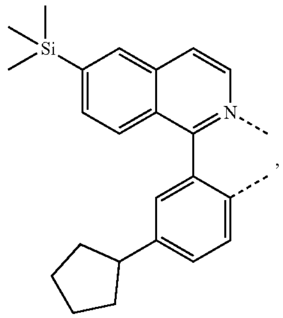
$L_{a323}$
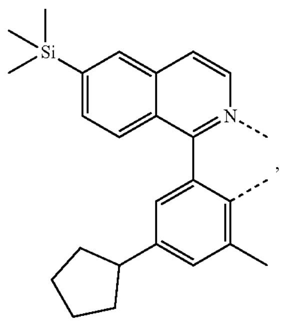
$L_{a324}$
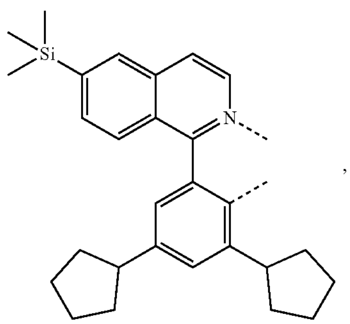
$L_{a325}$
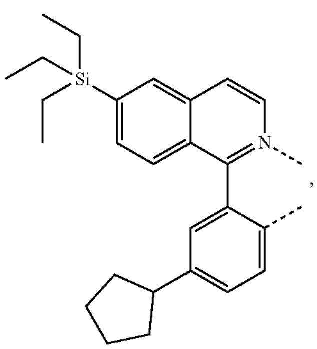
-continued
$L_{a326}$
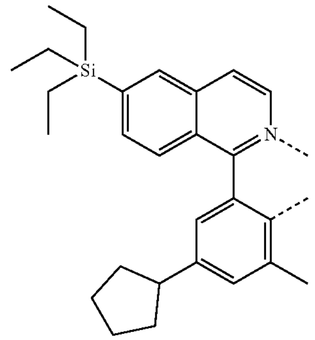
$L_{a327}$
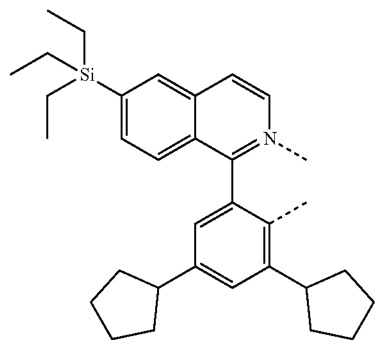
$L_{a328}$
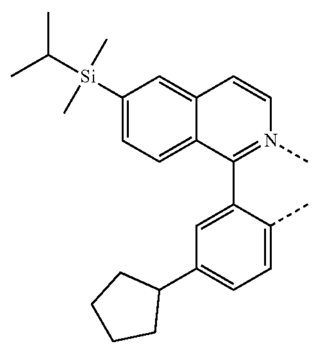
$L_{a329}$
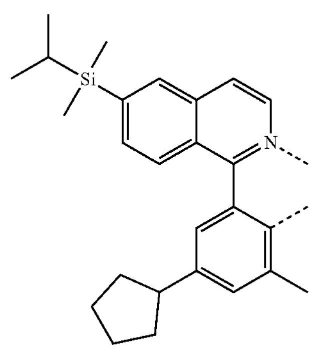

$L_{a330}$
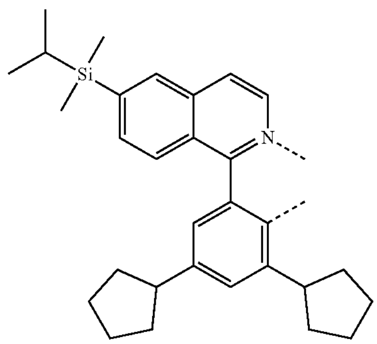
,
$L_{a331}$
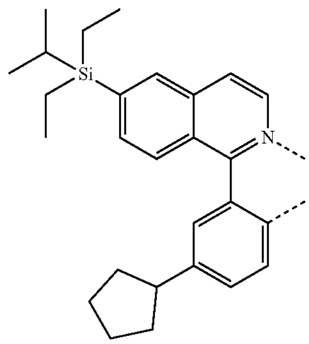
,
$L_{a332}$
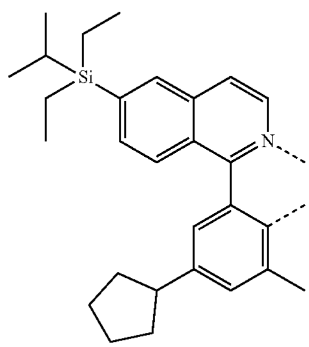
,
$L_{a333}$
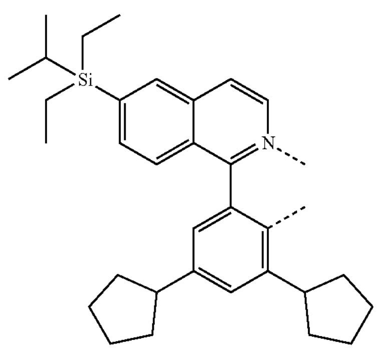
,
$L_{a334}$
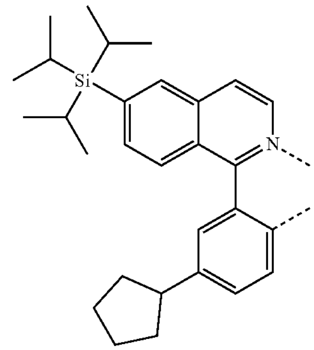
,
$L_{a335}$
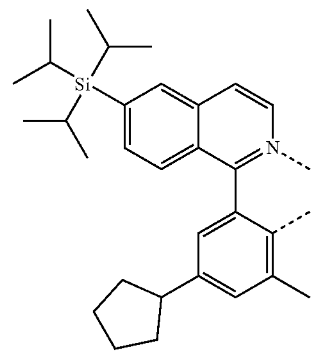
,
$L_{a336}$
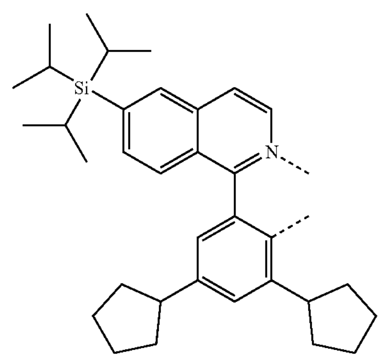
,
$L_{a337}$
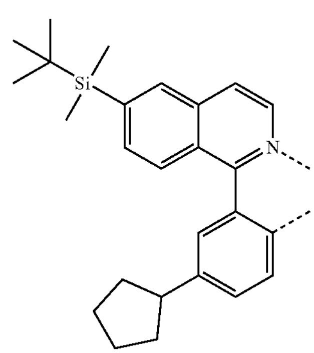
, -continued
$L_{a338}$
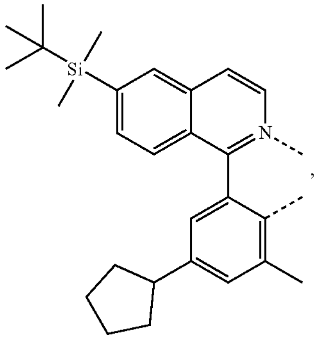
$L_{a339}$
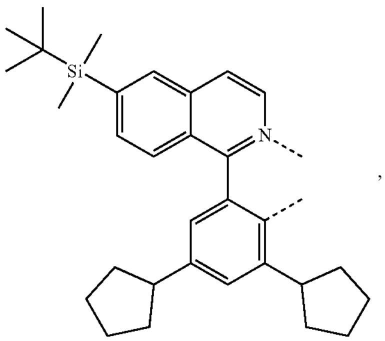
$L_{a340}$
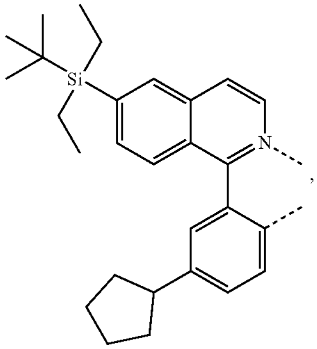
$L_{a341}$
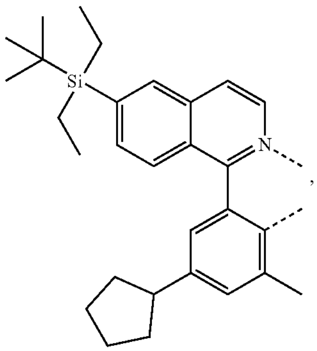
-continued
$L_{a342}$
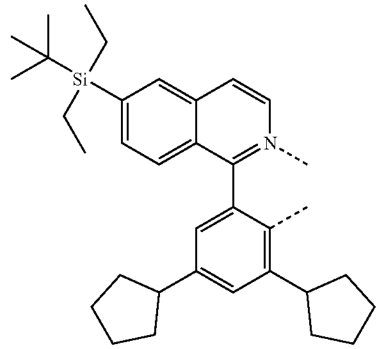
$L_{a343}$
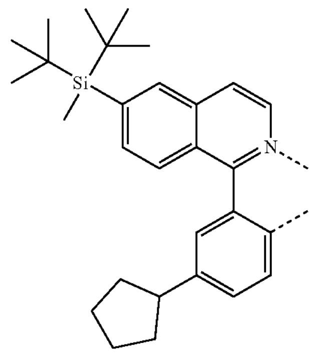
$L_{a344}$
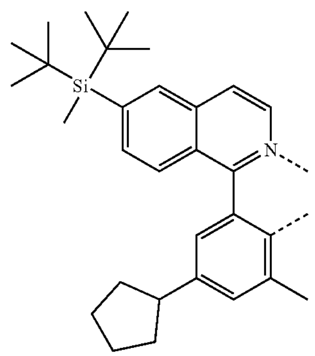
$L_{a345}$
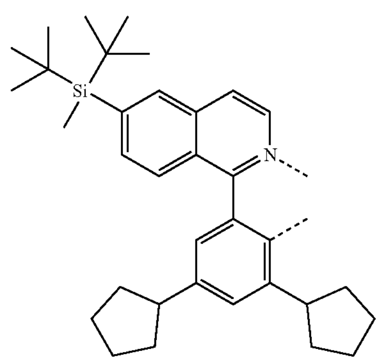

-continued
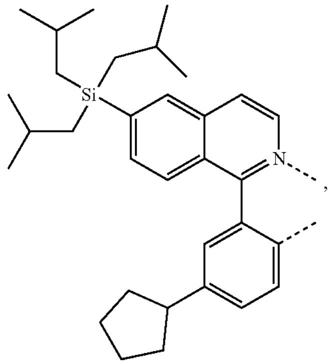
$L_{a346}$
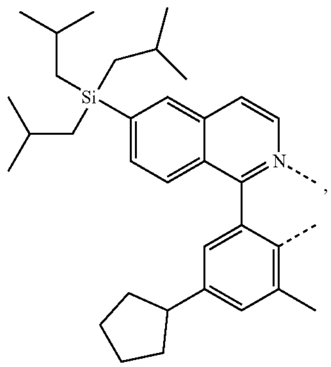
$L_{a347}$
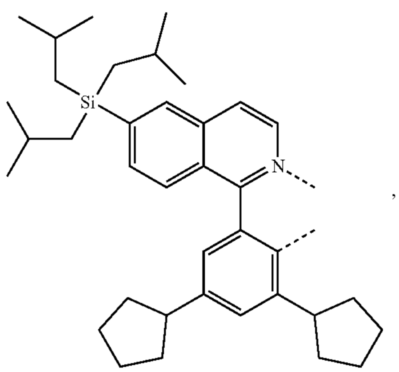
$L_{a348}$
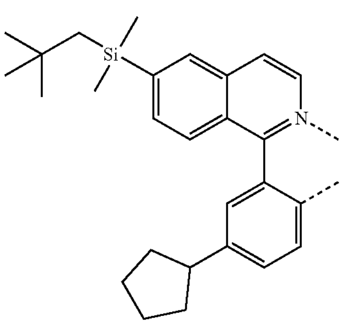
$L_{a349}$
-continued
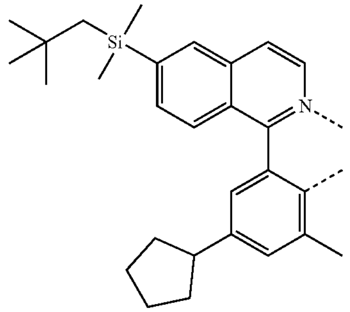
$L_{a350}$
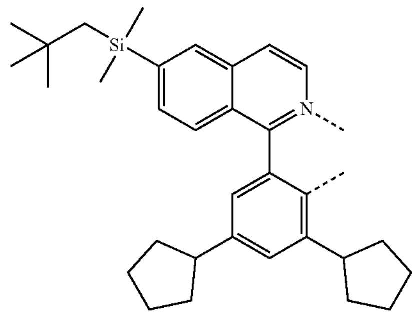
$L_{a351}$
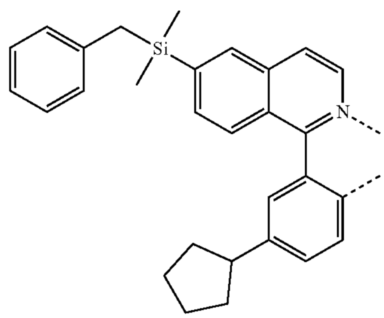
$L_{a352}$
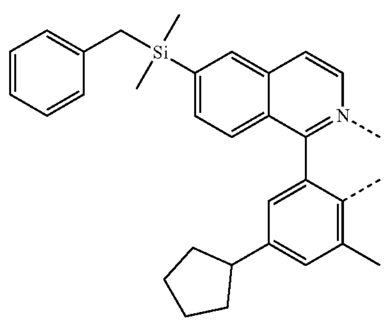
$L_{a353}$
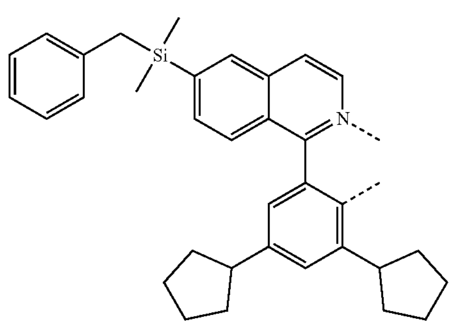
$L_{a354}$ -continued
La355
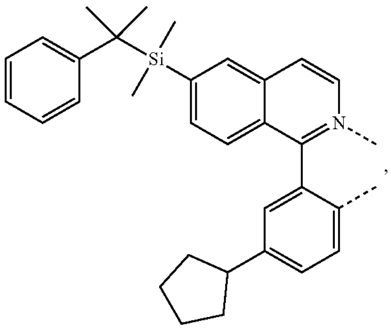
La356
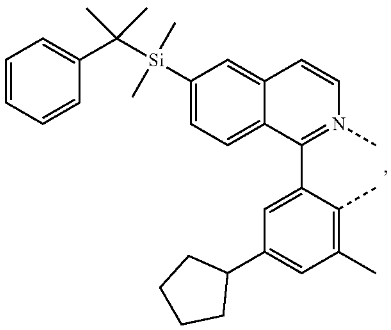
La357
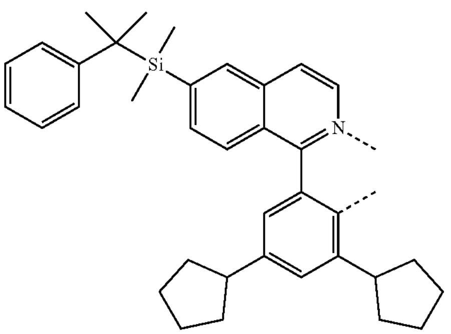
La358
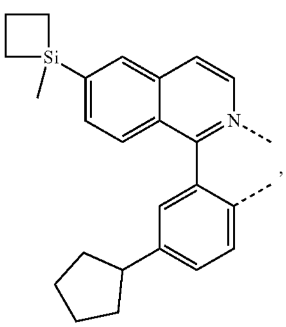
-continued
La359
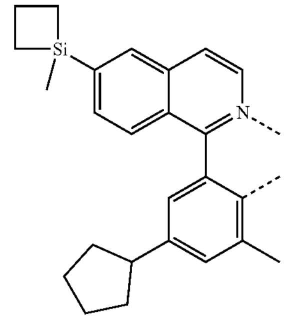
La360
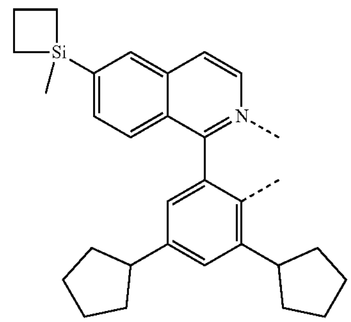
La361
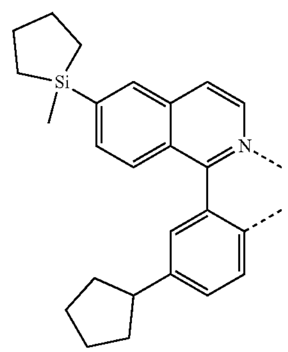
La362
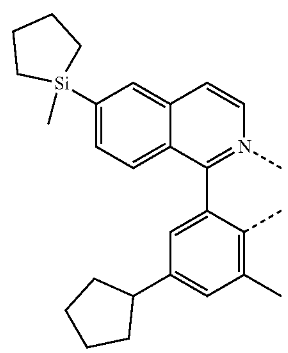

-continued
La363
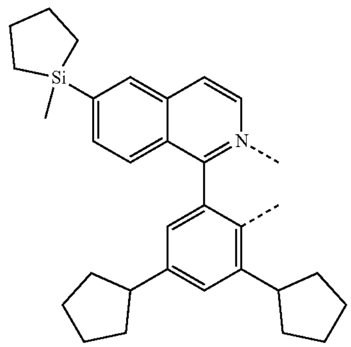
,
La364
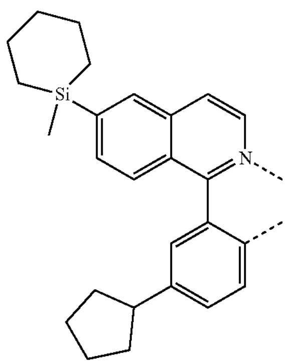
La365
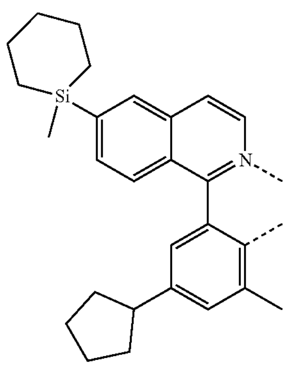
La366
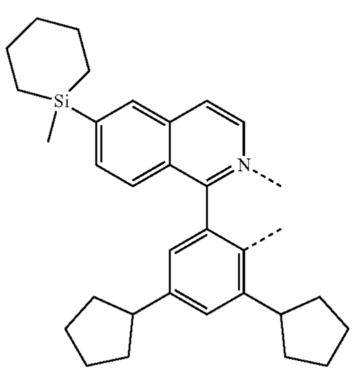
,
-continued
La367
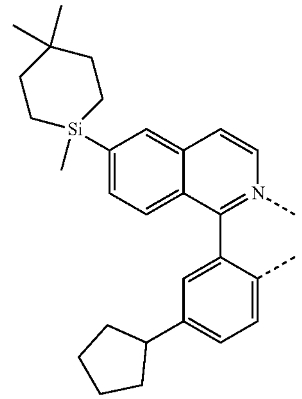
La368
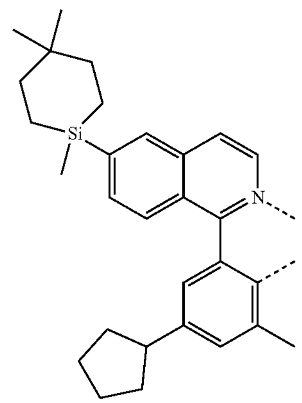
La369
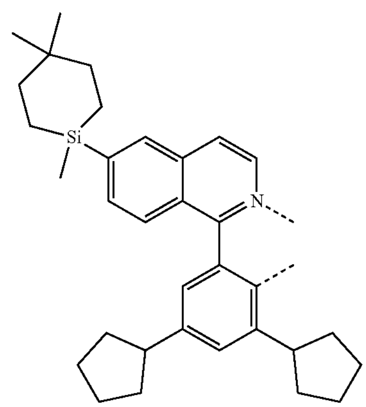
,
La370
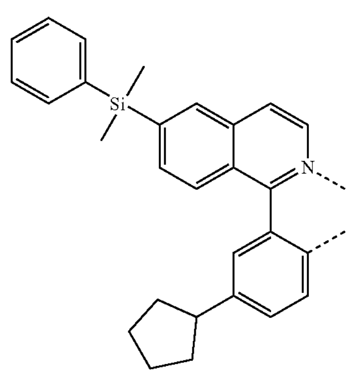

$L_{a371}$
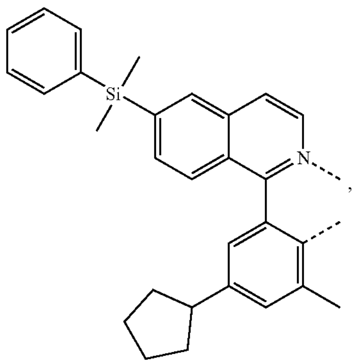
$L_{a372}$
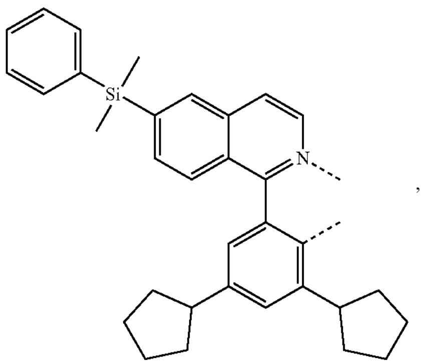
$L_{a373}$
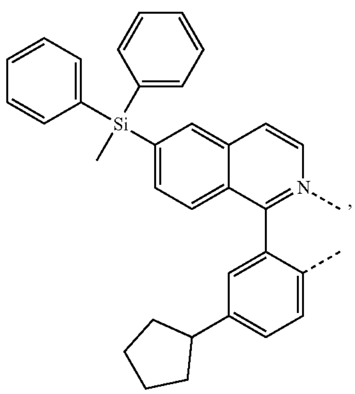
$L_{a374}$
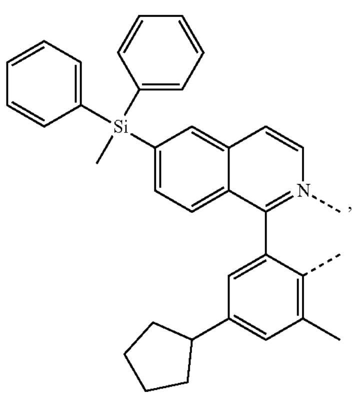
$L_{a375}$
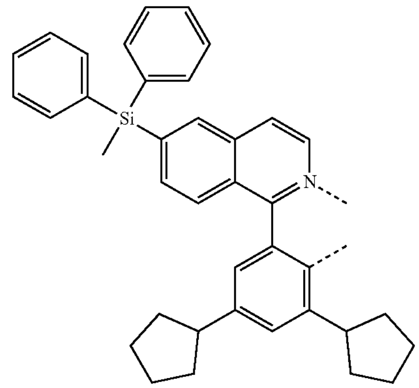
$L_{a376}$
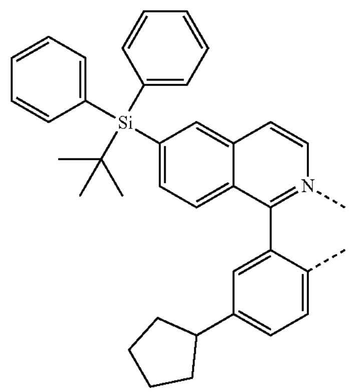
$L_{a377}$
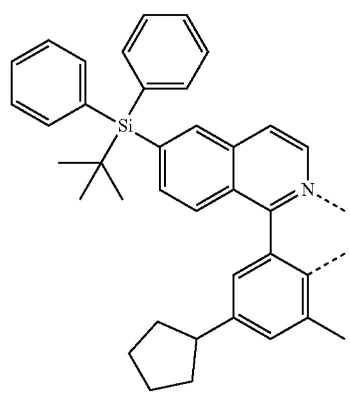
$L_{a378}$
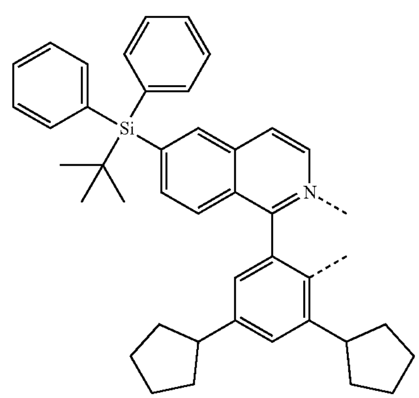

-continued
$L_{a379}$
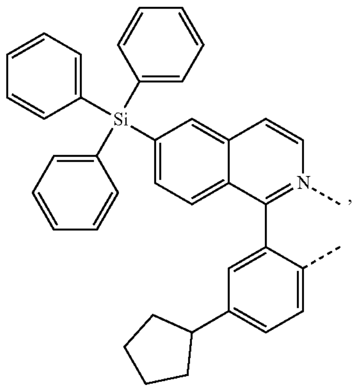
$L_{a380}$
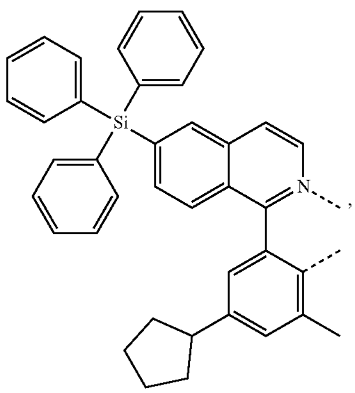
$L_{a381}$
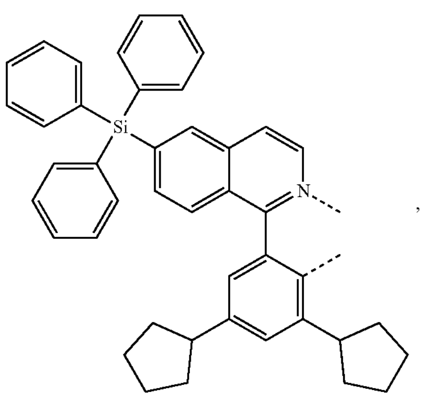
$L_{a382}$
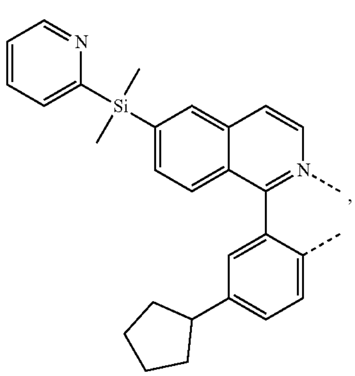
-continued
$L_{a383}$
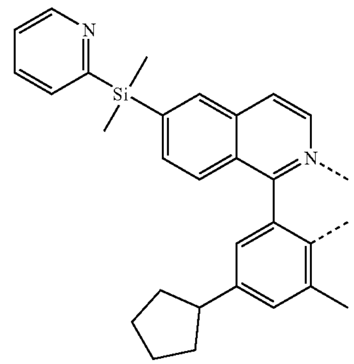
$L_{a384}$
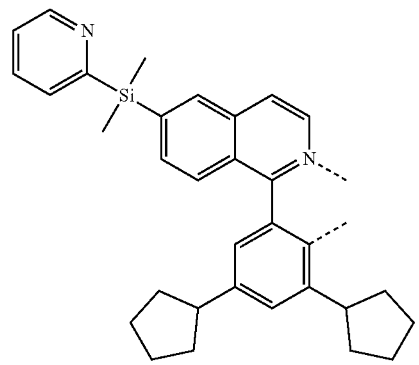
$L_{a385}$
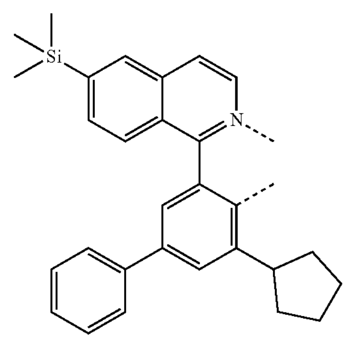
$L_{a386}$
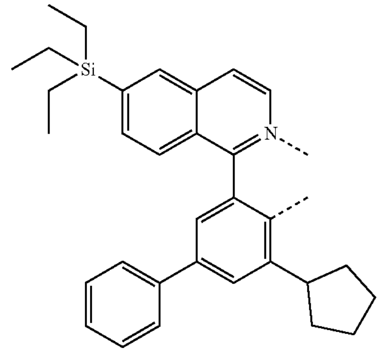

-continued
$L_{a387}$
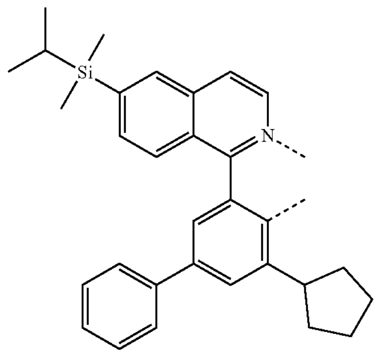
,
$L_{a388}$
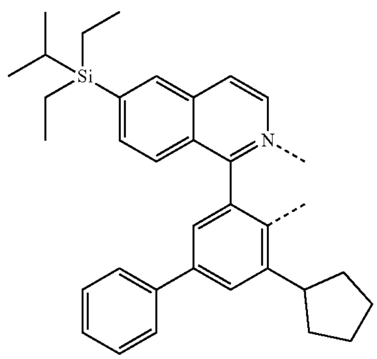
,
$L_{a389}$
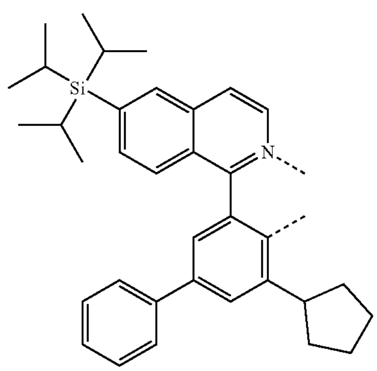
,
$L_{a390}$
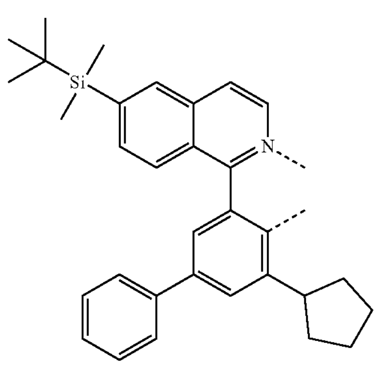
,
-continued
$L_{a391}$
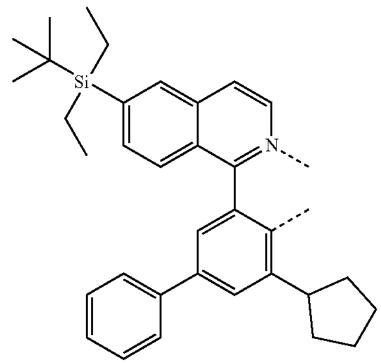
,
$L_{a392}$
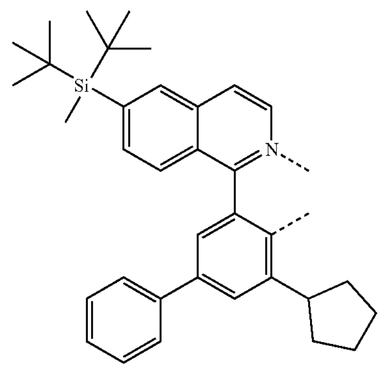
,
$L_{a393}$
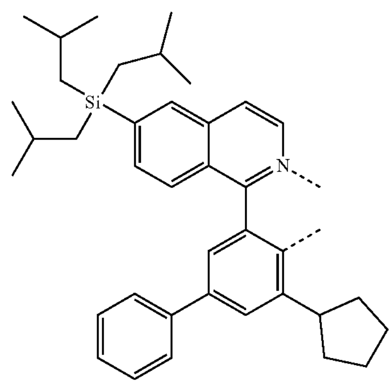
,
$L_{a394}$
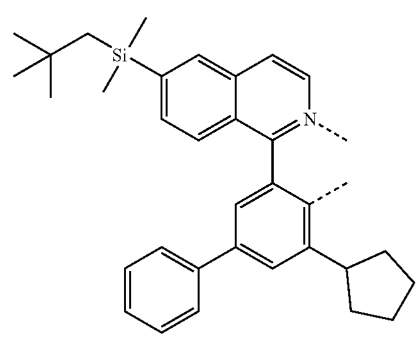
, $L_{a395}$
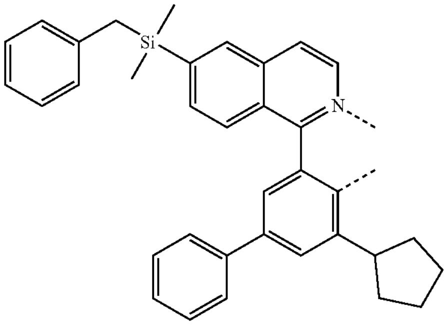
,
$L_{a396}$
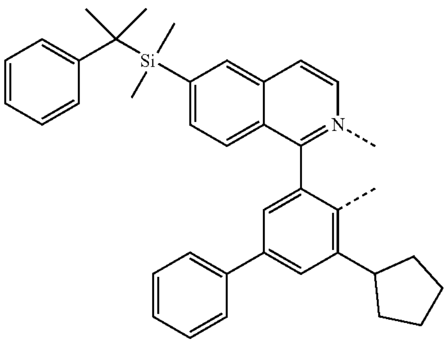
,
$L_{a397}$
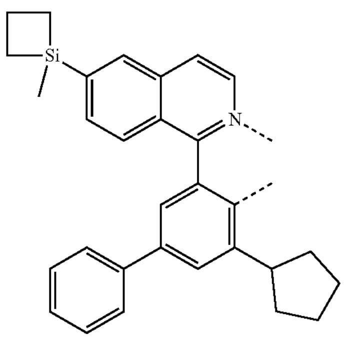
,
$L_{a398}$
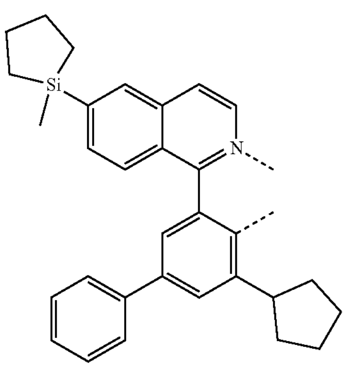
,
$L_{a399}$
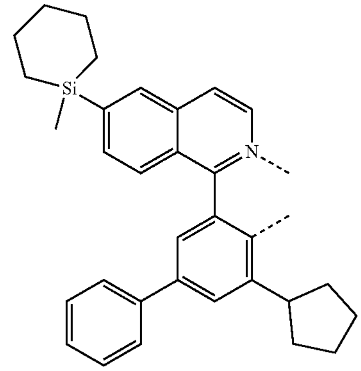
,
$L_{a400}$
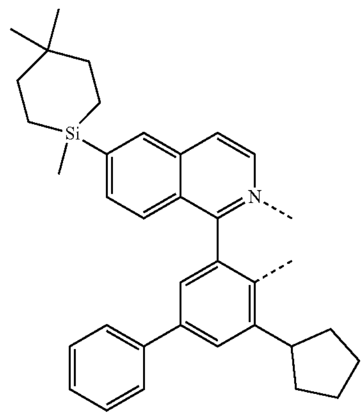
,
$L_{a401}$
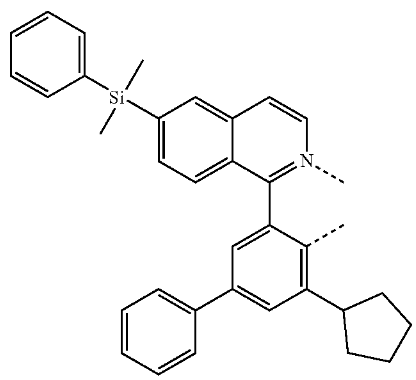
,
$L_{a402}$
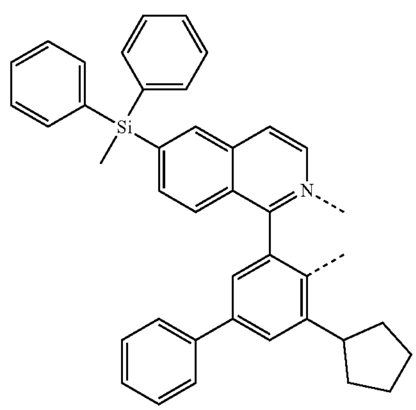
, -continued
$L_{a403}$
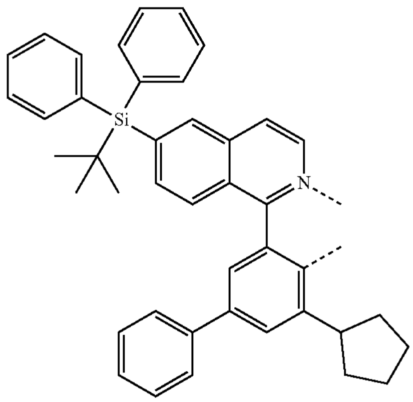
,
$L_{a404}$
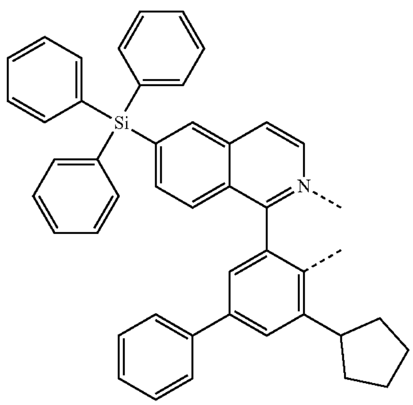
,
$L_{a405}$
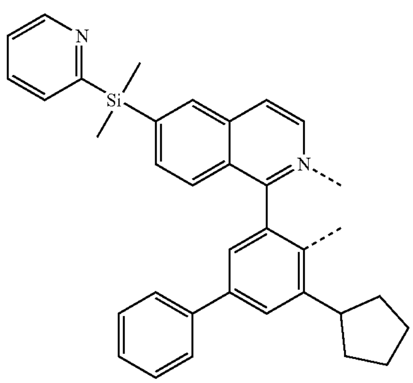
,
$L_{a406}$
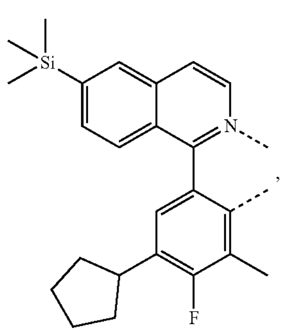
,
-continued
$L_{a407}$
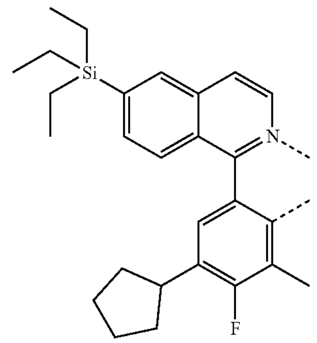
,
$L_{a408}$
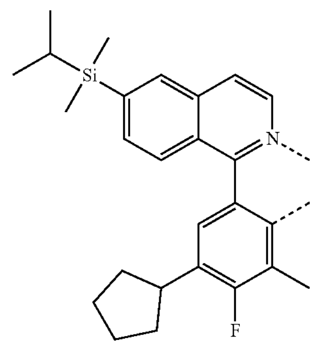
,
$L_{a409}$
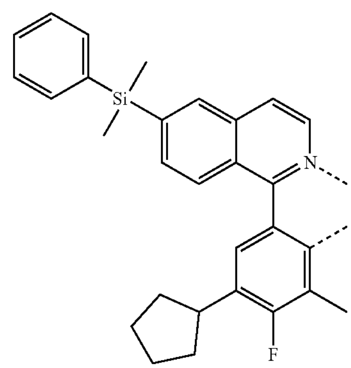
,
$L_{a410}$
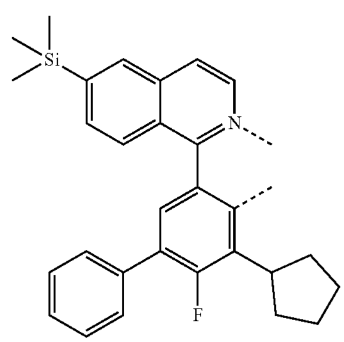
, -continued
$L_{a411}$
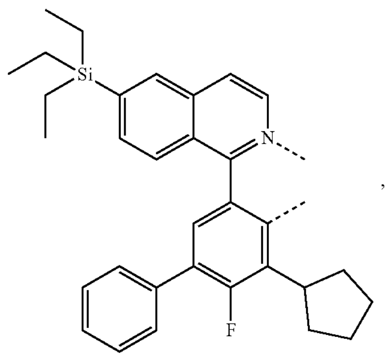
$L_{a412}$
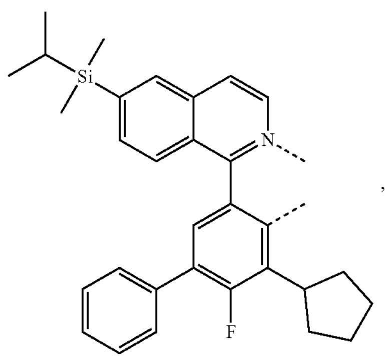
$L_{a413}$
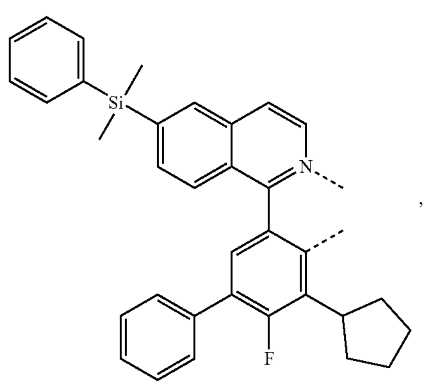
$L_{a414}$
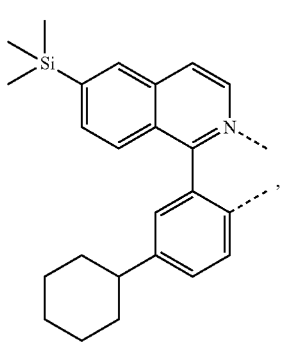
-continued
$L_{a415}$
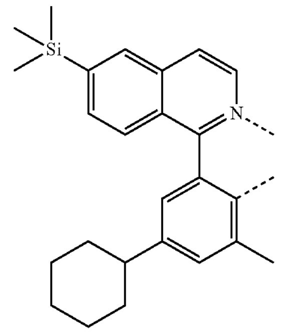
$L_{a416}$
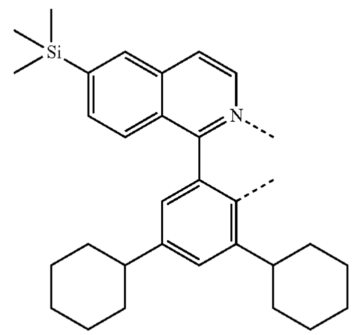
$L_{a417}$
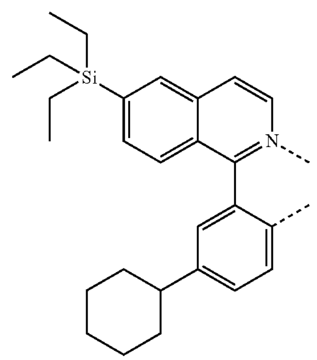
$L_{a418}$
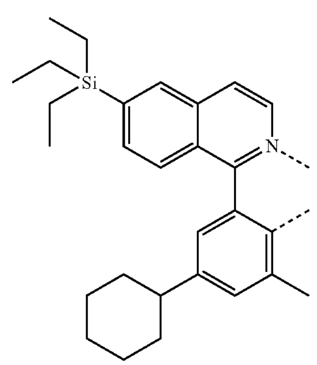

-continued
$L_{a419}$
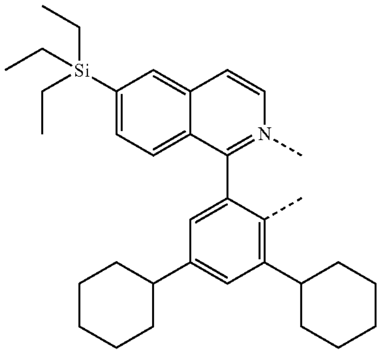
,
$L_{a420}$
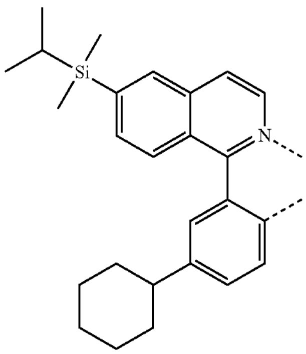
,
$L_{a421}$
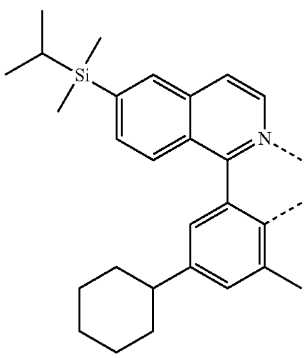
,
$L_{a422}$
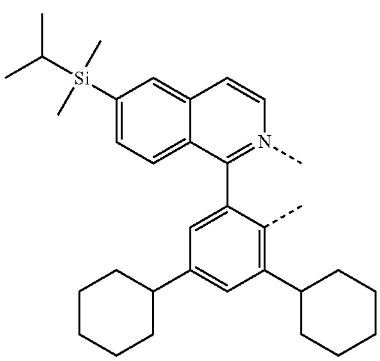
,
-continued
$L_{a423}$
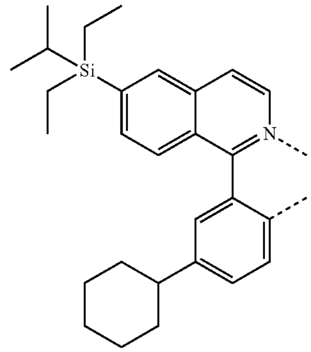
,
$L_{a424}$
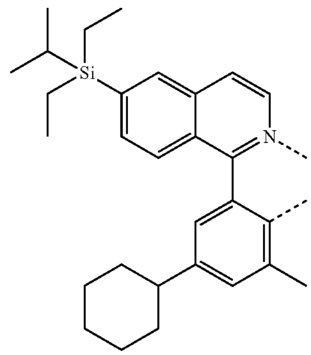
,
$L_{a425}$
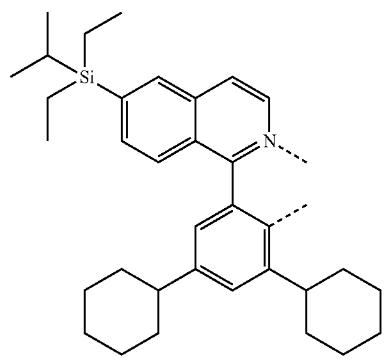
,
$L_{a426}$
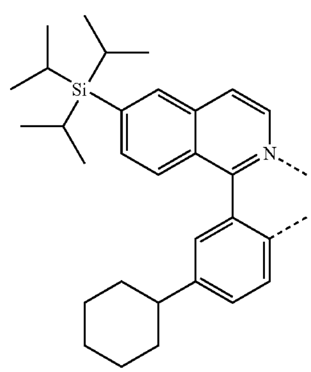
, -continued
La427
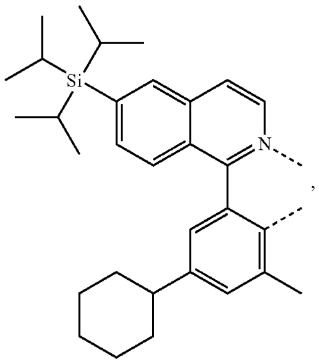
La428
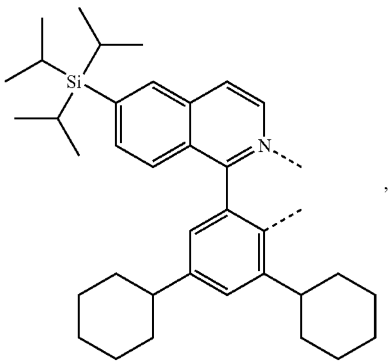
La429
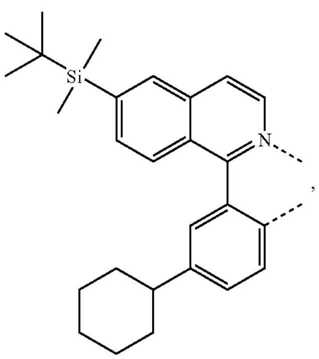
La430
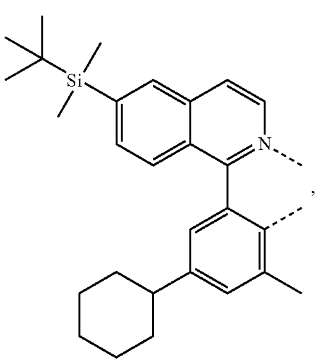
-continued
La431
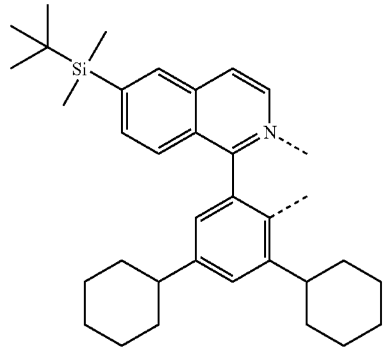
La432
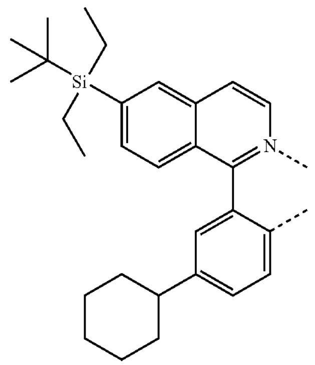
La433
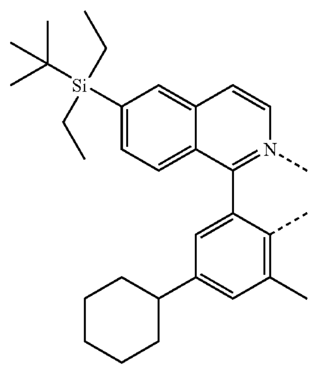
La434
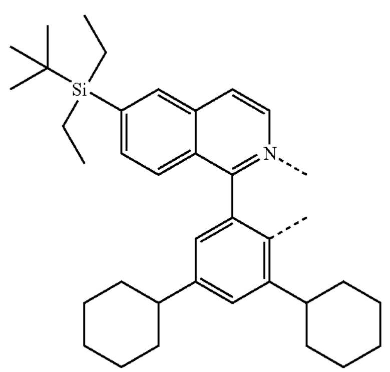

$L_{a435}$
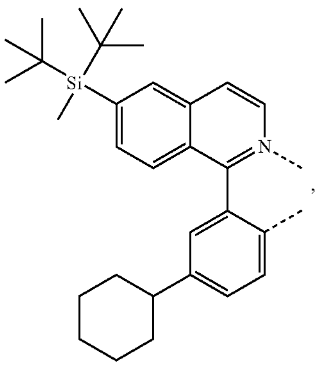
$L_{a436}$
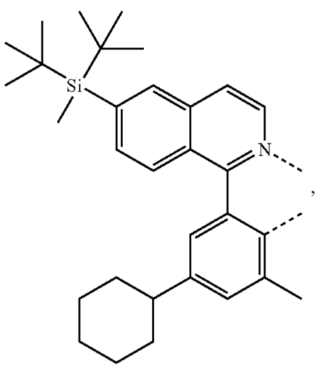
$L_{a437}$
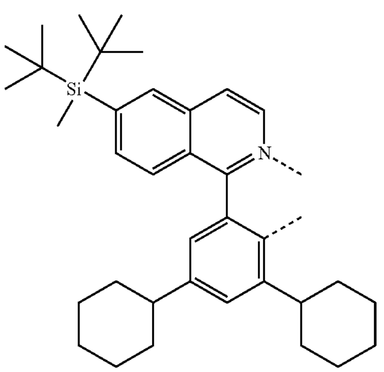
$L_{a438}$
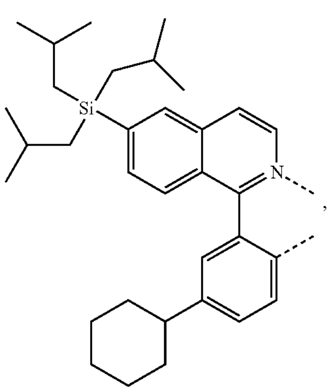
$L_{a439}$
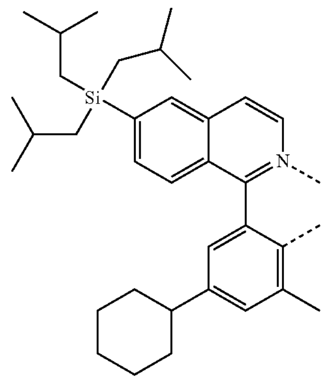
$L_{a440}$
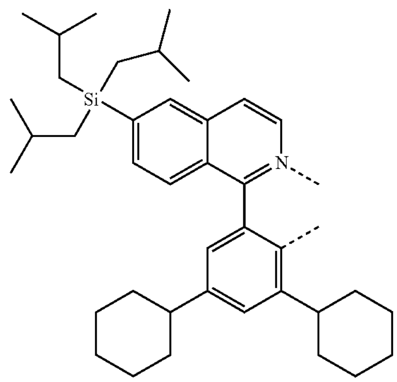
$L_{a441}$
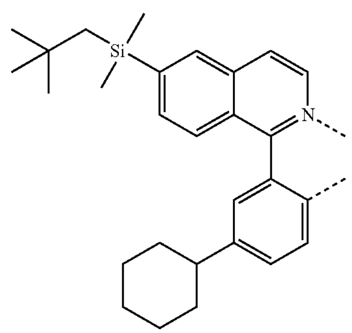
$L_{a442}$
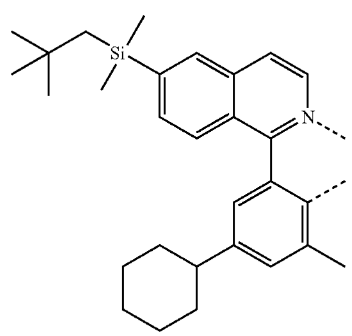

-continued
$L_{a443}$
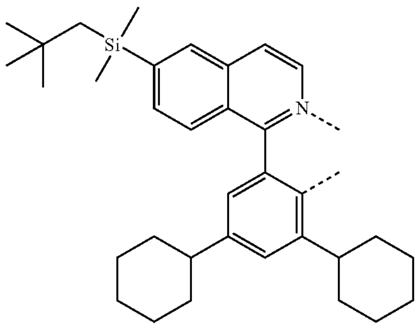
,
$L_{a444}$
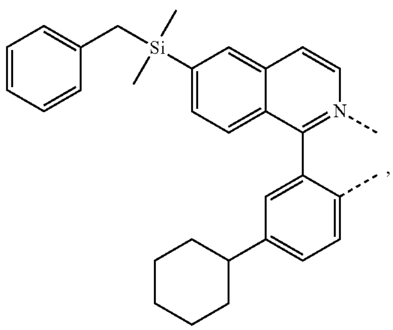
,
$L_{a445}$
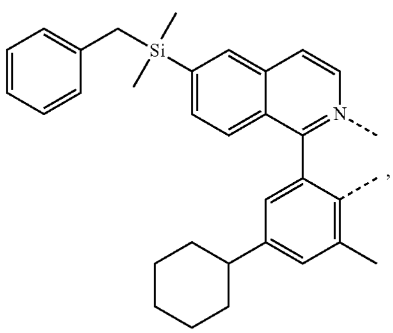
,
$L_{a446}$
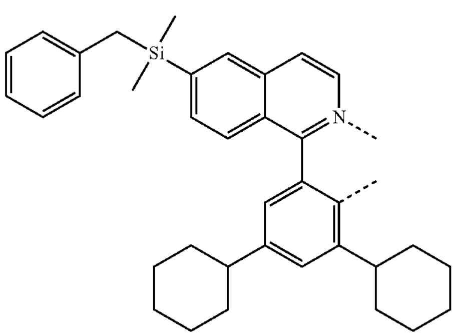
,
-continued
$L_{a447}$
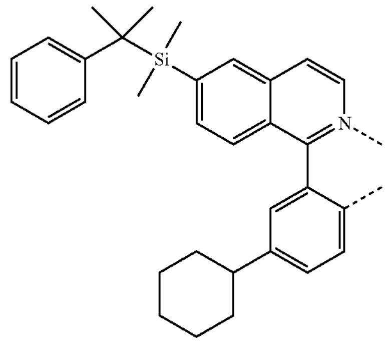
,
$L_{a448}$
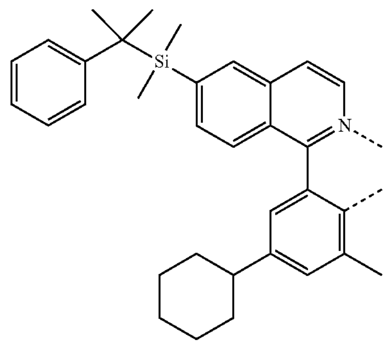
,
$L_{a449}$
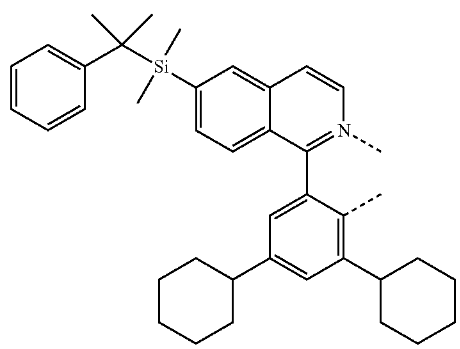
,
$L_{a450}$
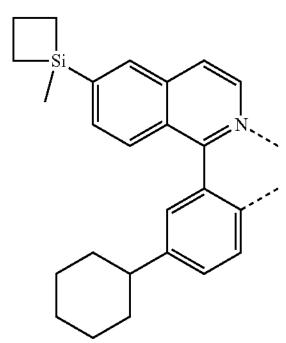
, -continued
$L_{a451}$
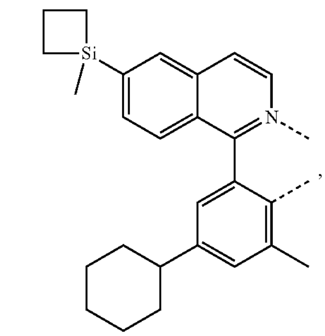
$L_{a452}$
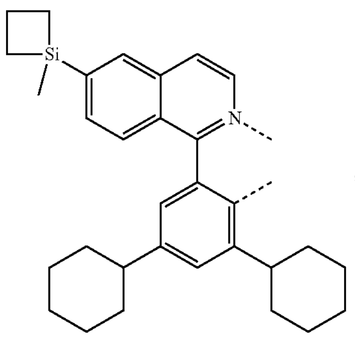
$L_{a453}$
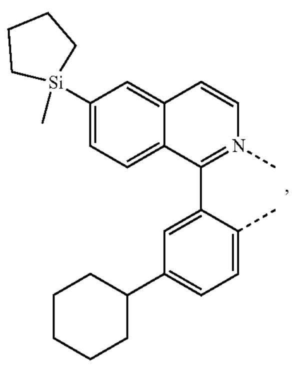
$L_{a454}$
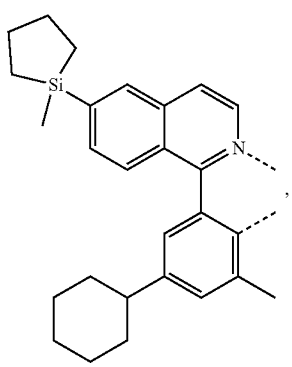
-continued
$L_{a455}$
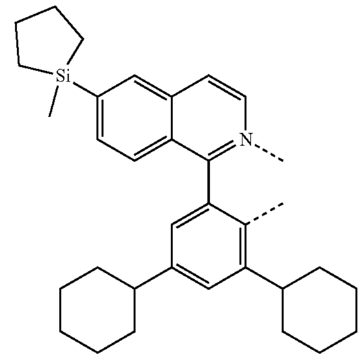
$L_{a456}$
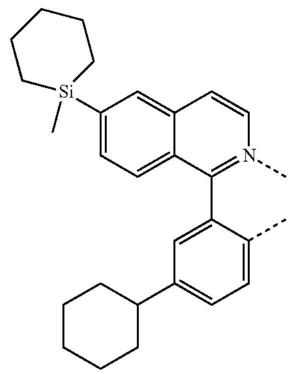
$L_{a457}$
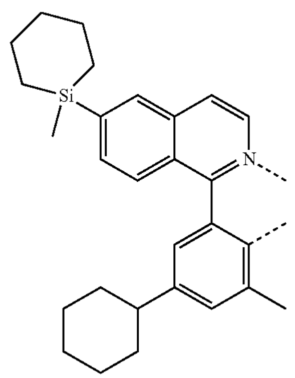
$L_{a458}$
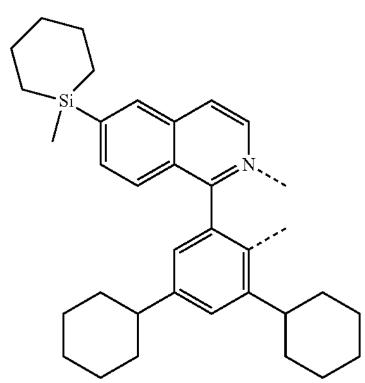

-continued
$L_{a459}$
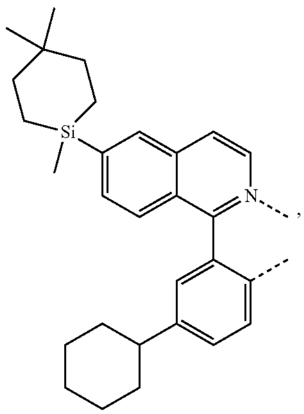
$L_{a460}$
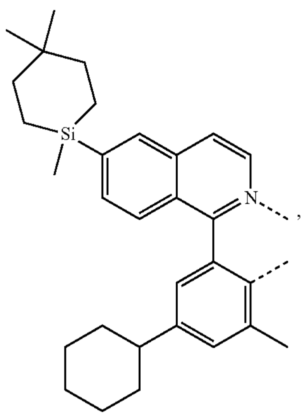
$L_{a461}$
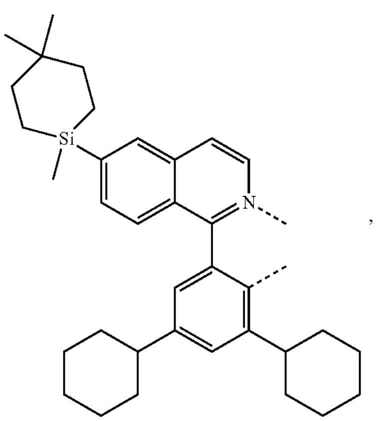
$L_{a462}$
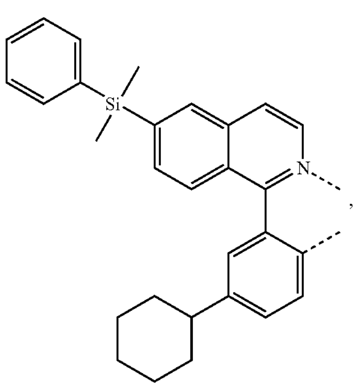
-continued
$L_{a463}$
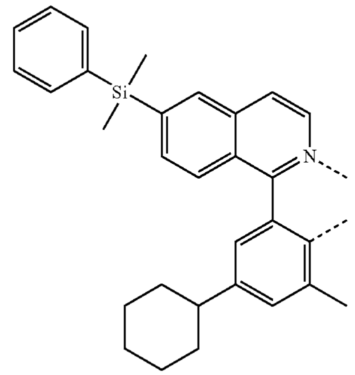
$L_{a464}$
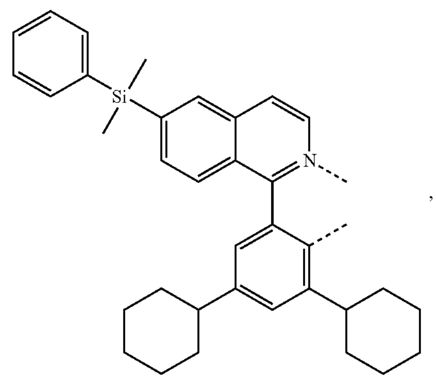
$L_{a465}$
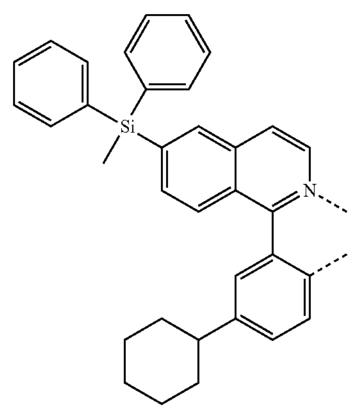
$L_{a466}$
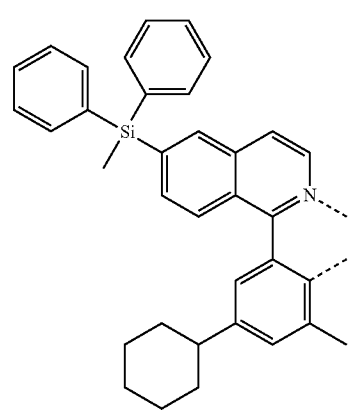

-continued
$L_{a467}$
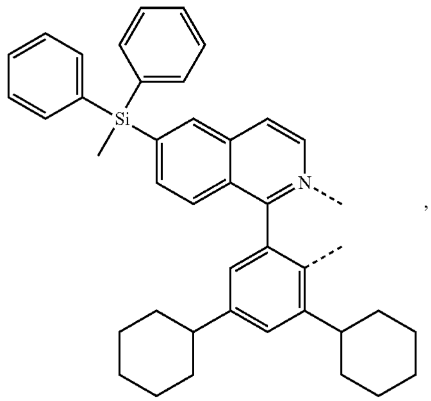
$L_{a468}$
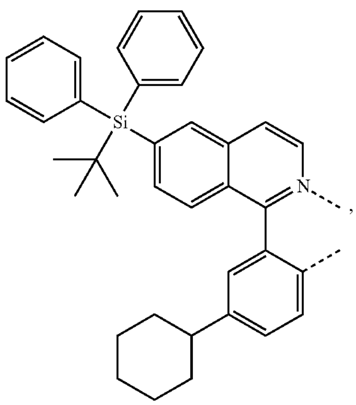
$L_{a469}$
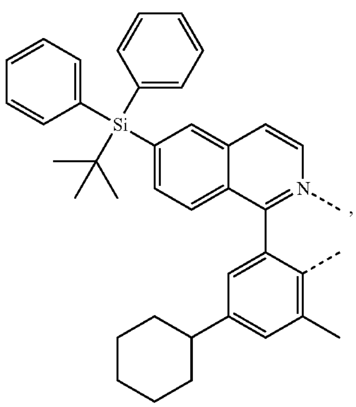
$L_{a470}$
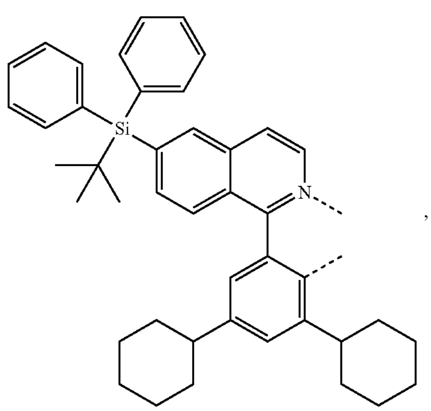
-continued
$L_{a471}$
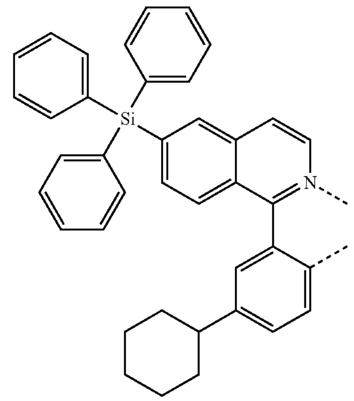
$L_{a472}$
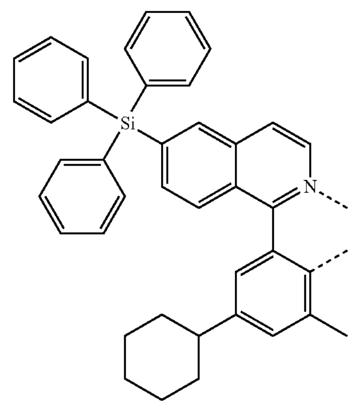
$L_{a473}$
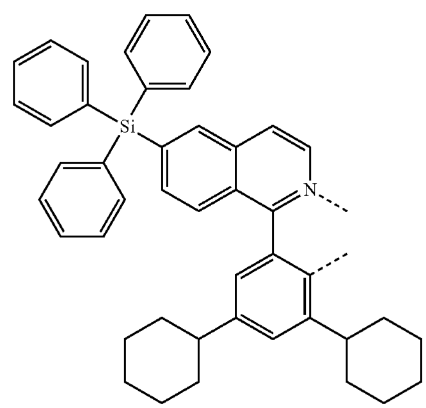
$L_{a474}$
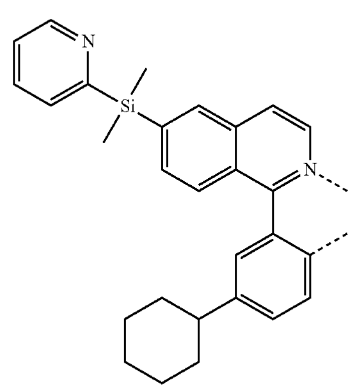

-continued
$L_{a475}$
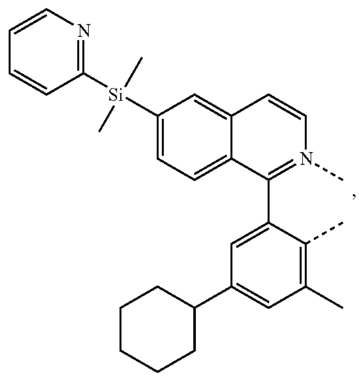
$L_{a476}$
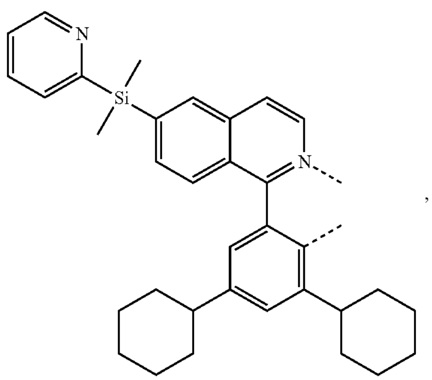
$L_{a477}$
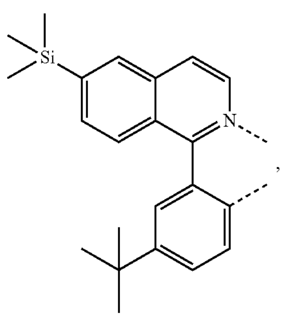
$L_{a478}$
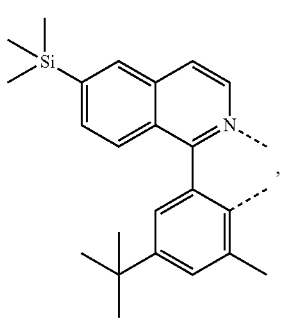
-continued
$L_{a479}$
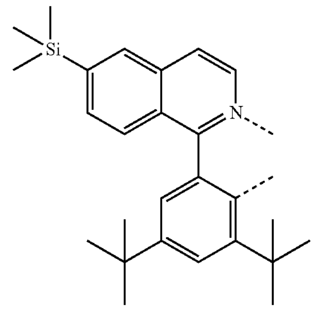
$L_{a480}$
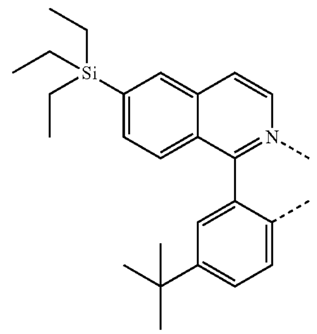
$L_{a481}$
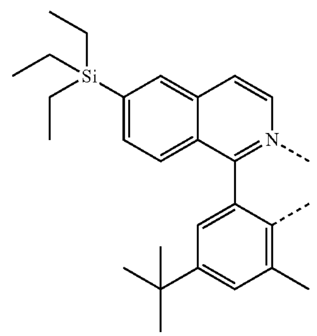
$L_{a482}$
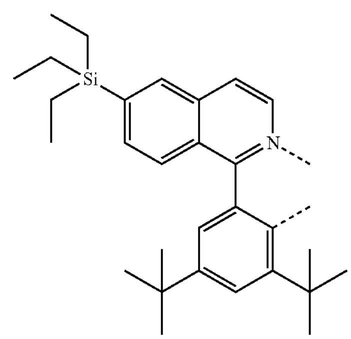

170
-continued
$L_{a483}$
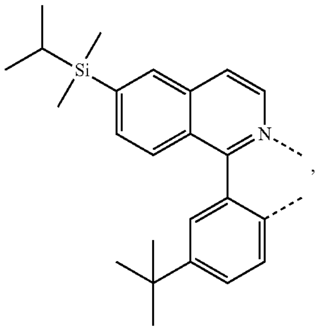
$L_{a484}$
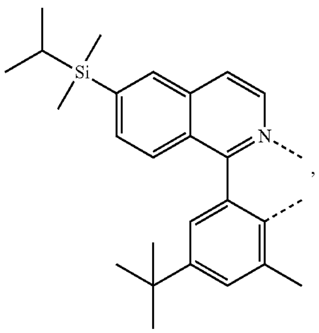
$L_{a485}$
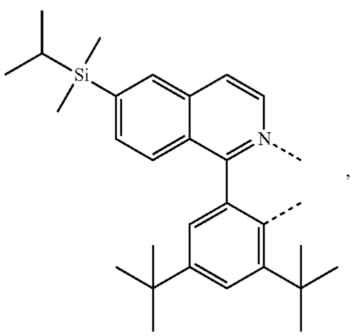
$L_{a486}$
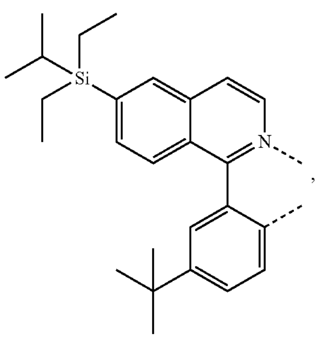
$L_{a487}$
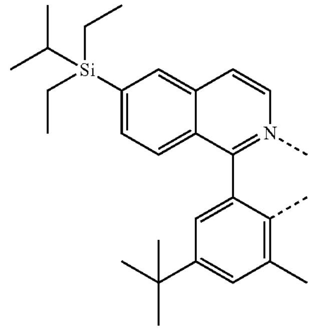
$L_{a488}$
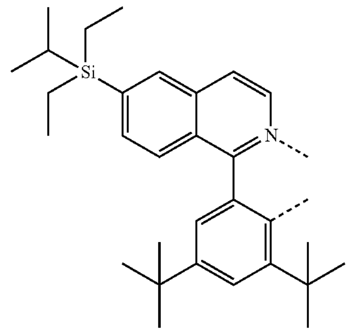
$L_{a489}$
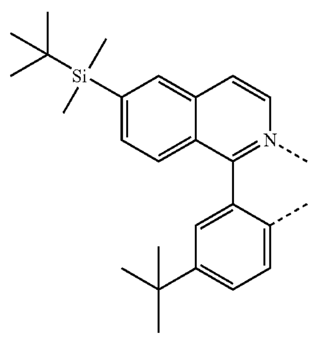
$L_{a490}$
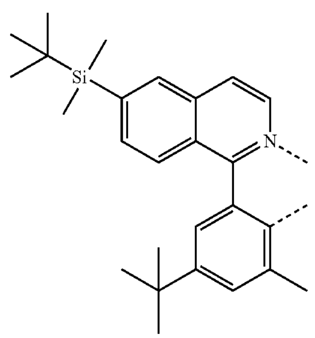

-continued
$L_{a491}$
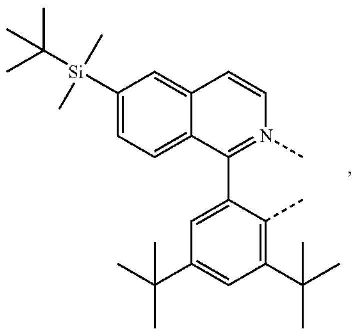
$L_{a492}$
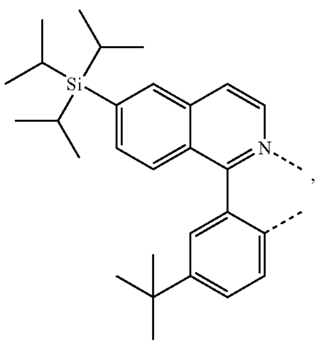
$L_{a493}$
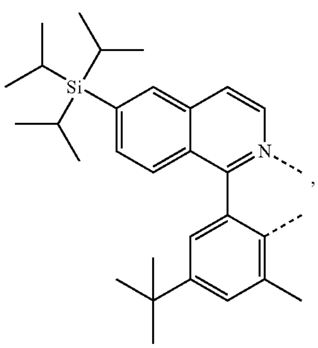
$L_{a494}$
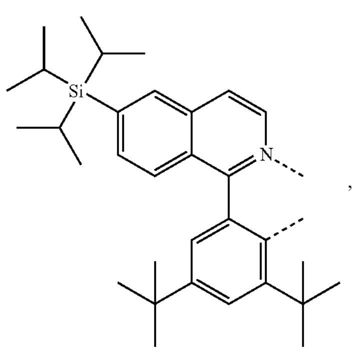
-continued
$L_{a495}$
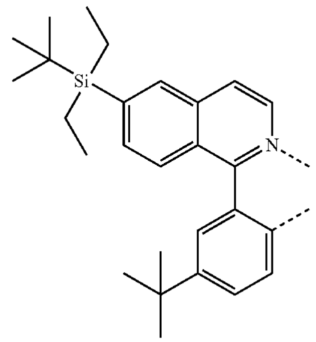
$L_{a496}$
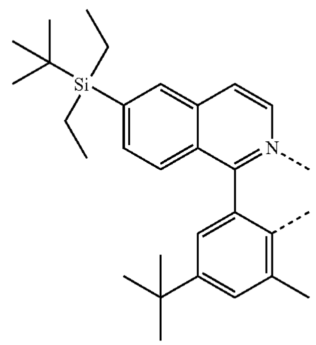
$L_{a497}$
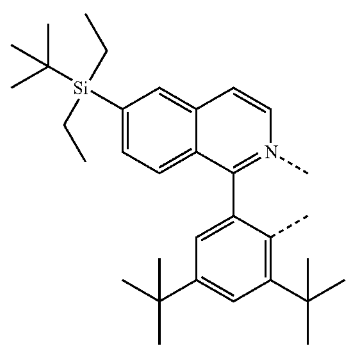
$L_{a498}$
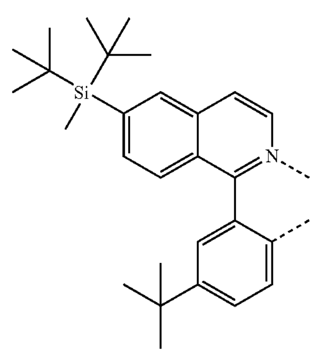

L$_{a499}$
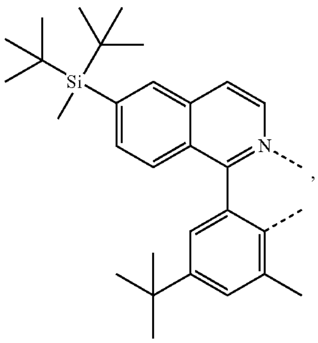
L$_{a500}$
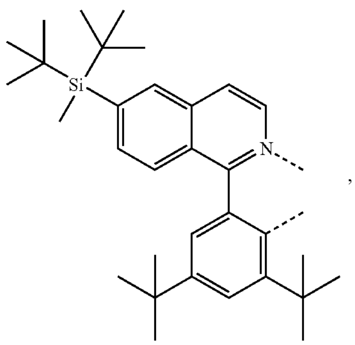
L$_{a501}$
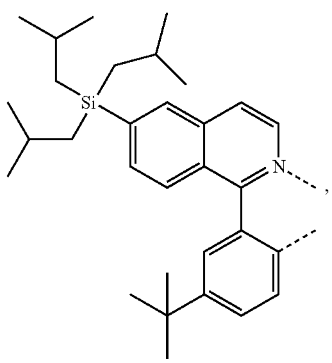
L$_{a502}$
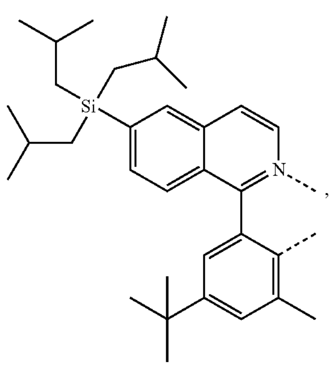
L$_{a503}$
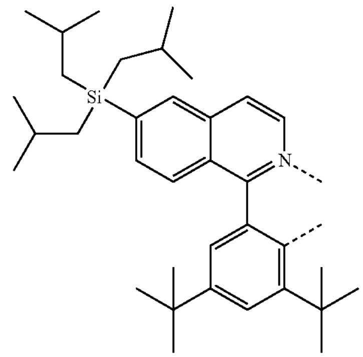
L$_{a504}$
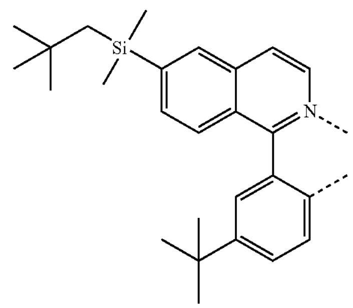
L$_{a505}$
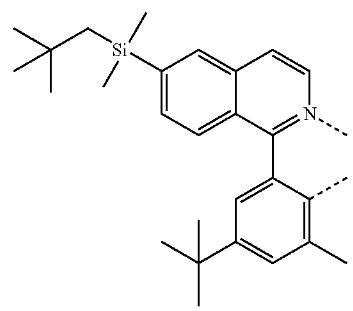
L$_{a506}$
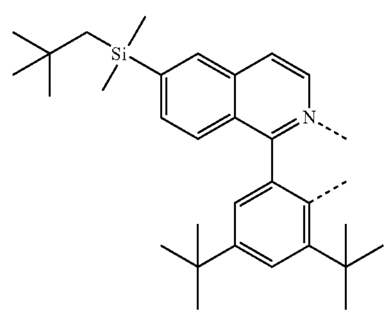
L$_{a507}$
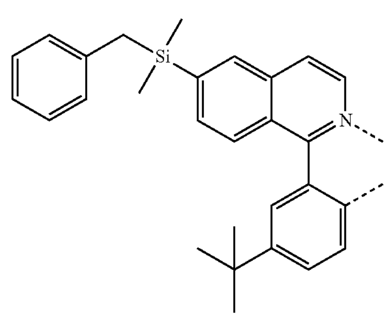

-continued
$L_{a508}$
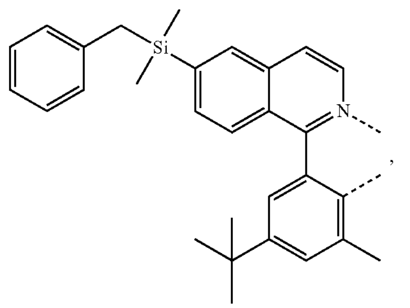
$L_{a509}$
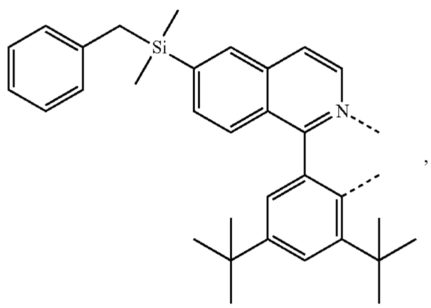
$L_{a510}$
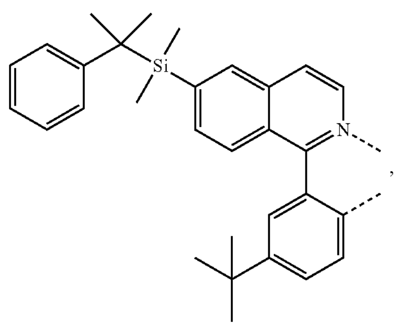
$L_{a511}$
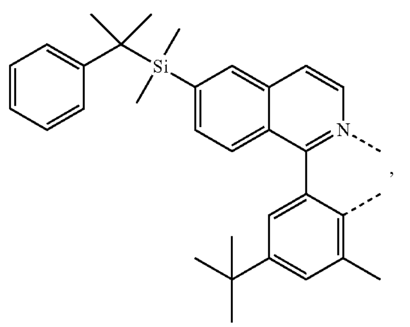
$L_{a512}$
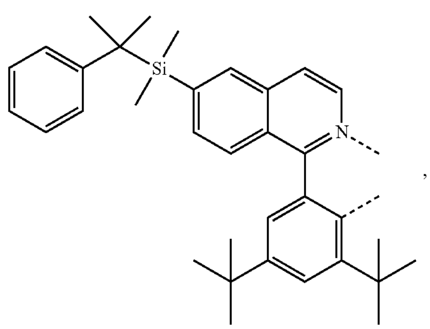
-continued
$L_{a513}$
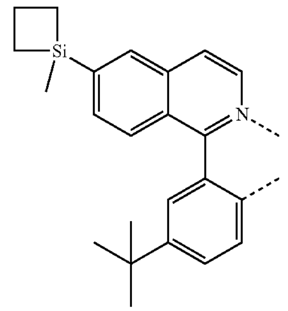
$L_{a514}$
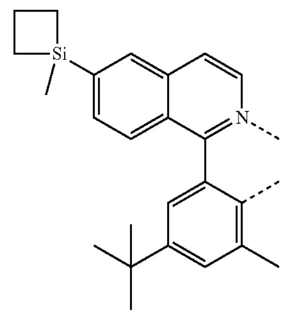
$L_{a515}$
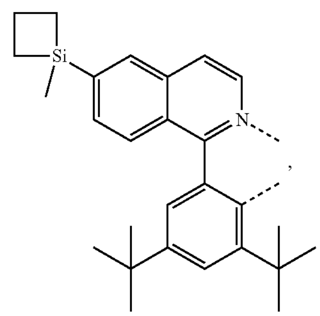
$L_{a516}$
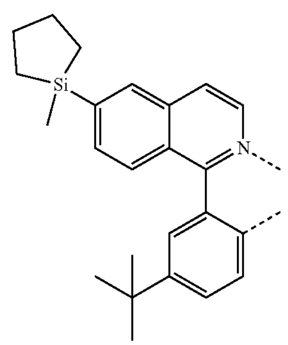
$L_{a517}$
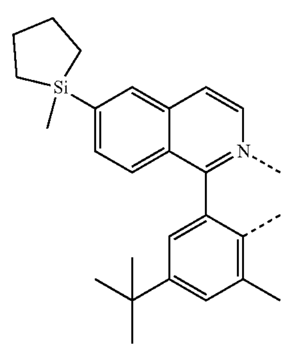

-continued
$L_{a518}$
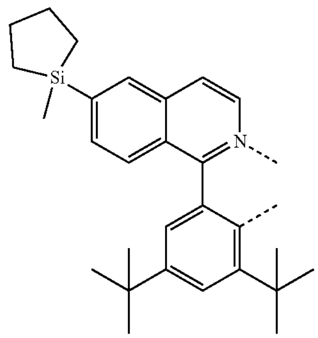
,
$L_{a519}$
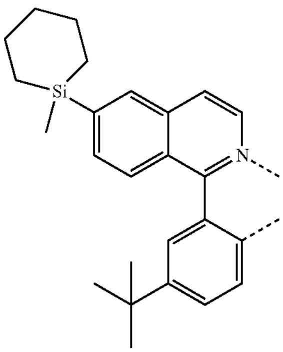
,
$L_{a520}$
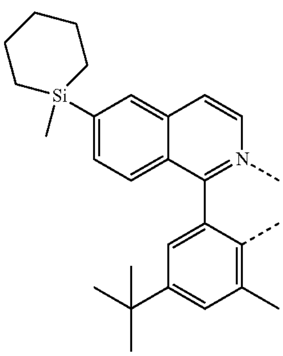
,
$L_{a521}$
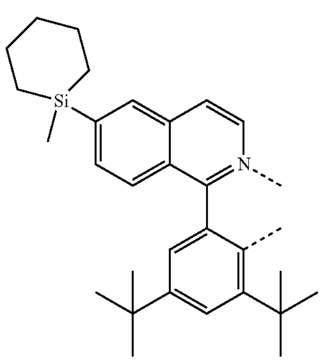
,
-continued
$L_{a522}$
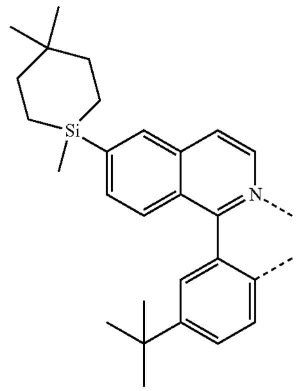
,
$L_{a523}$
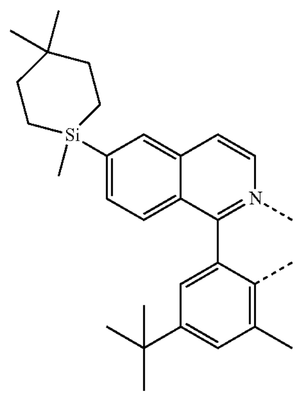
,
$L_{a524}$
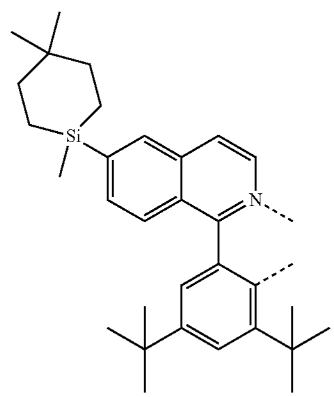
,
$L_{a525}$
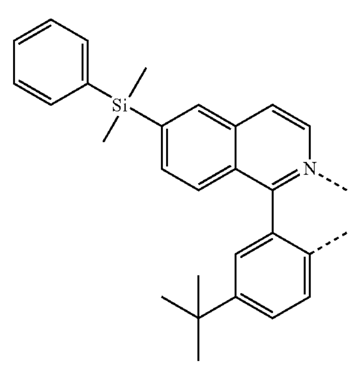
, -continued
$L_{a526}$
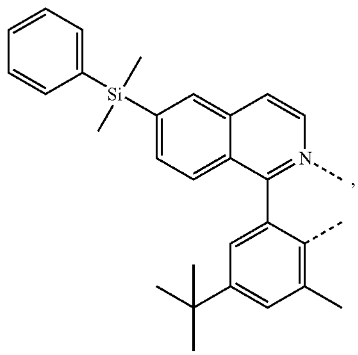
$L_{a527}$
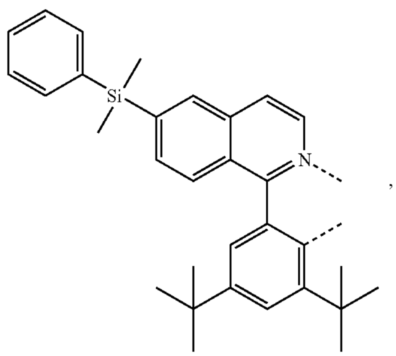
$L_{a528}$
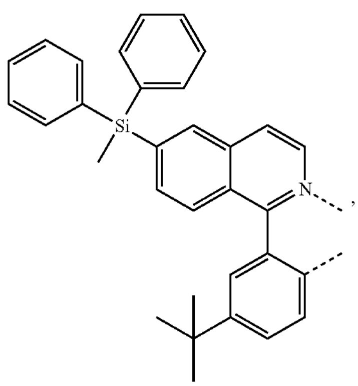
$L_{a529}$
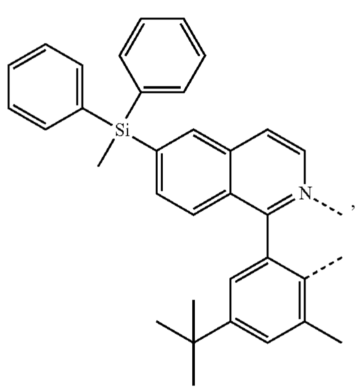
-continued
$L_{a530}$
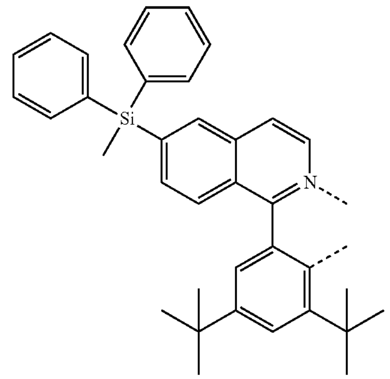
$L_{a531}$
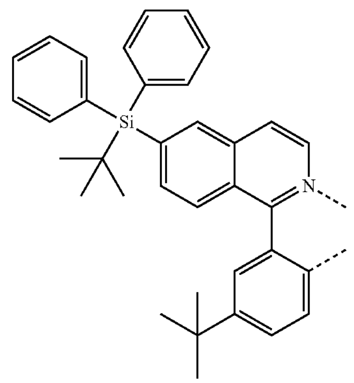
$L_{a532}$
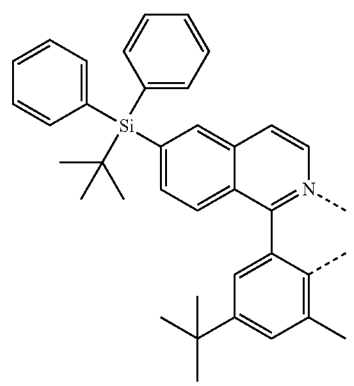
$L_{a533}$
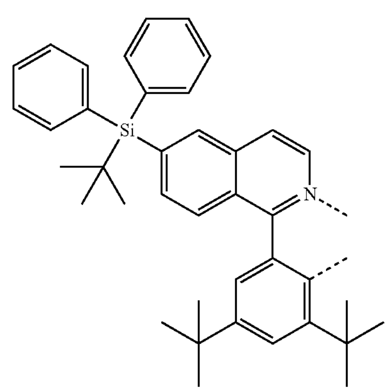

-continued
$L_{a534}$
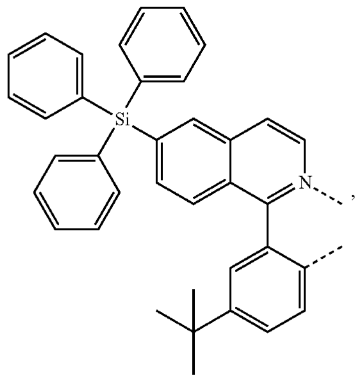
$L_{a535}$
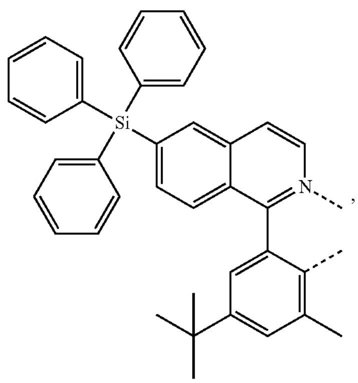
$L_{a536}$
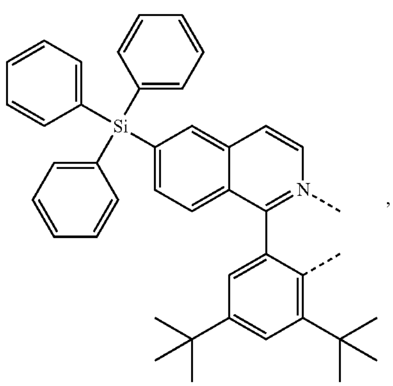
$L_{a537}$
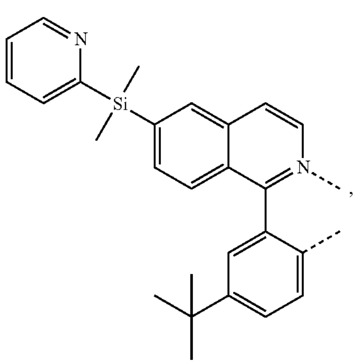
-continued
$L_{a538}$
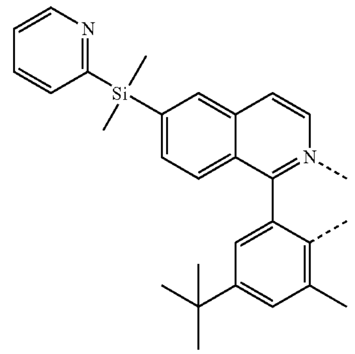
$L_{a539}$
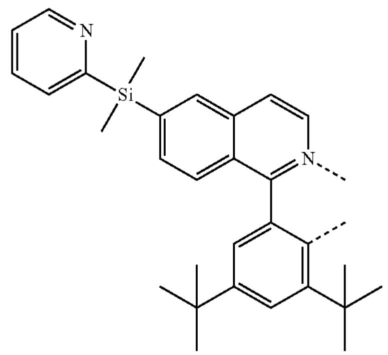
$L_{a540}$
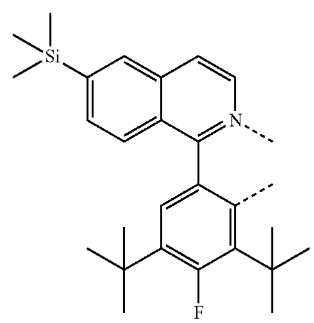
$L_{a541}$
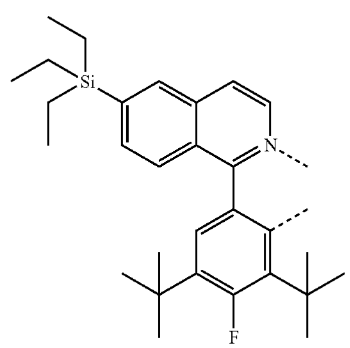

-continued
$L_{a542}$
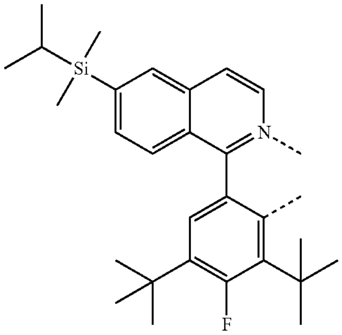
,
$L_{a543}$
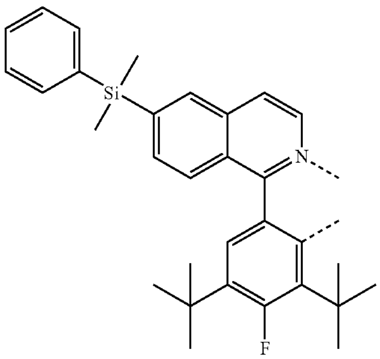
,
$L_{a544}$
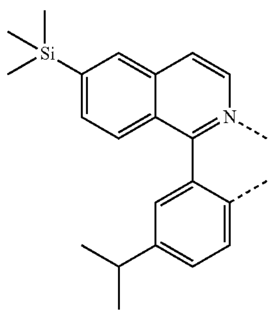
,
$L_{a545}$
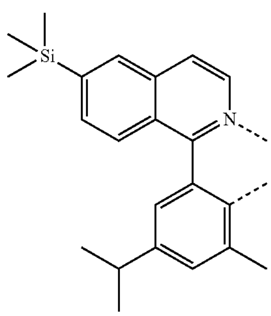
,
-continued
$L_{a546}$
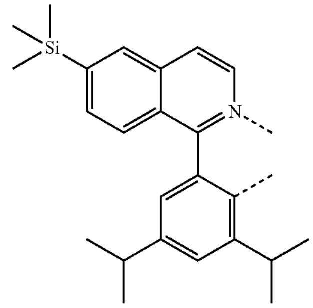
,
$L_{a547}$
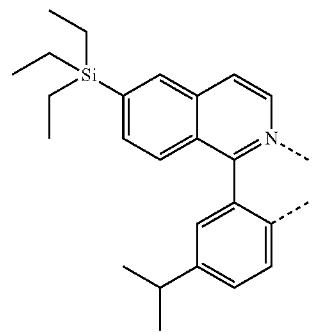
,
$L_{a548}$
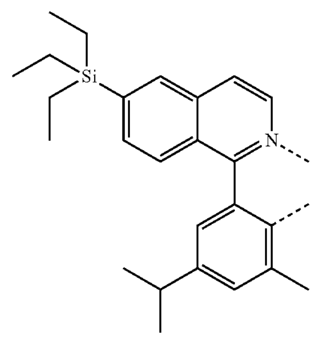
,
$L_{a549}$
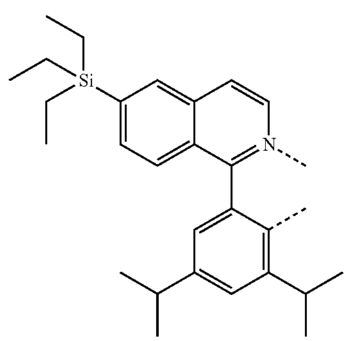
, -continued
$L_{a550}$
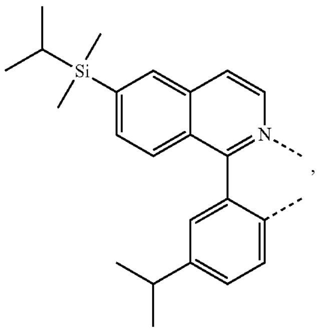
$L_{a551}$
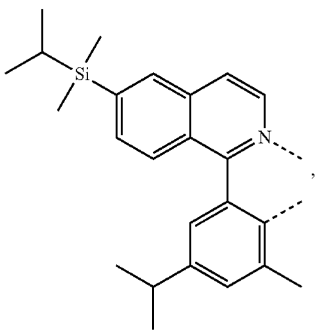
$L_{a552}$
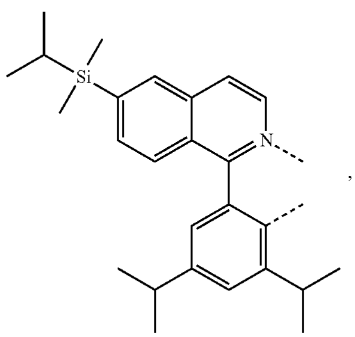
$L_{a553}$
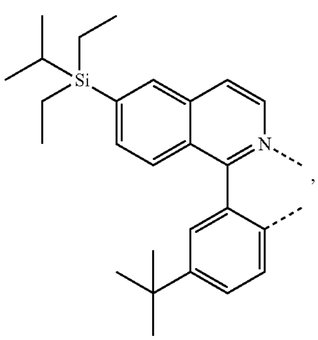
-continued
$L_{a554}$
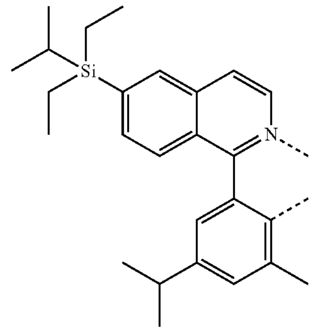
$L_{a555}$
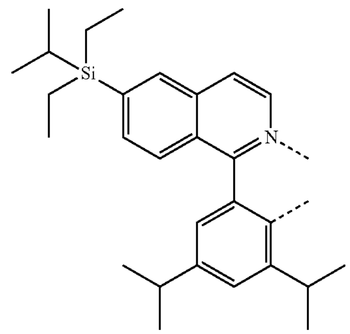
$L_{a556}$
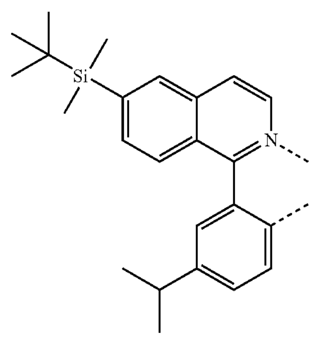
$L_{a557}$
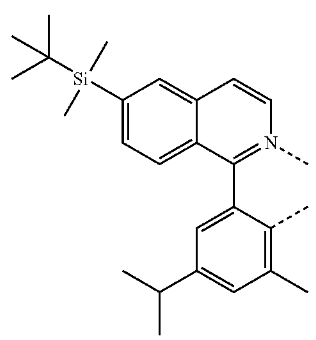

-continued
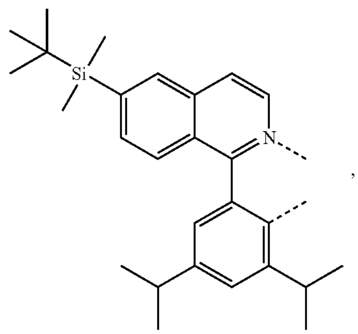
$L_{a558}$
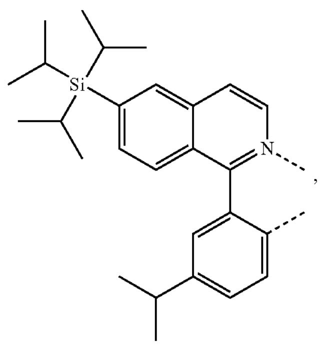
$L_{a559}$
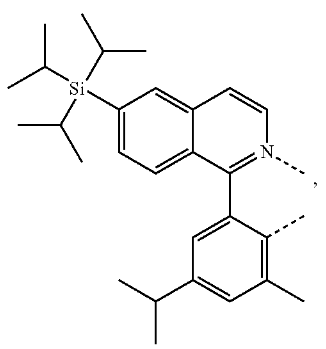
$L_{a560}$
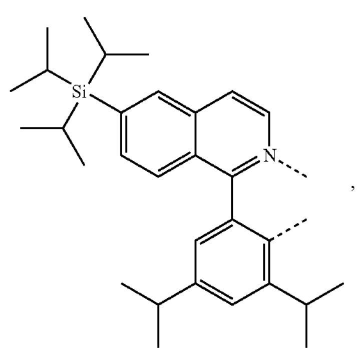
$L_{a561}$
-continued
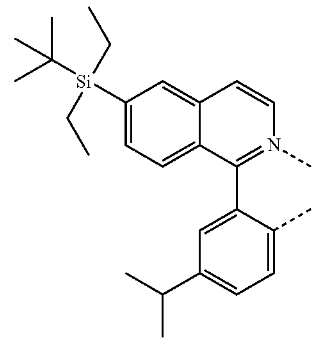
$L_{a562}$
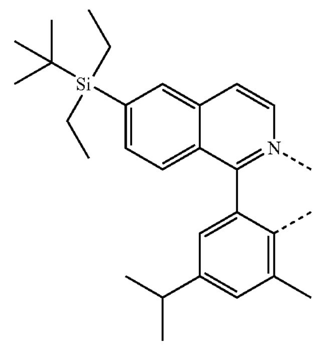
$L_{a563}$
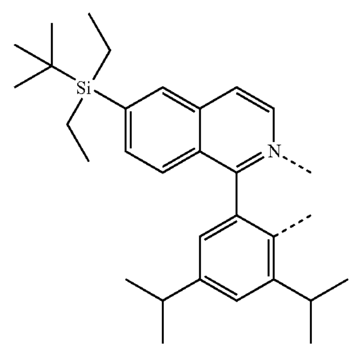
$L_{a564}$
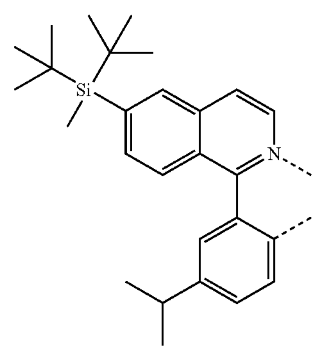
$L_{a565}$ -continued
$L_{a566}$
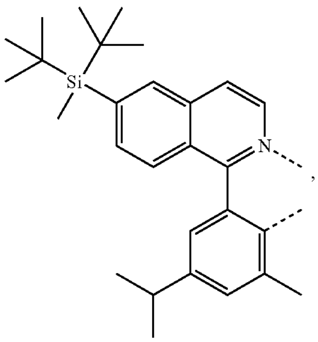
$L_{a567}$
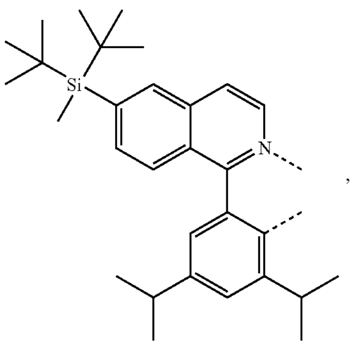
$L_{a568}$
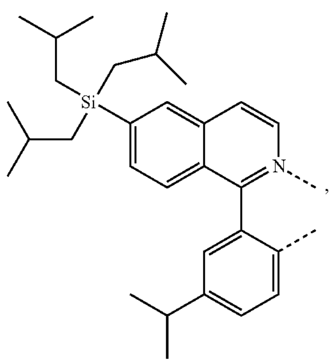
$L_{a569}$
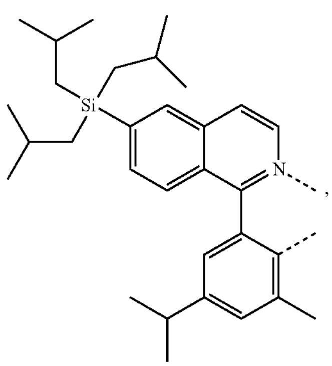
-continued
$L_{a570}$
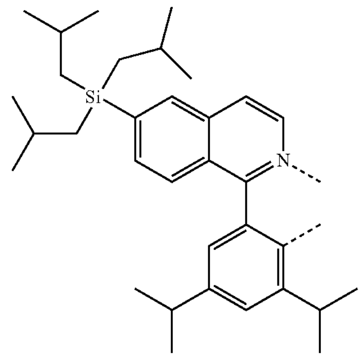
$L_{a571}$
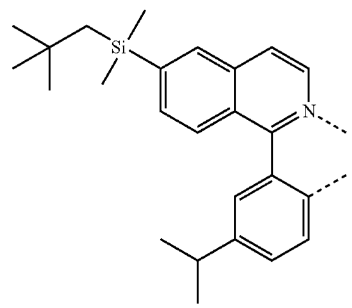
$L_{a572}$
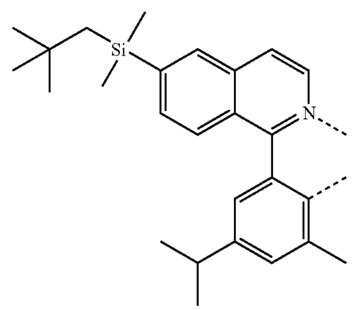
$L_{a573}$
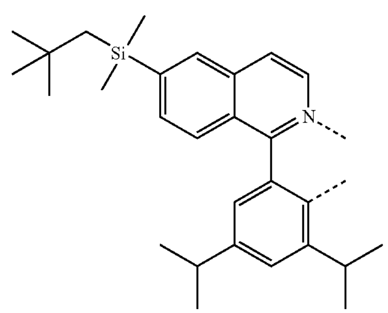
$L_{a574}$
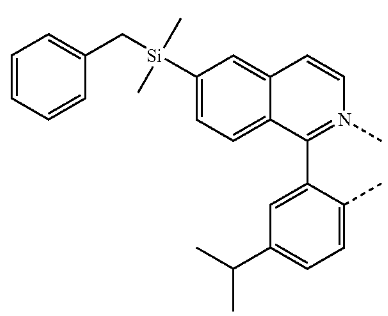

-continued
$L_{a575}$
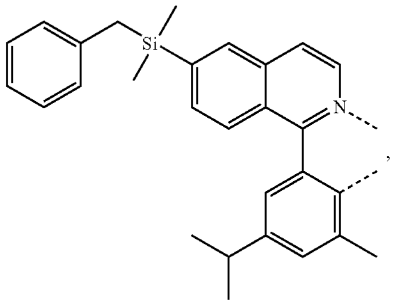
$L_{a576}$
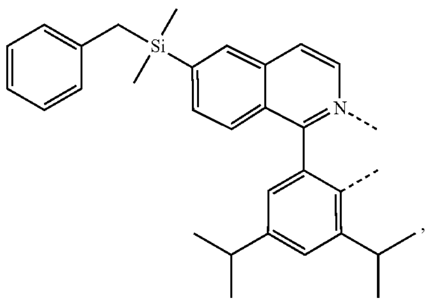
$L_{a577}$
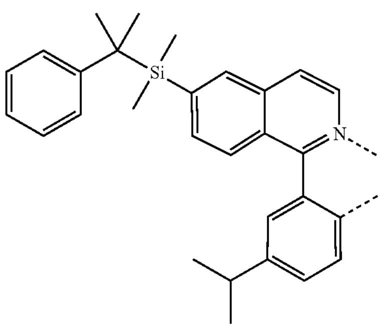
$L_{a578}$
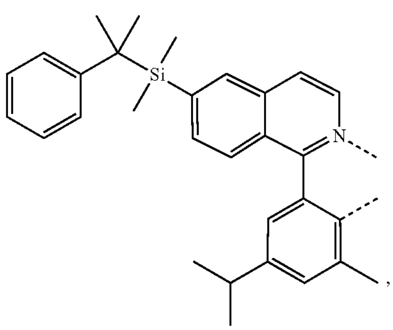
-continued
$L_{a579}$
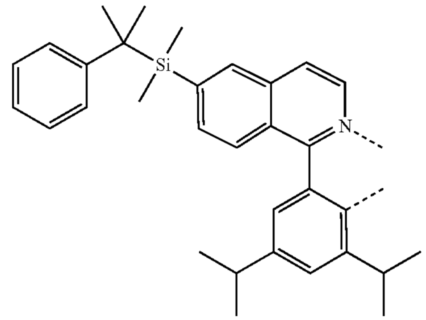
$L_{a580}$
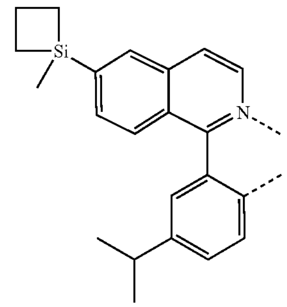
$L_{a581}$
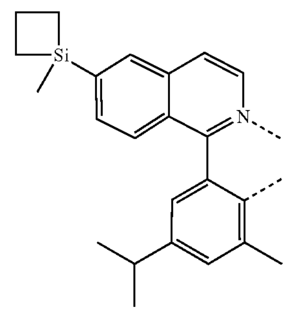
$L_{a582}$
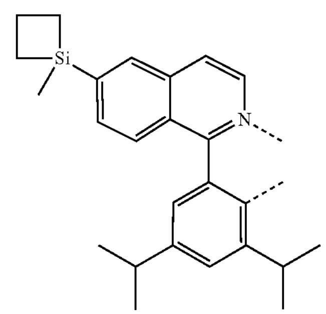
$L_{a583}$
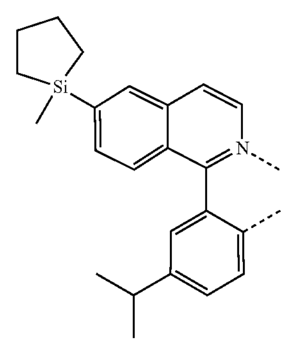

-continued
$L_{a584}$
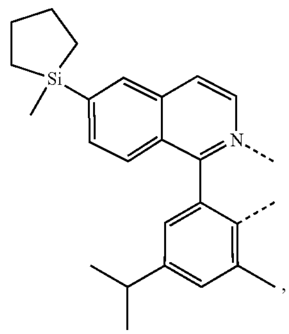
$L_{a585}$
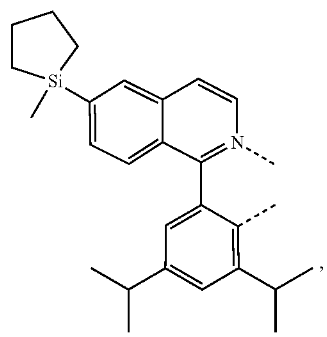
$L_{a586}$
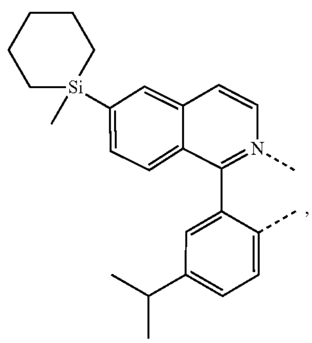
$L_{a587}$
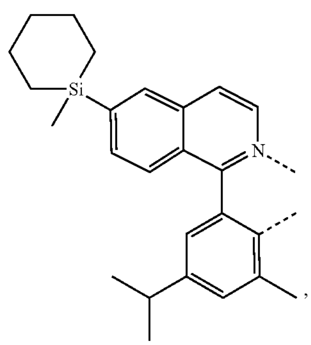
-continued
$L_{a588}$
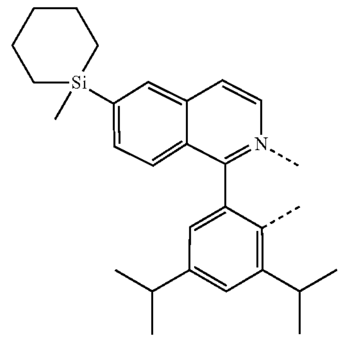
$L_{a589}$
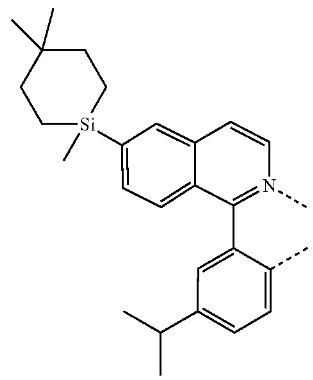
$L_{a590}$
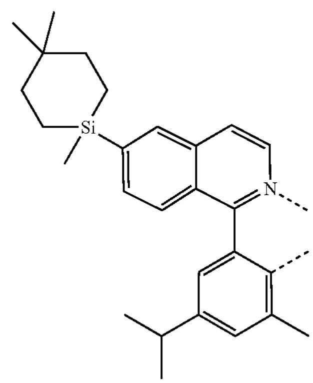
$L_{a591}$
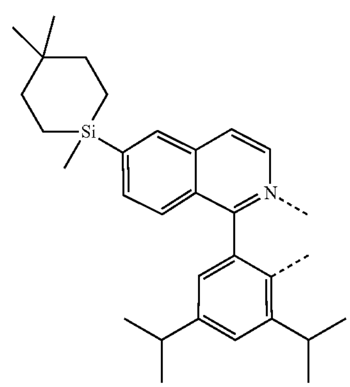

-continued
$L_{a592}$
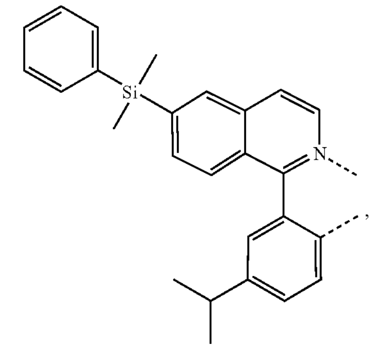
$L_{a593}$
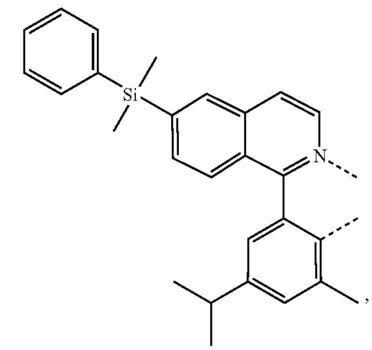
$L_{a594}$
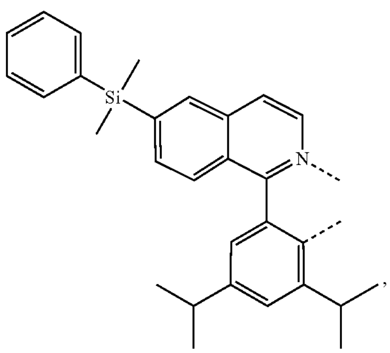
$L_{a595}$
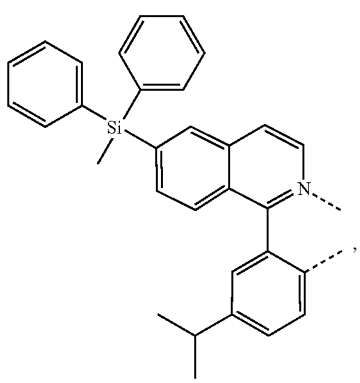
-continued
$L_{a596}$
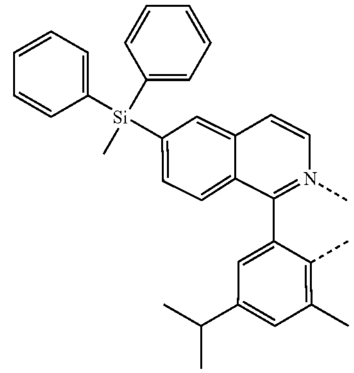
$L_{a597}$
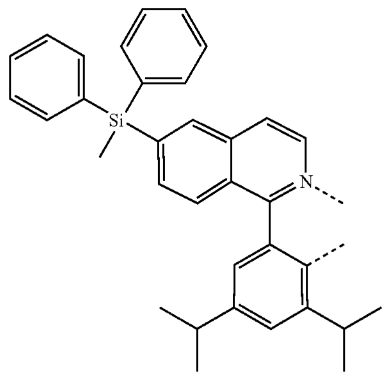
$L_{a598}$
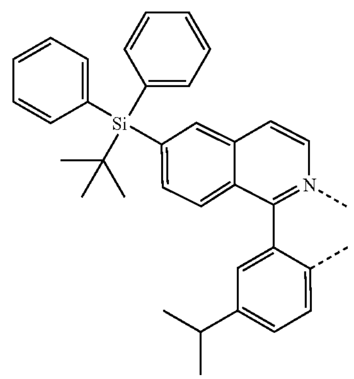
$L_{a599}$
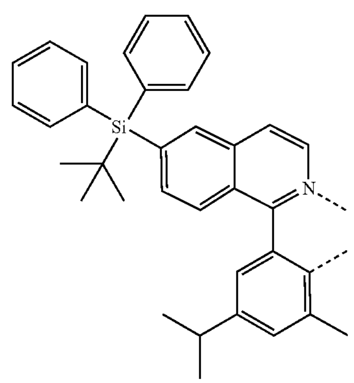

-continued
$L_{a600}$
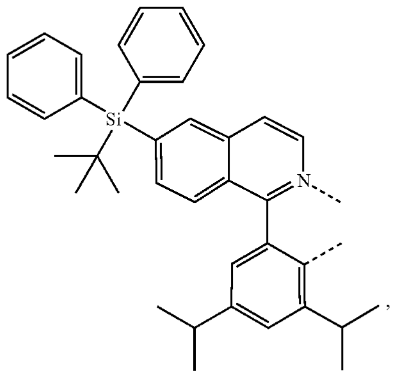
$L_{a601}$
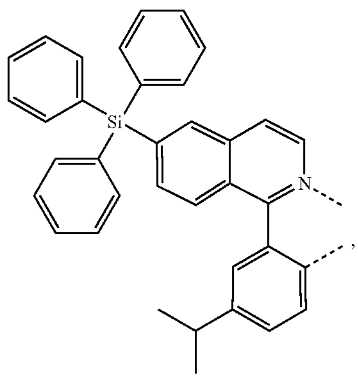
$L_{a602}$
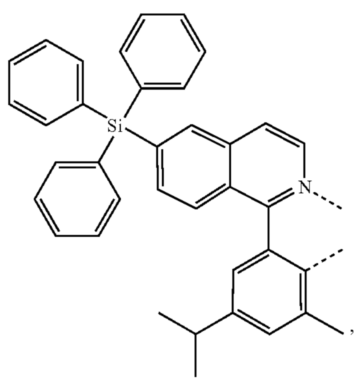
$L_{a603}$
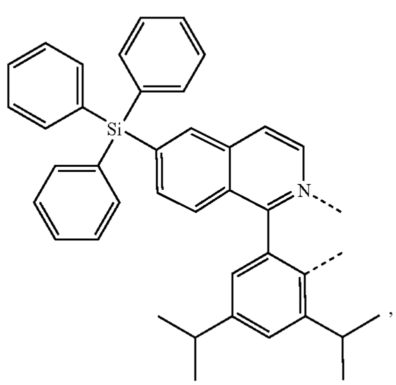
-continued
$L_{a604}$
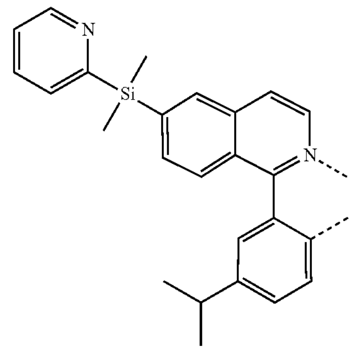
$L_{a605}$
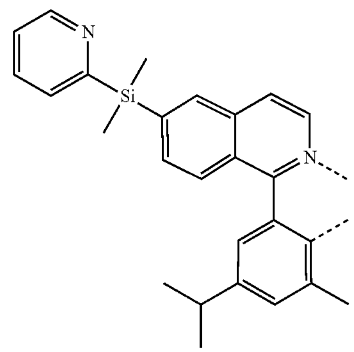
$L_{a606}$
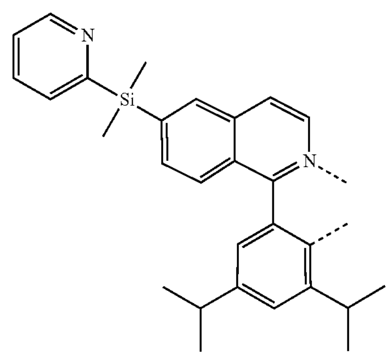
$L_{a607}$
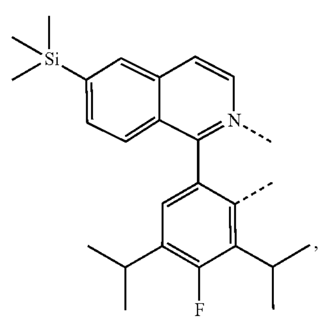

$L_{a608}$
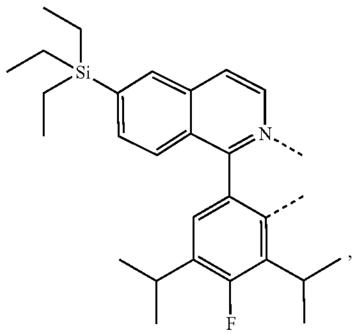
$L_{a609}$
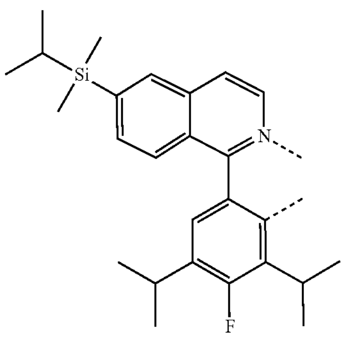
$L_{a610}$
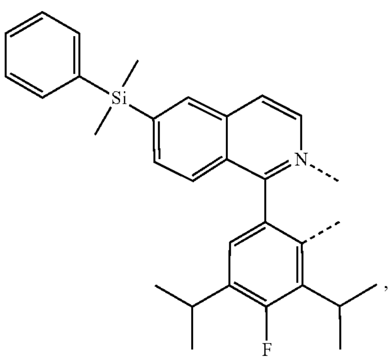
$L_{a611}$
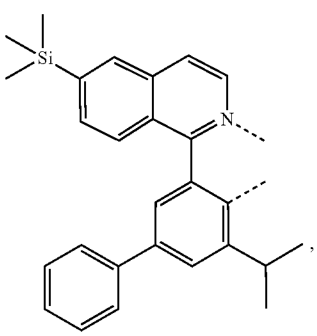
$L_{a612}$
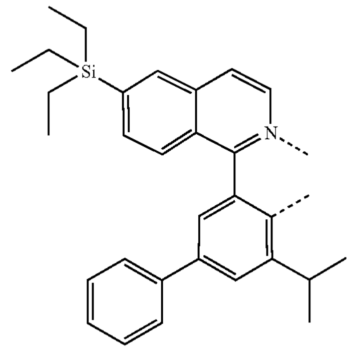
$L_{a613}$
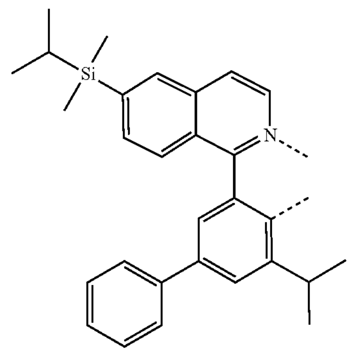
$L_{a614}$
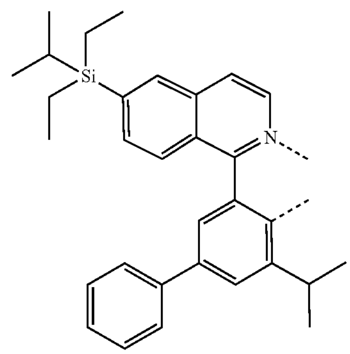
$L_{a615}$
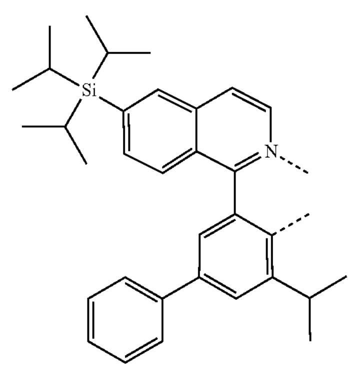

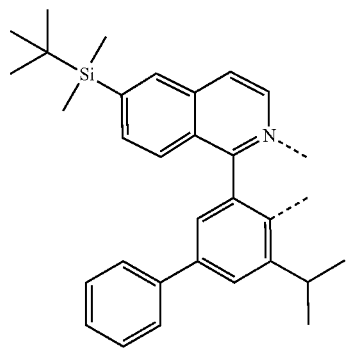
$L_{a616}$
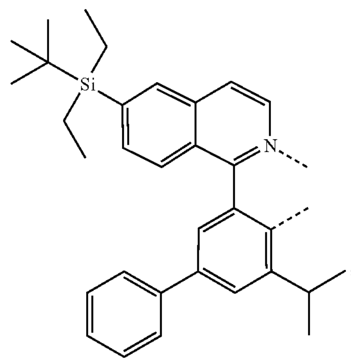
$L_{a617}$
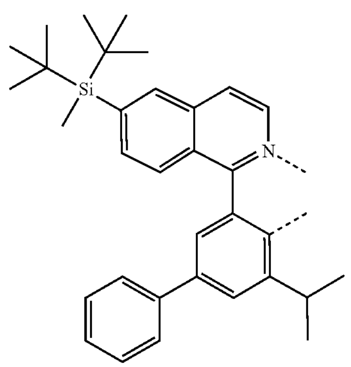
$L_{a618}$
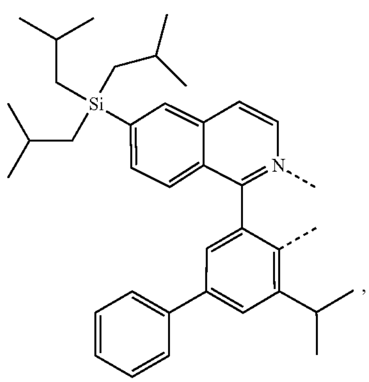
$L_{a619}$
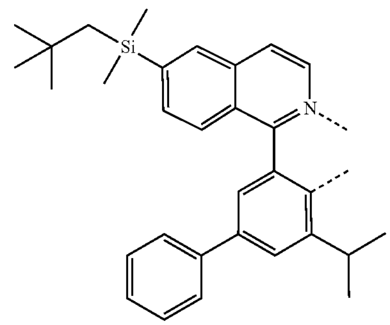
$L_{a620}$
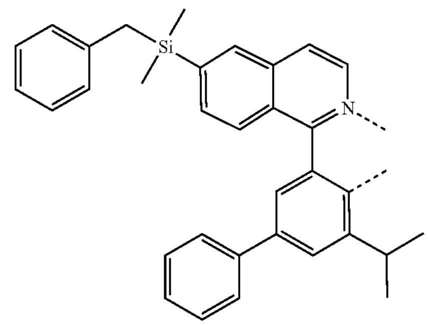
$L_{a621}$
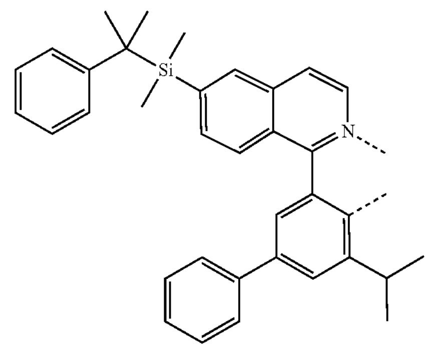
$L_{a622}$
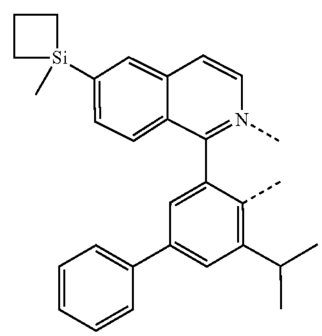
$L_{a623}$ -continued
$L_{a624}$
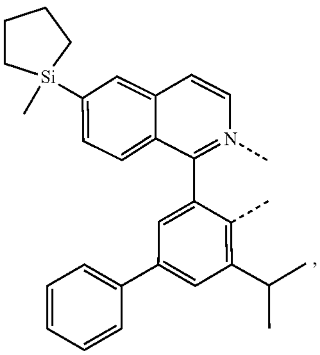
$L_{a625}$
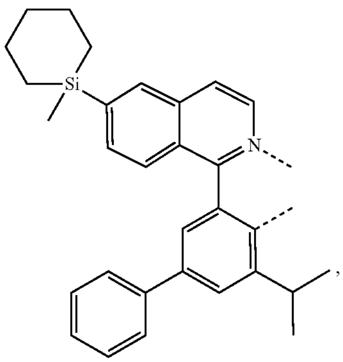
$L_{a626}$
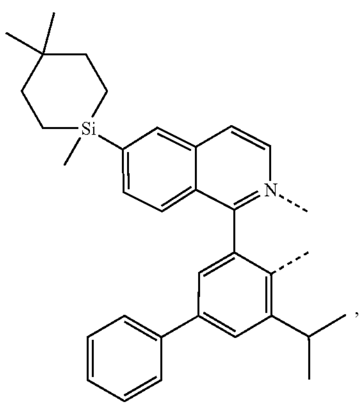
$L_{a627}$
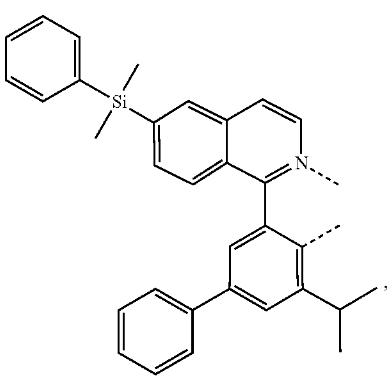
-continued
$L_{a628}$
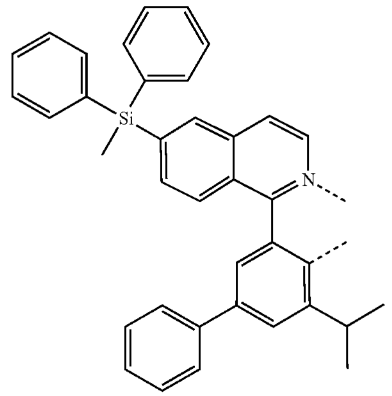
$L_{a629}$
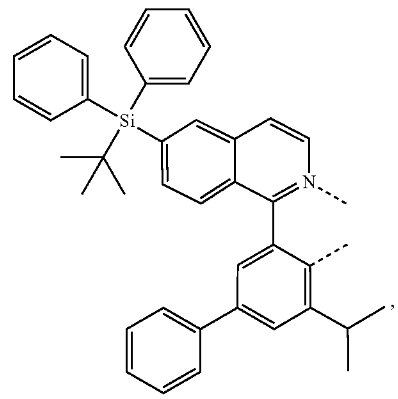
$L_{a630}$
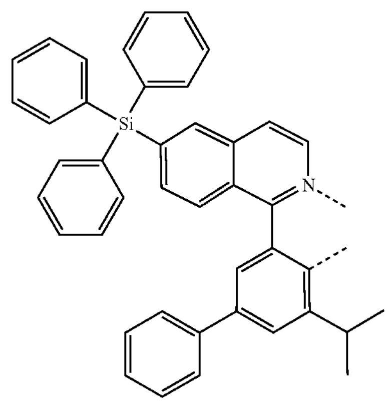
$L_{a631}$
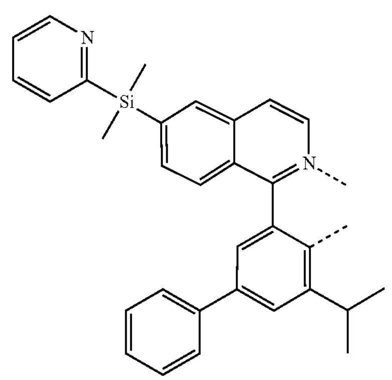

-continued
$L_{a632}$
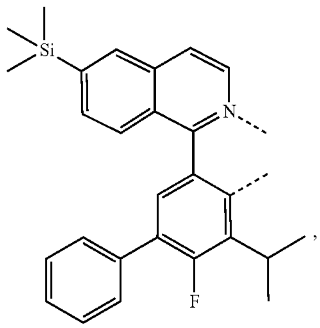
$L_{a633}$
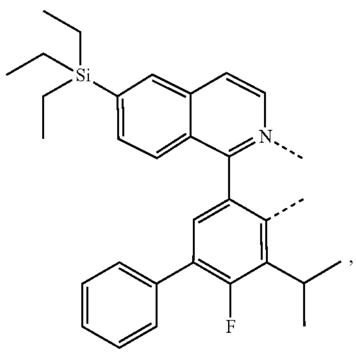
$L_{a634}$
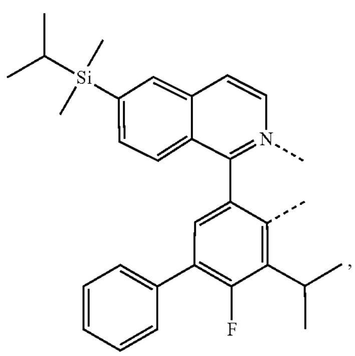
$L_{a635}$
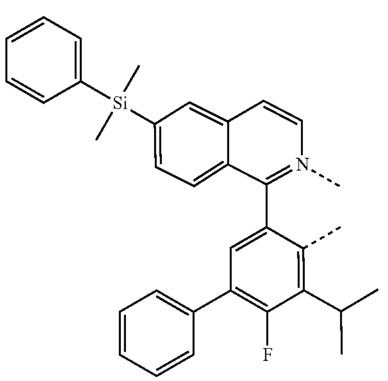
-continued
$L_{a636}$
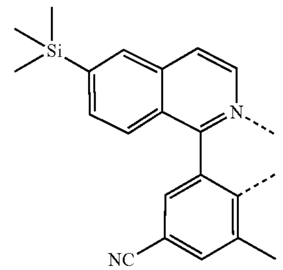
$L_{a637}$
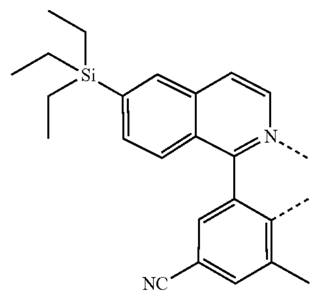
$L_{a638}$
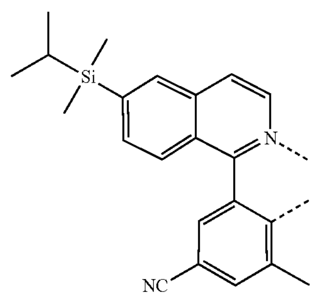
$L_{a639}$
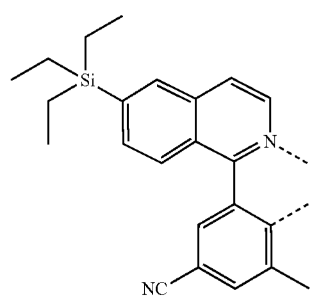
$L_{a640}$
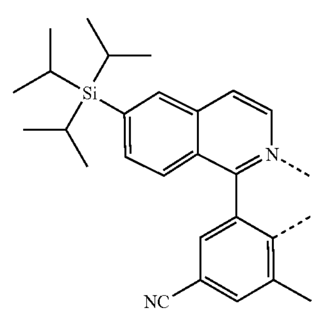

-continued
$L_{a641}$
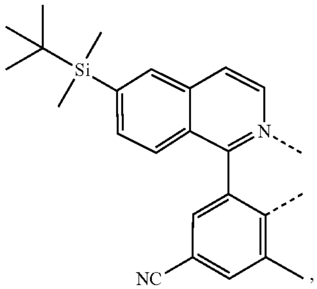
$L_{a642}$
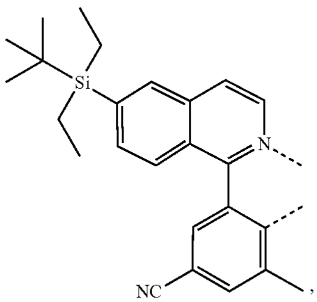
$L_{a643}$
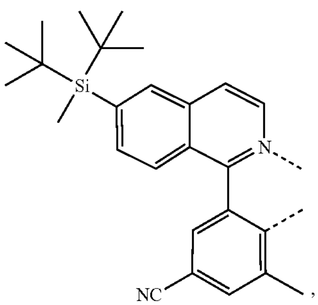
$L_{a644}$
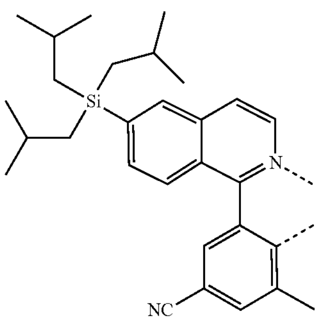
$L_{a645}$
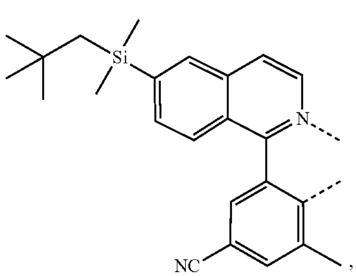
-continued
$L_{a646}$
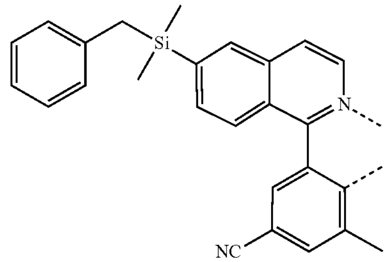
$L_{a647}$
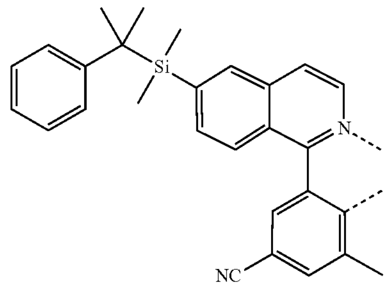
$L_{a648}$
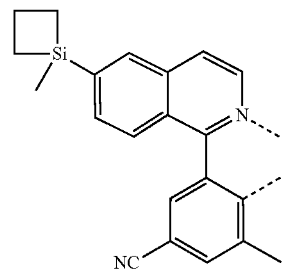
$L_{a649}$
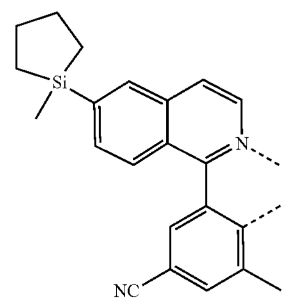
$L_{a650}$
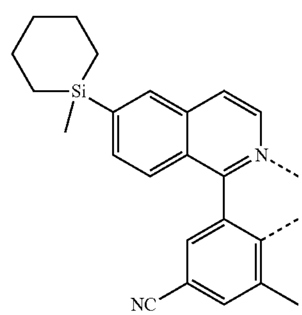
, -continued
$L_{a651}$
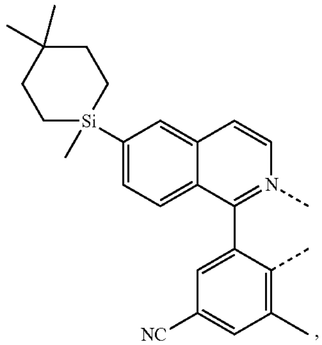
$L_{a652}$
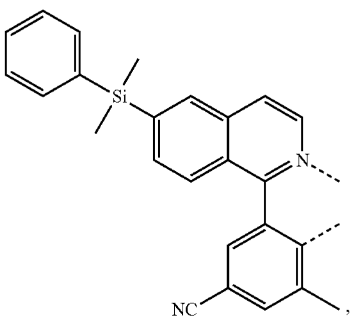
$L_{a653}$
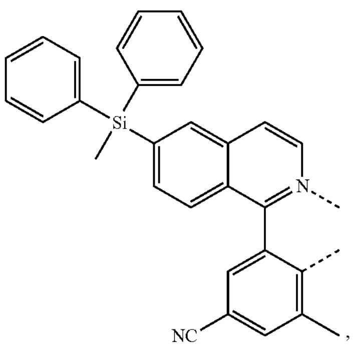
$L_{a654}$
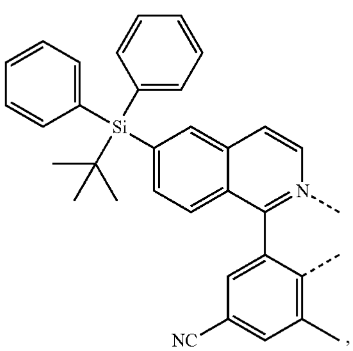
-continued
$L_{a655}$
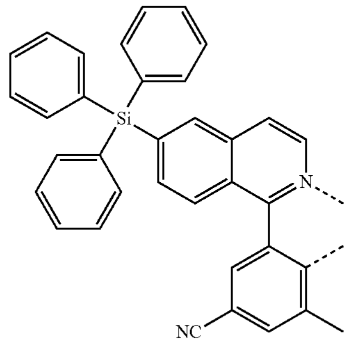
$L_{a656}$
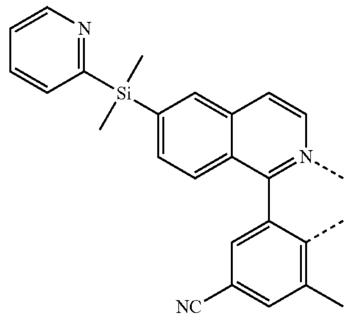
$L_{a657}$
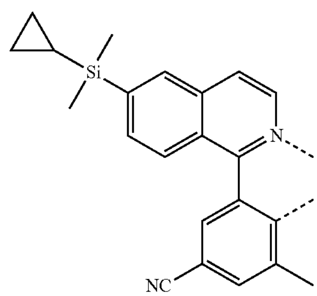
$L_{a658}$
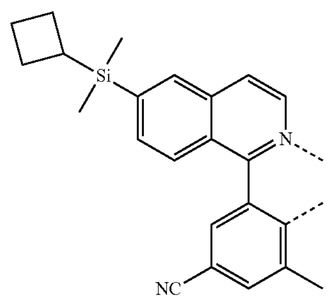
$L_{a659}$
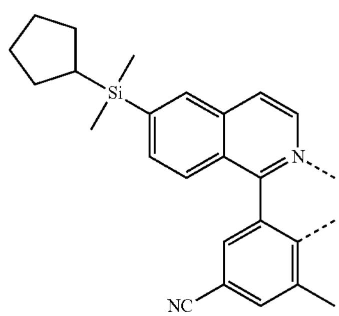

-continued
$L_{a660}$
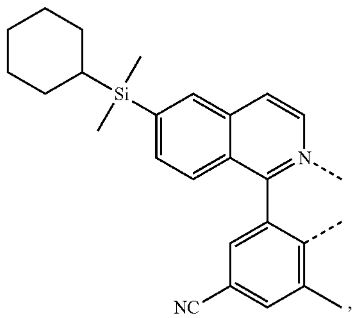
$L_{a661}$
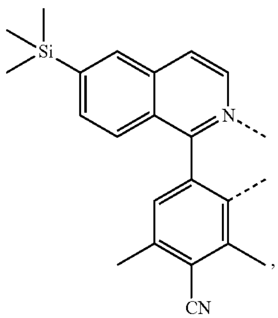
$L_{a662}$
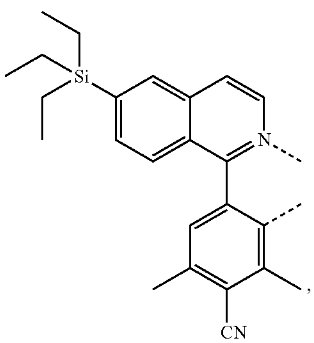
$L_{a663}$
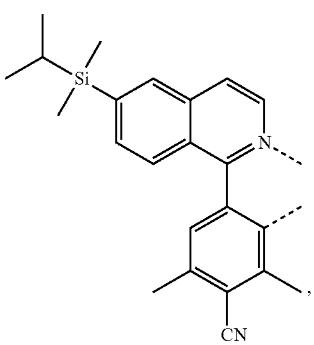
-continued
$L_{a664}$
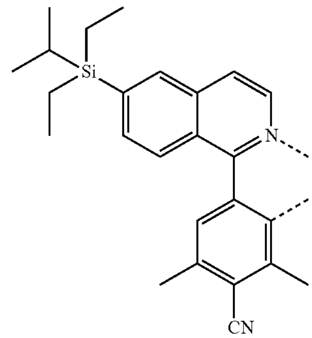
$L_{a665}$
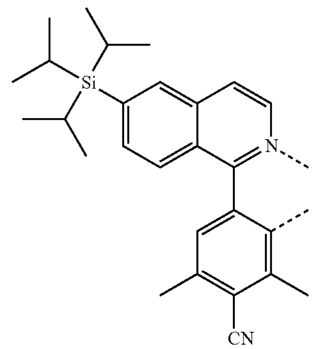
$L_{a666}$
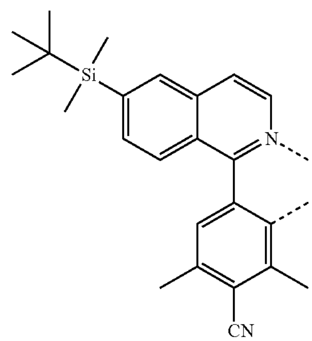
$L_{a667}$
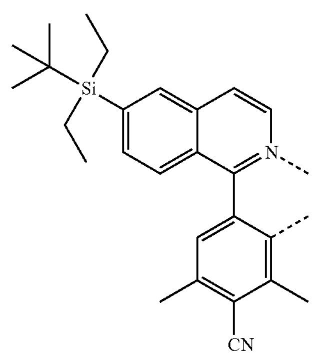

-continued
$L_{a668}$
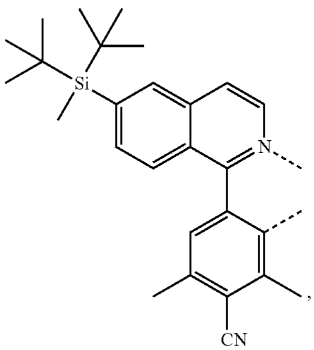
$L_{a669}$
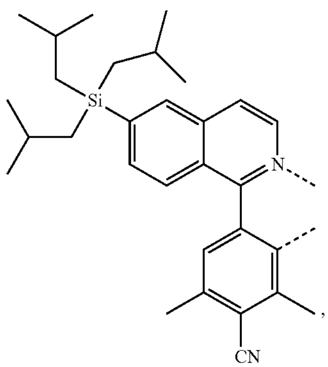
$L_{a670}$
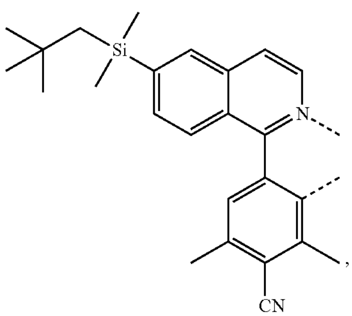
$L_{a671}$
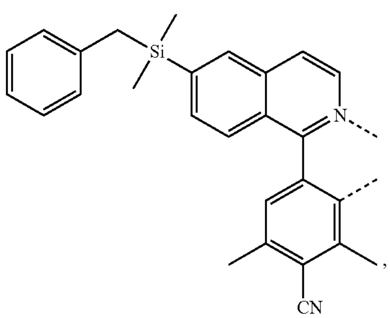
-continued
$L_{a672}$
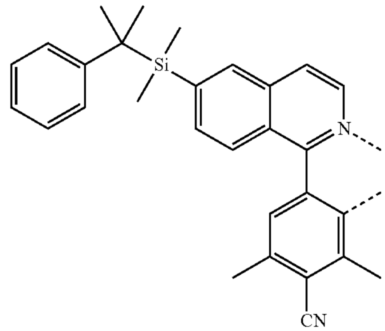
$L_{a673}$
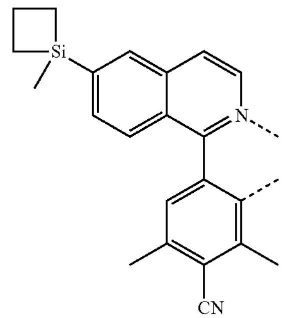
$L_{a674}$
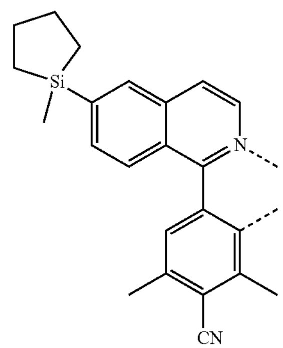
$L_{a675}$
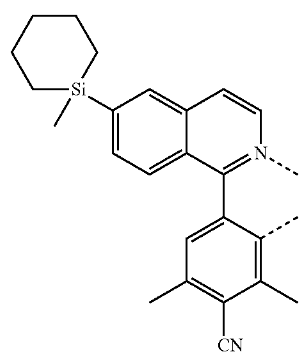

-continued
$L_{a676}$
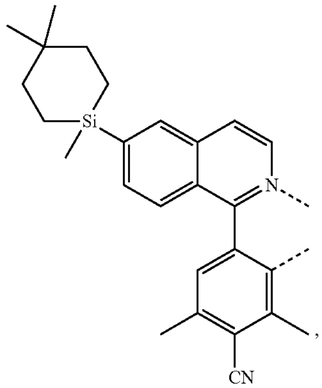
$L_{a677}$
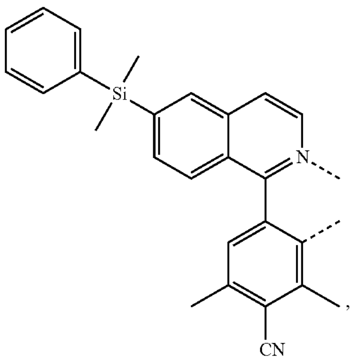
$L_{a678}$
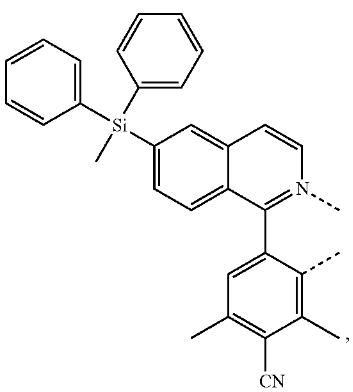
$L_{a679}$
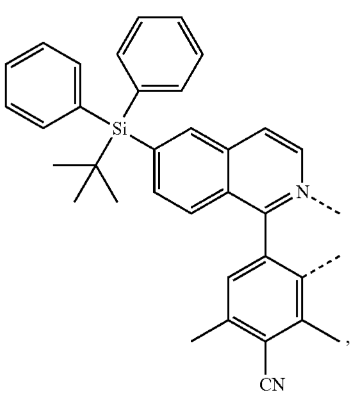
-continued
$L_{a680}$
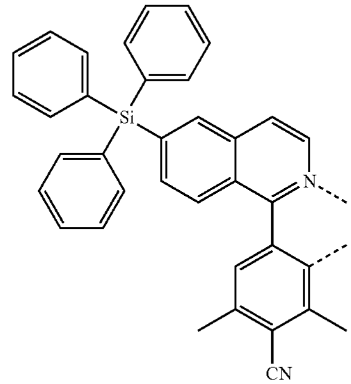
$L_{a681}$
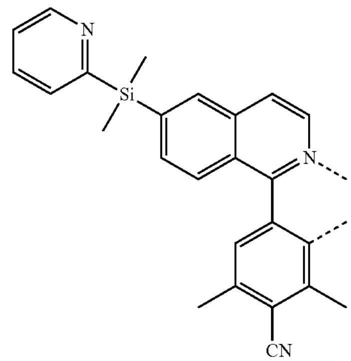
$L_{a682}$
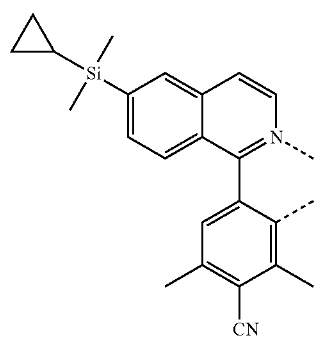
$L_{a683}$
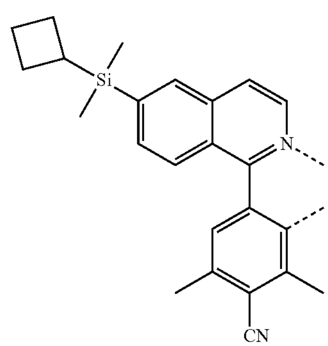

$L_{a684}$
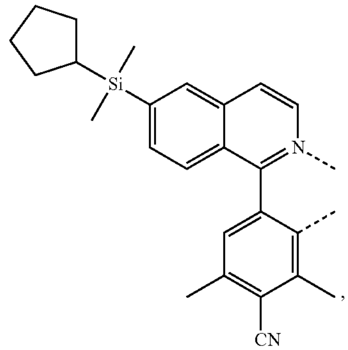
$L_{a685}$
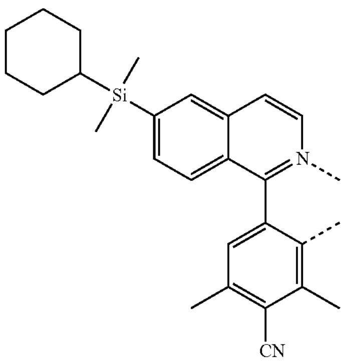
$L_{a686}$
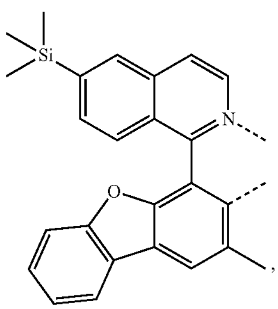
$L_{a687}$
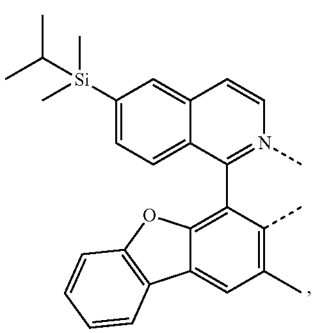
$L_{a688}$
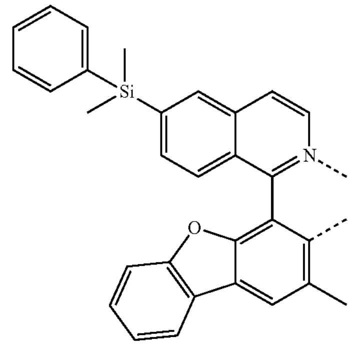
$L_{a689}$
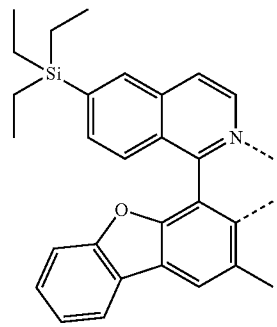
$L_{a690}$
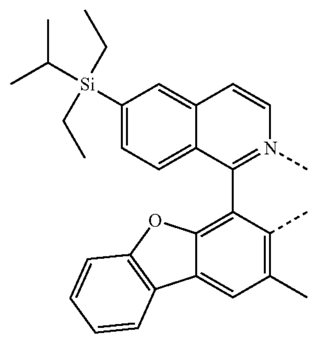
$L_{a691}$
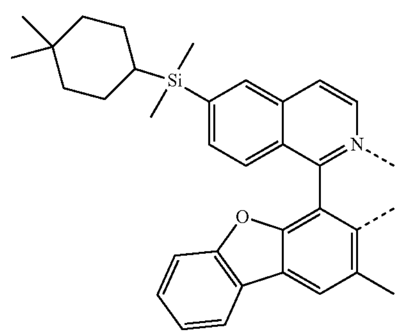

$L_{a692}$

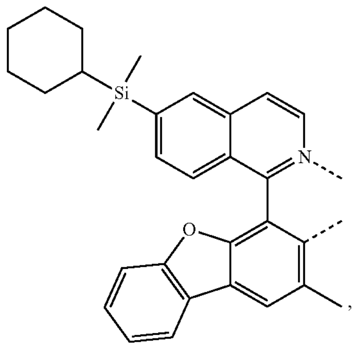

$L_{a693}$

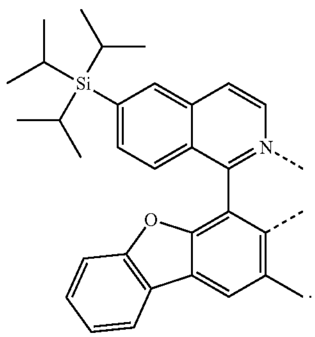

8. The metal complex of claim 1, wherein in Formula 2, $R_t$ to $R_z$ are each independently selected from the group consisting of: hydrogen, deuterium, halogen, substituted or unsubstituted alkyl having 1 to 20 carbon atoms, substituted or unsubstituted cycloalkyl having 3 to 20 ring carbon atoms, and combinations thereof.

9. The metal complex of claim 1, wherein $L_b$ has any one structure or any two structures independently selected from the group consisting of $L_{b1}$ to $L_{b365}$:

$L_{b1}$

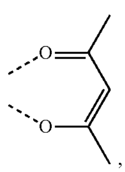

$L_{b2}$

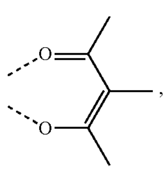

$L_{b3}$

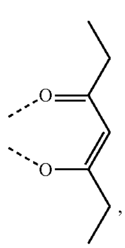

$L_{b4}$

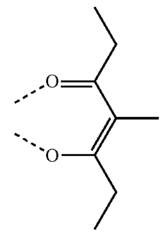

$L_{b5}$

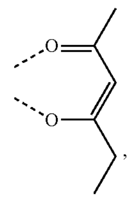

$L_{b6}$

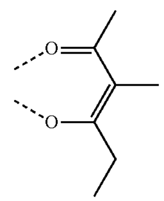

$L_{b7}$

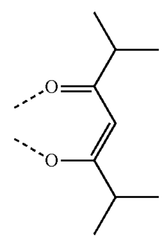

$L_{b8}$

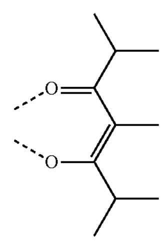

$L_{b9}$

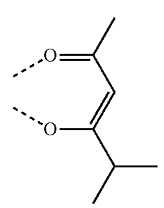

$L_{b10}$

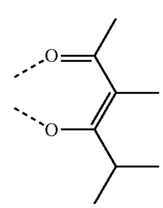

-continued
$L_{b11}$
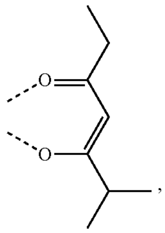
$L_{b12}$
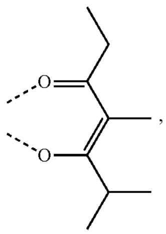
$L_{b13}$
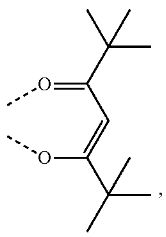
$L_{b14}$
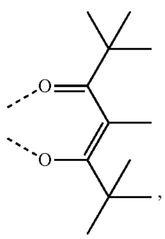
$L_{b15}$
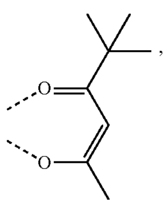
$L_{b16}$
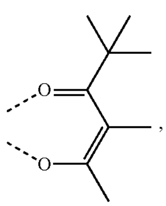
$L_{b17}$
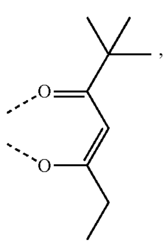
-continued
$L_{b18}$
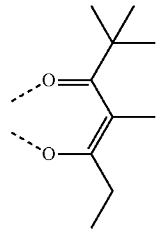
$L_{b19}$
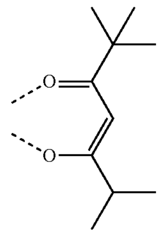
$L_{b20}$
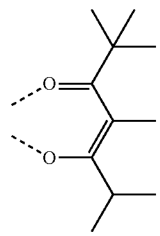
$L_{b21}$
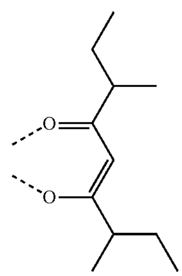
$L_{b22}$
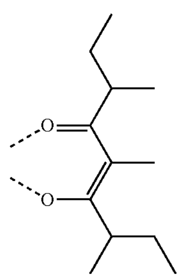
$L_{b23}$
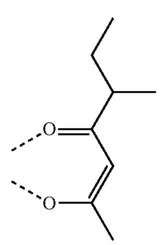

Lb24
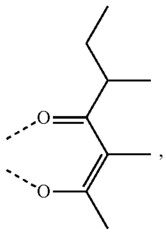
Lb25
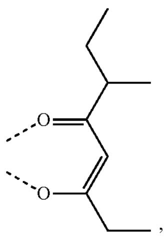
Lb26
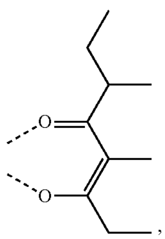
Lb27
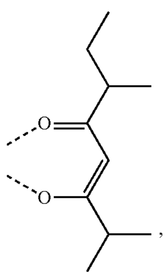
Lb28
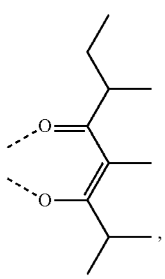
Lb29
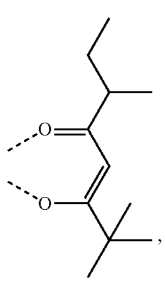
Lb30
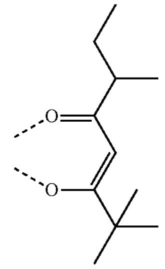
Lb31
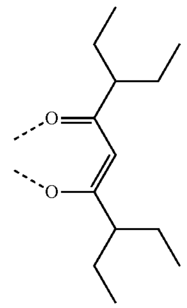
Lb32
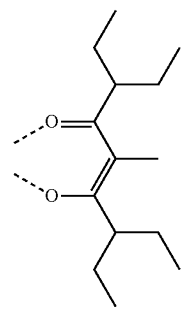
Lb33
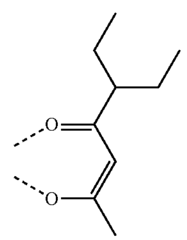
Lb34
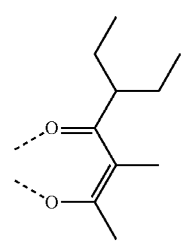
Lb35
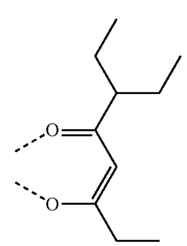

-continued
$L_{b36}$
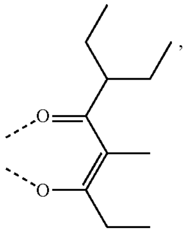
$L_{b37}$
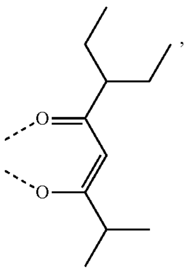
$L_{b38}$
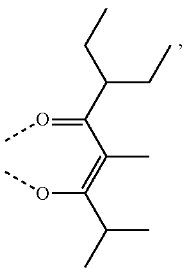
$L_{b39}$
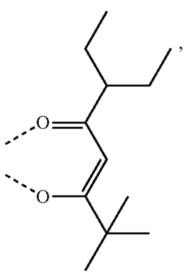
$L_{b40}$
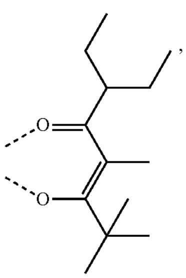
$L_{b41}$
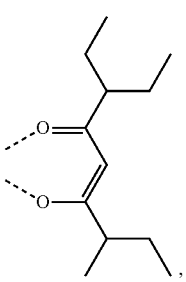
-continued
$L_{b42}$
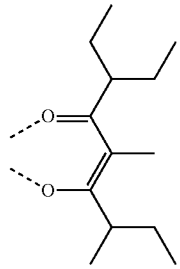
$L_{b43}$
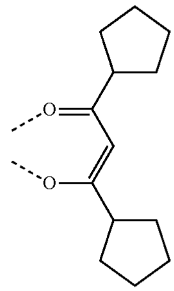
$L_{b44}$
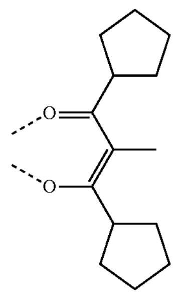
$L_{b45}$
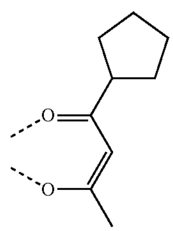
$L_{b46}$
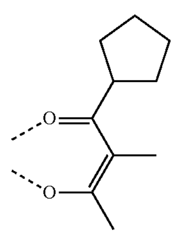
$L_{b47}$
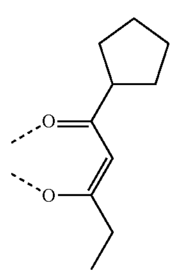

$L_{b48}$
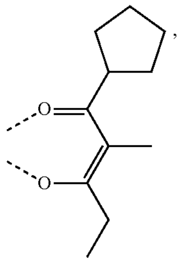
$L_{b49}$
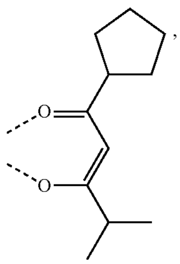
$L_{b50}$
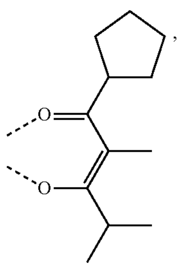
$L_{b51}$
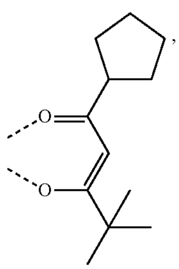
$L_{b52}$
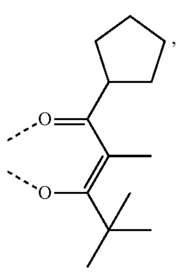
$L_{b53}$
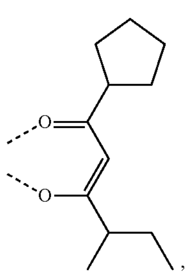
$L_{b54}$
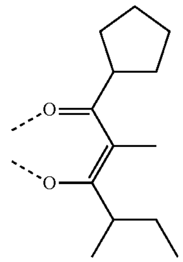
$L_{b55}$
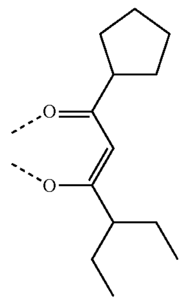
$L_{b56}$
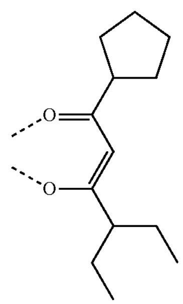
$L_{b57}$
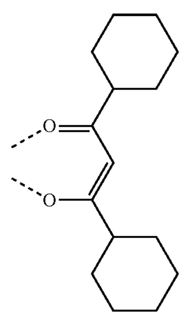
$L_{b58}$
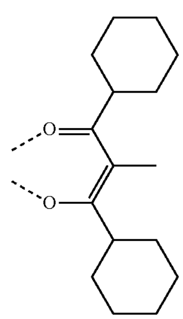

-continued
$L_{b59}$
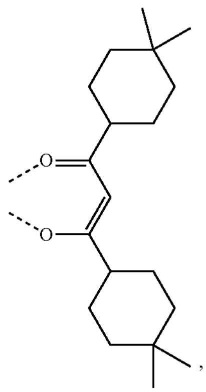
$L_{b60}$
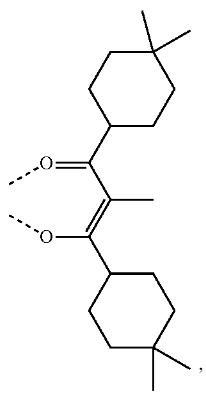
$L_{b61}$
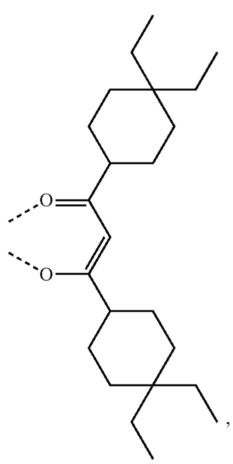
-continued
$L_{b62}$
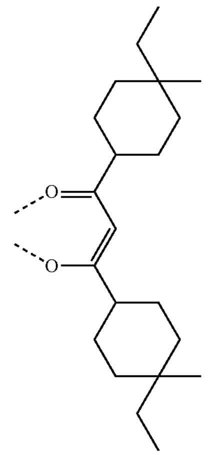
$L_{b63}$
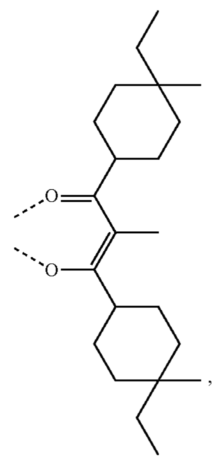
$L_{b64}$
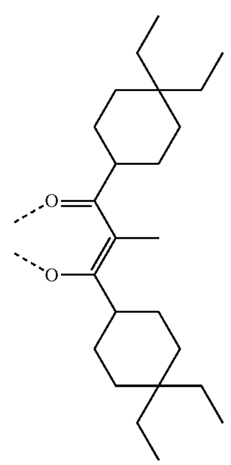
$L_{b65}$
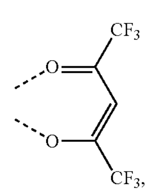

$L_{b66}$
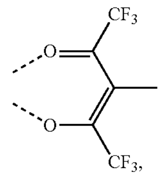
$L_{b67}$
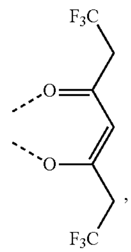
$L_{b68}$
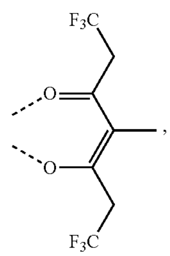
$L_{b69}$
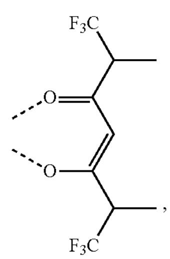
$L_{b70}$
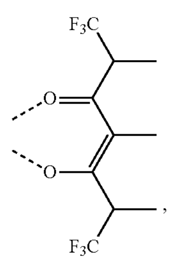
$L_{b71}$
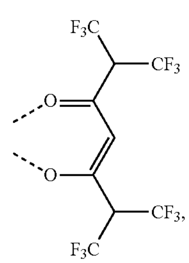
$L_{b72}$
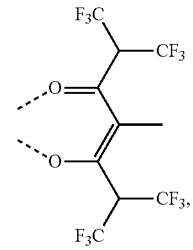
$L_{b73}$
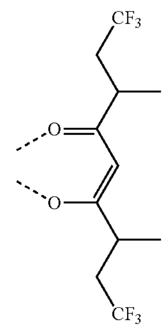
$L_{b74}$
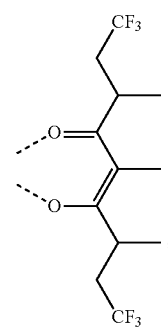
$L_{b75}$
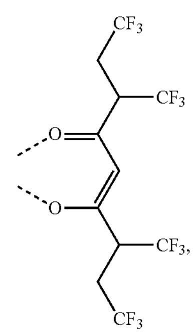
$L_{b76}$
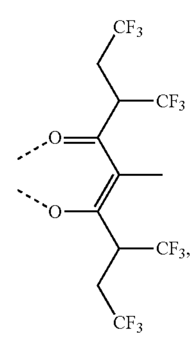

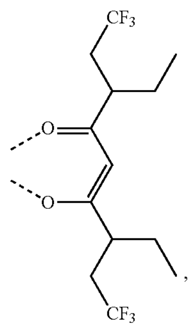
$L_{b77}$
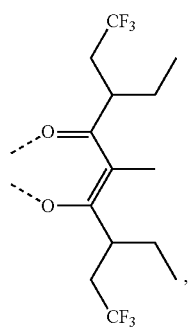
$L_{b78}$
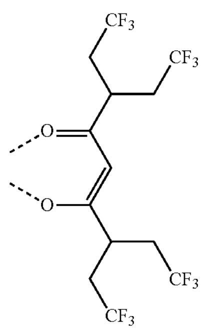
$L_{b79}$
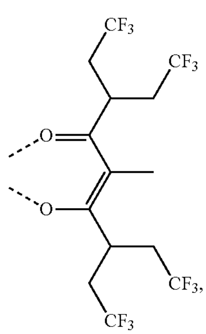
$L_{b80}$
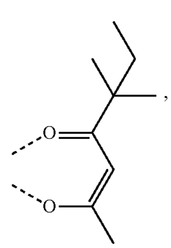
$L_{b81}$
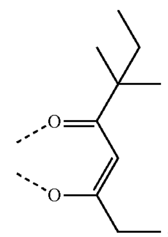
$L_{b82}$
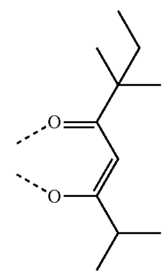
$L_{b83}$
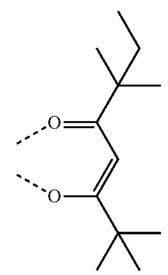
$L_{b84}$
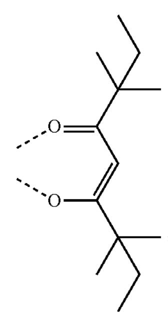
$L_{b85}$
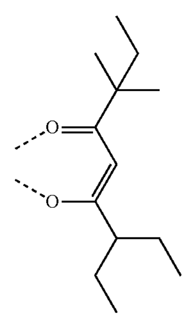
$L_{b86}$ -continued
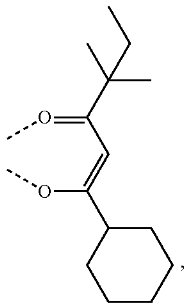
$L_{b87}$
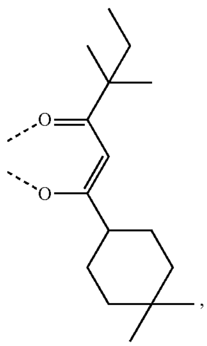
$L_{b88}$
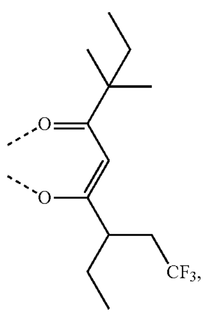
$L_{b89}$
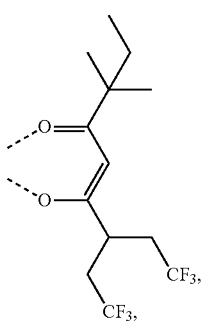
$L_{b90}$
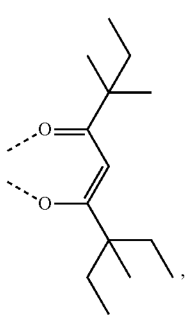
$L_{b91}$
-continued
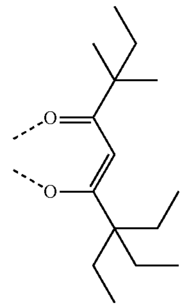
$L_{b92}$
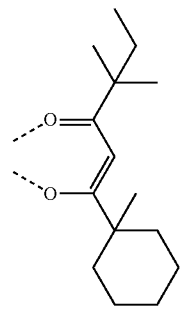
$L_{b93}$
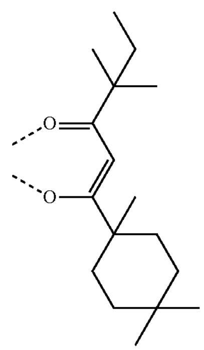
$L_{b94}$
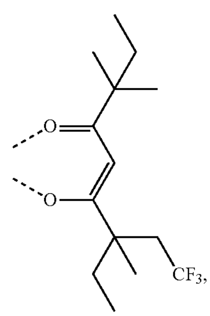
$L_{b95}$
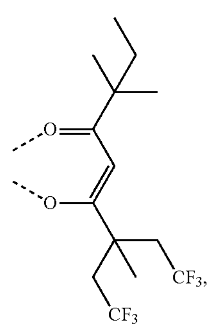
$L_{b96}$

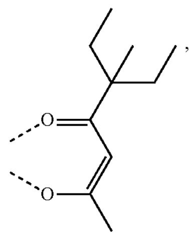
$L_{b97}$
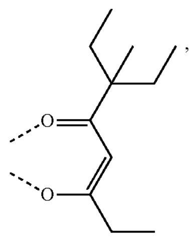
$L_{b98}$
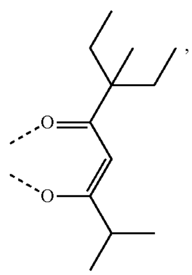
$L_{b99}$
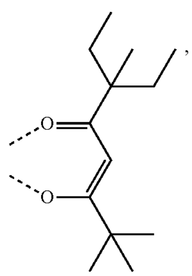
$L_{b100}$
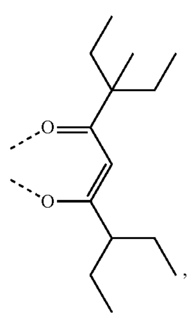
$L_{b101}$
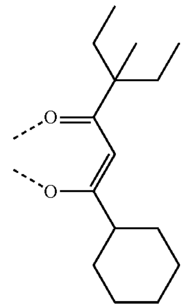
$L_{b102}$
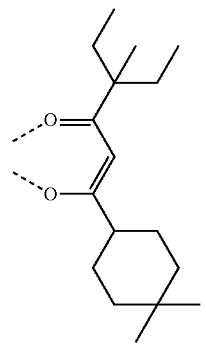
$L_{b103}$
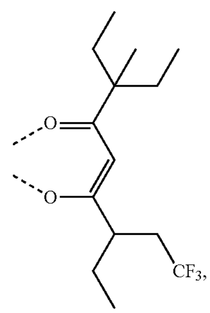
$L_{b104}$
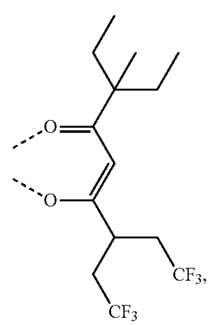
$L_{b105}$
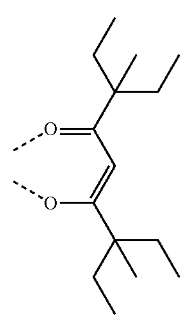
$L_{b106}$ -continued
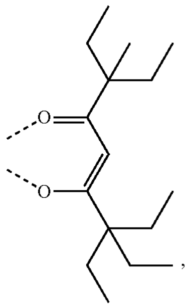
$L_{b107}$
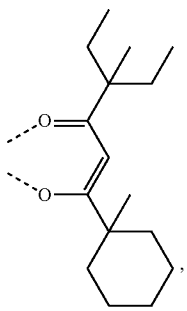
$L_{b108}$
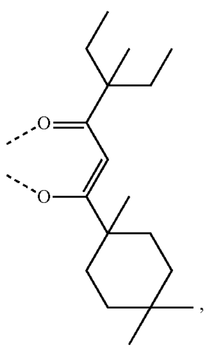
$L_{b109}$
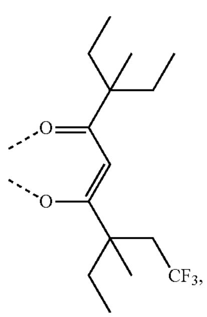
$L_{b110}$
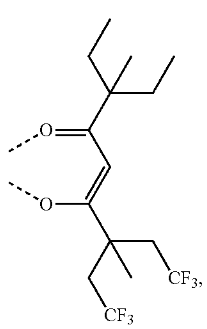
$L_{b111}$
-continued
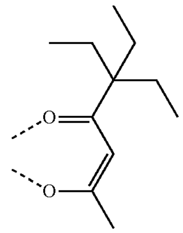
$L_{b112}$
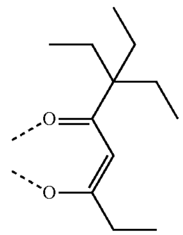
$L_{b113}$
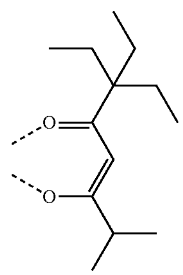
$L_{b114}$
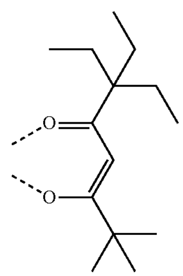
$L_{b115}$
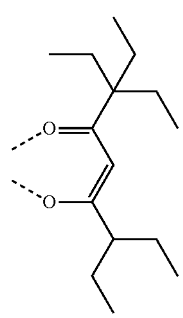
$L_{b116}$ $L_{b117}$
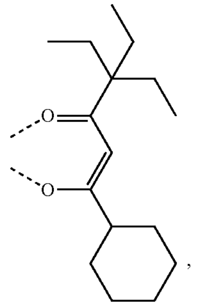
$L_{b118}$
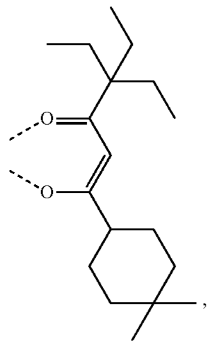
$L_{b119}$
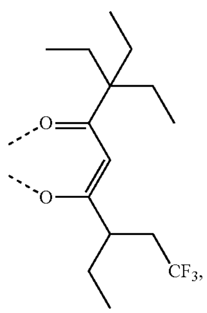
$L_{b120}$
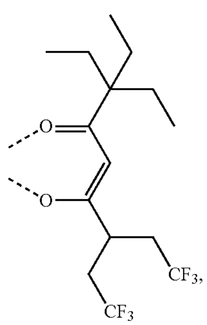
$L_{b121}$
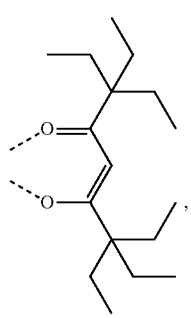
$L_{b122}$
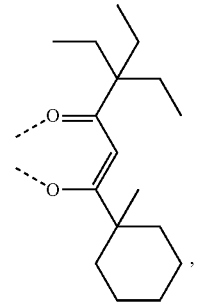
$L_{b123}$
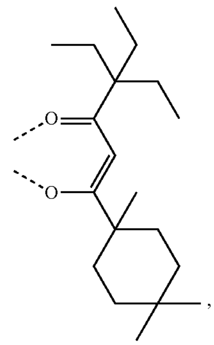
$L_{b124}$
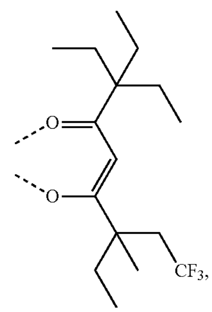
$L_{b125}$
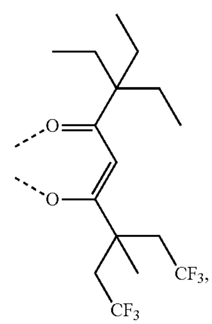
$L_{b126}$
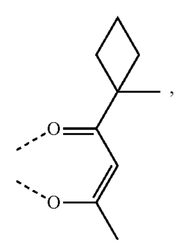

$L_{b127}$
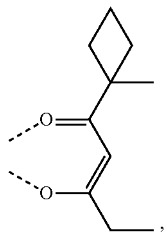
$L_{b128}$
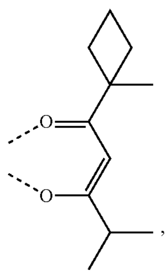
$L_{b129}$
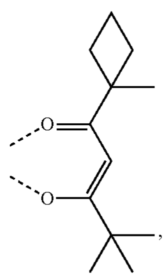
$L_{b130}$
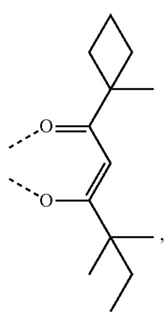
$L_{b131}$
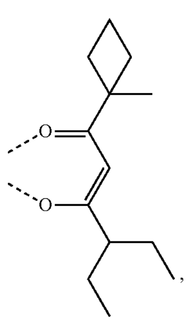
$L_{b132}$
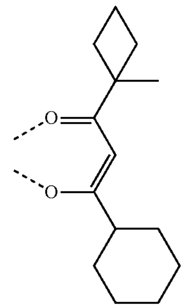
$L_{b133}$
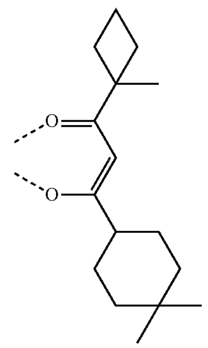
$L_{b134}$
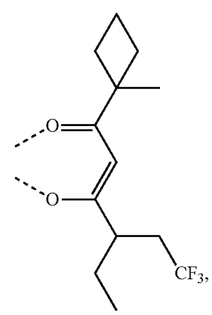
$L_{b135}$
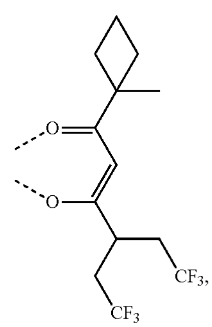
$L_{b136}$
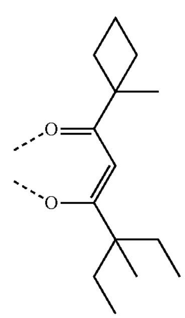

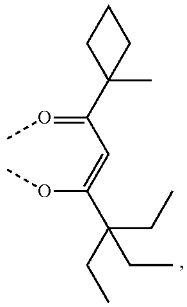
$L_{b137}$
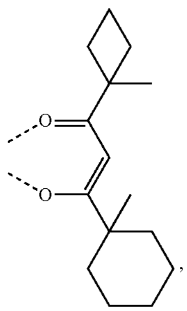
$L_{b138}$
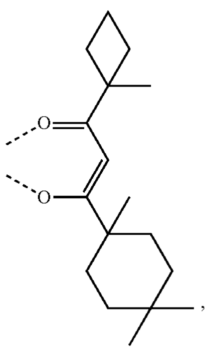
$L_{b139}$
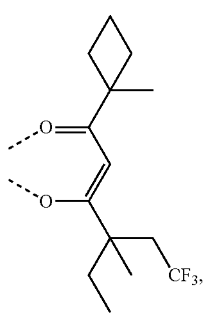
$L_{b140}$
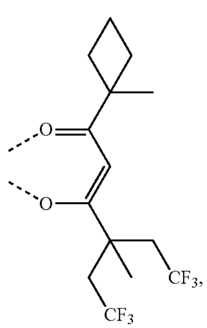
$L_{b141}$
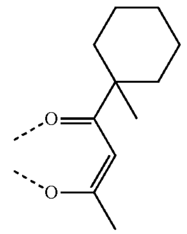
$L_{b142}$
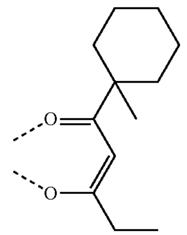
$L_{b143}$
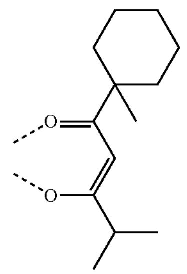
$L_{b144}$
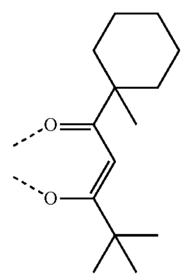
$L_{b145}$
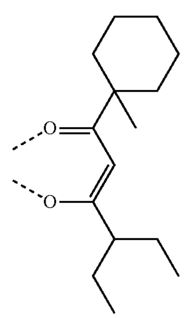
$L_{b146}$ $L_{b147}$
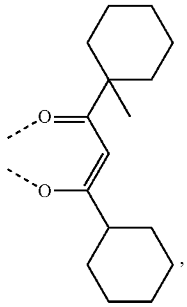
$L_{b148}$
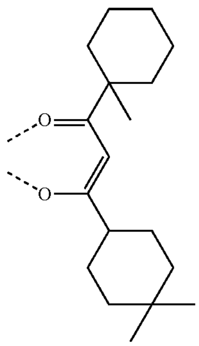
$L_{b149}$
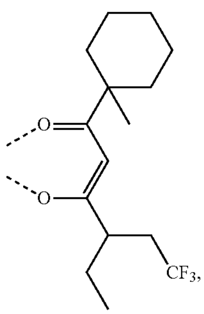
$L_{b150}$
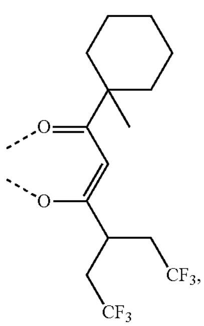
$L_{b151}$
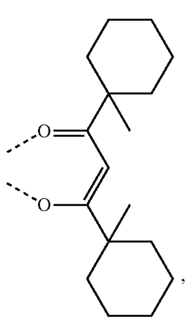
$L_{b152}$
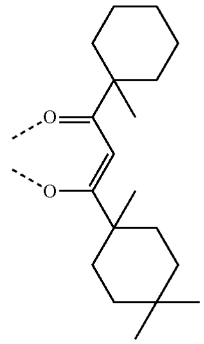
$L_{b153}$
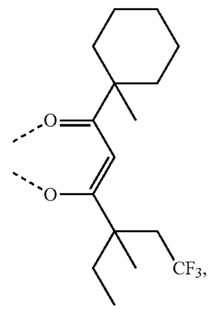
$L_{b154}$
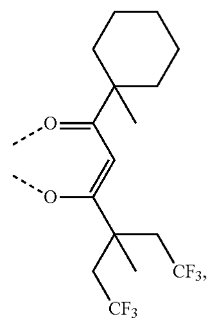
$L_{b155}$
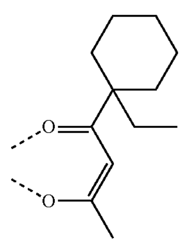
$L_{b156}$
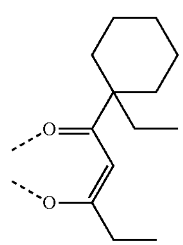

-continued
Lb157
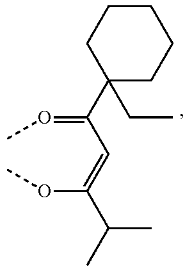
Lb158
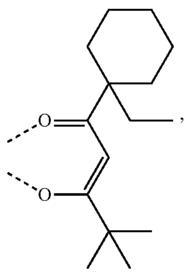
Lb159
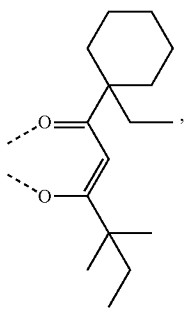
Lb160
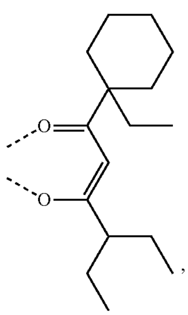
Lb161
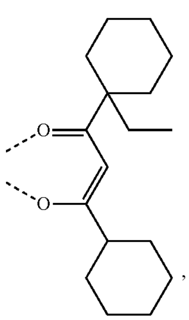
-continued
Lb162
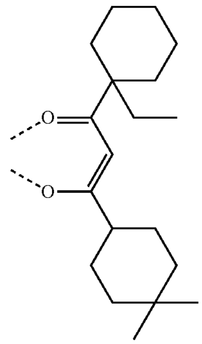
Lb163
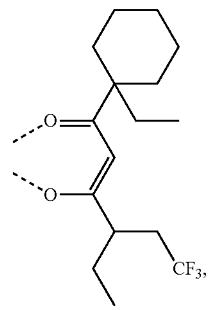
Lb164
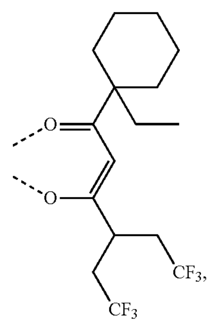
Lb165
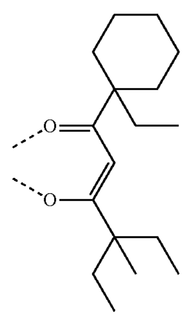
Lb166
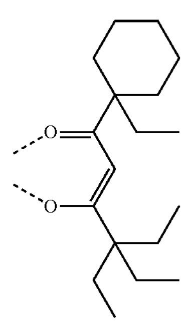

-continued
$L_{b167}$
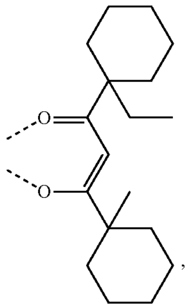
$L_{b168}$
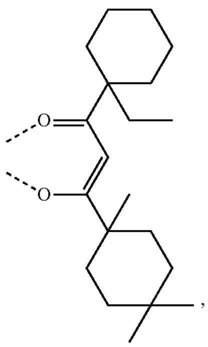
$L_{b169}$
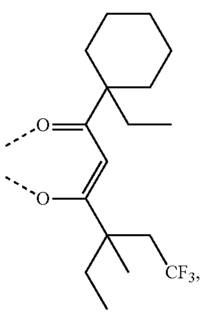
$L_{b170}$
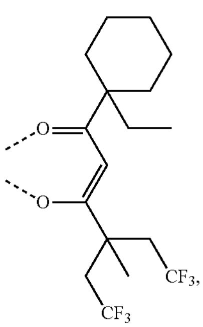
$L_{b171}$
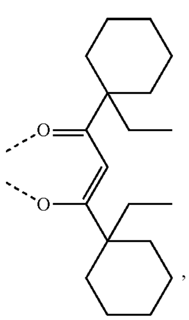
-continued
$L_{b172}$
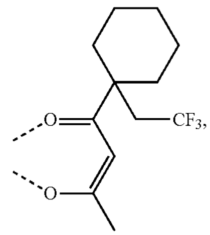
$L_{b173}$
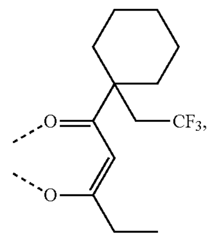
$L_{b174}$
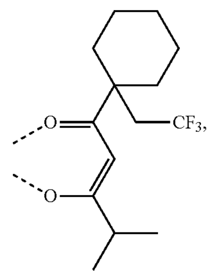
$L_{b175}$
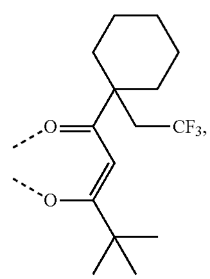
$L_{b176}$
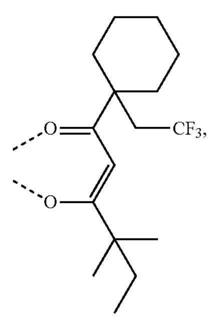

L$_{b177}$
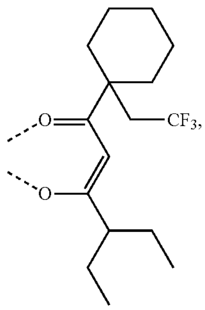
L$_{b178}$
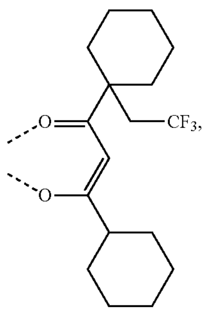
L$_{b179}$
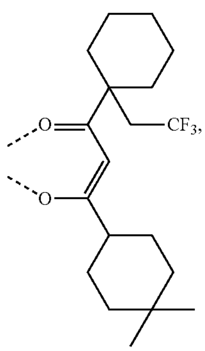
L$_{b180}$
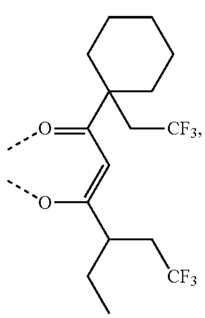
L$_{b181}$
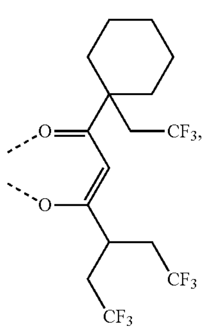
L$_{b182}$
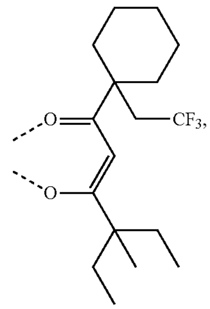
L$_{b183}$
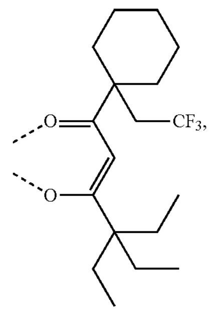
L$_{b184}$
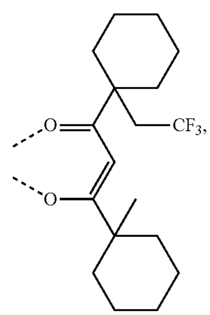
L$_{b185}$
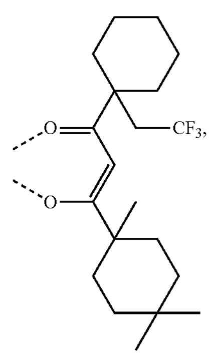
L$_{b186}$
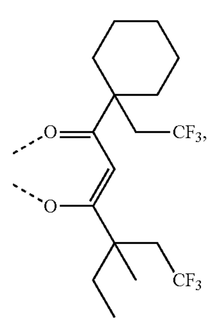

-continued
$L_{b187}$
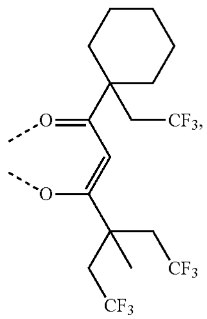
$L_{b188}$
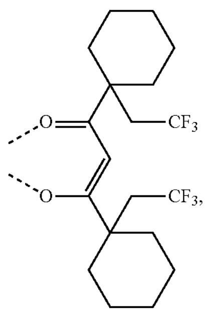
$L_{b189}$
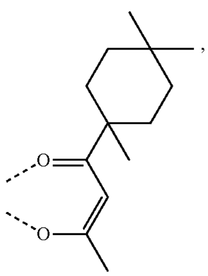
$L_{b190}$
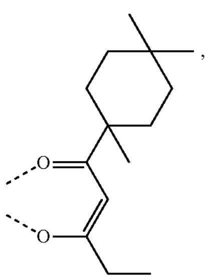
$L_{b191}$
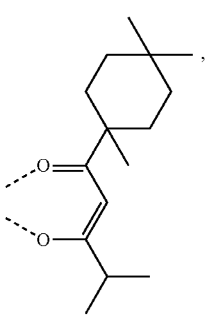
-continued
$L_{b192}$
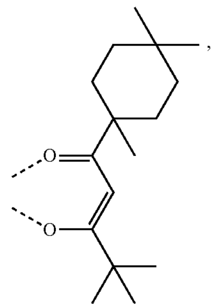
$L_{b193}$
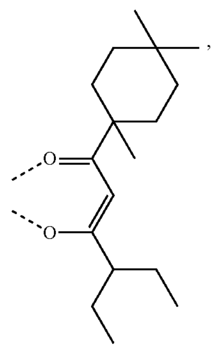
$L_{b194}$
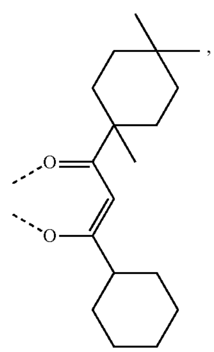
$L_{b195}$
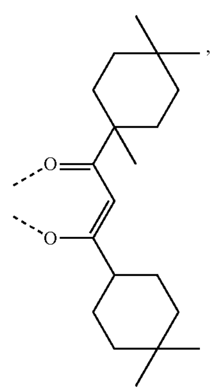

-continued
$L_{b196}$
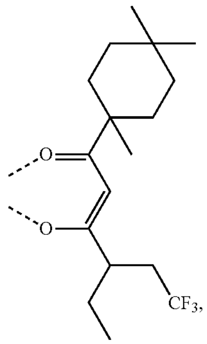
$L_{b197}$
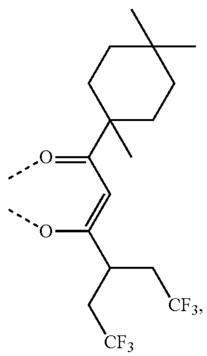
$L_{b198}$
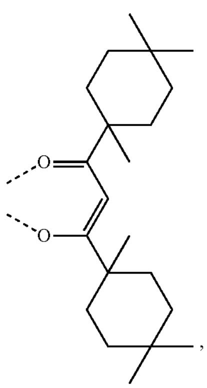
$L_{b199}$
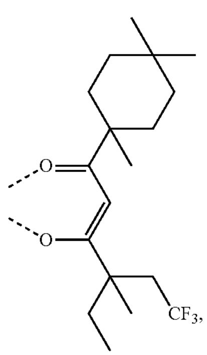
-continued
$L_{b200}$
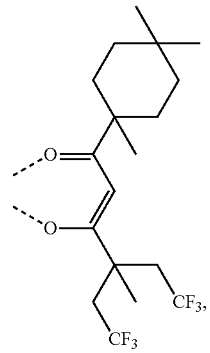
$L_{b201}$
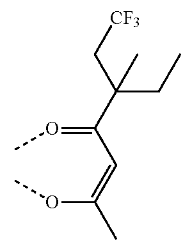
$L_{b202}$
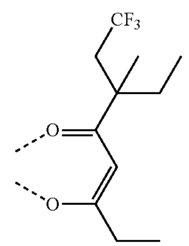
$L_{b203}$
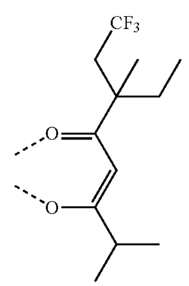
$L_{b204}$
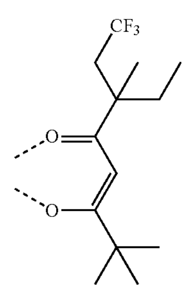

-continued
$L_{b205}$
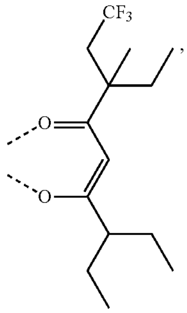
$L_{b206}$
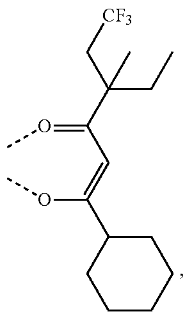
$L_{b207}$
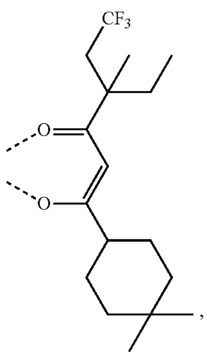
$L_{b208}$
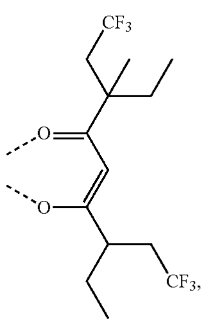
$L_{b209}$
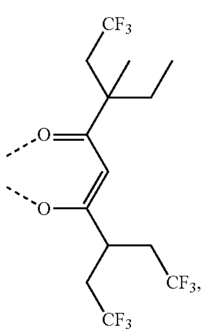
-continued
$L_{b210}$
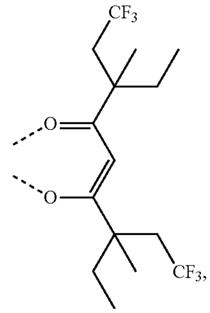
$L_{b211}$
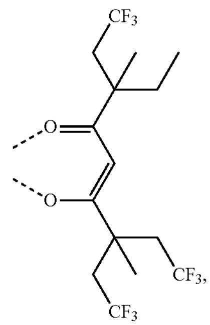
$L_{b212}$
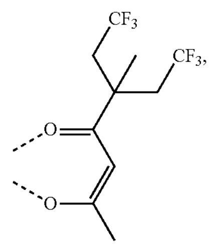
$L_{b213}$
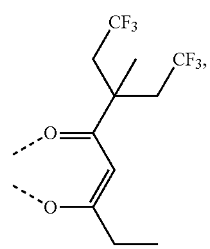
$L_{b214}$
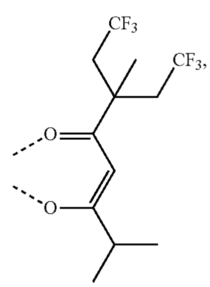

-continued
$L_{b215}$
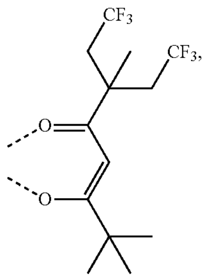
$L_{b216}$
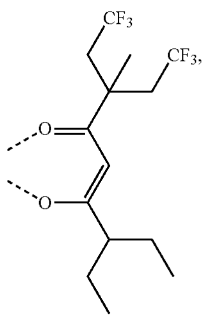
$L_{b217}$
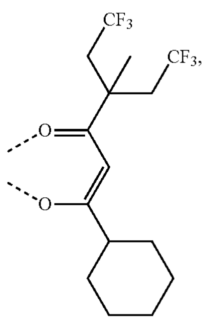
$L_{b218}$
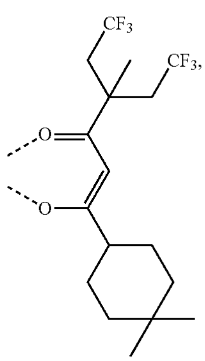
$L_{b219}$
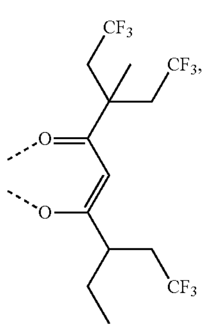
-continued
$L_{b220}$
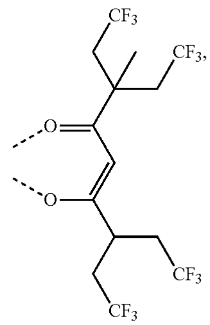
$L_{b221}$
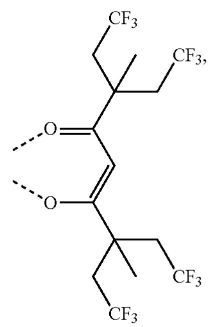
$L_{b222}$
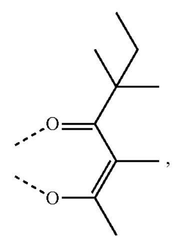
$L_{b223}$
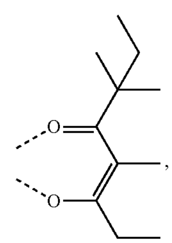
$L_{b224}$
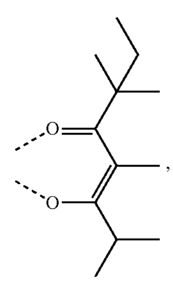

-continued
$L_{b225}$
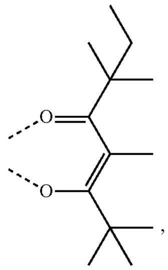
$L_{b226}$
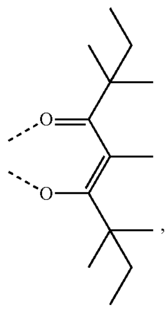
$L_{b227}$
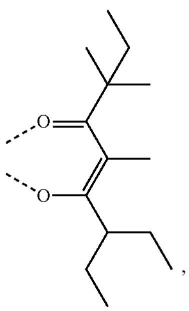
$L_{b228}$
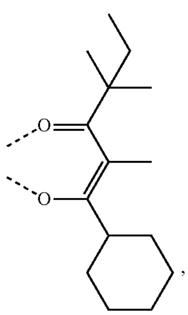
$L_{b229}$
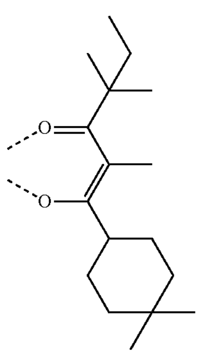
-continued
$L_{b230}$
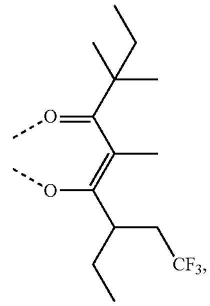
$L_{b231}$
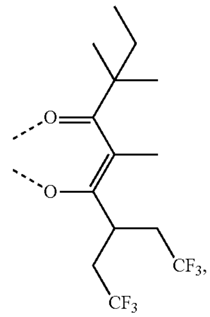
$L_{b232}$
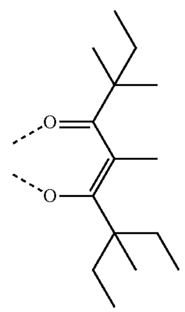
$L_{b233}$
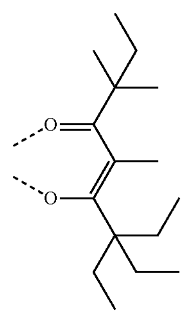
$L_{b234}$
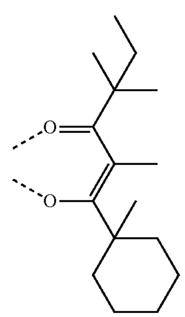

-continued
$L_{b235}$
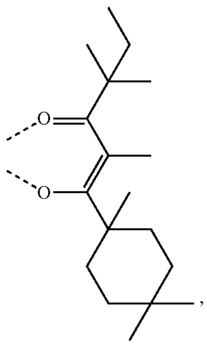
$L_{b236}$
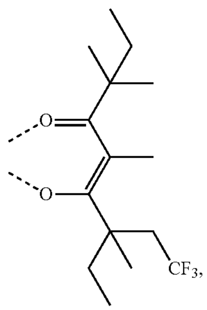
$L_{b237}$
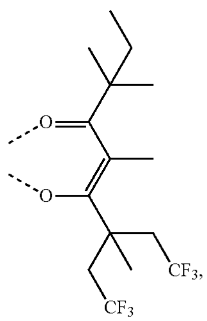
$L_{b238}$
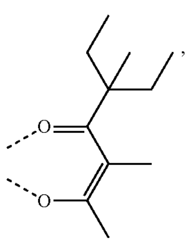
$L_{b239}$
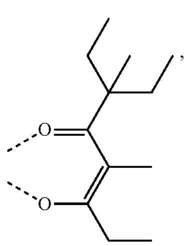
-continued
$L_{b240}$
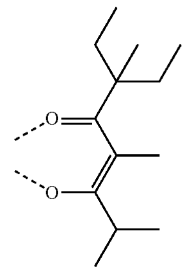
$L_{b241}$
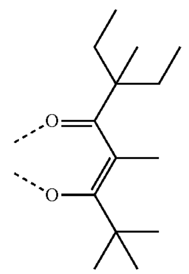
$L_{b242}$
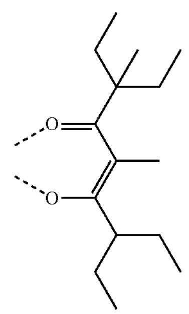
$L_{b243}$
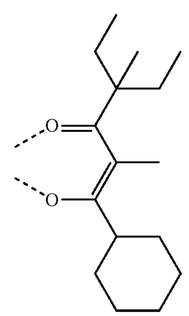
$L_{b244}$
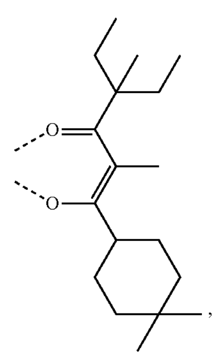

-continued
$L_{b245}$
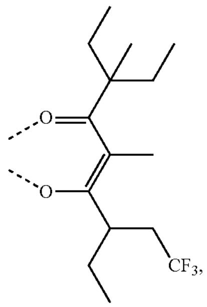
$L_{b246}$
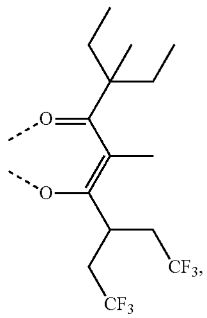
$L_{b247}$
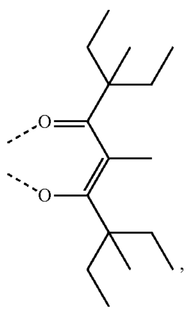
$L_{b248}$
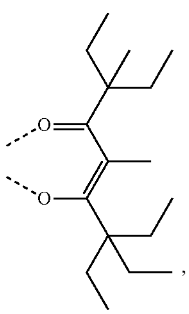
$L_{b249}$
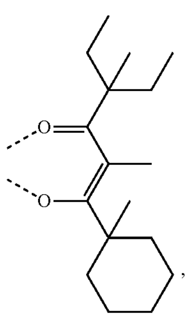
-continued
$L_{b250}$
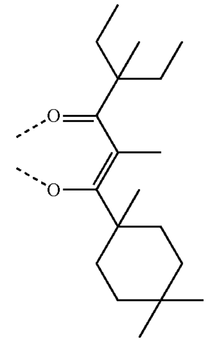
$L_{b251}$
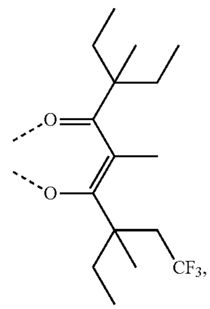
$L_{b252}$
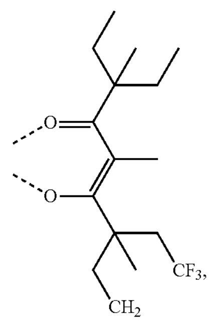
$L_{b253}$
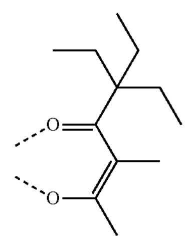
$L_{b254}$
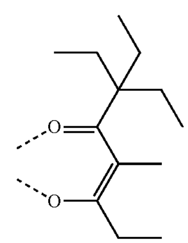

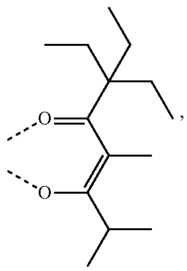
$L_{b255}$
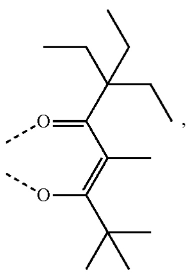
$L_{b256}$
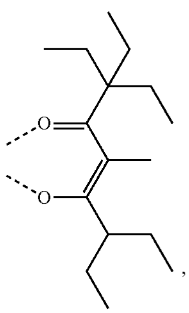
$L_{b257}$
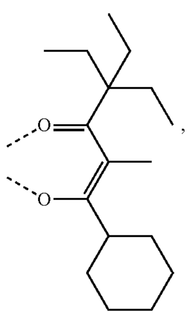
$L_{b258}$
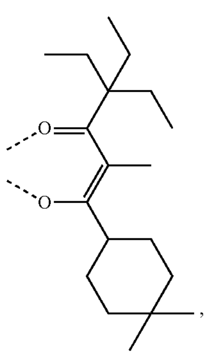
$L_{b259}$
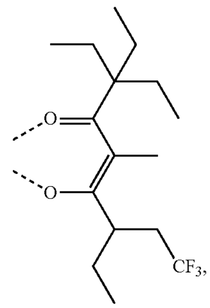
$L_{b260}$
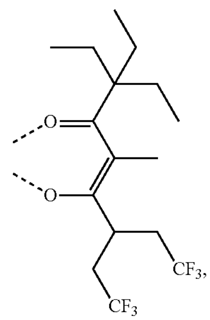
$L_{b261}$
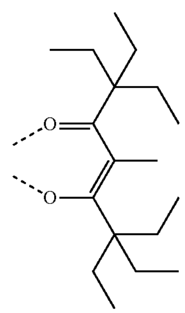
$L_{b262}$
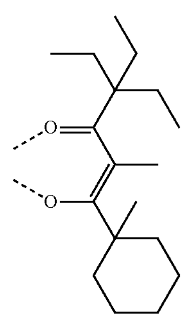
$L_{b263}$
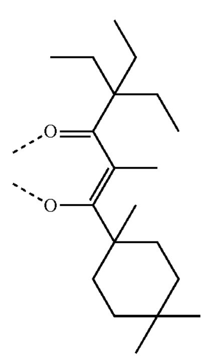
$L_{b264}$

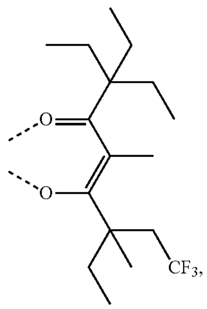
$L_{b265}$
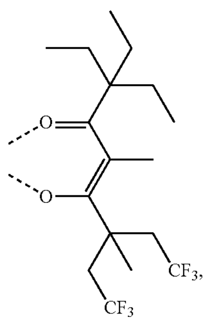
$L_{b266}$
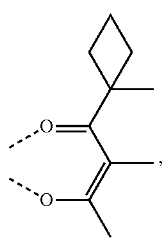
$L_{b267}$
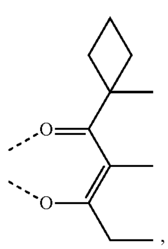
$L_{b268}$
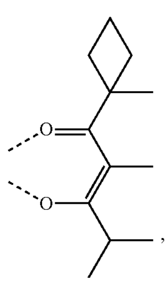
$L_{b269}$
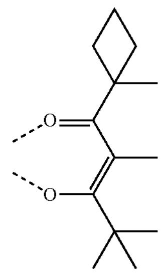
$L_{b270}$
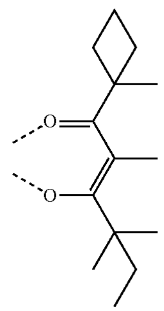
$L_{b271}$
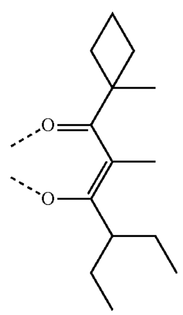
$L_{b272}$
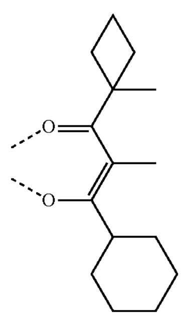
$L_{b273}$
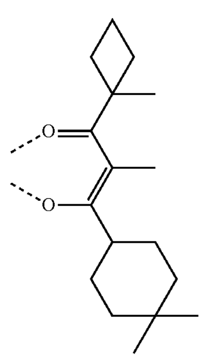
$L_{b274}$ -continued
$L_{b275}$
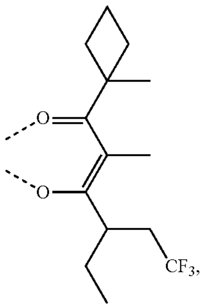
$L_{b276}$
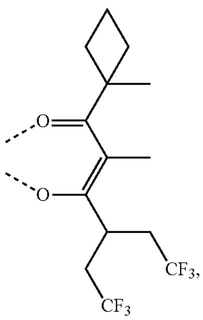
$L_{b277}$
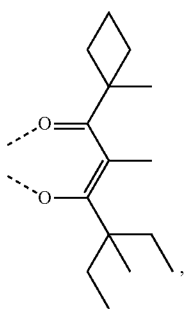
$L_{b278}$
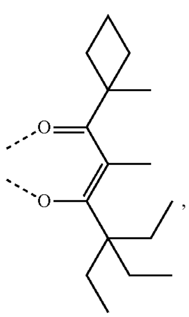
$L_{b279}$
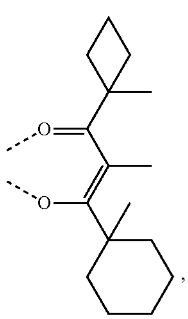
-continued
$L_{b280}$
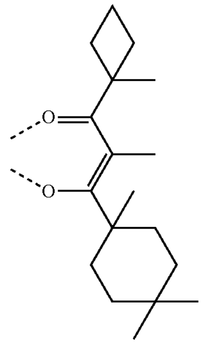
$L_{b281}$
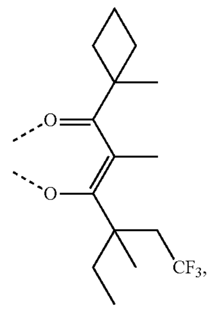
$L_{b282}$
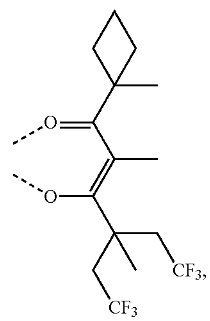
$L_{b283}$
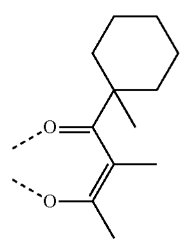
$L_{b284}$
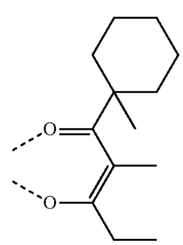

-continued
$L_{b285}$
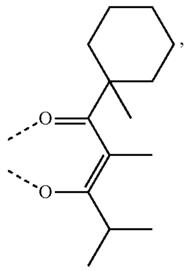
$L_{b286}$
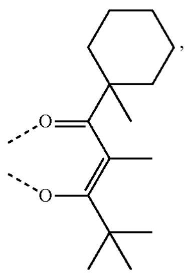
$L_{b287}$
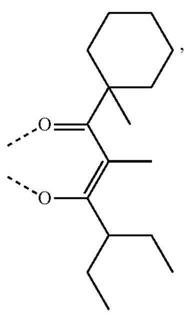
$L_{b288}$
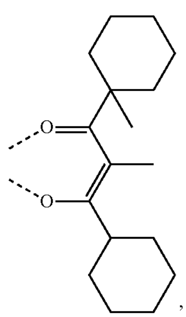
$L_{b289}$
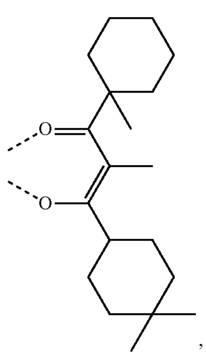
-continued
$L_{b290}$
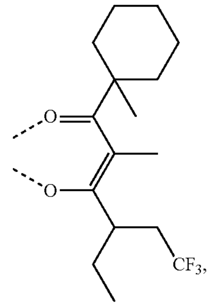
$L_{b291}$
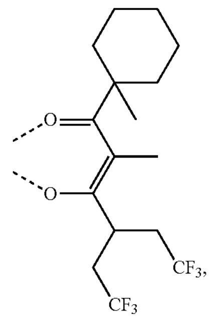
$L_{b292}$
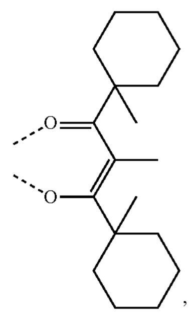
$L_{b293}$
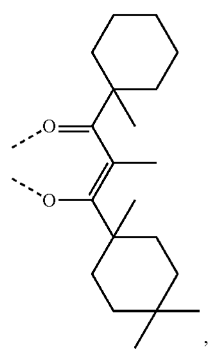
$L_{b294}$
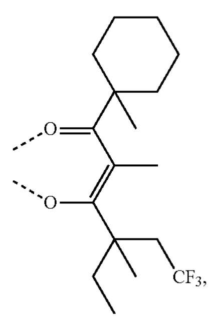

-continued
$L_{b295}$
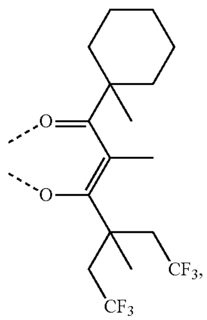
$L_{b296}$
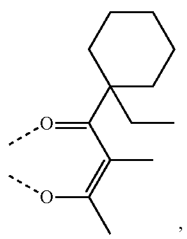
$L_{b297}$
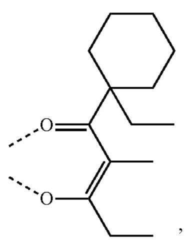
$L_{b298}$
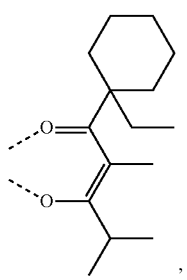
$L_{b299}$
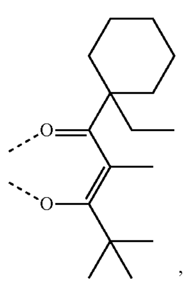
-continued
$L_{b300}$
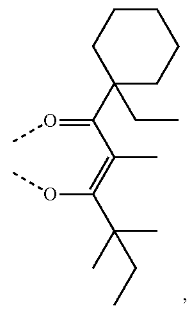
$L_{b301}$
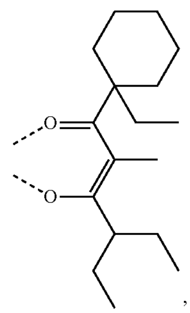
$L_{b302}$
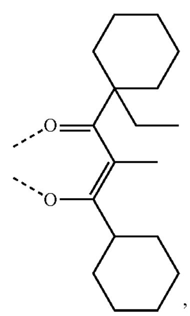
$L_{b303}$
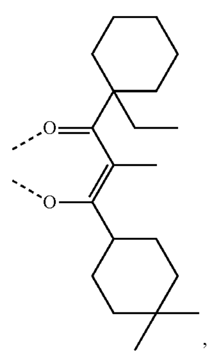
$L_{b304}$
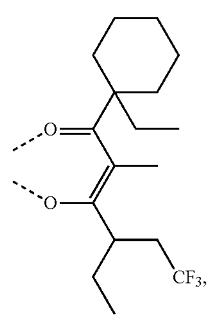

-continued
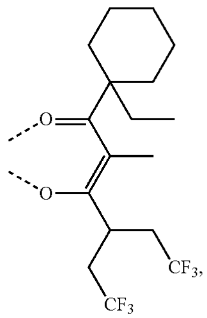
$L_{b305}$
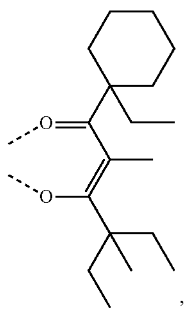
$L_{b306}$
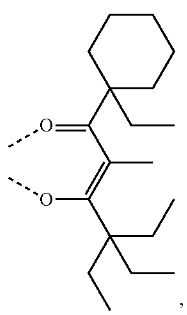
$L_{b307}$
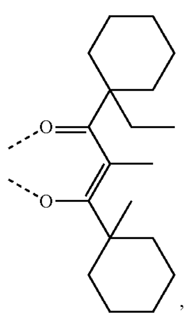
$L_{b308}$
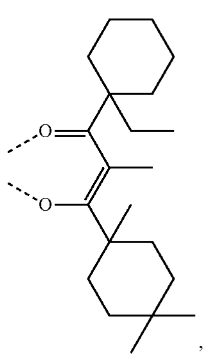
$L_{b309}$
-continued
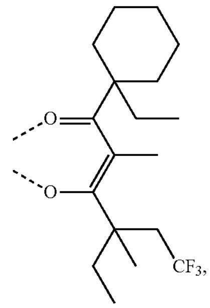
$L_{b310}$
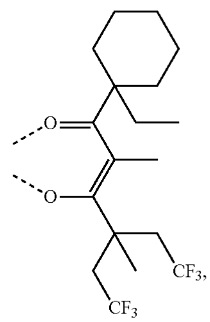
$L_{b311}$
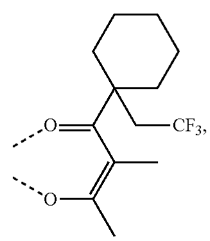
$L_{b312}$
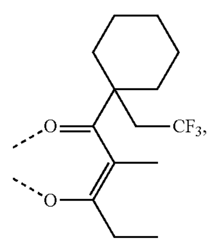
$L_{b313}$
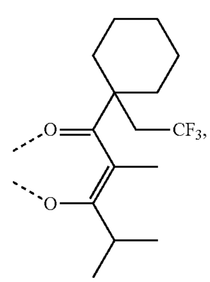
$L_{b314}$ $L_{b315}$
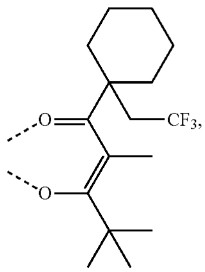
$L_{b316}$
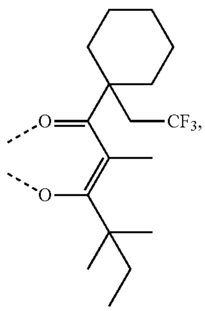
$L_{b317}$
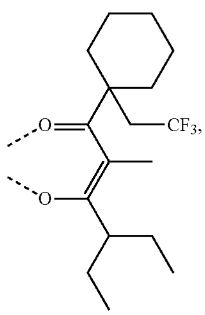
$L_{b318}$
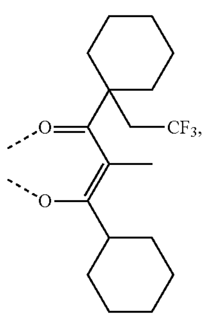
$L_{b319}$
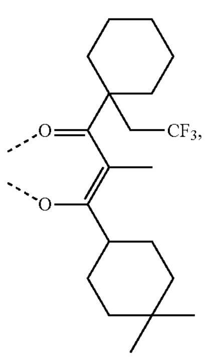
$L_{b320}$
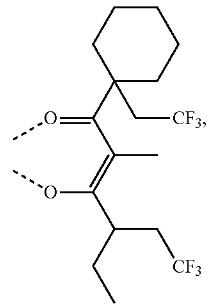
$L_{b321}$
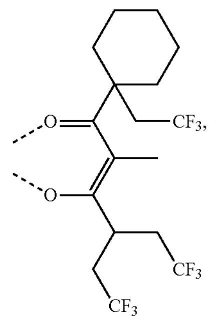
$L_{b322}$
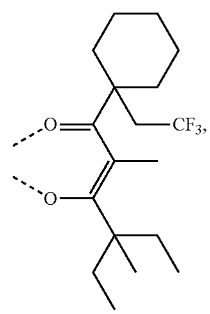
$L_{b323}$
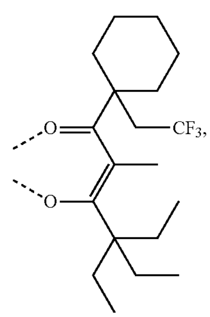
$L_{b324}$
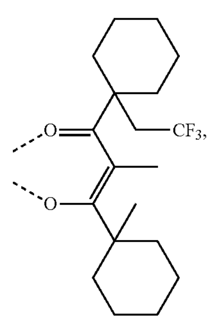

-continued
$L_{b325}$
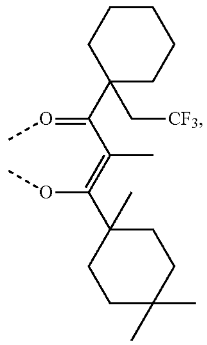
$L_{b326}$
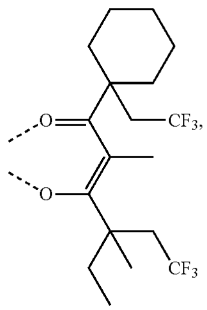
$L_{b327}$
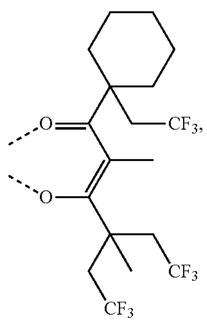
$L_{b328}$
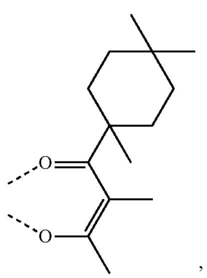
$L_{b329}$
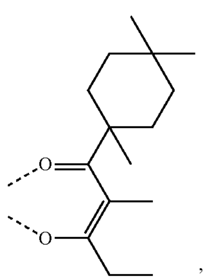
-continued
$L_{b330}$
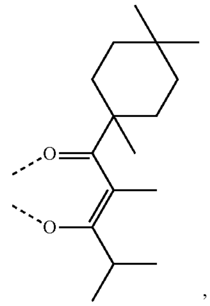
$L_{b331}$
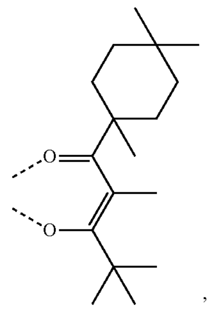
$L_{b332}$
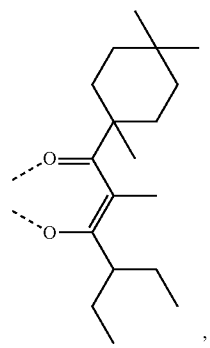
$L_{b333}$
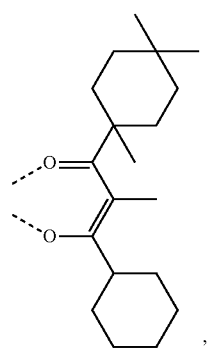

-continued
$L_{b334}$
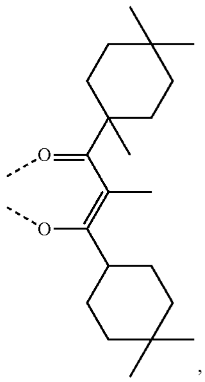
$L_{b335}$
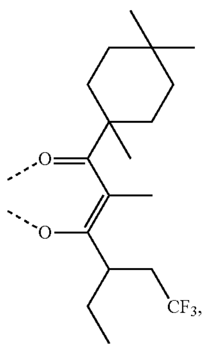
$L_{b336}$
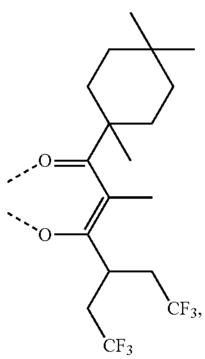
$L_{b337}$
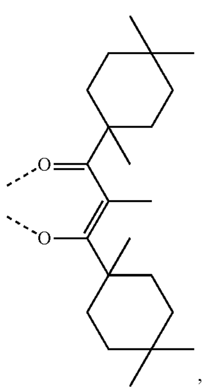
-continued
$L_{b338}$
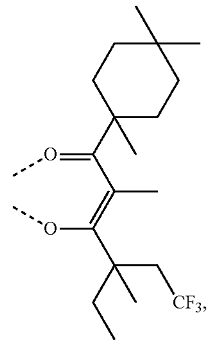
$L_{b339}$
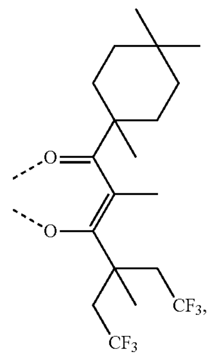
$L_{b340}$
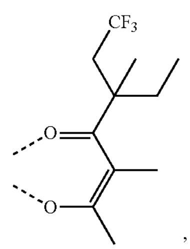
$L_{b341}$
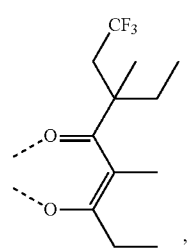
$L_{b342}$
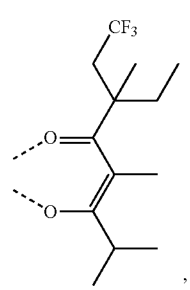

-continued
$L_{b343}$
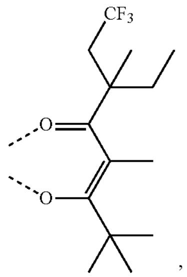
$L_{b344}$
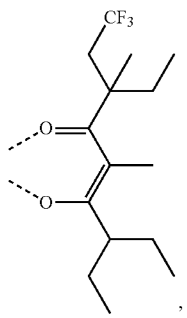
$L_{b345}$
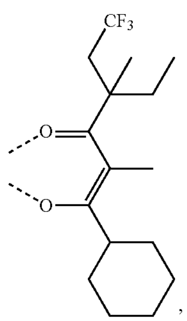
$L_{b346}$
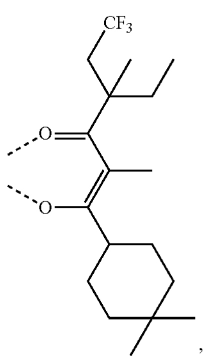
$L_{b347}$
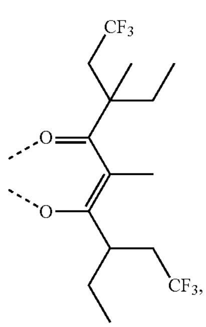
-continued
$L_{b348}$
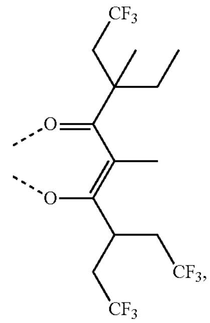
$L_{b349}$
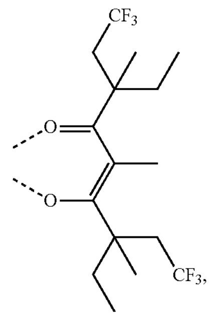
$L_{b350}$
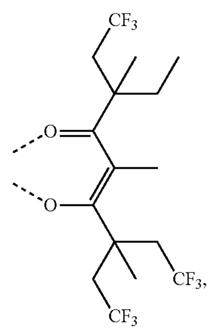
$L_{b351}$
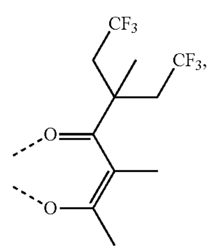
$L_{b352}$
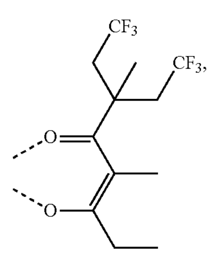

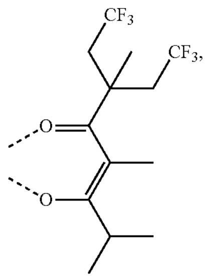
$L_{b353}$
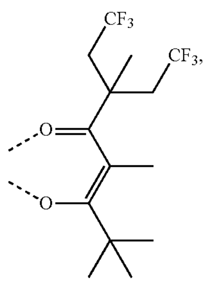
$L_{b354}$
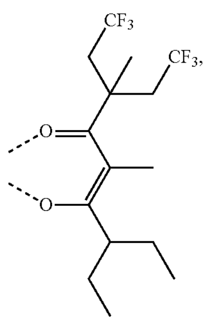
$L_{b355}$
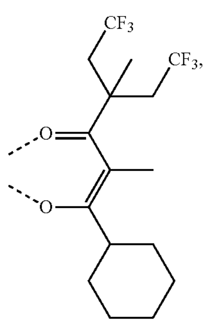
$L_{b356}$
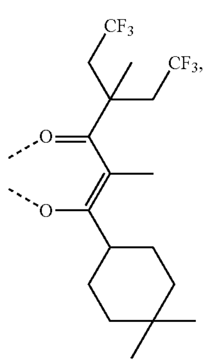
$L_{b357}$
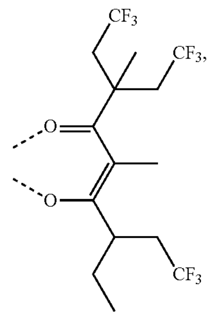
$L_{b358}$
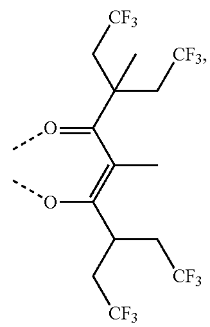
$L_{b359}$
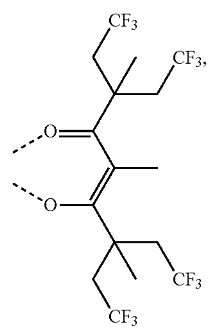
$L_{b360}$
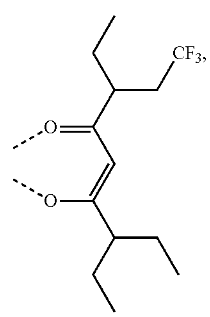
$L_{b361}$
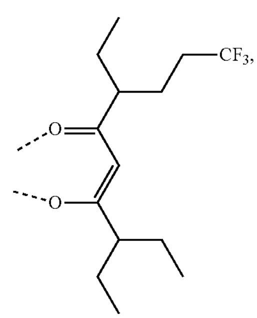
$L_{b362}$ -continued $L_{b363}$

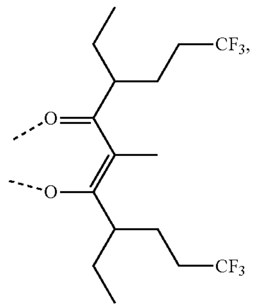

$L_{b364}$

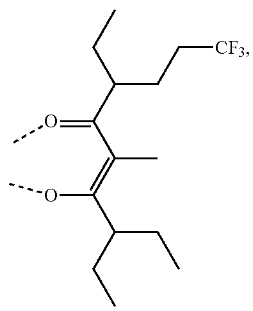

$L_{b365}$

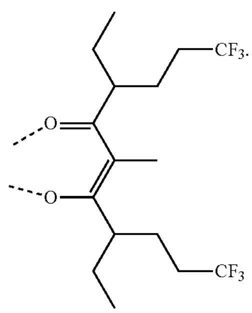

10. The metal complex of claim 1, wherein $L_c$ has any one structure selected from:

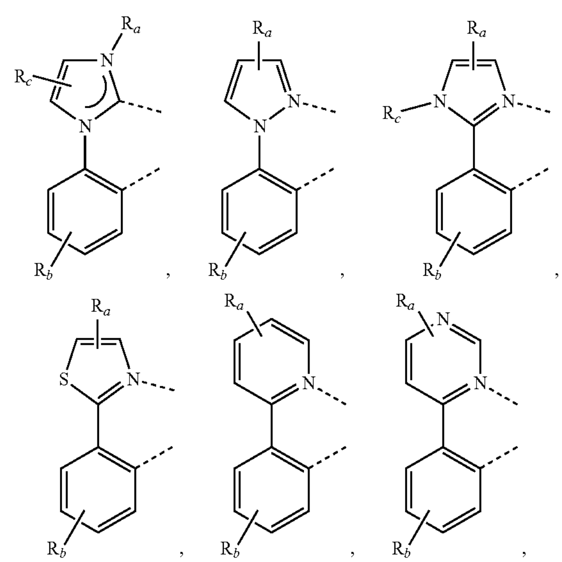

-continued

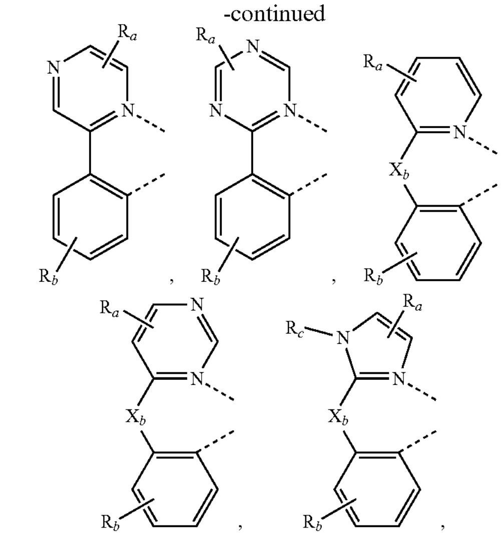

wherein $R_a$, $R_b$ and $R_c$ may represent mono-substitution, multi-substitution or non-substitution;

$X_b$ is selected from the group consisting of: O, S, Se, $NR_{N1}$ and $CR_{C1}R_{C2}$;

$R_a$, $R_b$, $R_c$, $R_{N1}$, $R_{C1}$ and $R_{C2}$ are each independently selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a thiol group, a sulfinyl group, a sulfonyl group and a phosphino group, and combinations thereof;

in the structure of $L_c$, adjacent substituents can be optionally joined to form a ring.

11. The metal complex of claim 1, wherein the ligand $L_c$ is any one selected from the group consisting of $L_{c1}$ to $L_{c99}$:

$L_{c1}$

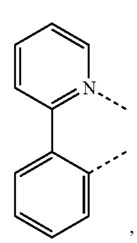

-continued
$L_{c2}$
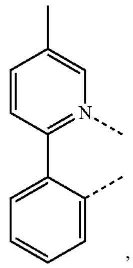
,
$L_{c3}$
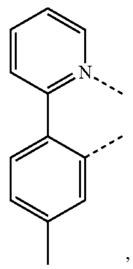
,
$L_{c4}$
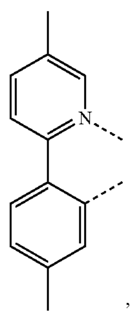
,
$L_{c5}$
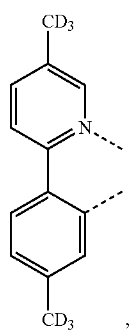
,
$L_{c6}$
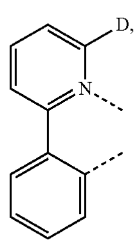
-continued
$L_{c7}$
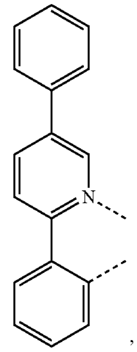
,
$L_{c8}$
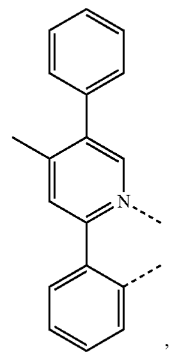
,
$L_{c9}$
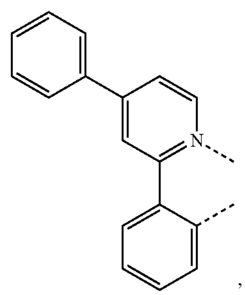
,
$L_{c10}$
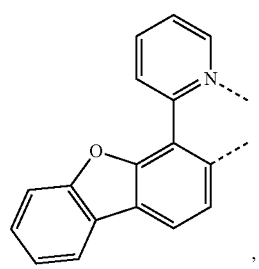
,
$L_{c11}$
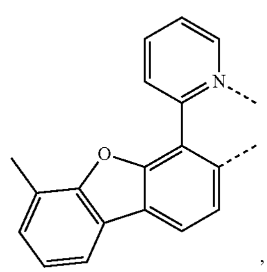
, -continued
L$_{c12}$
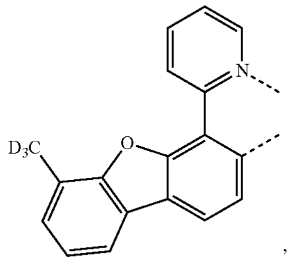
L$_{c13}$
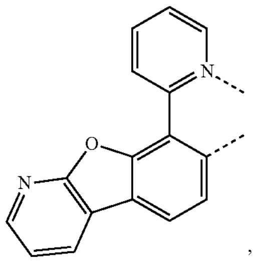
L$_{c14}$
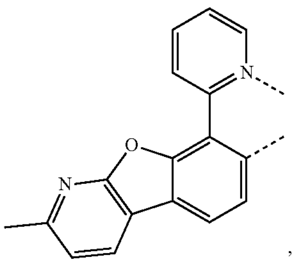
L$_{c15}$
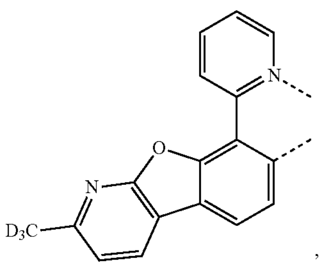
L$_{c16}$
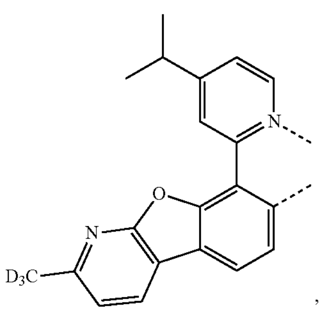
-continued
L$_{c17}$
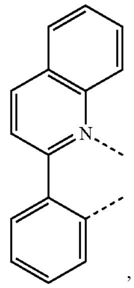
L$_{c18}$
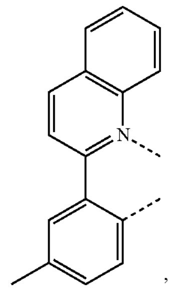
L$_{c19}$
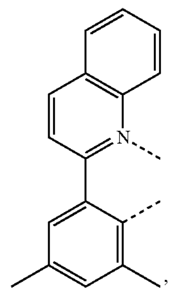
L$_{c20}$
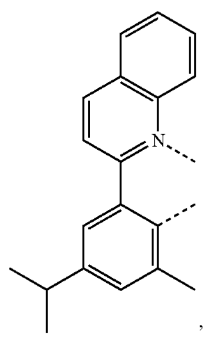
L$_{c21}$
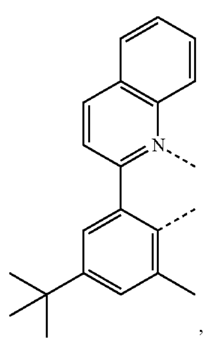

$L_{c22}$
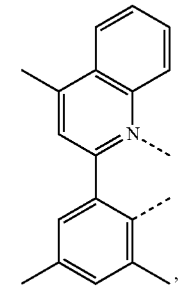
$L_{c23}$
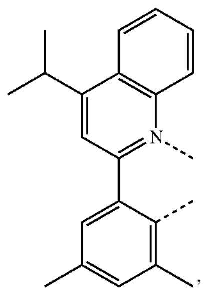
$L_{c24}$
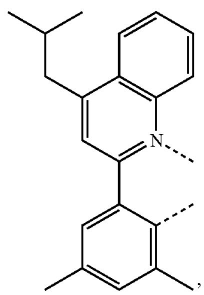
$L_{c25}$
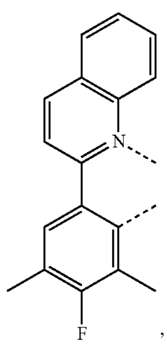
$L_{c26}$
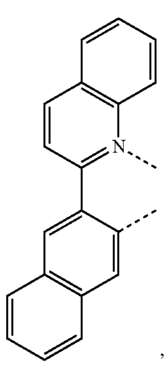
$L_{c27}$
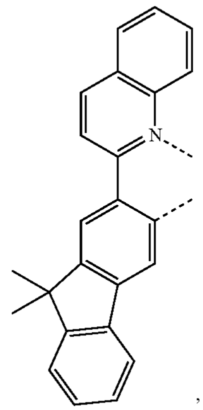
$L_{c28}$
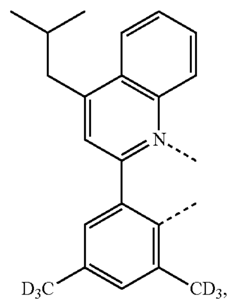
$L_{c29}$
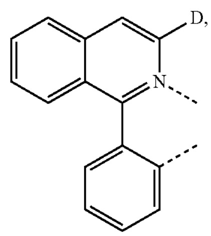
$L_{c30}$
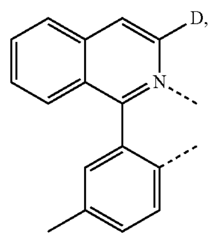
$L_{c31}$
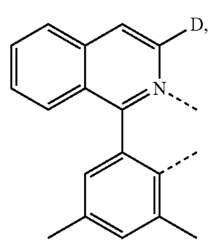

-continued
$L_{c32}$
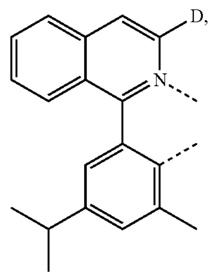
$L_{c33}$
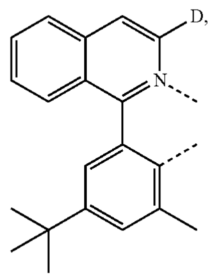
$L_{c34}$
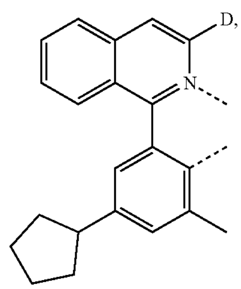
$L_{c35}$
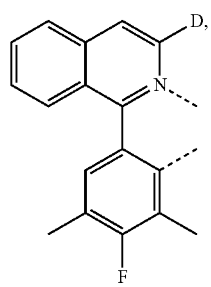
$L_{c36}$
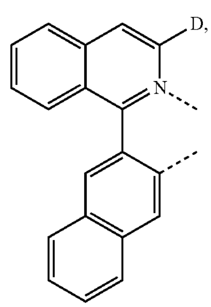
-continued
$L_{c37}$
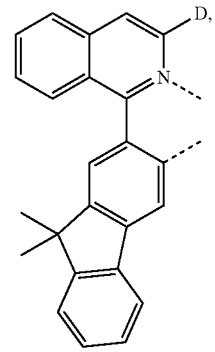
$L_{c38}$
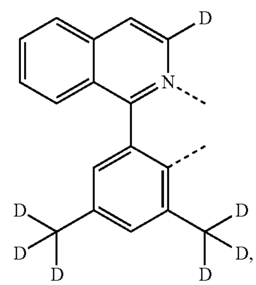
$L_{c39}$
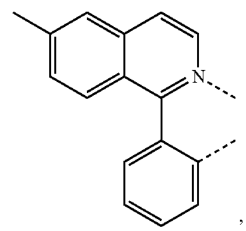
$L_{c40}$
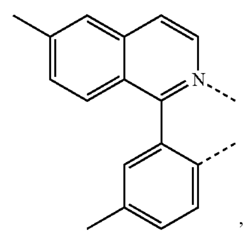
$L_{c41}$
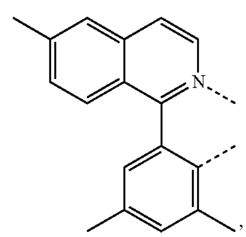
$L_{c42}$
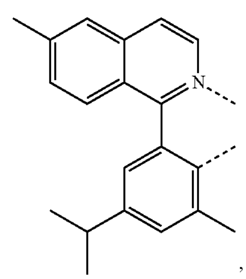

-continued
$L_{c43}$
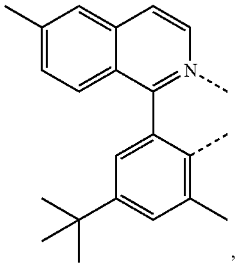
$L_{c44}$
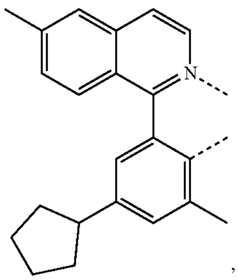
$L_{c45}$
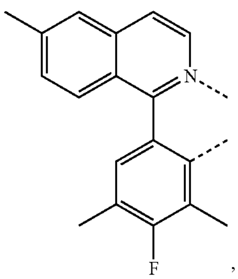
$L_{c46}$
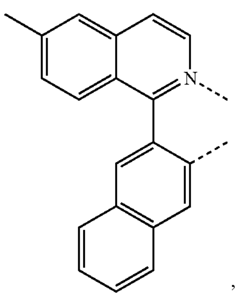
$L_{c47}$
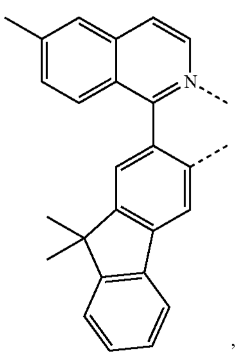
-continued
$L_{c48}$
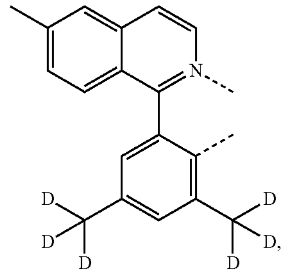
$L_{c49}$
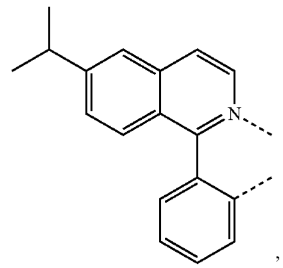
$L_{c50}$
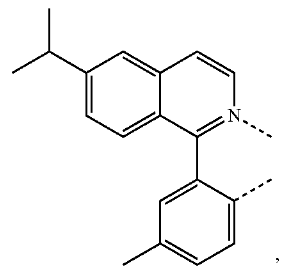
$L_{c51}$
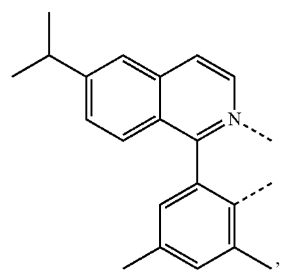
$L_{c52}$
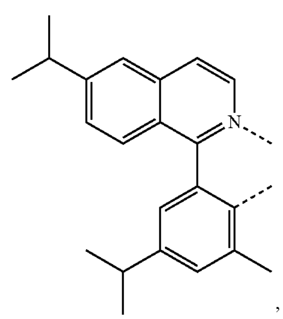

-continued
$L_{c53}$
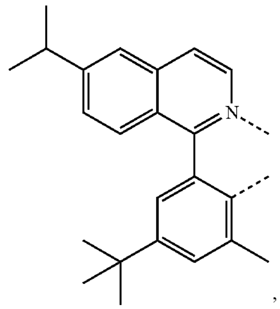
$L_{c54}$
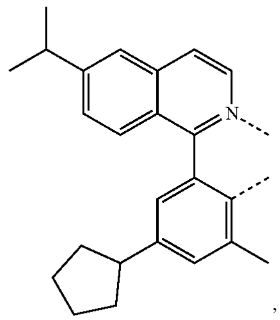
$L_{c55}$
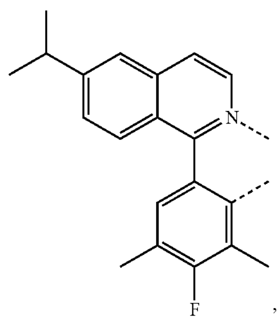
$L_{c56}$
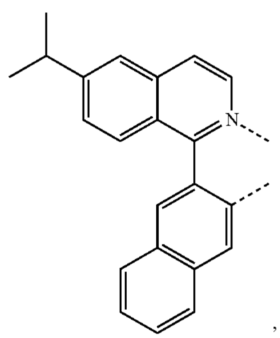
-continued
$L_{c57}$
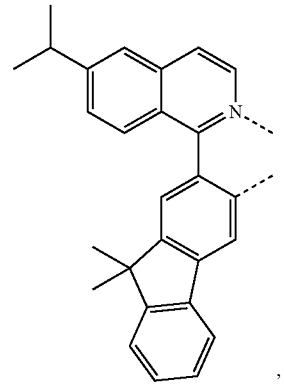
$L_{c58}$
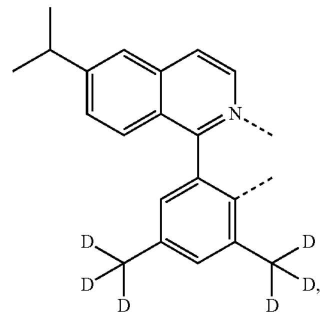
$L_{c59}$
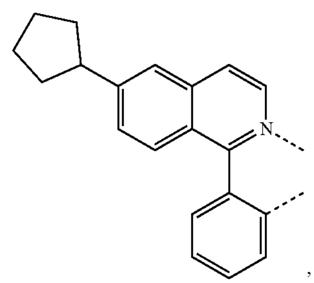
$L_{c60}$
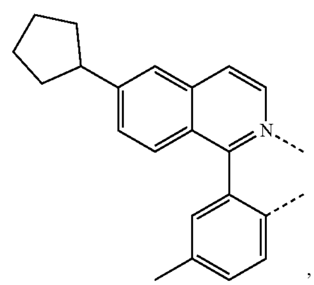
$L_{c61}$
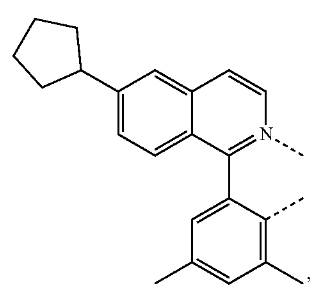

-continued
$L_{c62}$
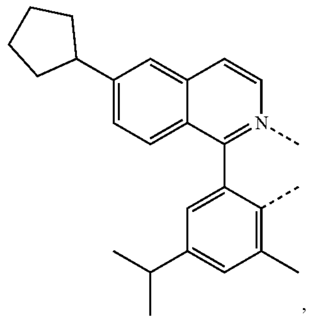
,
$L_{c63}$
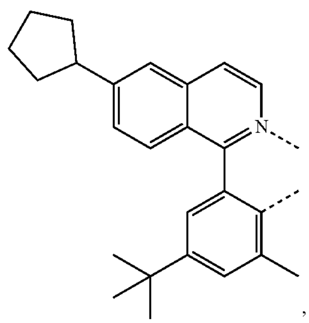
,
$L_{c64}$
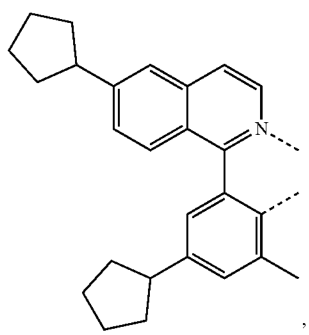
,
$L_{c65}$
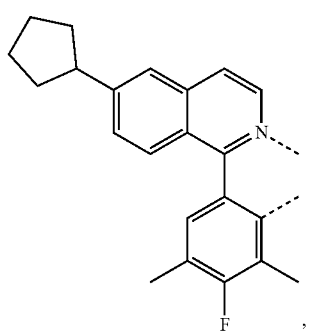
,
-continued
$L_{c66}$
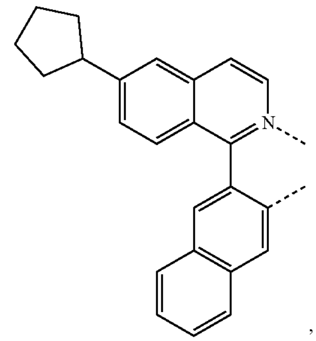
,
$L_{c67}$
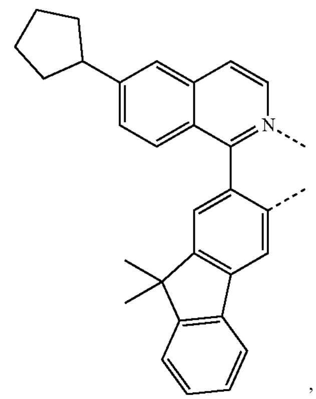
,
$L_{c68}$
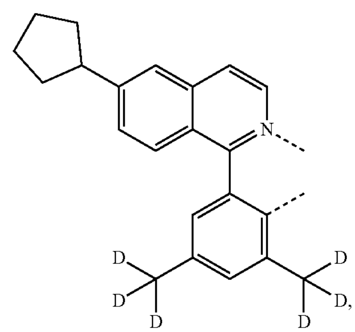
$L_{c69}$
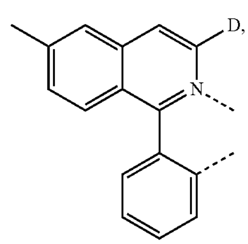
$L_{c70}$
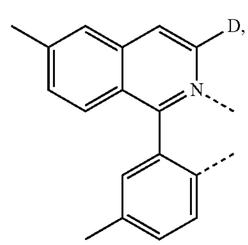

L$_{c71}$
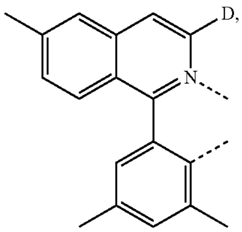
L$_{c72}$
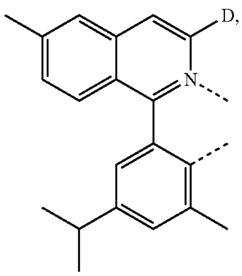
L$_{c73}$
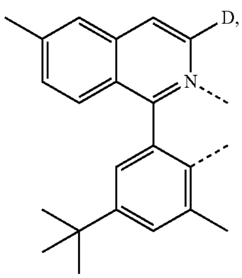
L$_{c74}$
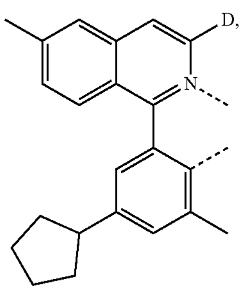
L$_{c75}$
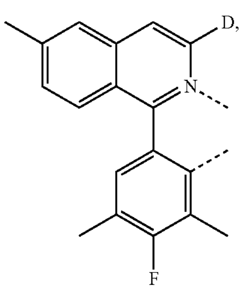
L$_{c76}$
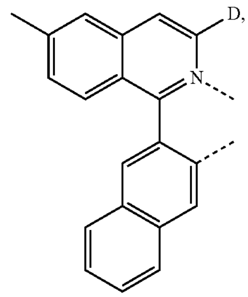
L$_{c77}$
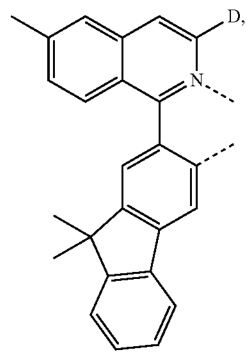
L$_{c78}$
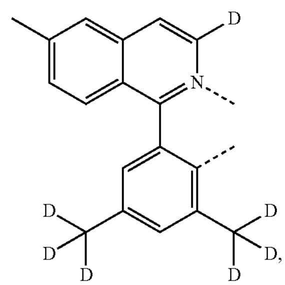
L$_{c79}$
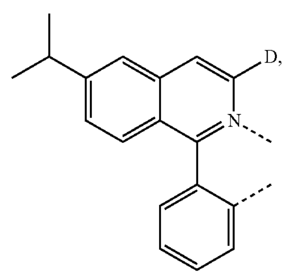
L$_{c80}$
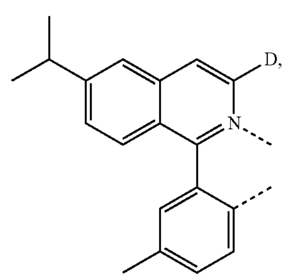

-continued
$L_{c81}$
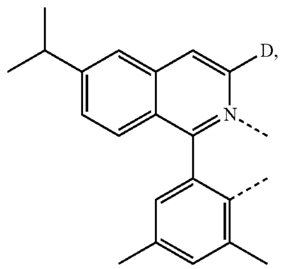
$L_{c82}$
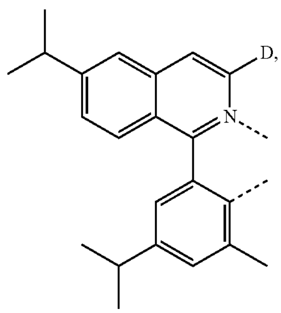
$L_{c83}$
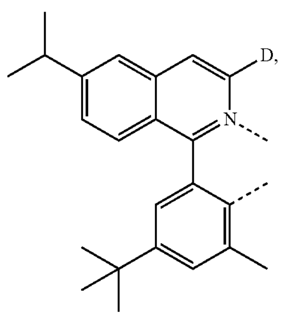
$L_{c84}$
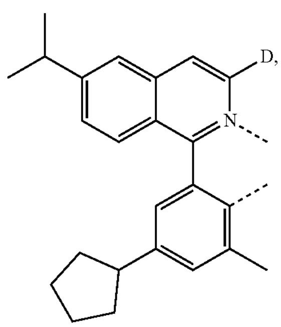
$L_{c85}$
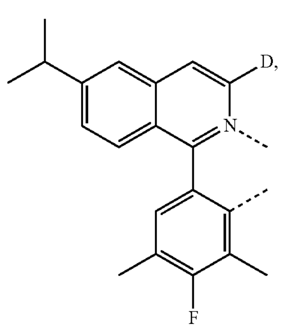
-continued
$L_{c86}$
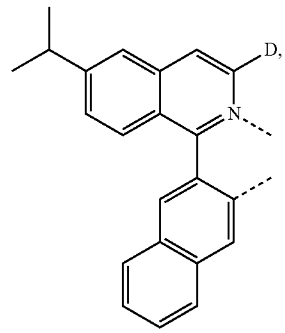
$L_{c87}$
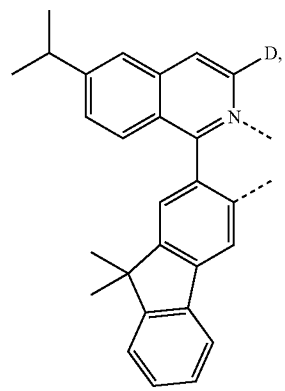
$L_{c88}$
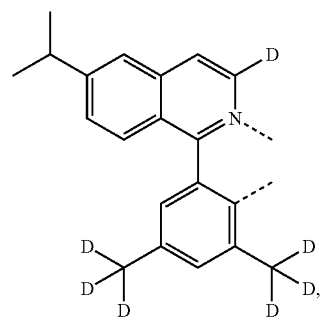
$L_{c89}$
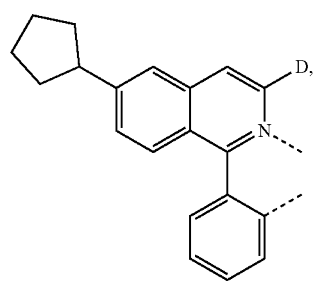
$L_{c90}$
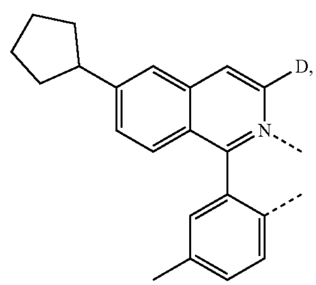

-continued $L_{c91}$

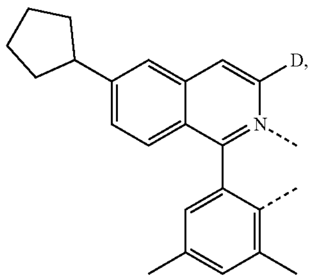

$L_{c92}$

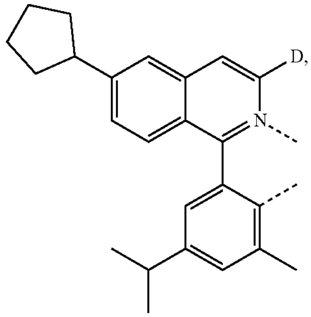

$L_{c93}$

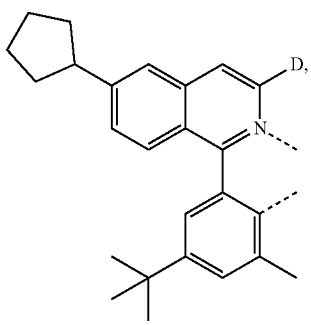

$L_{c94}$

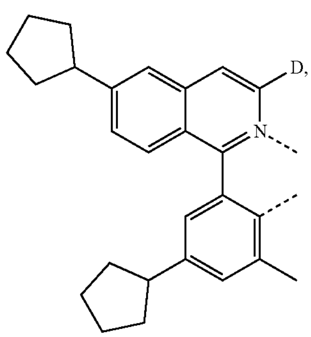

$L_{c95}$

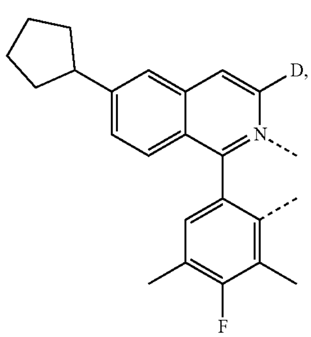

-continued $L_{c96}$

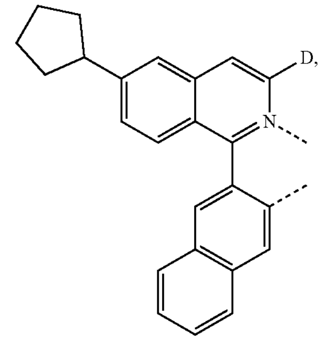

$L_{c97}$

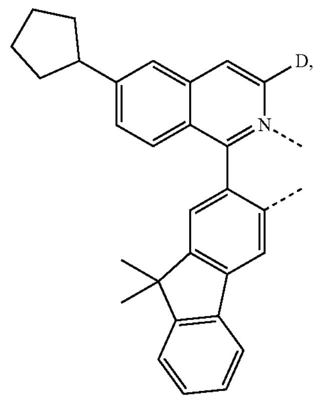

$L_{c98}$

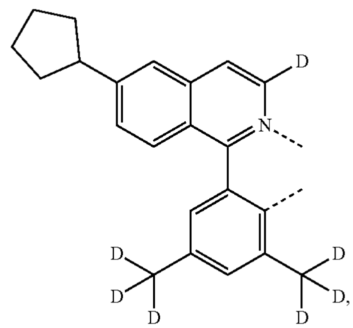

$L_{c99}$

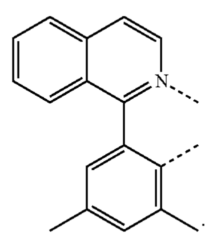

12. The metal complex of claim 7, wherein hydrogen in the ligands $L_a$ may be partially or fully substituted by deuterium.

13. The metal complex of claim 9, wherein hydrogen in the ligands $L_b$ may be partially or fully substituted by deuterium.

14. The metal complex of claim 7, wherein the metal complex is $Ir(L_a)_2(L_b)$, and $L_a$ is any one or two selected from $L_{a1}$ to $L_{a693}$, and optionally, hydrogen in the ligands $L_a$ and $L_b$ may be partially or fully substituted by deuterium, wherein $L_b$ has any one structure or any two structures independently selected from the group consisting of $L_{b1}$ to $L_{b365}$:

-continued
L$_{b1}$
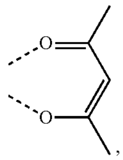
L$_{b2}$
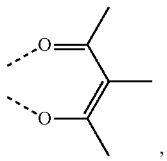
L$_{b3}$
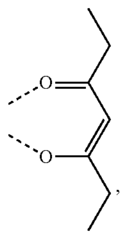
L$_{b4}$
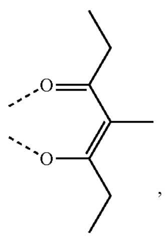
L$_{b5}$
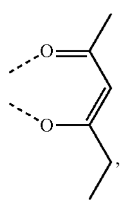
L$_{b6}$
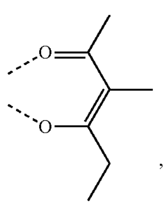
L$_{b7}$
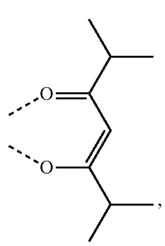
L$_{b8}$
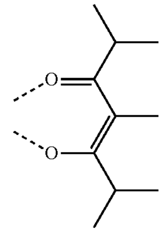
L$_{b9}$
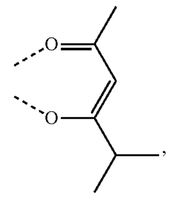
L$_{b10}$
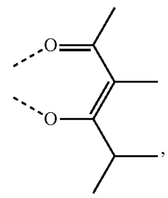
L$_{b11}$
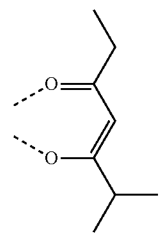
L$_{b12}$
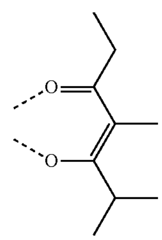
L$_{b13}$
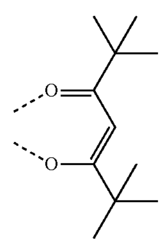
L$_{b14}$
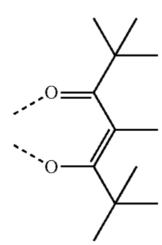

-continued
$L_{b15}$
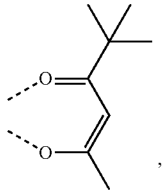
$L_{b16}$
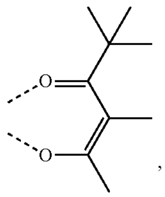
$L_{b17}$
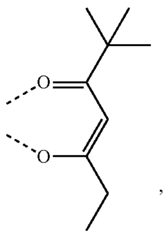
$L_{b18}$
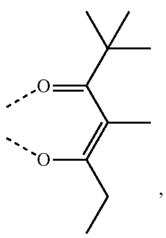
$L_{b19}$
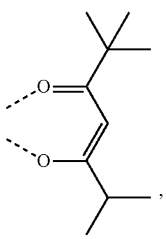
$L_{b20}$
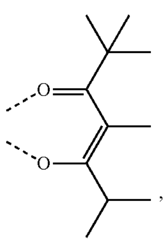
-continued
$L_{b21}$
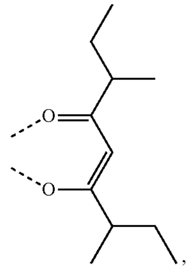
$L_{b22}$
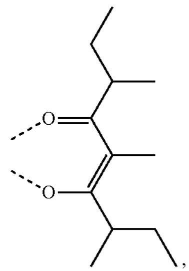
$L_{b23}$
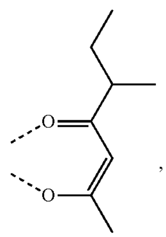
$L_{b24}$
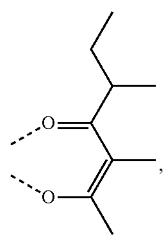
$L_{b25}$
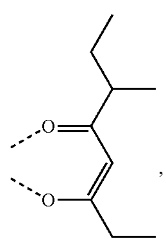
$L_{b26}$
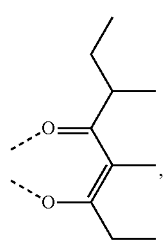

-continued
$L_{b27}$
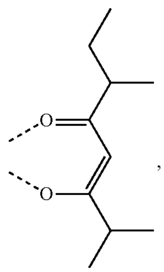
$L_{b28}$
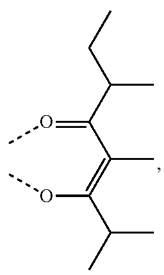
$L_{b29}$
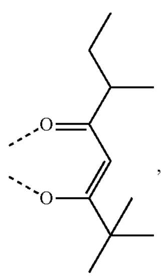
$L_{b30}$
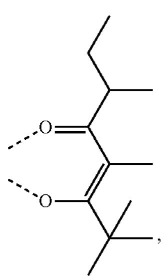
$L_{b31}$
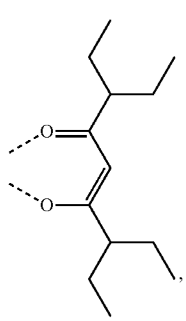
-continued
$L_{b32}$
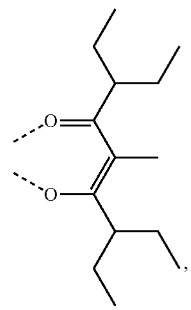
$L_{b33}$
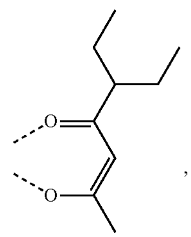
$L_{b34}$
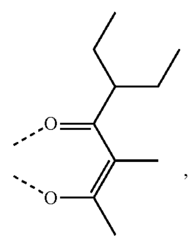
$L_{b35}$
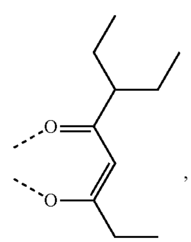
$L_{b36}$
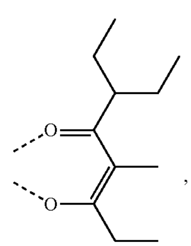
$L_{b37}$
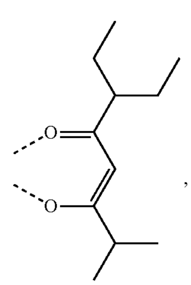

-continued
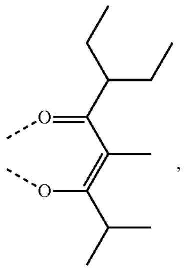
$L_{b38}$
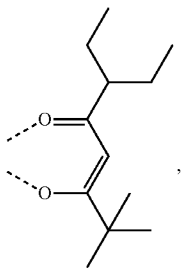
$L_{b39}$
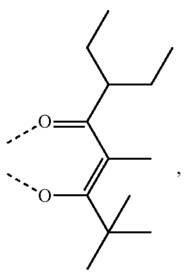
$L_{b40}$
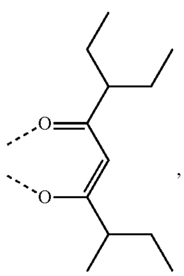
$L_{b41}$
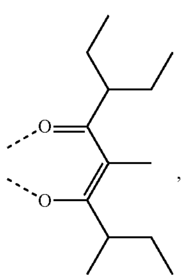
$L_{b42}$
-continued
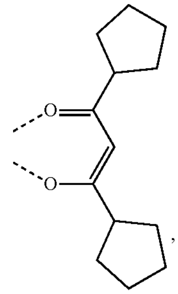
$L_{b43}$
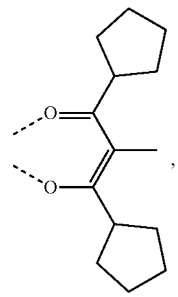
$L_{b44}$
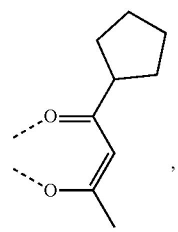
$L_{b45}$
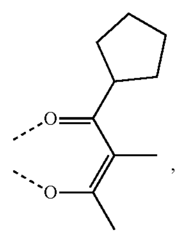
$L_{b46}$
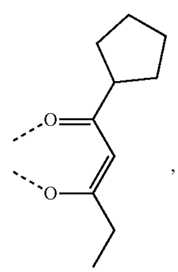
$L_{b47}$
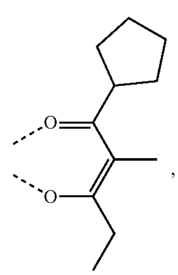
$L_{b48}$ $L_{b49}$
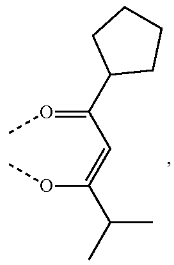
$L_{b50}$
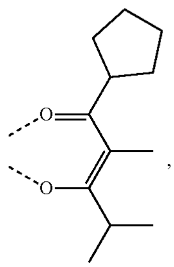
$L_{b51}$
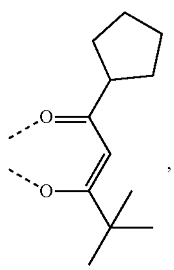
$L_{b52}$
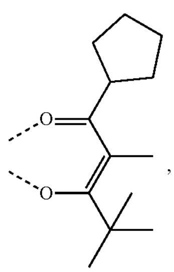
$L_{b53}$
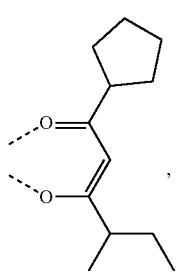
$L_{b54}$
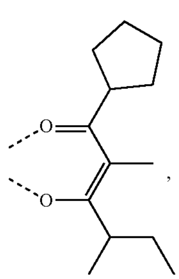
$L_{b55}$
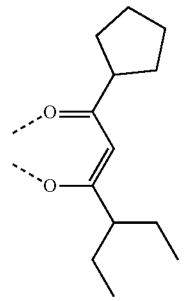
$L_{b56}$
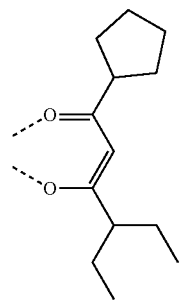
$L_{b57}$
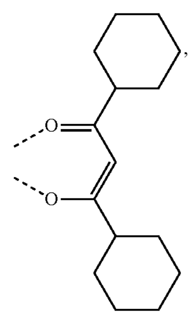
$L_{b58}$
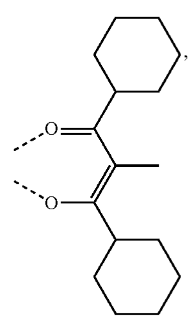
$L_{b59}$
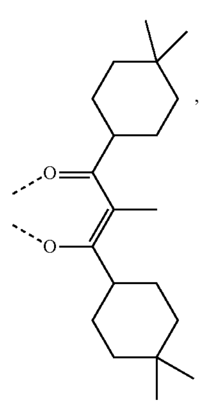

-continued
$L_{b60}$
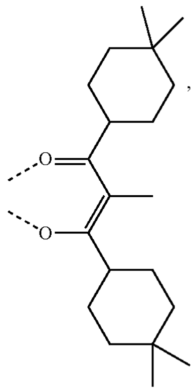
$L_{b61}$
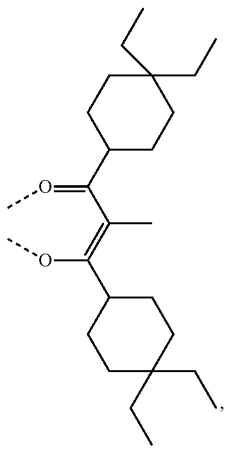
$L_{b62}$
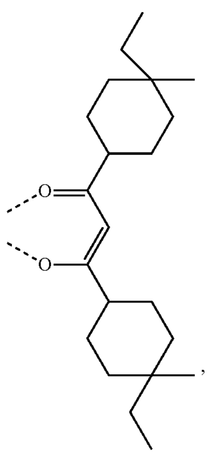
-continued
$L_{b63}$
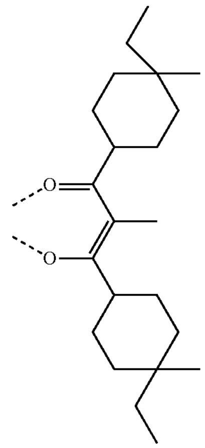
$L_{b64}$
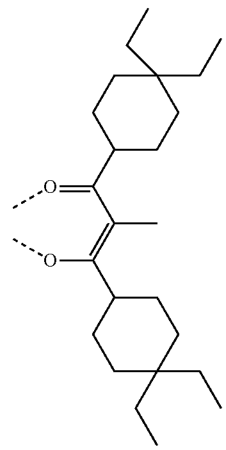
$L_{b65}$
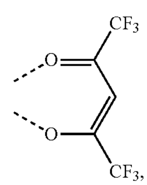
$L_{b66}$
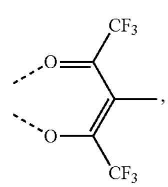
$L_{b67}$
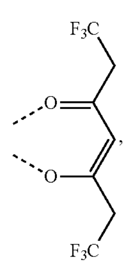

L$_{b68}$
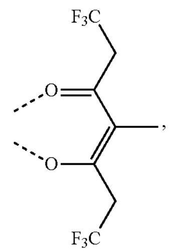
L$_{b69}$
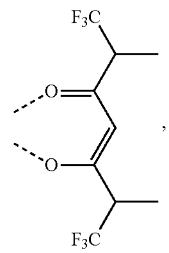
L$_{b70}$
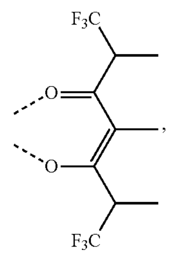
L$_{b71}$
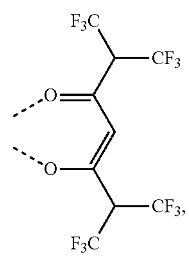
L$_{b72}$
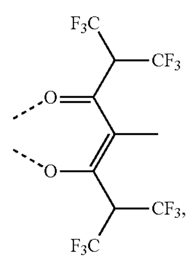
L$_{b73}$
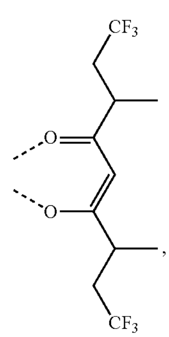
L$_{b74}$
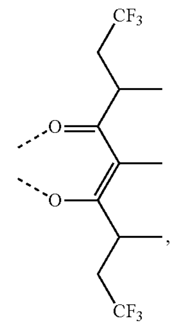
L$_{b75}$
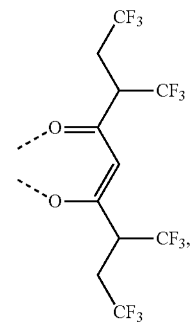
L$_{b76}$
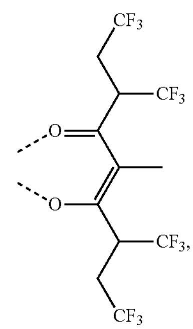
L$_{b77}$
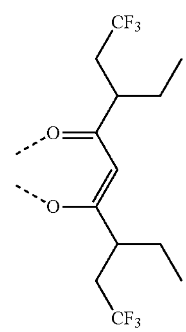

-continued
$L_{b78}$
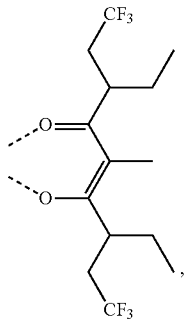
$L_{b79}$
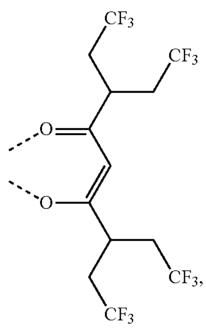
$L_{b80}$
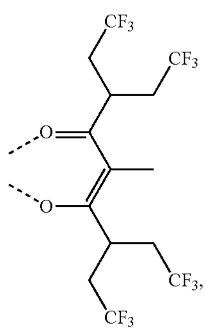
$L_{b81}$
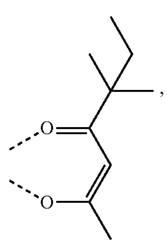
$L_{b82}$
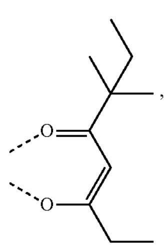
-continued
$L_{b83}$
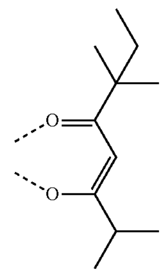
$L_{b84}$
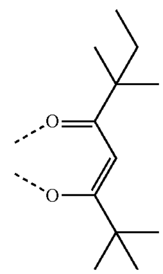
$L_{b85}$
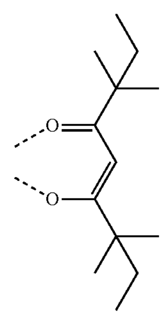
$L_{b86}$
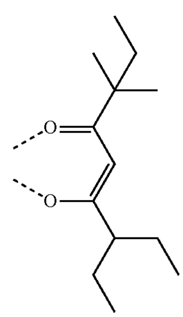
$L_{b87}$
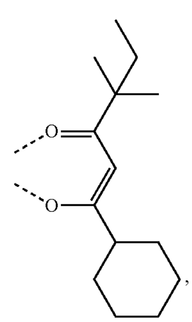

-continued
$L_{b88}$
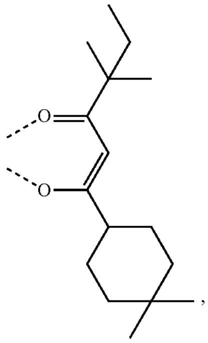
$L_{b89}$
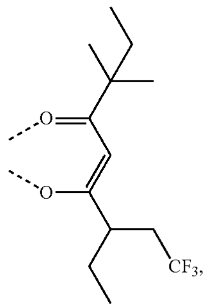
$L_{b90}$
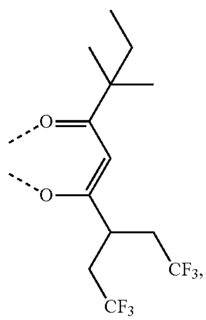
$L_{b91}$
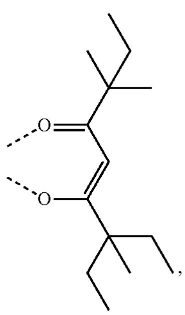
$L_{b92}$
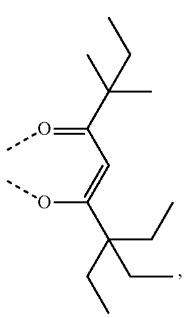
-continued
$L_{b93}$
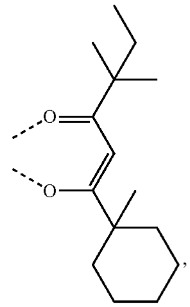
$L_{b94}$
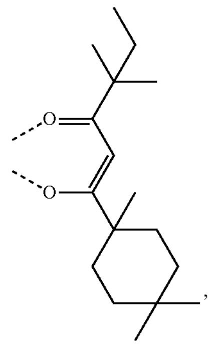
$L_{b95}$
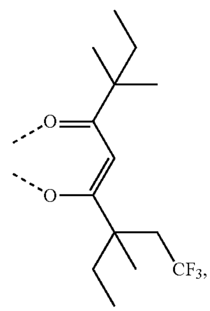
$L_{b96}$
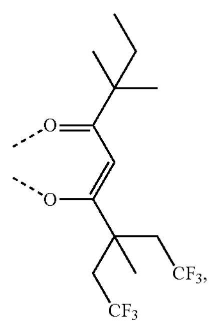
$L_{b97}$
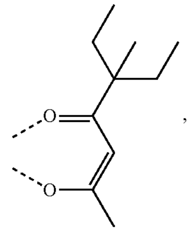

-continued
$L_{b98}$
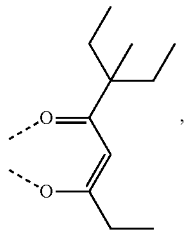
$L_{b99}$
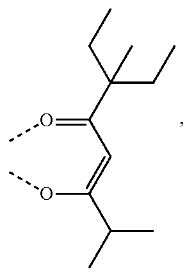
$L_{b100}$
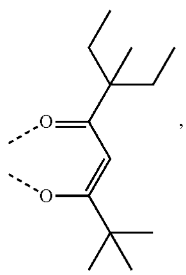
$L_{b101}$
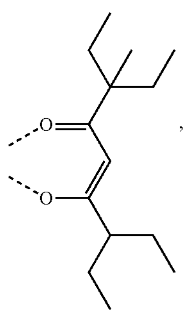
$L_{b102}$
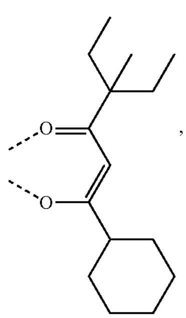
-continued
$L_{b103}$
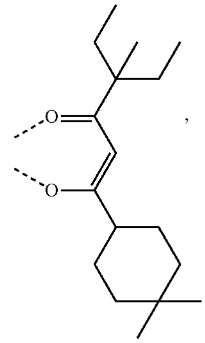
$L_{b104}$
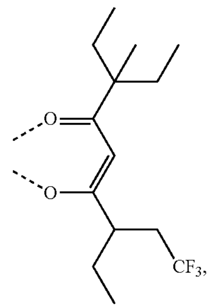
$L_{b105}$
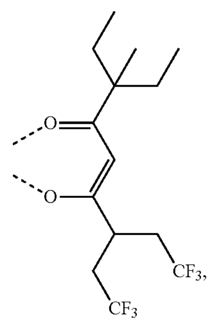
$L_{b106}$
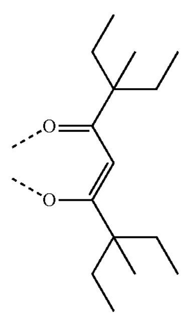
$L_{b107}$
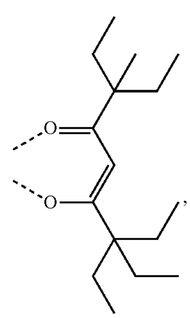

-continued
$L_{b108}$
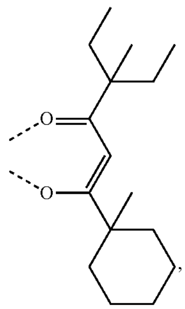
$L_{b109}$
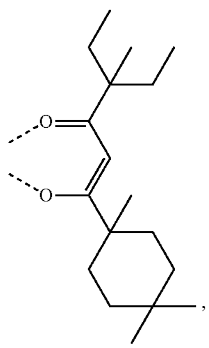
$L_{b110}$
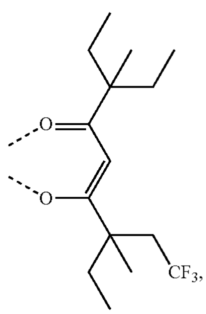
$L_{b111}$
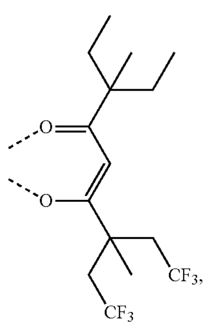
$L_{b112}$
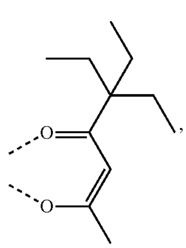
-continued
$L_{b113}$
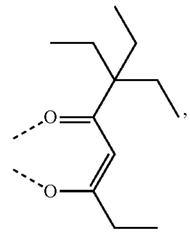
$L_{b114}$
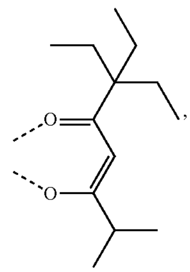
$L_{b115}$
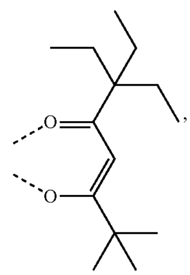
$L_{b116}$
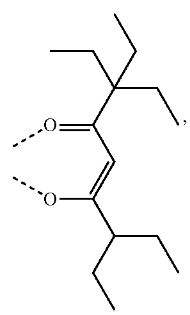
$L_{b117}$
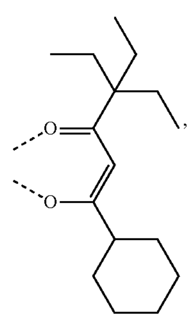

-continued
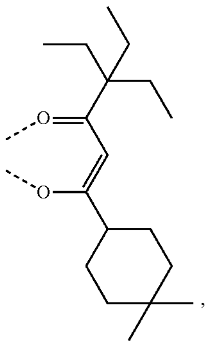
$L_{b118}$
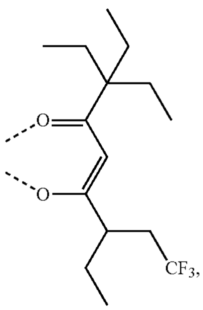
$L_{b119}$
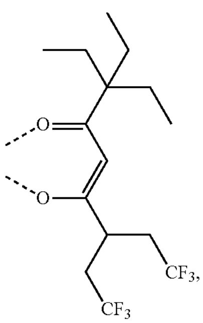
$L_{b120}$
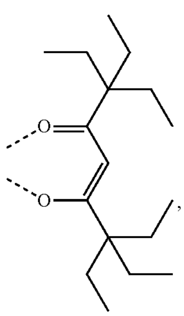
$L_{b121}$
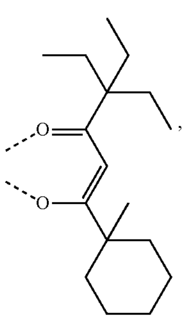
$L_{b122}$
-continued
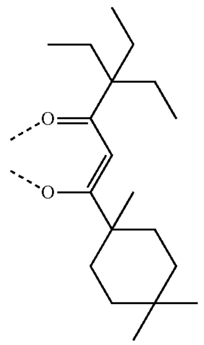
$L_{b123}$
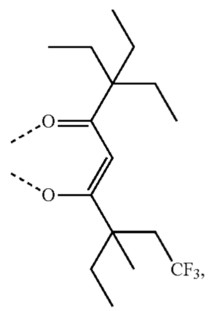
$L_{b124}$
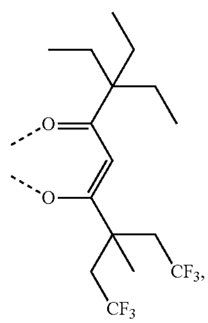
$L_{b125}$
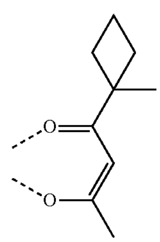
$L_{b126}$
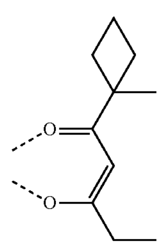
$L_{b127}$ -continued
$L_{b128}$
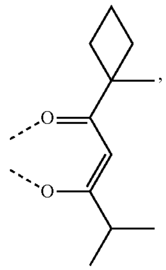
$L_{b129}$
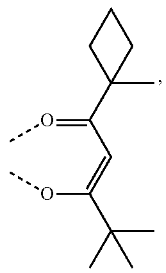
$L_{b130}$
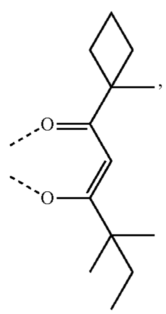
$L_{b131}$
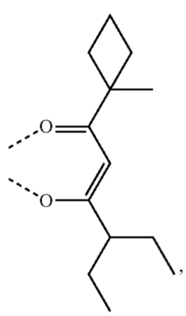
$L_{b132}$
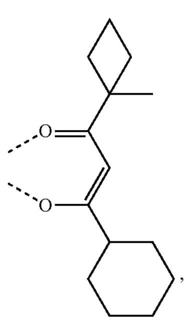
-continued
$L_{b133}$
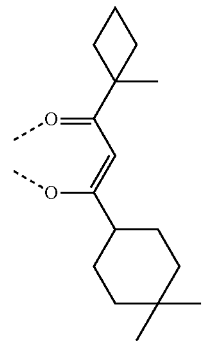
$L_{b134}$
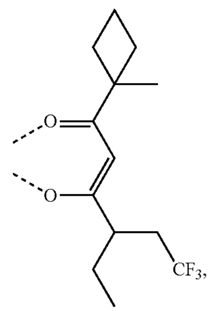
$L_{b135}$
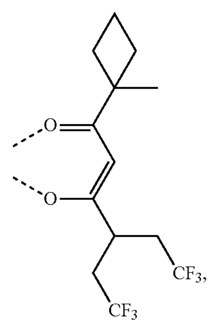
$L_{b136}$
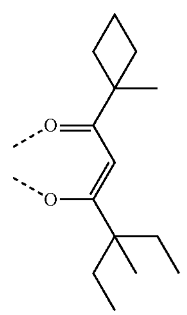
$L_{b137}$
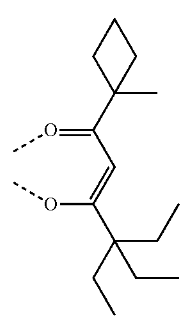

-continued
$L_{b138}$
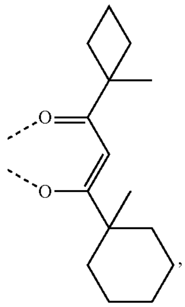
$L_{b139}$
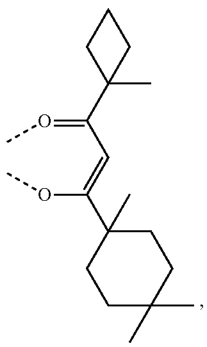
$L_{b140}$
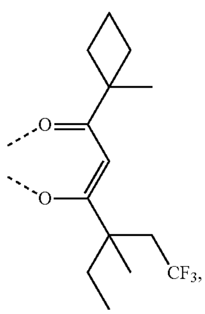
$L_{b141}$
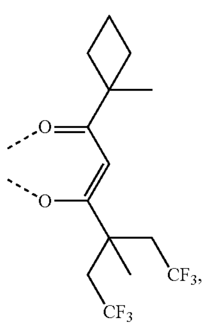
$L_{b142}$
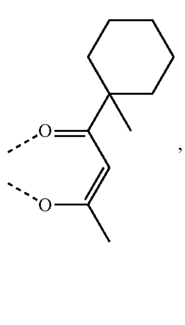
-continued
$L_{b143}$
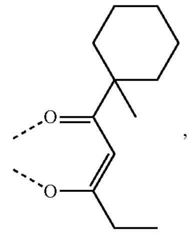
$L_{b144}$
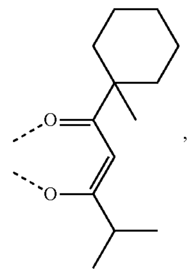
$L_{b145}$
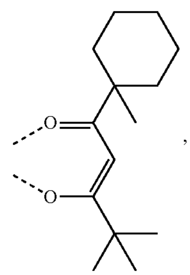
$L_{b146}$
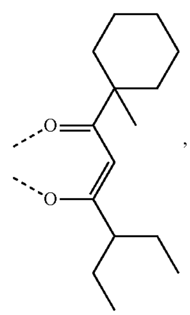
$L_{b147}$
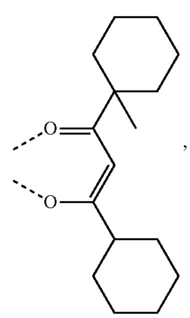

-continued
$L_{b148}$
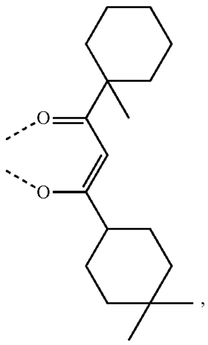
$L_{b149}$
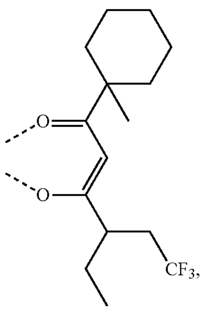
$L_{b150}$
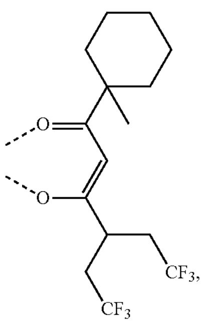
$L_{b151}$
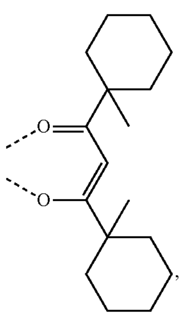
-continued
$L_{b152}$
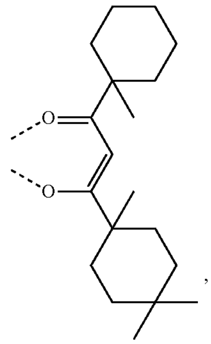
$L_{b153}$
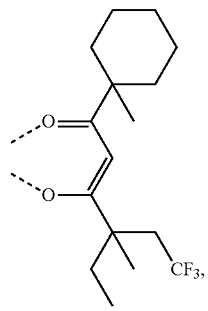
$L_{b154}$
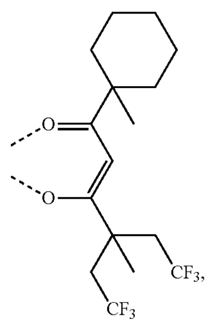
$L_{b155}$
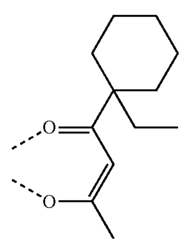
$L_{b156}$
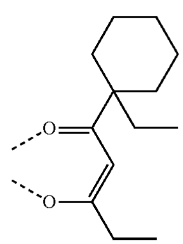

-continued
$L_{b157}$
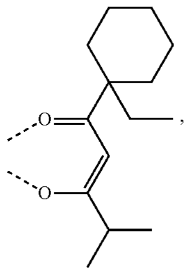
$L_{b158}$
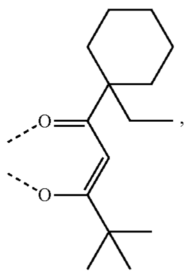
$L_{b159}$
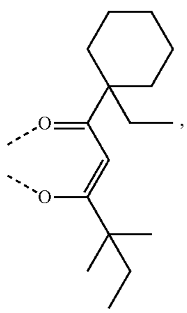
$L_{b160}$
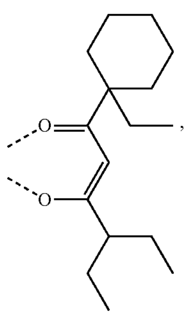
$L_{b161}$
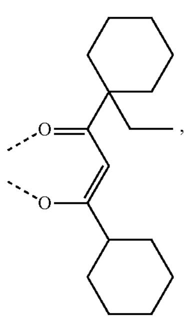
-continued
$L_{b162}$
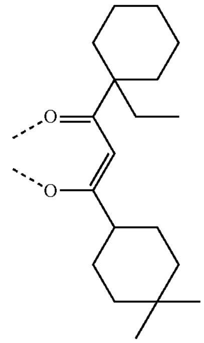
$L_{b163}$
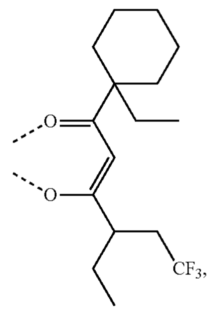
$L_{b164}$
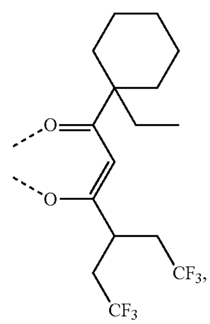
$L_{b165}$
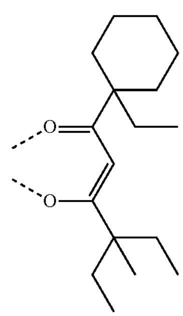
$L_{b166}$
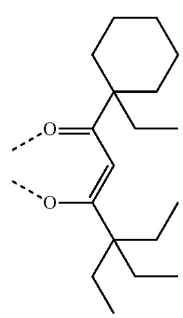

-continued
$L_{b167}$
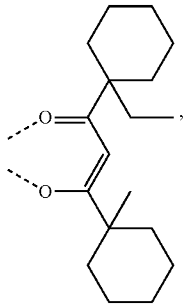
$L_{b168}$
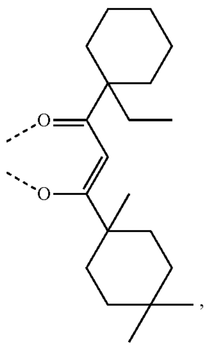
$L_{b169}$
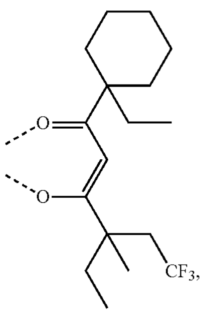
$L_{b170}$
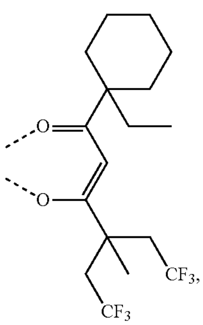
$L_{b171}$
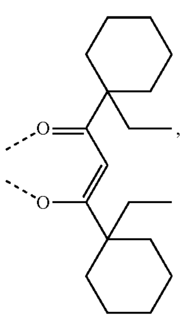
-continued
$L_{b172}$
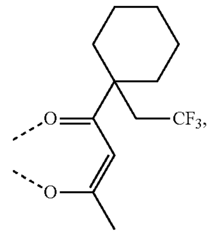
$L_{b173}$
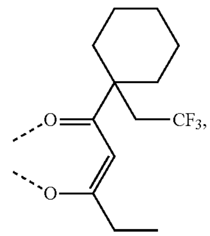
$L_{b174}$
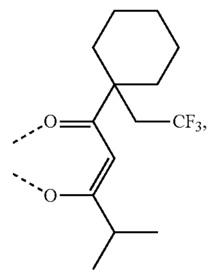
$L_{b175}$
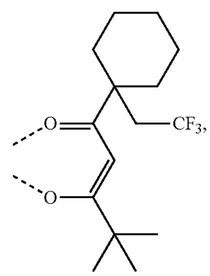
$L_{b176}$
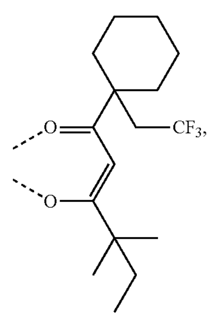

-continued
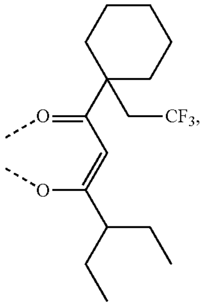
Lb177
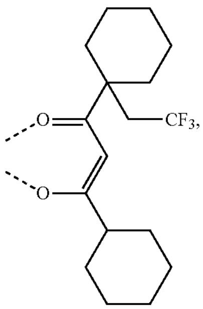
Lb178
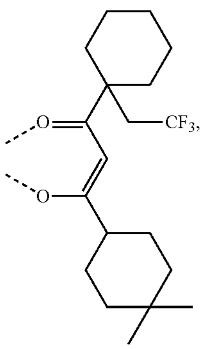
Lb179
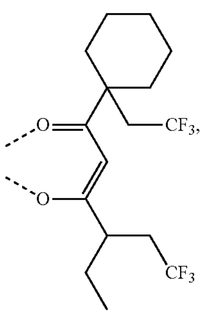
Lb180
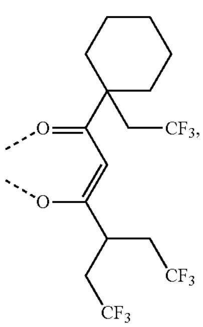
Lb181
-continued
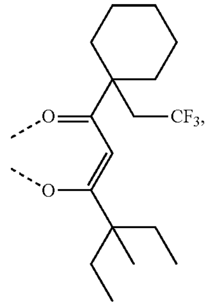
Lb182
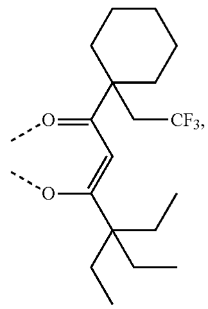
Lb183
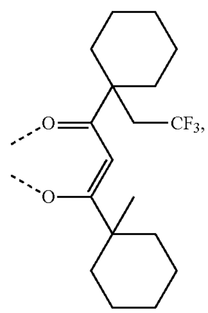
Lb184
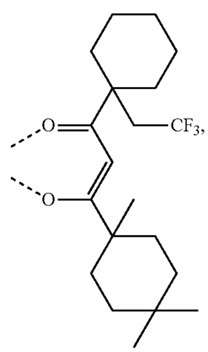
Lb185
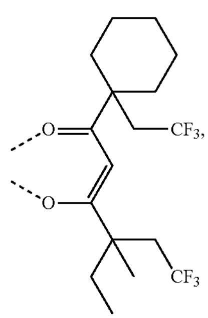
Lb186

$L_{b187}$
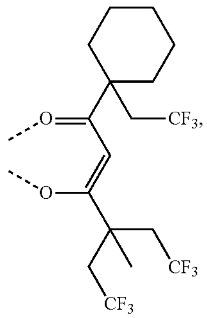
$L_{b188}$
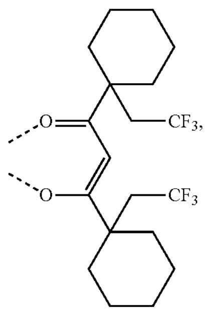
$L_{b189}$
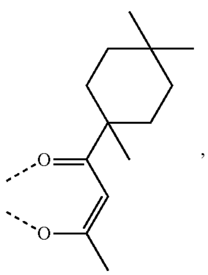
$L_{b190}$
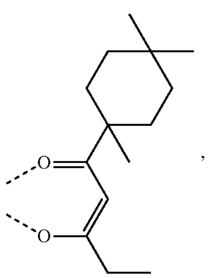
$L_{b191}$
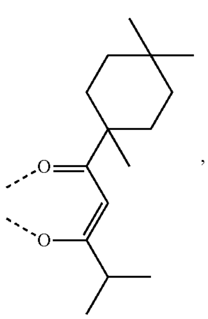
$L_{b192}$
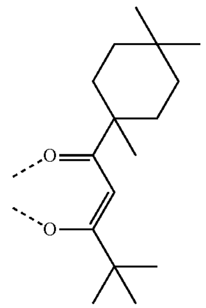
$L_{b193}$
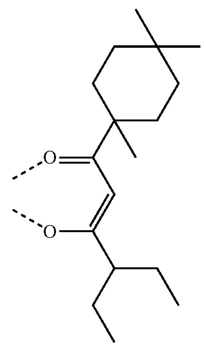
$L_{b194}$
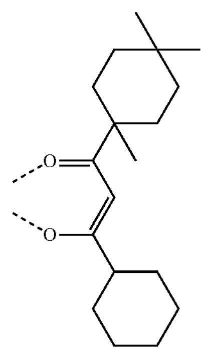
$L_{b195}$
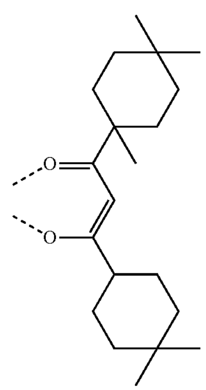

-continued
$L_{b196}$
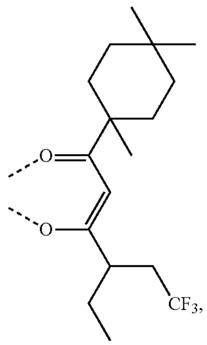
$L_{b197}$
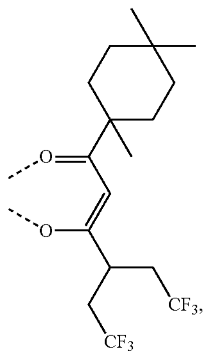
$L_{b198}$
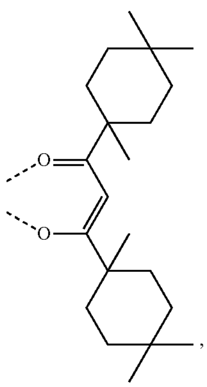
$L_{b199}$
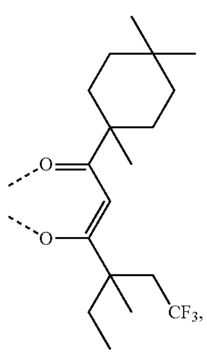
-continued
$L_{b200}$
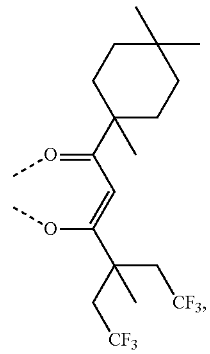
$L_{b201}$
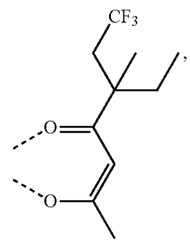
$L_{b202}$
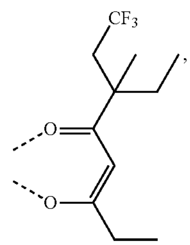
$L_{b203}$
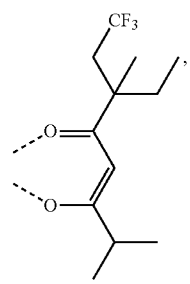
$L_{b204}$
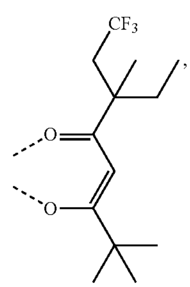

-continued
$L_{b205}$
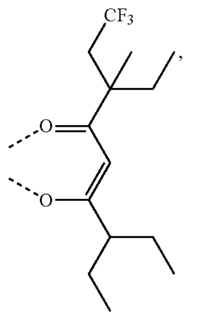
$L_{b206}$
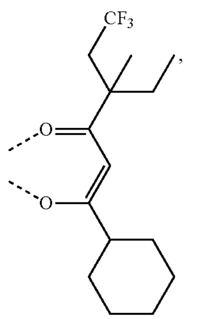
$L_{b207}$
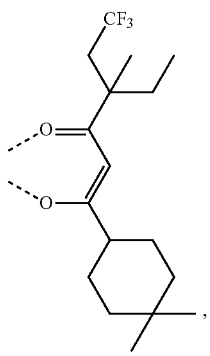
$L_{b208}$
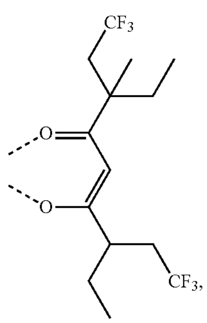
$L_{b209}$
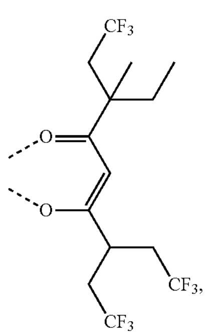
-continued
$L_{b210}$
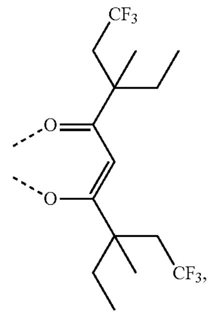
$L_{b211}$
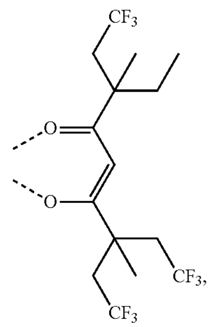
$L_{b212}$
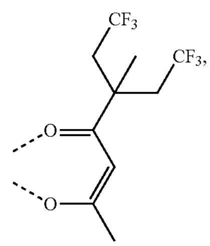
$L_{b213}$
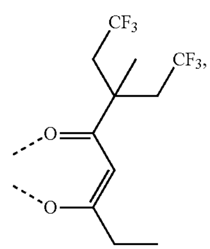
$L_{b214}$
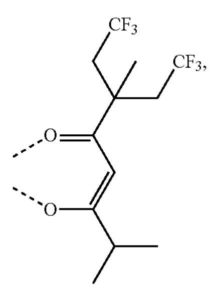

-continued
Lb215
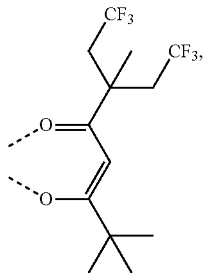
Lb216
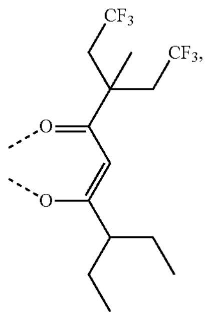
Lb217
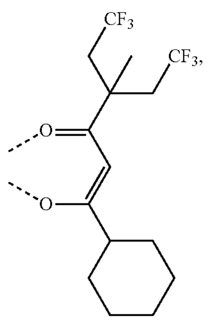
Lb218
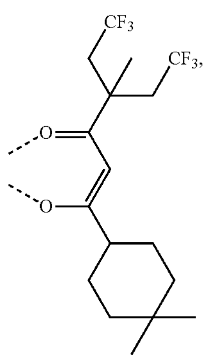
Lb219
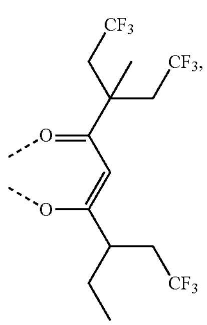
-continued
Lb220
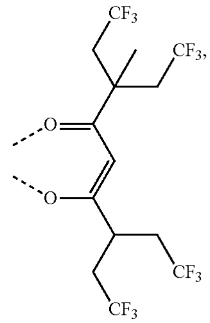
Lb221
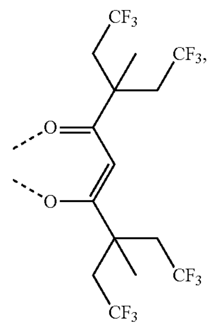
Lb222
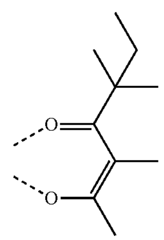
Lb223
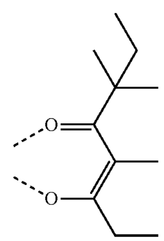
Lb224
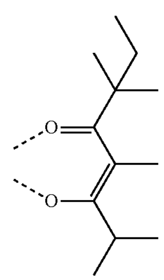

-continued
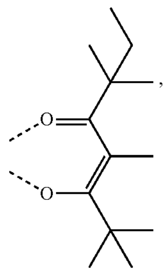
$L_{b225}$
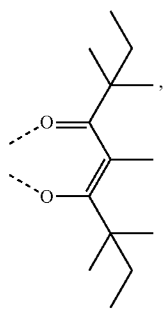
$L_{b226}$
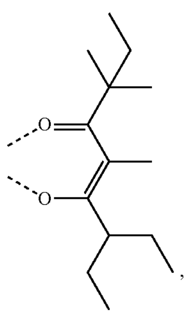
$L_{b227}$
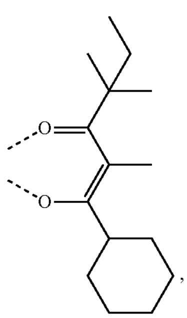
$L_{b228}$
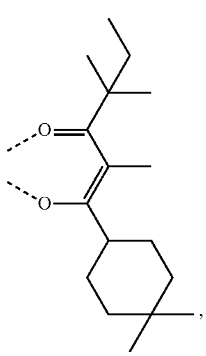
$L_{b229}$
-continued
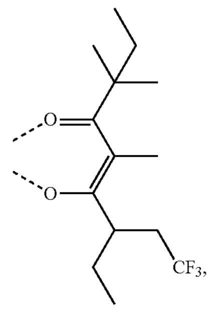
$L_{b230}$
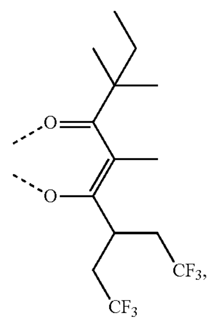
$L_{b231}$
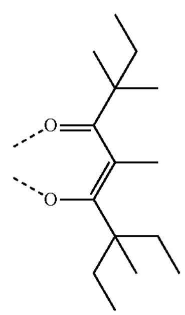
$L_{b232}$
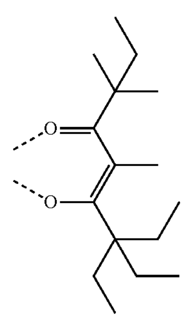
$L_{b233}$
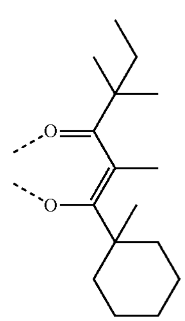
$L_{b234}$ -continued
$L_{b235}$
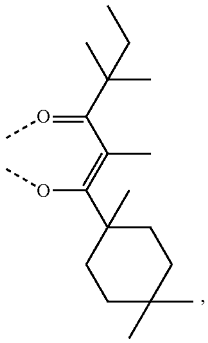
$L_{b236}$
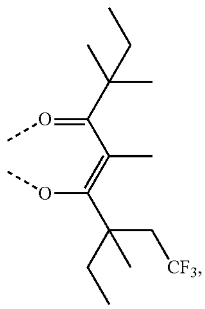
$L_{b237}$
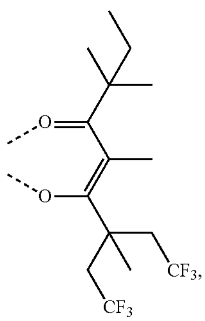
$L_{b238}$
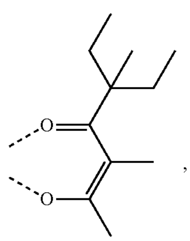
$L_{b239}$
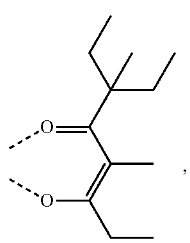
-continued
$L_{b240}$
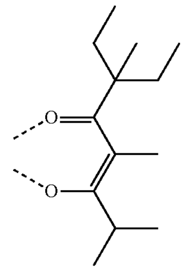
L*b*241
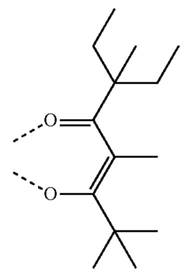
$L_{b242}$
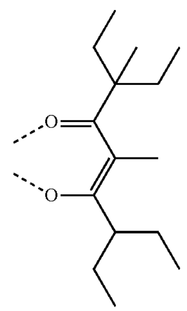
$L_{b243}$
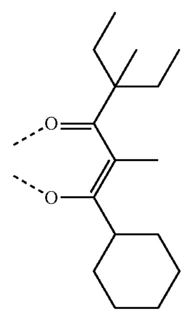
$L_{b244}$
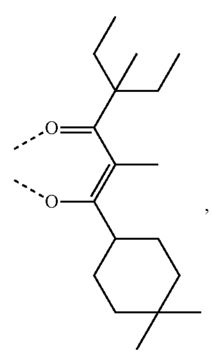

-continued
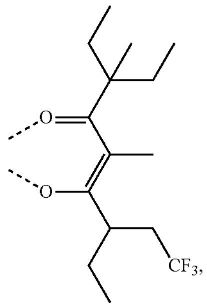
$L_{b245}$
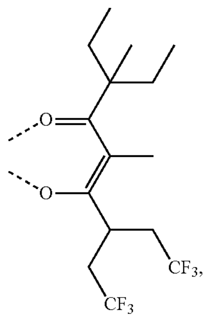
$L_{b246}$
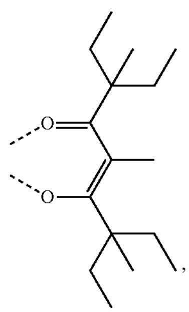
$L_{b247}$
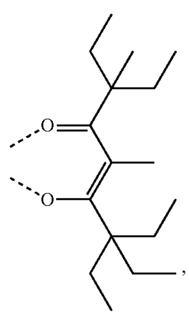
$L_{b248}$
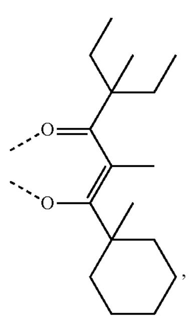
$L_{b249}$
-continued
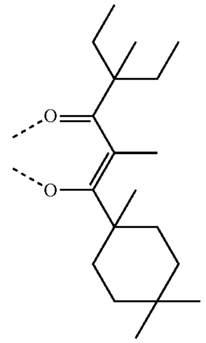
$L_{b250}$
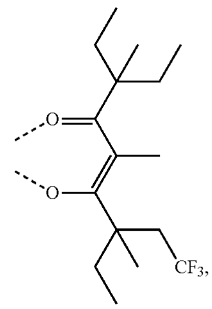
$L_{b251}$
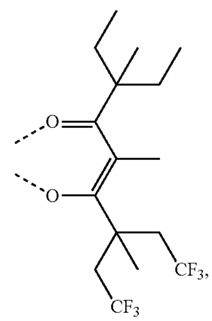
$L_{b252}$
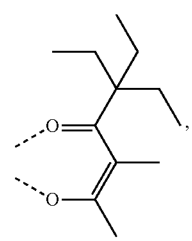
$L_{b253}$
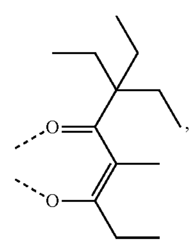
$L_{b254}$ -continued
$L_{b255}$
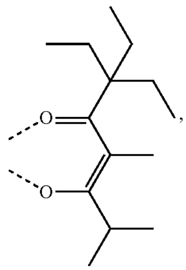
$L_{b256}$
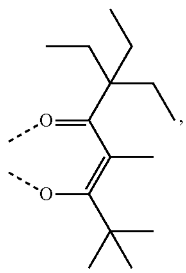
$L_{b257}$
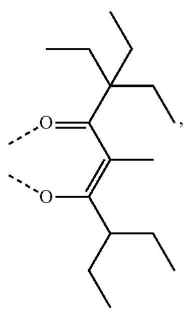
$L_{b258}$
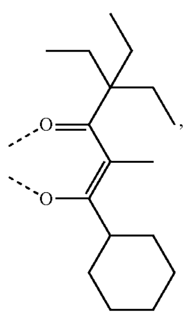
$L_{b259}$
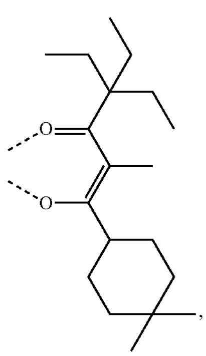
-continued
$L_{b260}$
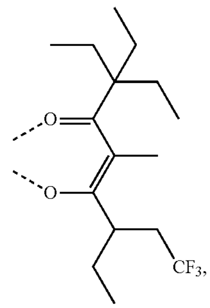
$L_{b261}$
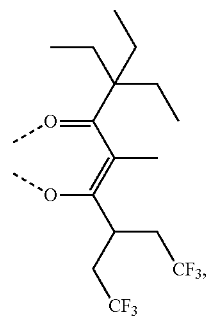
$L_{b262}$
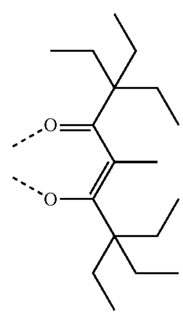
$L_{b263}$
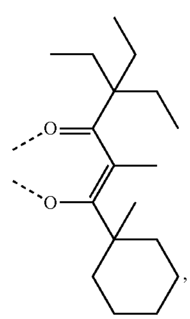
$L_{b264}$
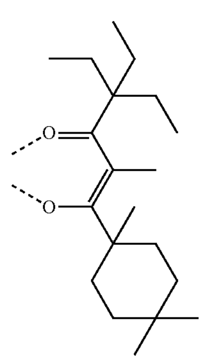

-continued
$L_{b265}$
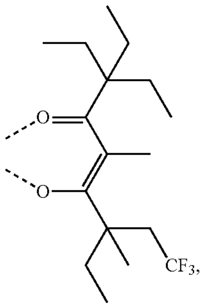
$L_{b266}$
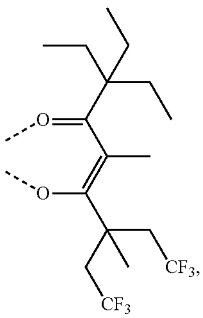
$L_{b267}$
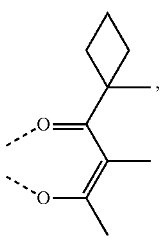
$L_{b268}$
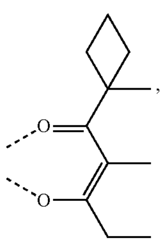
$L_{b269}$
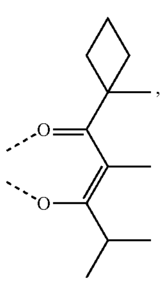
-continued
$L_{b270}$
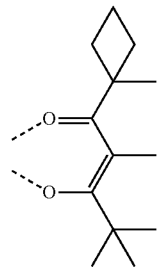
$L_{b271}$
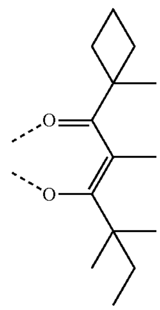
$L_{b272}$
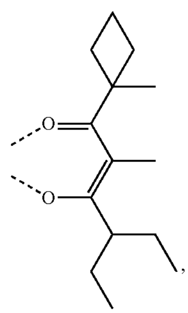
$L_{b273}$
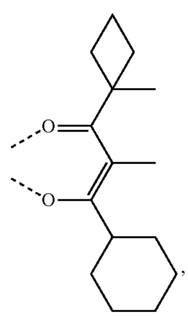
$L_{b274}$
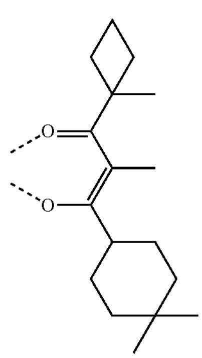

-continued
$L_{b275}$
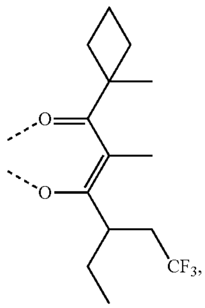
$L_{b276}$
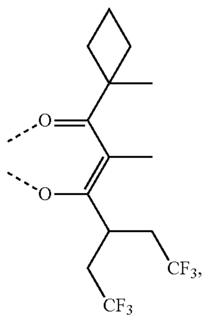
$L_{b277}$
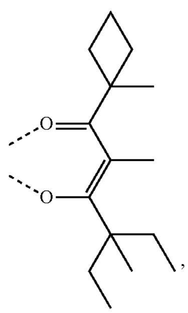
$L_{b278}$
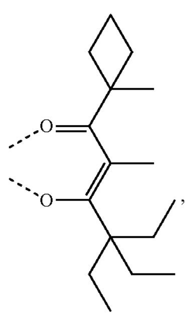
$L_{b279}$
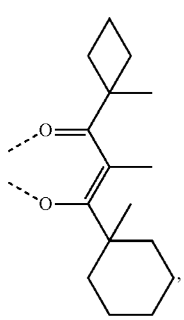
-continued
$L_{b280}$
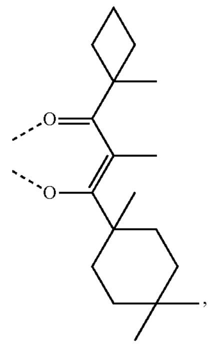
$L_{b281}$
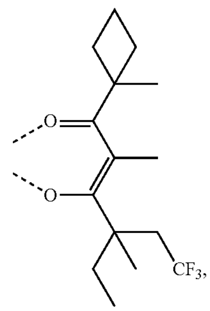
$L_{b282}$
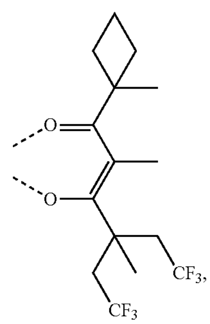
$L_{b283}$
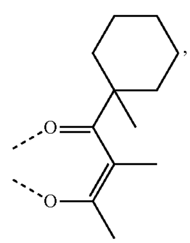
$L_{b284}$
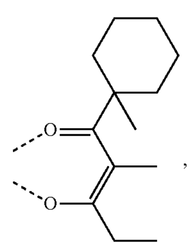

-continued
$L_{b285}$
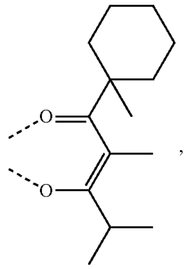
$L_{b286}$
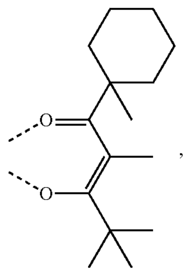
$L_{b287}$
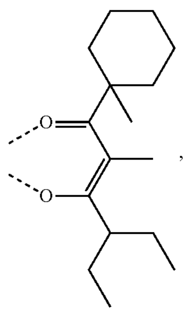
$L_{b288}$
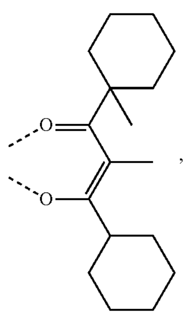
$L_{b289}$
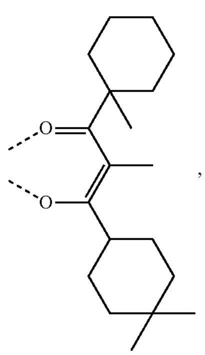
-continued
$L_{b290}$
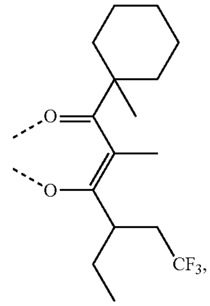
$L_{b291}$
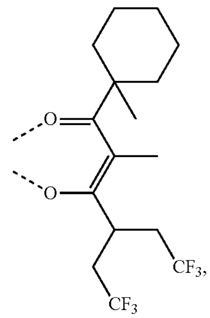
$L_{b292}$
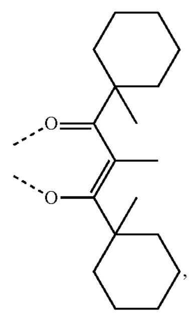
$L_{b293}$
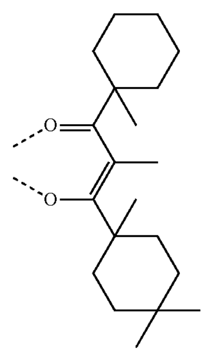
$L_{b294}$
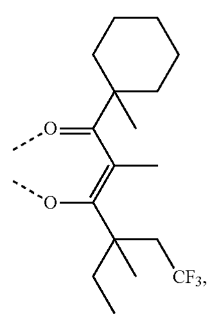

-continued
L$_{b295}$
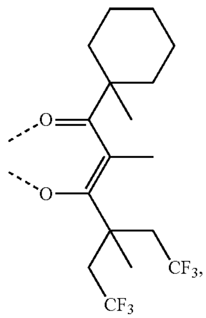
L$_{b296}$
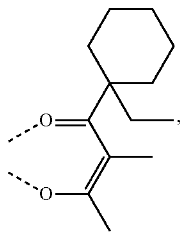
L$_{b297}$
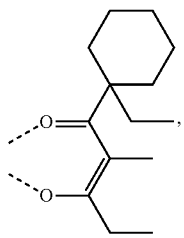
L$_{b298}$
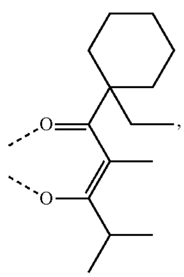
L$_{b299}$
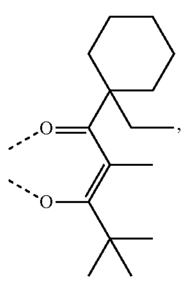
-continued
L$_{b300}$
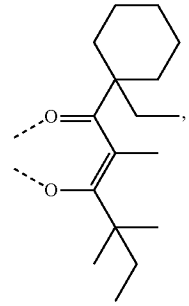
L$_{b301}$
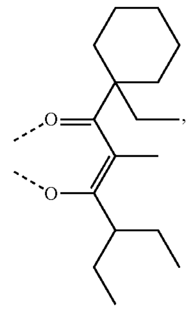
L$_{b302}$
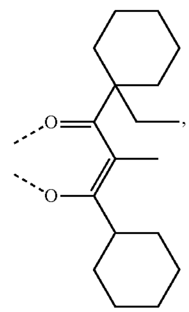
L$_{b303}$
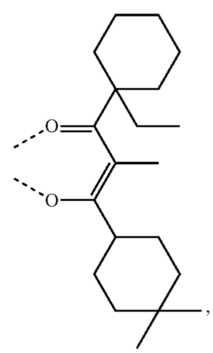
L$_{b304}$
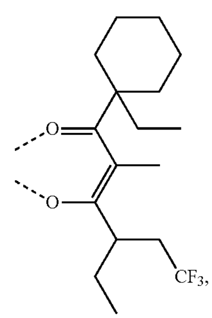

-continued
Lb305
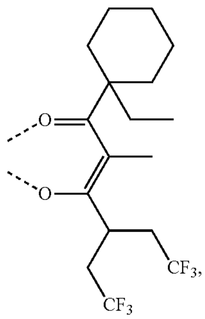
Lb306
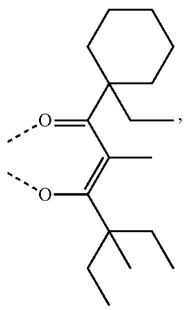
Lb307
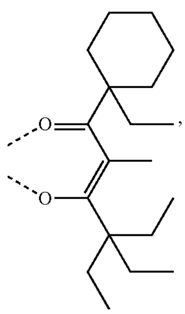
Lb308
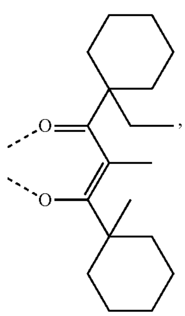
Lb309
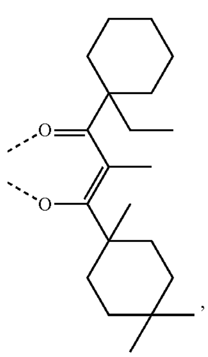
-continued
Lb310
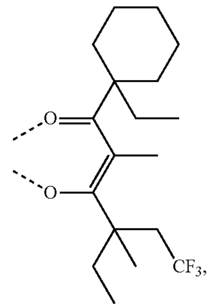
Lb311
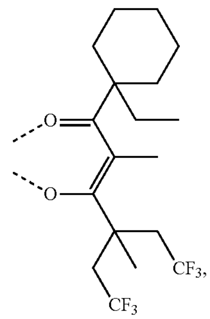
Lb312
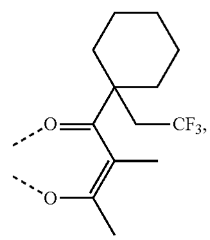
Lb313
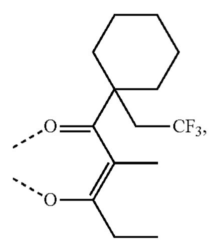
Lb314
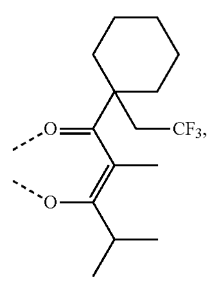

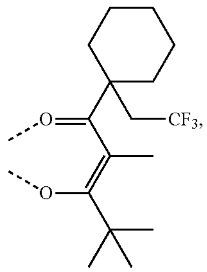
$L_{b315}$
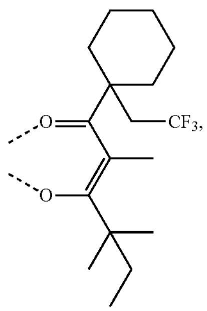
$L_{b316}$
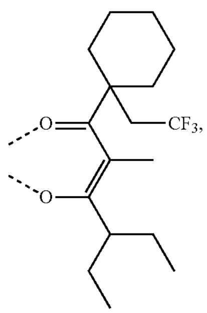
$L_{b317}$
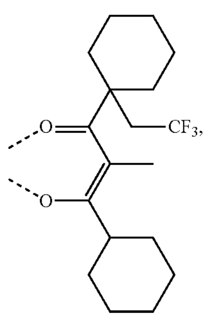
$L_{b318}$
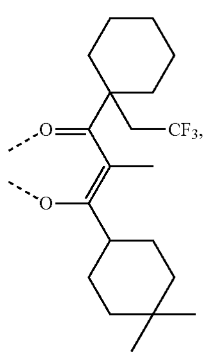
$L_{b319}$
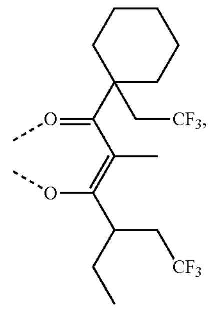
$L_{b320}$
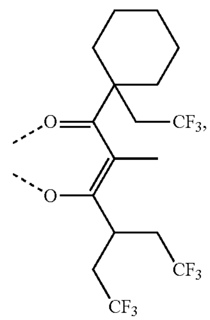
$L_{b321}$
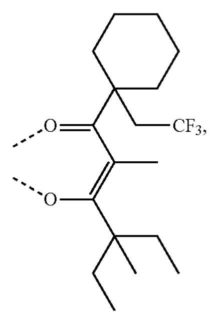
$L_{b322}$
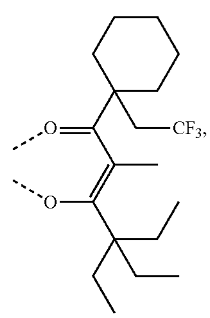
$L_{b323}$
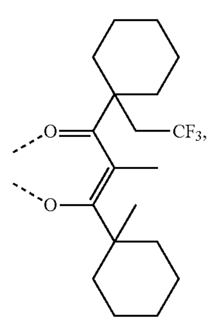
$L_{b324}$

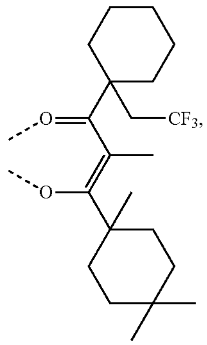
$L_{b325}$
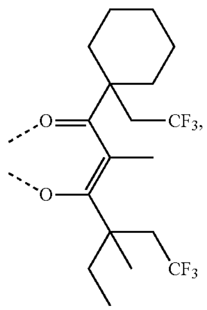
$L_{b326}$
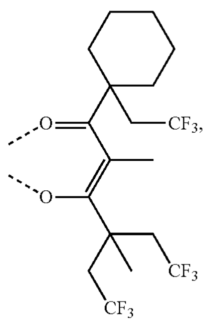
$L_{b327}$
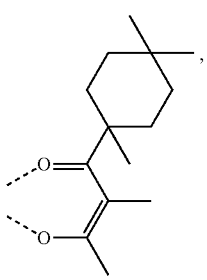
$L_{b328}$
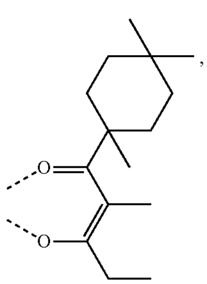
$L_{b329}$
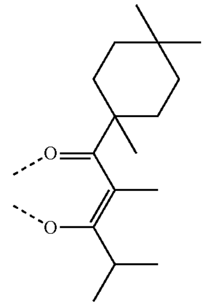
$L_{b330}$
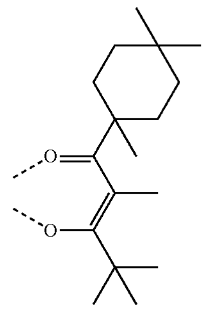
$L_{b331}$
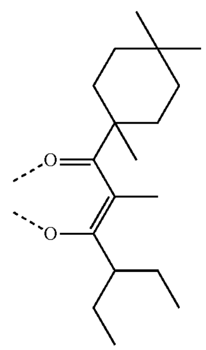
$L_{b332}$
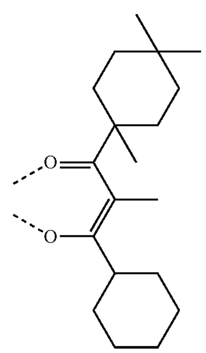
$L_{b333}$ $L_{b334}$
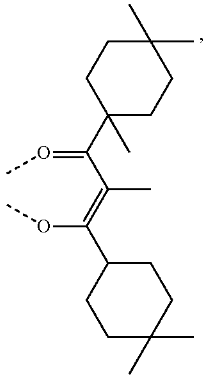
$L_{b335}$
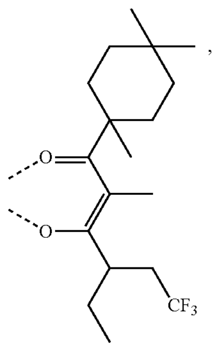
$L_{b336}$
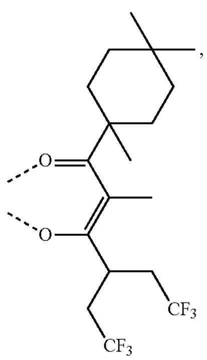
$L_{b337}$
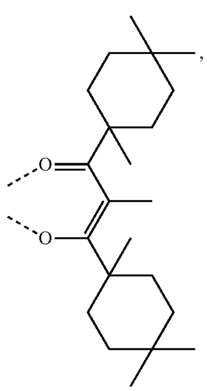
$L_{b338}$
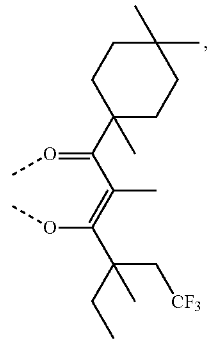
$L_{b339}$
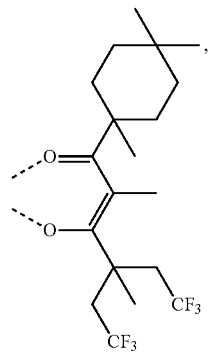
$L_{b340}$
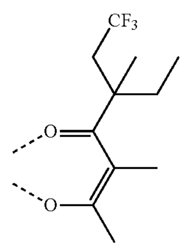
$L_{b341}$
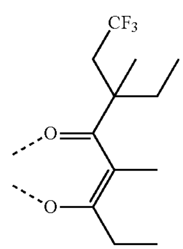
$L_{b342}$
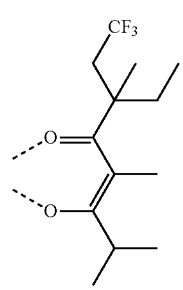

-continued
$L_{b343}$
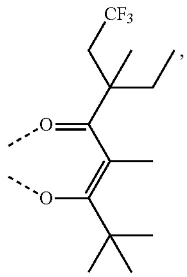
$L_{b344}$
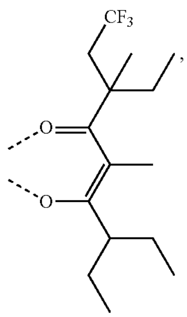
$L_{b345}$
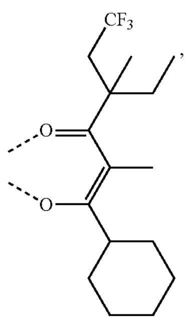
$L_{b346}$
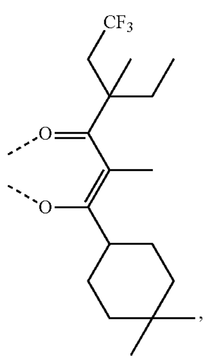
$L_{b347}$
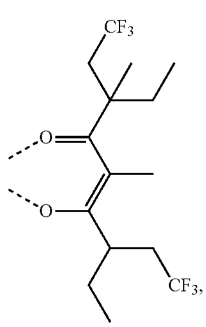
-continued
$L_{b348}$
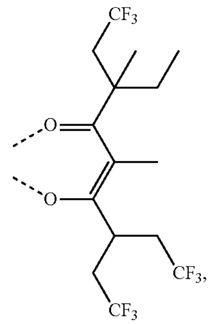
$L_{b349}$
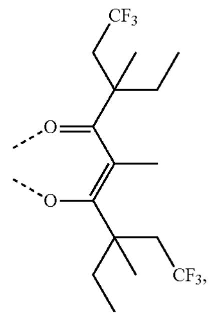
$L_{b350}$
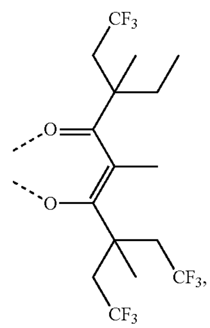
$L_{b351}$
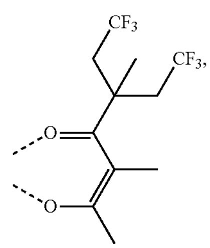
$L_{b352}$
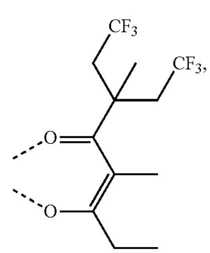

$L_{b353}$
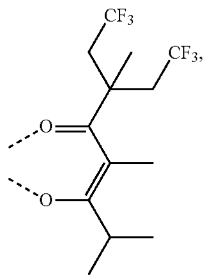
$L_{b354}$
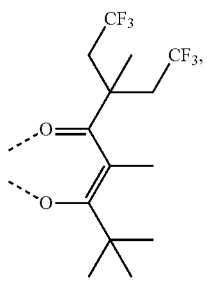
$L_{b355}$
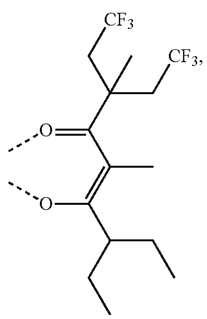
$L_{b356}$
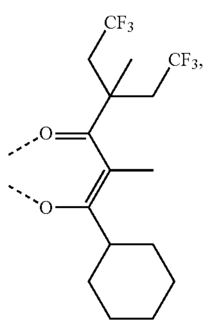
$L_{b357}$
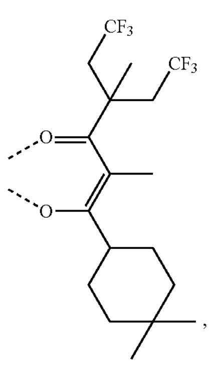
$L_{b358}$
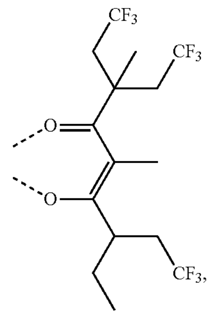
$L_{b359}$
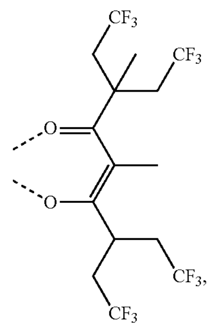
$L_{b360}$
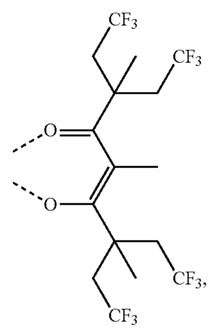
$L_{b361}$
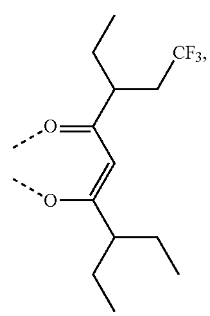
$L_{b362}$
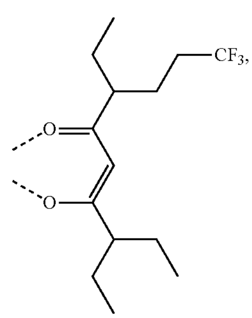

$L_{b363}$

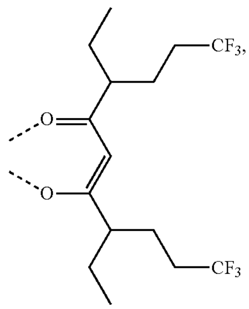

$L_{b364}$

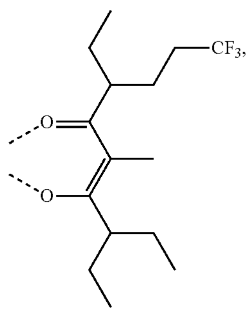

$L_{b365}$

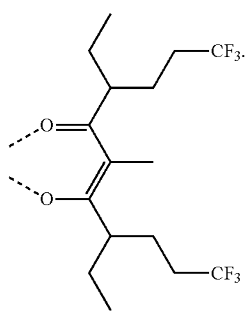

15. The metal complex of claim 7, wherein the metal complex is $Ir(L_a)(L_b)(L_c)$, and $L_a$ is any one selected from $L_{a1}$ to $L_{a693}$, and optionally, hydrogen in the ligands $L_a$ and $L_b$ may be partially or fully substituted by deuterium wherein $L_b$ has any one structure or any two structures independently selected from the group consisting of $L_{b1}$ to $L_{b365}$:

$L_{b1}$

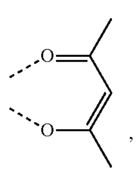

$L_{b2}$

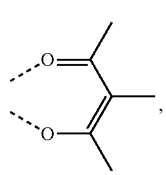

$L_{b3}$

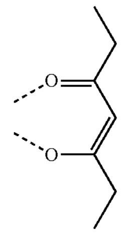

$L_{b4}$

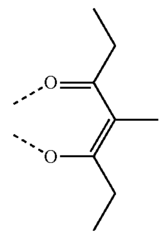

$L_{b5}$

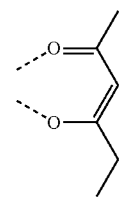

$L_{b6}$

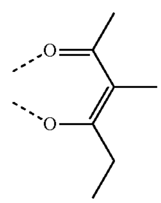

$L_{b7}$

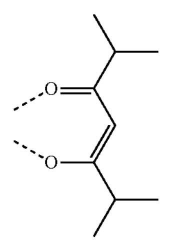

$L_{b8}$

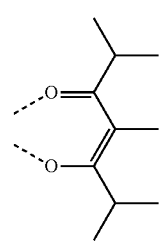

$L_{b9}$

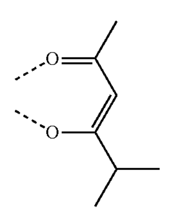

-continued
$L_{b10}$
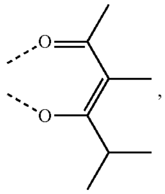
$L_{b11}$
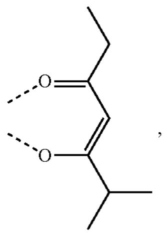
$L_{b12}$
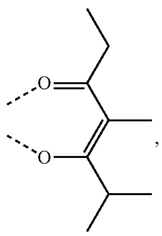
$L_{b13}$
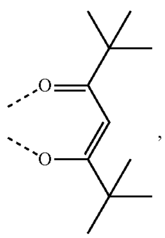
$L_{b14}$
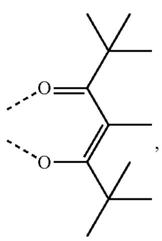
$L_{b15}$
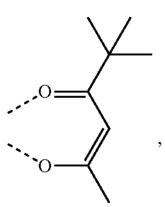
$L_{b16}$
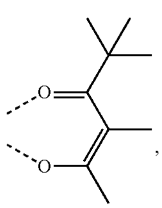
-continued
$L_{b17}$
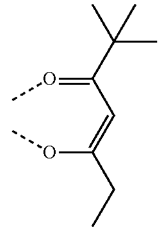
$L_{b18}$
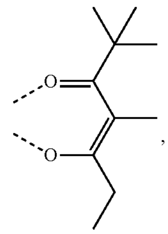
$L_{b19}$
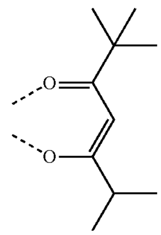
$L_{b20}$
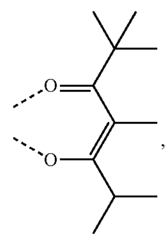
$L_{b21}$
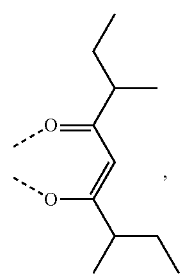
$L_{b22}$
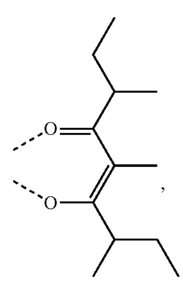

-continued
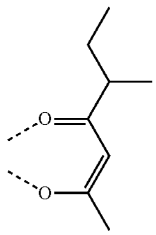
$L_{b23}$
,
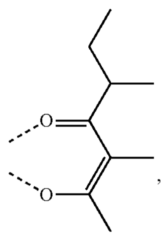
$L_{b24}$
,
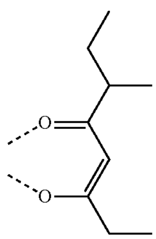
$L_{b25}$
,
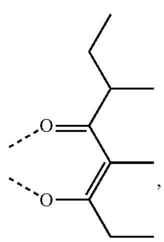
$L_{b26}$
,
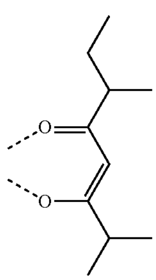
$L_{b27}$
,
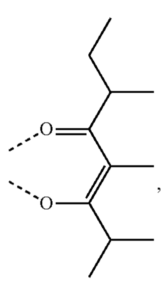
$L_{b28}$
,
-continued
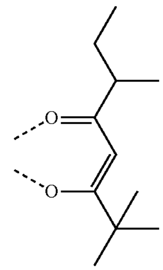
$L_{b29}$
,
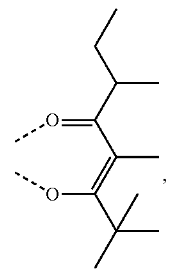
$L_{b30}$
,
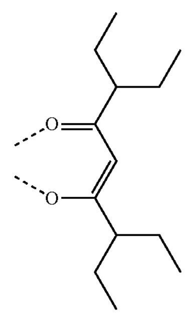
$L_{b31}$
,
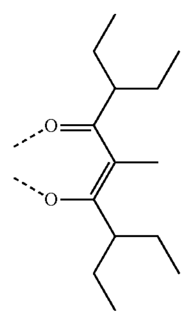
$L_{b32}$
,
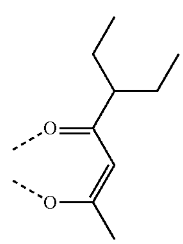
$L_{b33}$
, -continued
$L_{b34}$
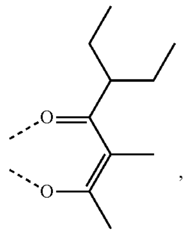
$L_{b35}$
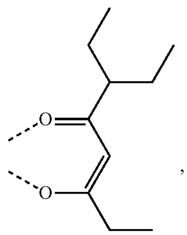
$L_{b36}$
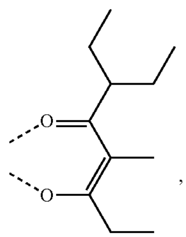
$L_{b37}$
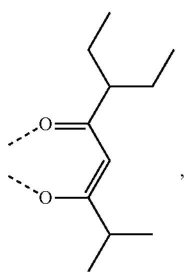
$L_{b38}$
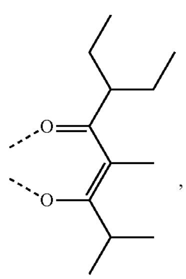
$L_{b39}$
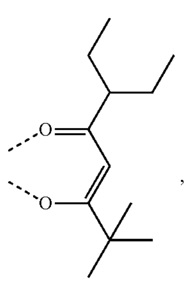
-continued
$L_{b40}$
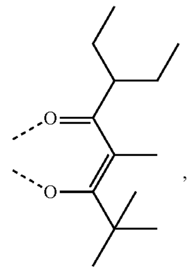
$L_{b41}$
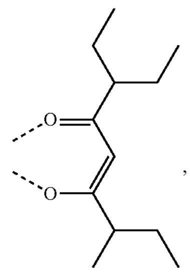
$L_{b42}$
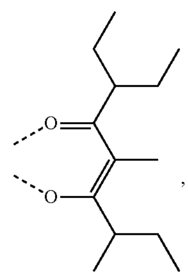
$L_{b43}$
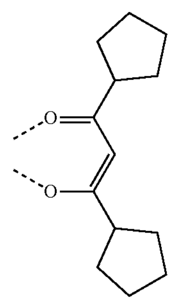
$L_{b44}$
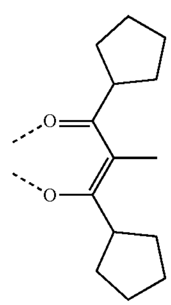

-continued
$L_{b45}$
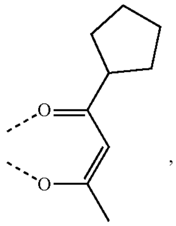
$L_{b46}$
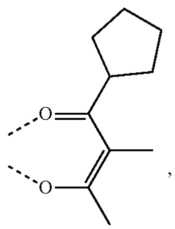
$L_{b47}$
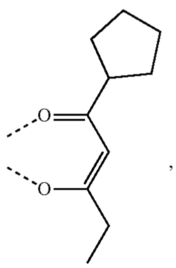
$L_{b48}$
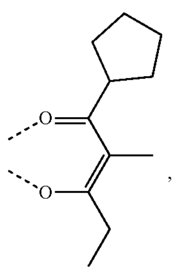
$L_{b49}$
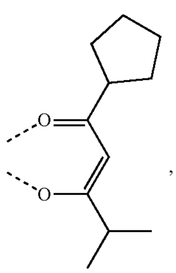
$L_{b50}$
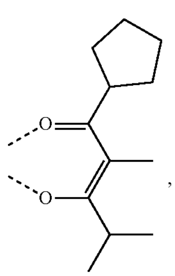
-continued
$L_{b51}$
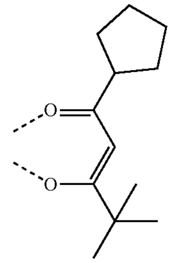
$L_{b52}$
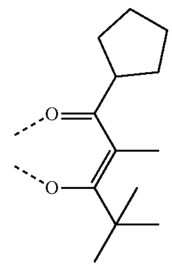
$L_{b53}$
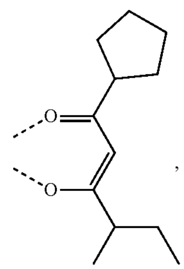
$L_{b54}$
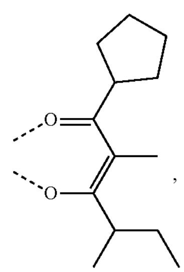
$L_{b55}$
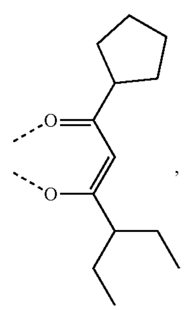

-continued
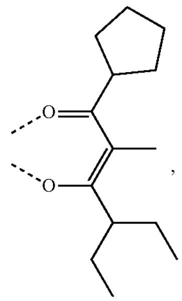
L_{b56}
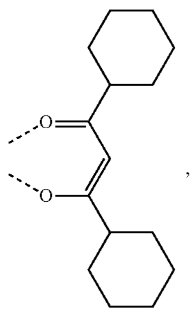
L_{b57}
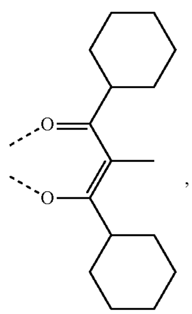
L_{b58}
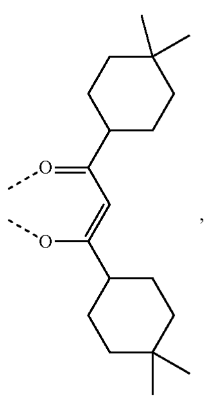
L_{b59}
-continued
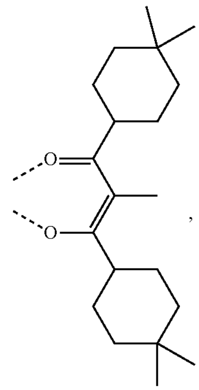
L_{b60}
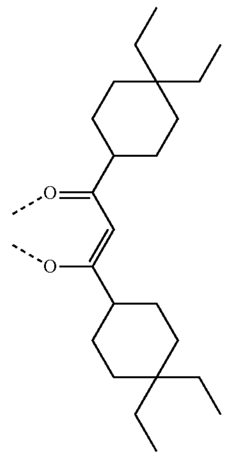
L_{b61}
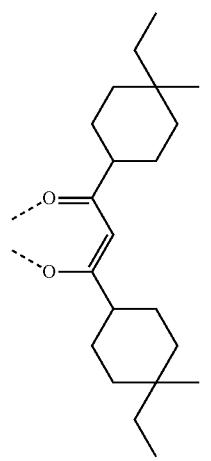
L_{b62}

-continued
$L_{b63}$
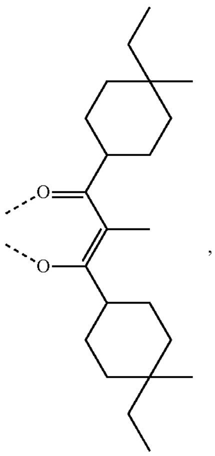
$L_{b64}$
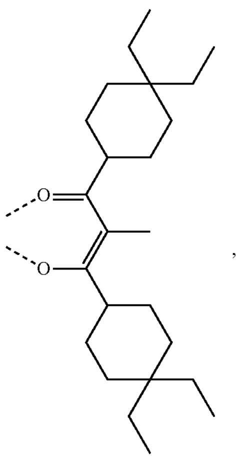
$L_{b65}$
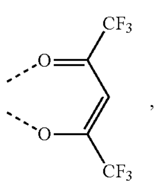
$L_{b66}$
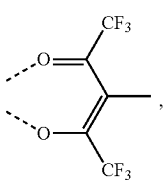
$L_{b67}$
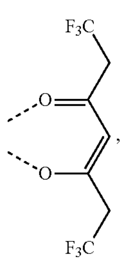
-continued
$L_{b68}$
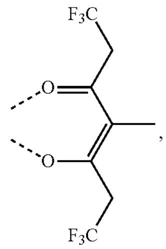
$L_{b69}$
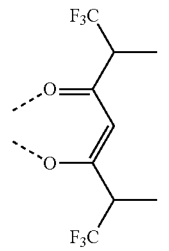
$L_{b70}$
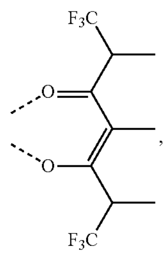
$L_{b71}$
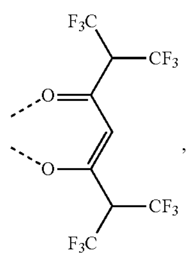
$L_{b72}$
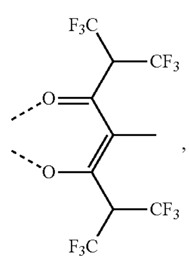
$L_{b73}$
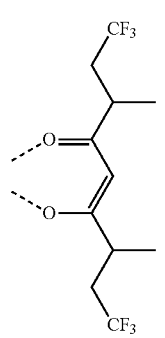

-continued
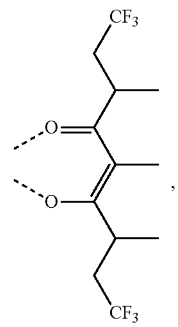
$L_{b74}$
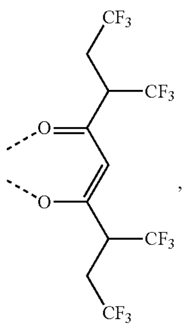
$L_{b75}$
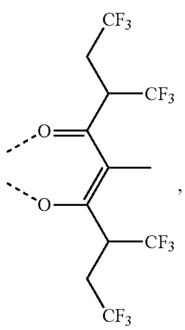
$L_{b76}$
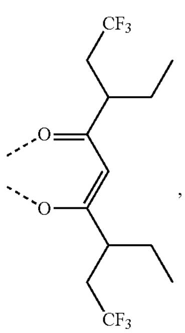
$L_{b77}$
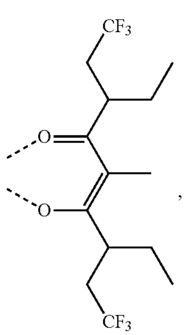
$L_{b78}$
-continued
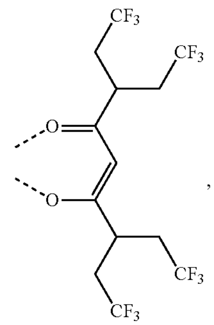
$L_{b79}$
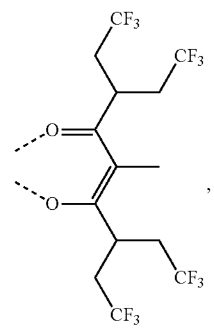
$L_{b80}$
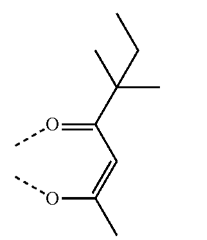
$L_{b81}$
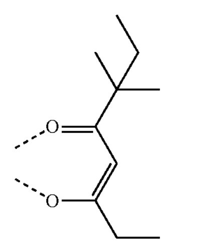
$L_{b82}$
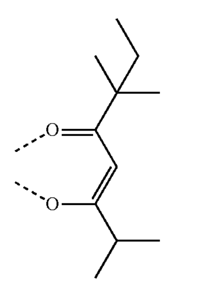
$L_{b83}$ $L_{b84}$
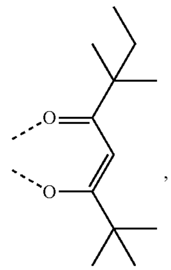
$L_{b85}$
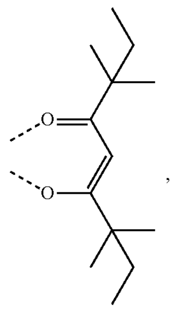
$L_{b86}$
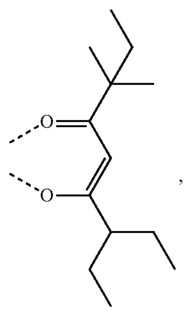
$L_{b87}$
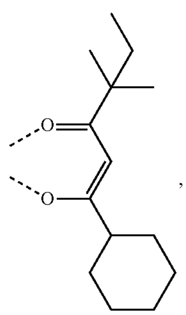
$L_{b88}$
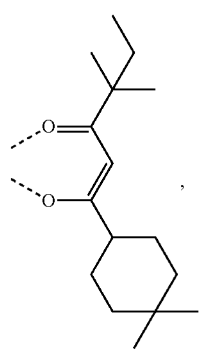
$L_{b89}$
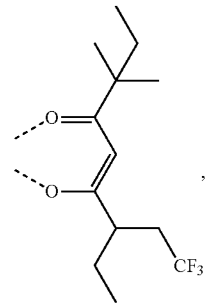
$L_{b90}$
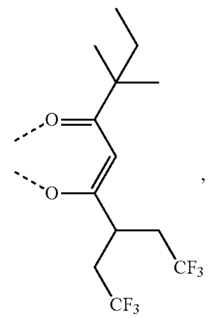
$L_{b91}$
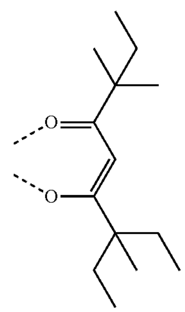
$L_{b92}$
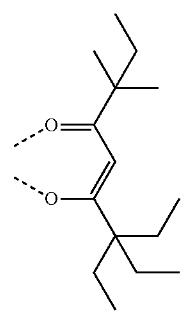
$L_{b93}$
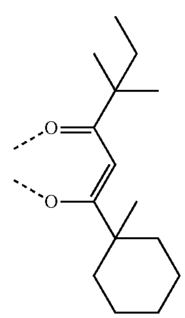

-continued
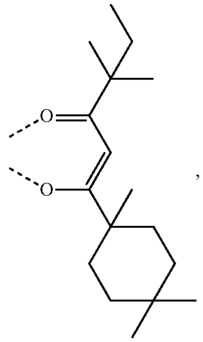
$L_{b94}$
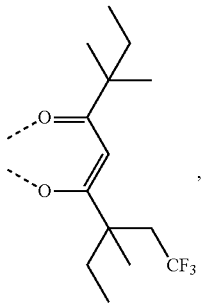
$L_{b95}$
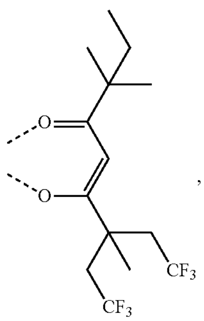
$L_{b96}$
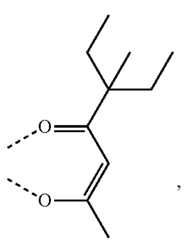
$L_{b97}$
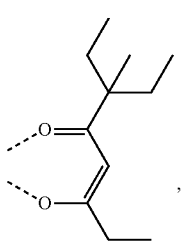
$L_{b98}$
-continued
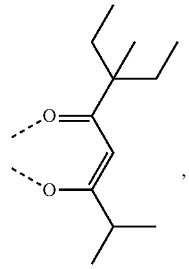
$L_{b99}$
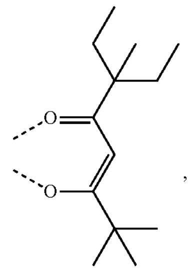
$L_{b100}$
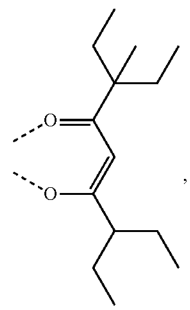
$L_{b101}$
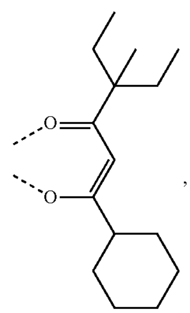
$L_{b102}$
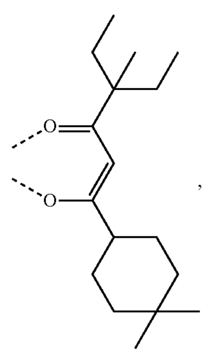
$L_{b103}$ $L_{b104}$
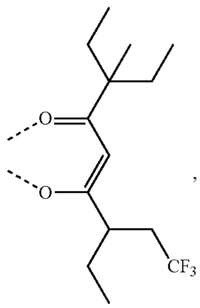
,
$L_{b105}$
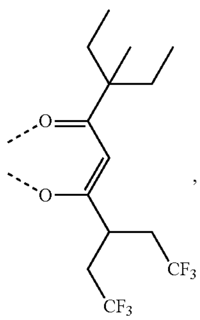
,
$L_{b106}$
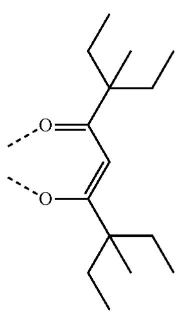
,
$L_{b107}$
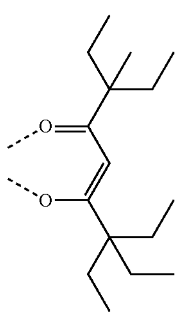
,
$L_{b108}$
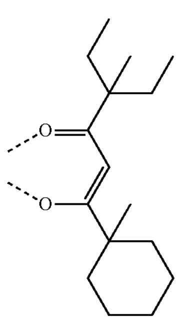
,
$L_{b109}$
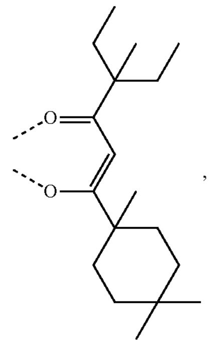
,
$L_{b110}$
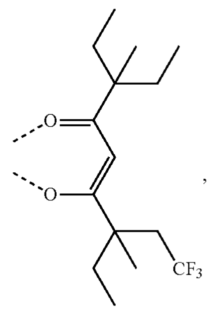
,
$L_{b111}$
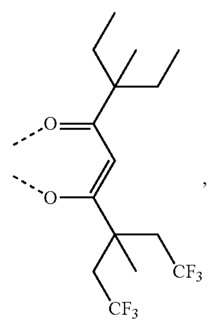
,
$L_{b112}$
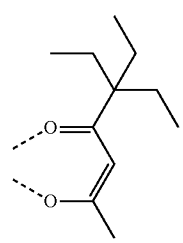
,
$L_{b113}$
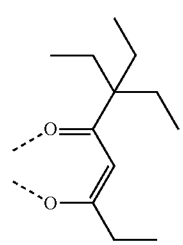
, -continued
$L_{b114}$
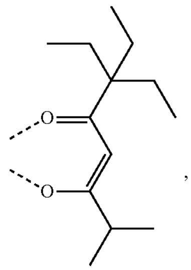
$L_{b115}$
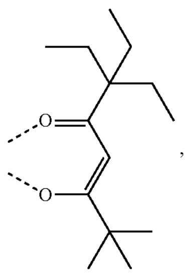
$L_{b116}$
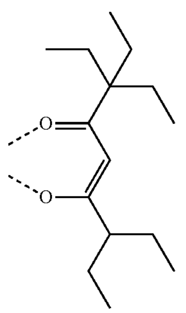
$L_{b117}$
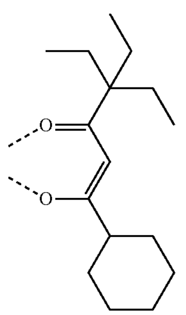
$L_{b118}$
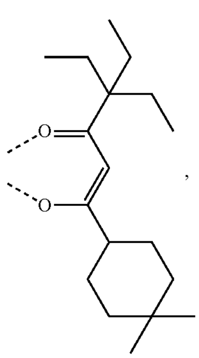
-continued
$L_{b119}$
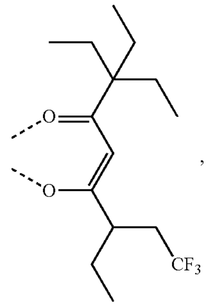
$L_{b120}$
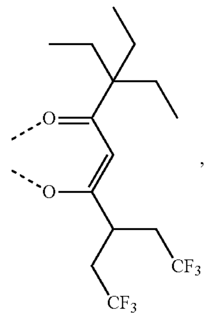
$L_{b121}$
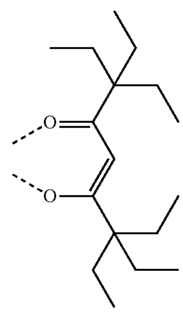
$L_{b122}$
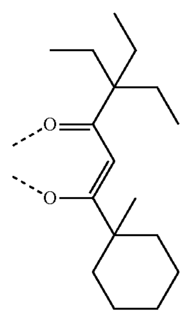
$L_{b123}$
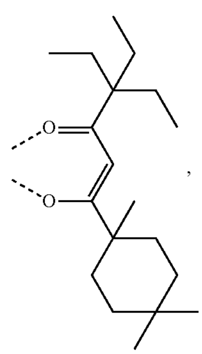

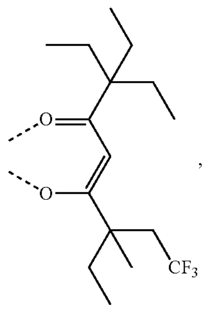
$L_{b124}$
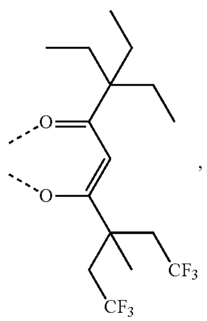
$L_{b125}$
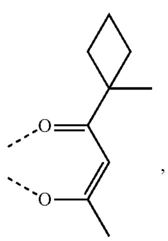
$L_{b126}$
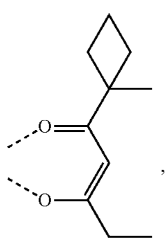
$L_{b127}$
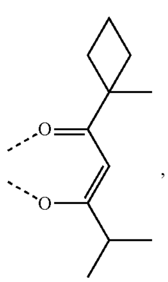
$L_{b128}$
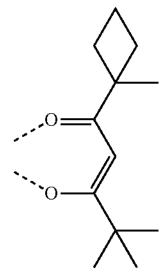
$L_{b129}$
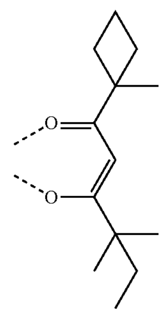
$L_{b130}$
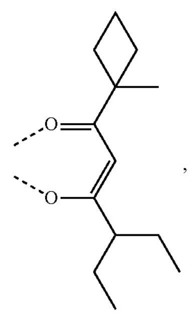
$L_{b131}$
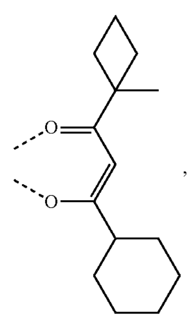
$L_{b132}$
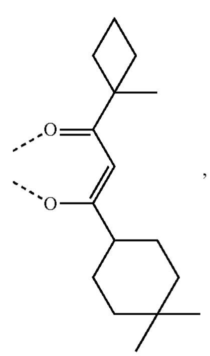
$L_{b133}$ $L_{b134}$
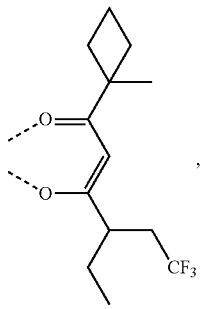
,
$L_{b135}$
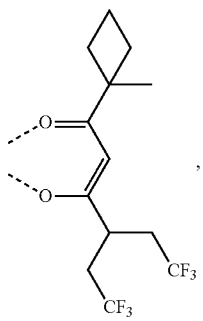
,
$L_{b136}$
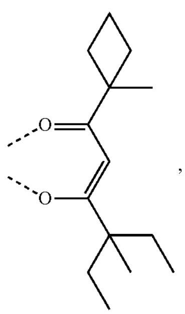
,
$L_{b137}$
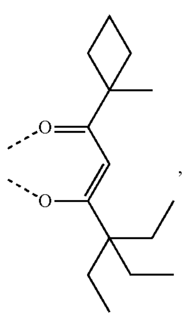
,
$L_{b138}$
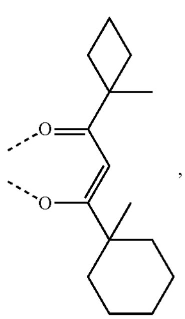
,
$L_{b139}$
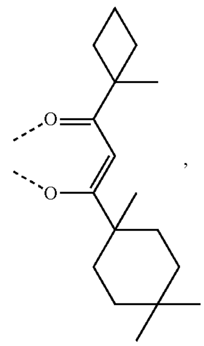
,
$L_{b140}$
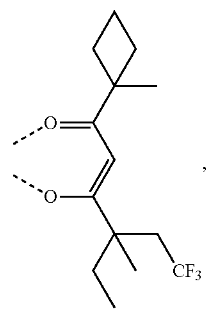
,
$L_{b141}$
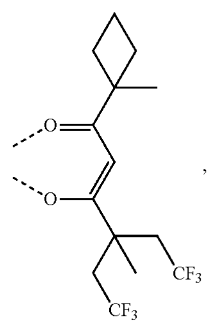
,
$L_{b142}$
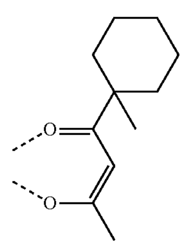
,
$L_{b143}$
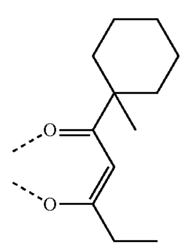
, $L_{b144}$
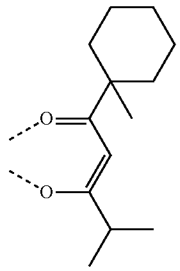
,
$L_{b145}$
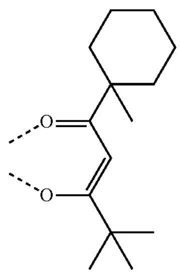
,
$L_{b146}$
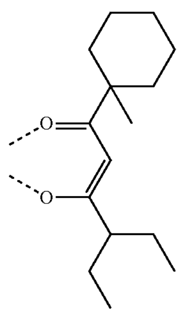
,
$L_{b147}$
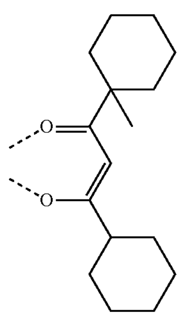
,
$L_{b148}$
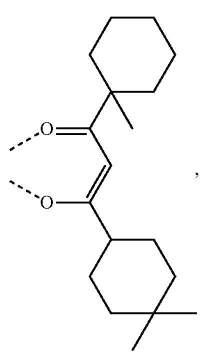
,
$L_{b149}$
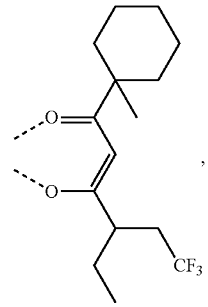
,
$L_{b150}$
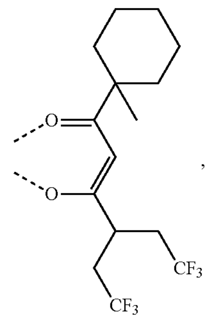
,
$L_{b151}$
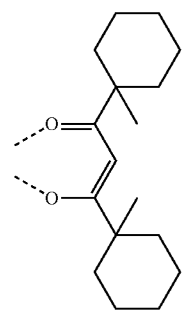
,
$L_{b152}$
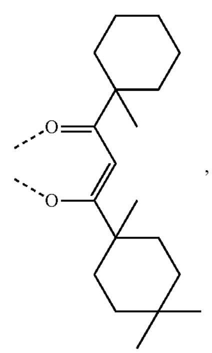
,
$L_{b153}$
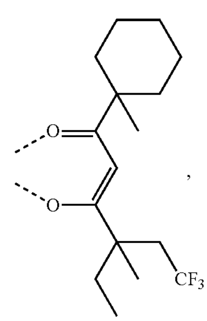
,

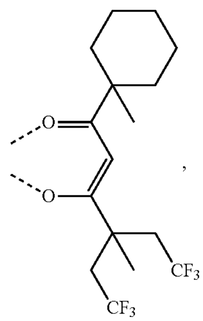
$L_{b154}$
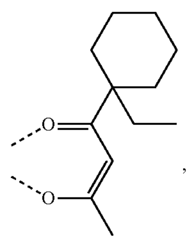
$L_{b155}$
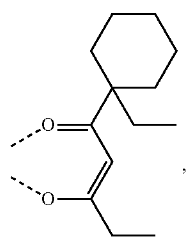
$L_{b156}$
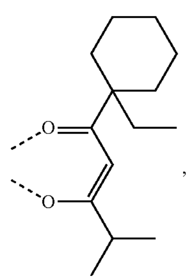
$L_{b157}$
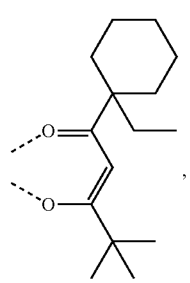
$L_{b158}$
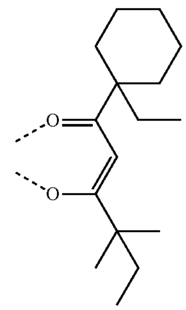
$L_{b159}$
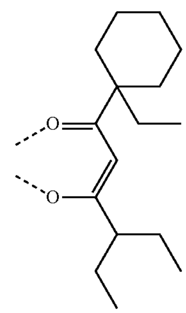
$L_{b160}$
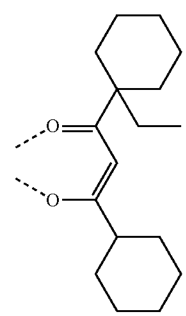
$L_{b161}$
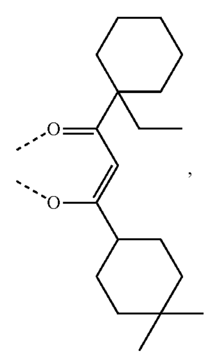
$L_{b162}$
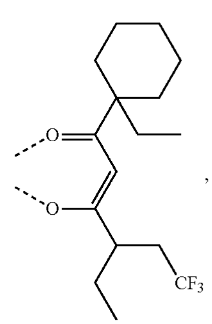
$L_{b163}$ -continued
Lb164
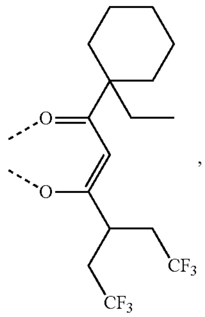
,
Lb165
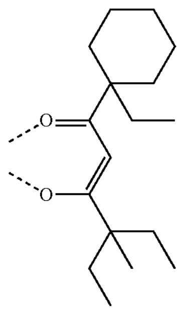
,
Lb166
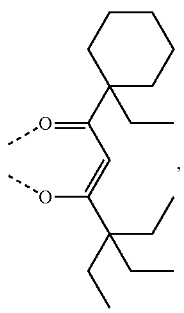
,
Lb167
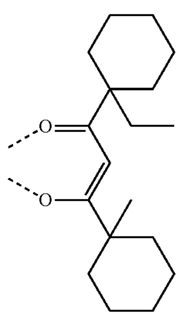
,
Lb168
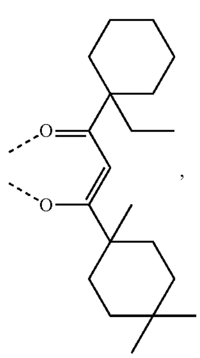
,
-continued
Lb169
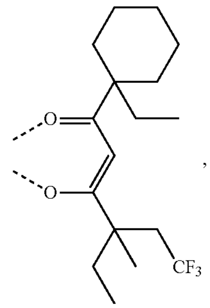
,
Lb170
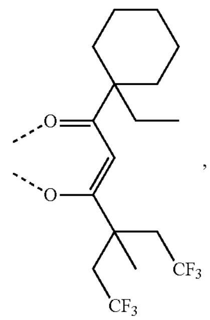
,
Lb171
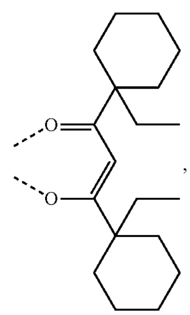
,
Lb172
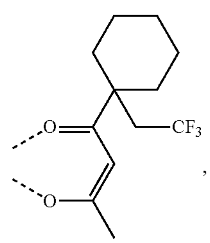
,
Lb173
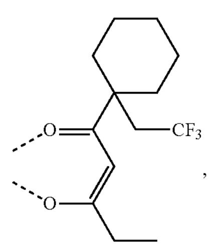
, -continued
Lb174
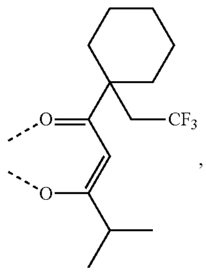
Lb175
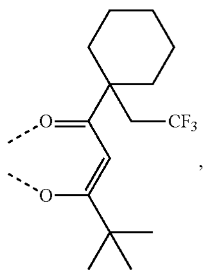
Lb176
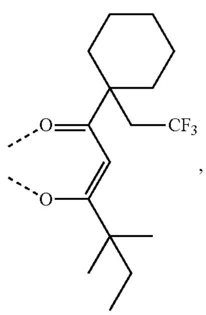
Lb177
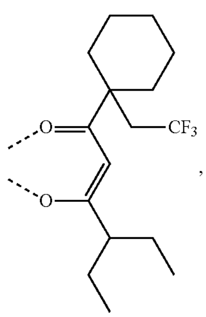
Lb178
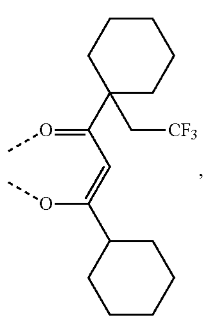
-continued
Lb179
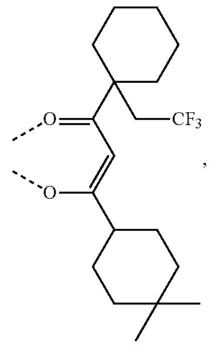
Lb180
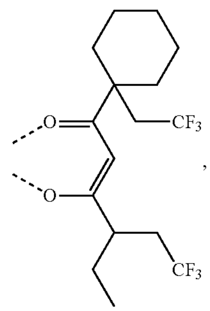
Lb181
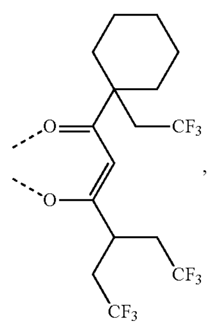
Lb182
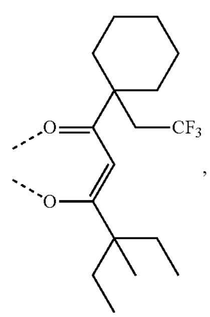
Lb183
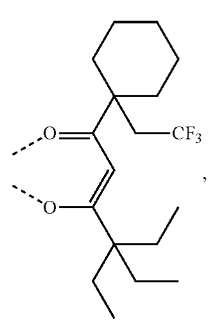

$L_{b184}$
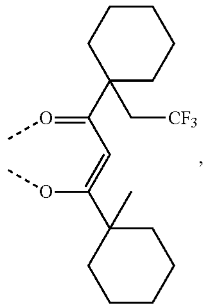
$L_{b185}$
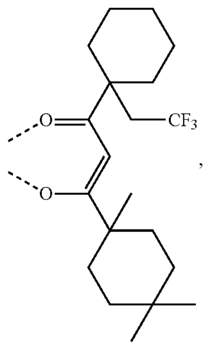
$L_{b186}$
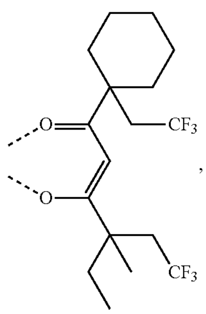
$L_{b187}$
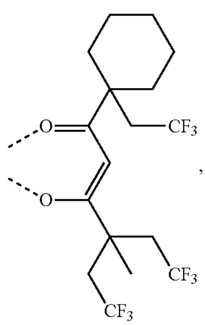
$L_{b188}$
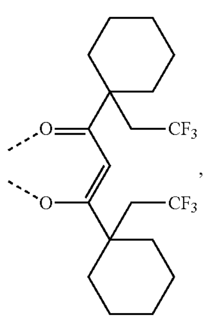
$L_{b189}$
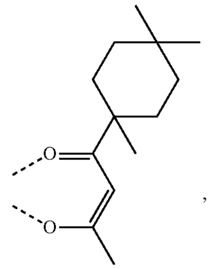
$L_{b190}$
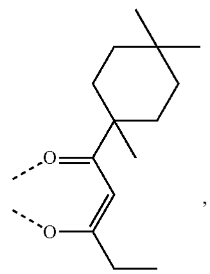
$L_{b191}$
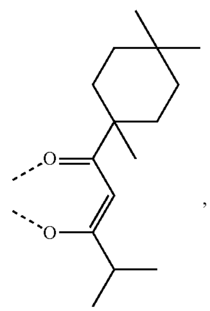
$L_{b192}$
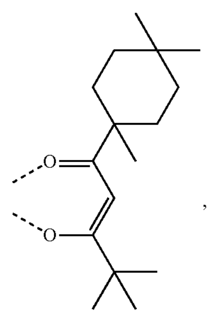
$L_{b193}$
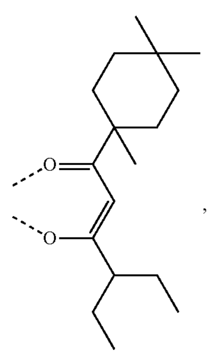

$L_{b194}$
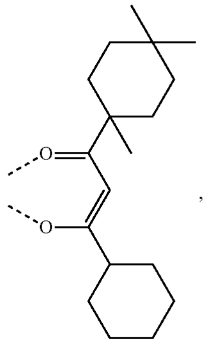
$L_{b195}$
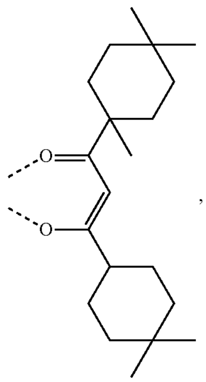
$L_{b196}$
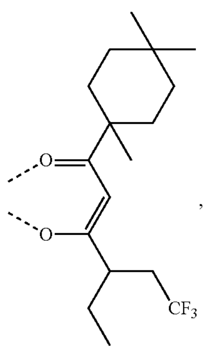
$L_{b197}$
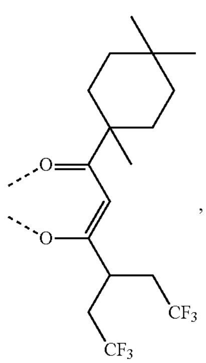
$L_{b198}$
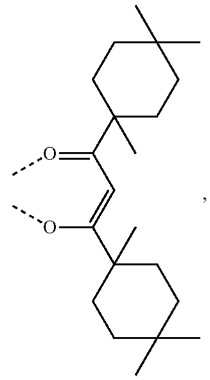
$L_{b199}$
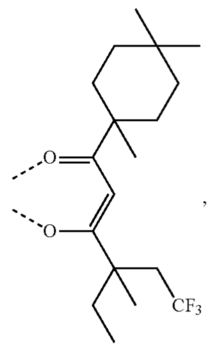
$L_{b200}$
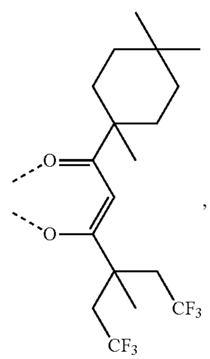
$L_{b201}$
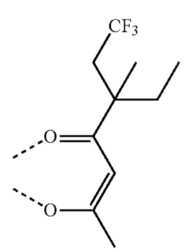
$L_{b202}$
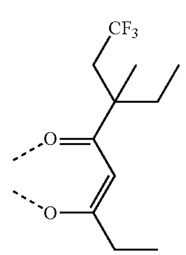

-continued
$L_{b203}$
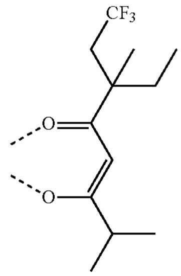
,
$L_{b204}$
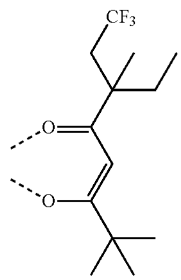
,
$L_{b205}$
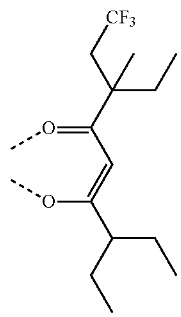
,
$L_{b206}$
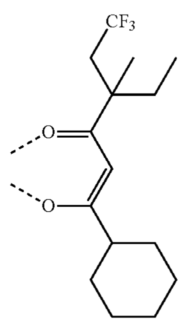
,
$L_{b207}$
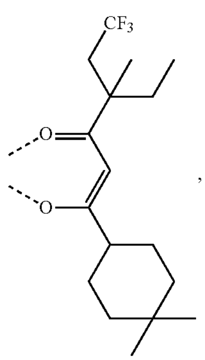
,
-continued
$L_{b208}$
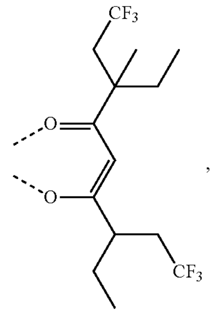
,
$L_{b209}$
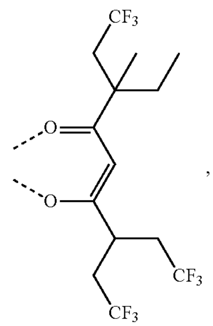
,
$L_{b210}$
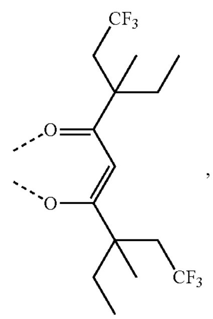
,
$L_{b211}$
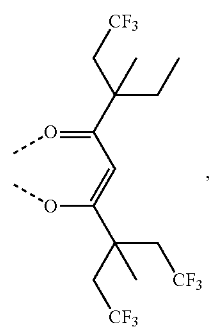
,
$L_{b212}$
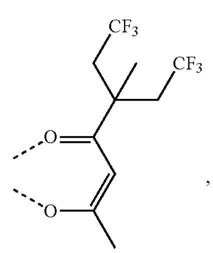
, -continued
$L_{b213}$
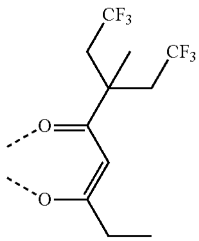
,
$L_{b214}$
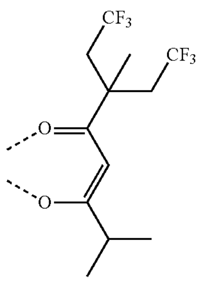
,
$L_{b215}$
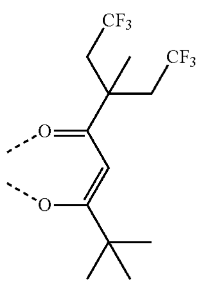
,
$L_{b216}$
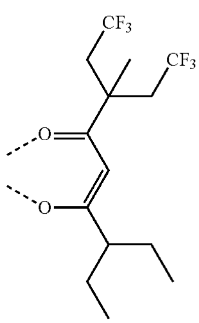
,
$L_{b217}$
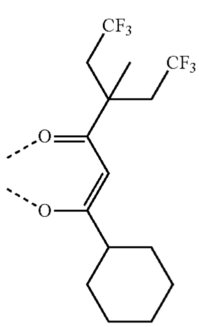
,
-continued
$L_{b218}$
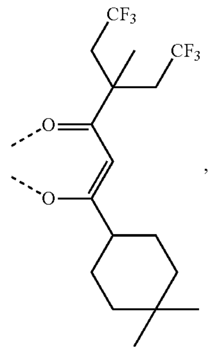
,
$L_{b219}$
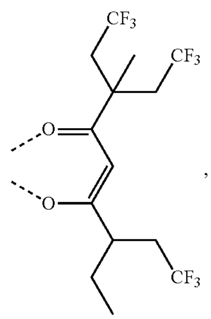
,
$L_{b220}$
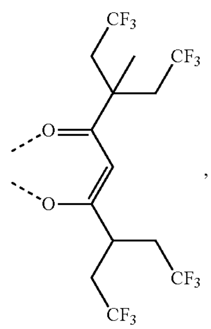
,
$L_{b221}$
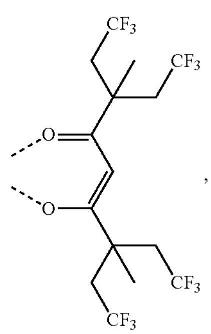
,
$L_{b222}$
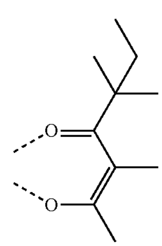
, -continued
$L_{b223}$
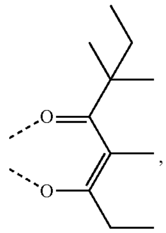
$L_{b224}$
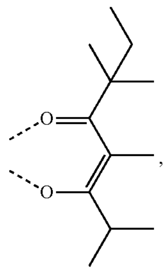
$L_{b225}$
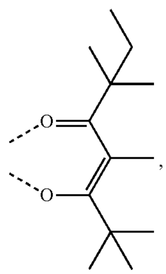
$L_{b226}$
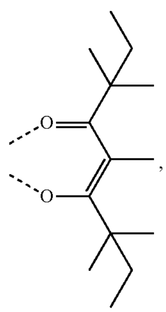
$L_{b227}$
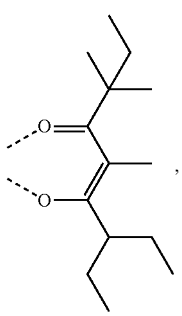
-continued
$L_{b228}$
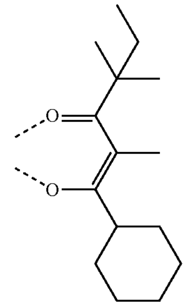
$L_{b229}$
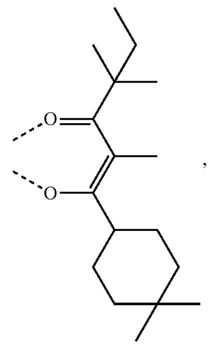
$L_{b230}$
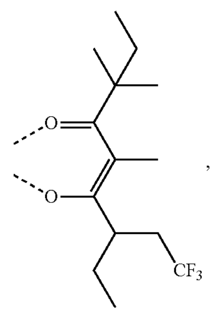
$L_{b231}$
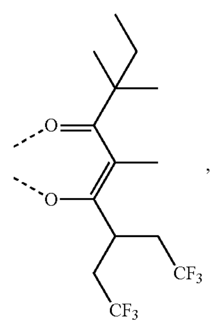
$L_{b232}$
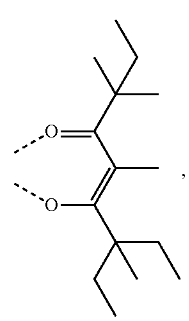

-continued
$L_{b233}$
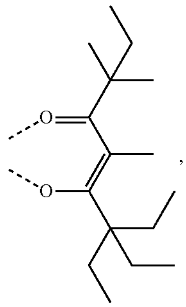
$L_{b234}$
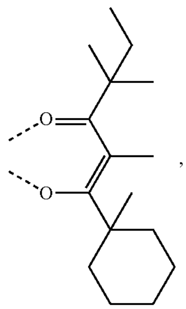
$L_{b235}$
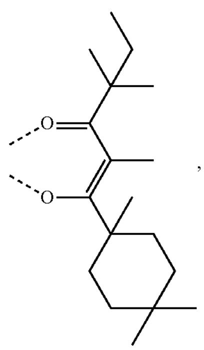
$L_{b236}$
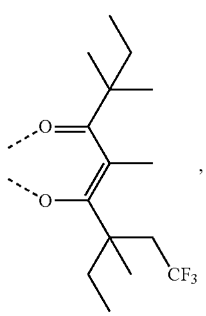
$L_{b237}$
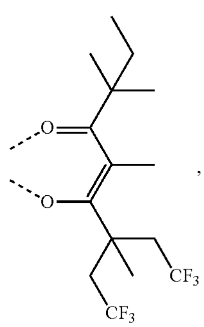
-continued
$L_{b238}$
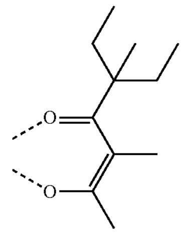
$L_{b239}$
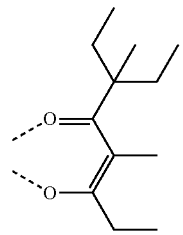
$L_{b240}$
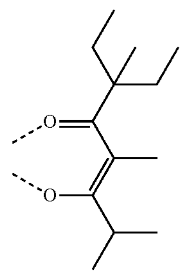
$L_{b241}$
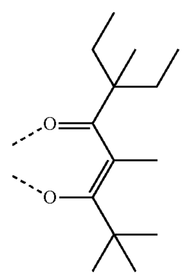
$L_{b242}$
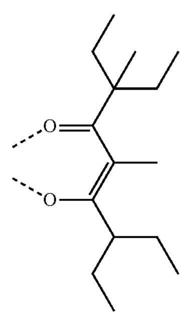

$L_{b243}$
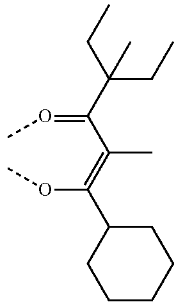
,
$L_{b244}$
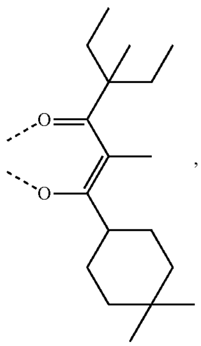
,
$L_{b245}$
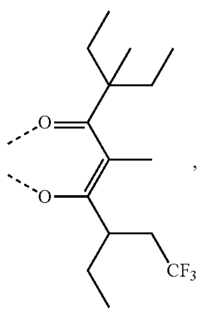
,
$L_{b246}$
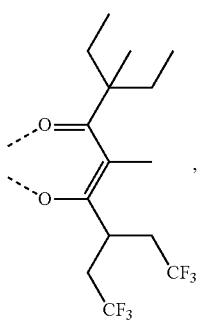
,
$L_{b247}$
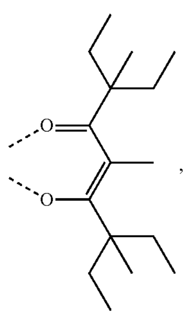
,
$L_{b248}$
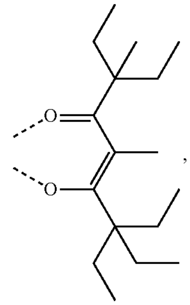
,
$L_{b249}$
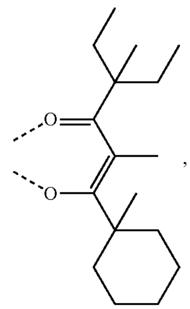
,
$L_{b250}$
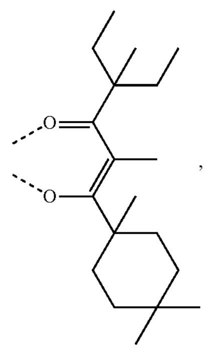
,
$L_{b251}$
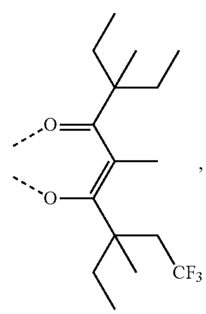
,
$L_{b252}$
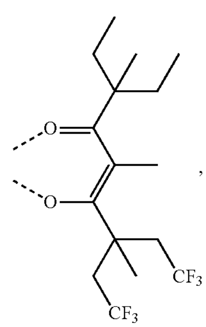
, -continued
$L_{b253}$
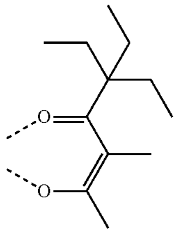
,
$L_{b254}$
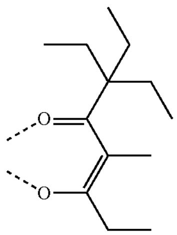
,
$L_{b255}$
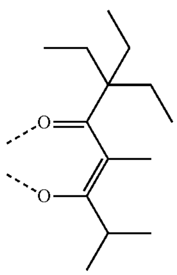
,
$L_{b256}$
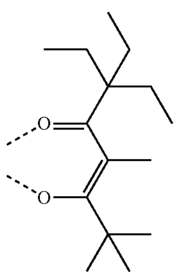
,
$L_{b257}$
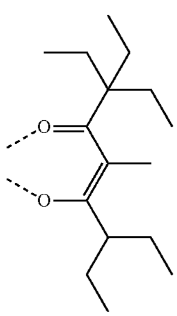
,
-continued
$L_{b258}$
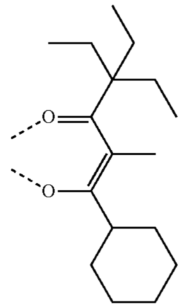
,
$L_{b259}$
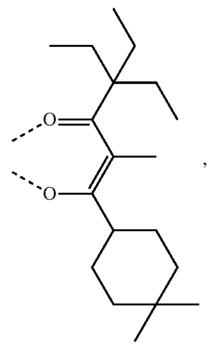
,
$L_{b260}$
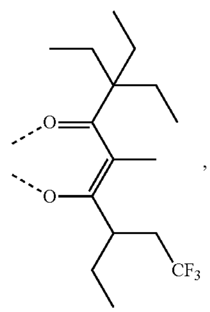
,
$L_{b261}$
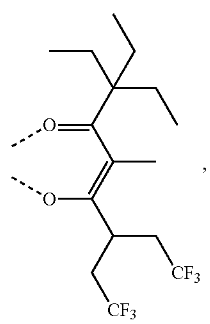
,
$L_{b262}$
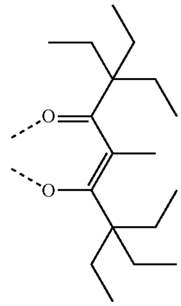
, $L_{b263}$
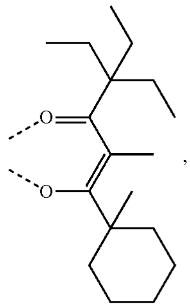
$L_{b264}$
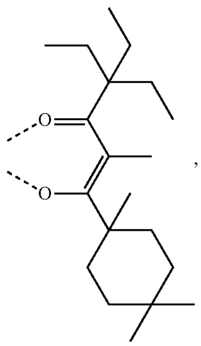
$L_{b265}$
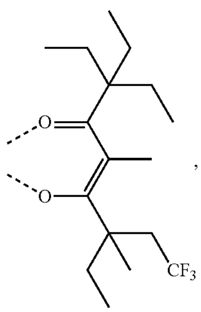
$L_{b266}$
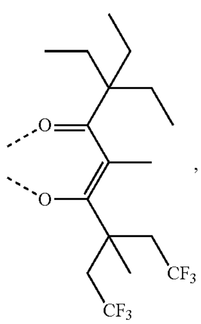
$L_{b267}$
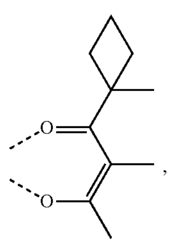
$L_{b268}$
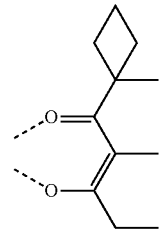
$L_{b269}$
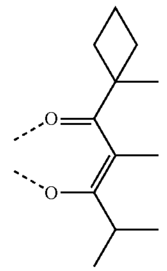
$L_{b270}$
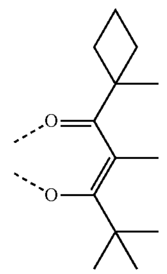
$L_{b271}$
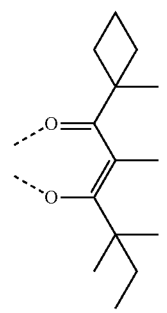
$L_{b272}$
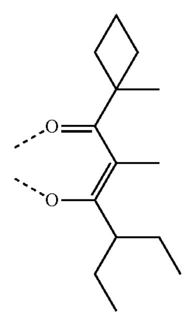

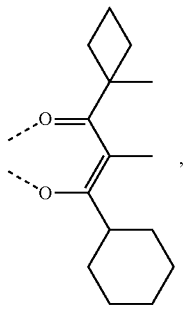
$L_{b273}$
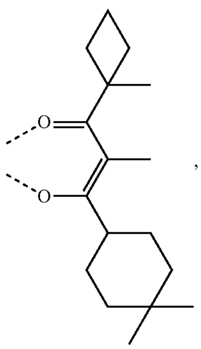
$L_{b274}$
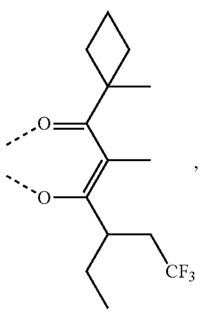
$L_{b275}$
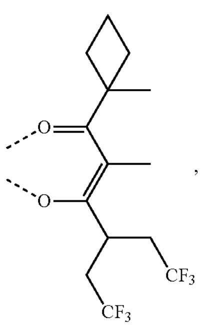
$L_{b276}$
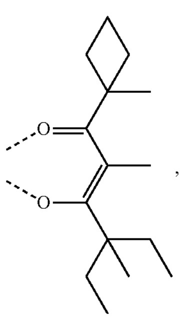
$L_{b277}$
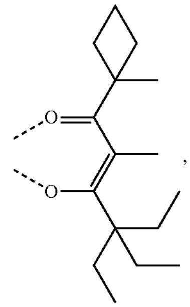
$L_{b278}$
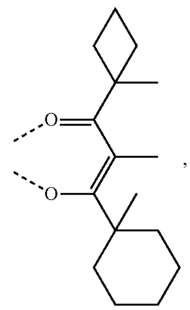
$L_{b279}$
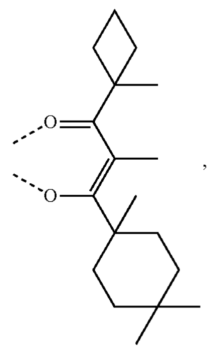
$L_{b280}$
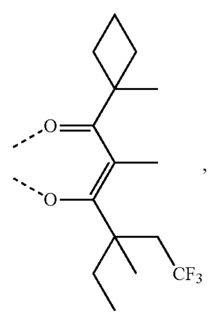
$L_{b281}$
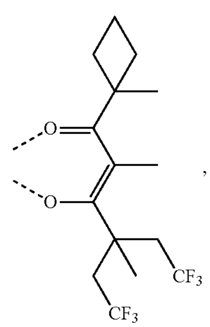
$L_{b282}$ $L_{b283}$
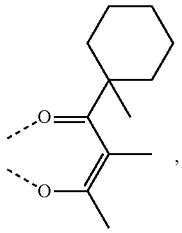
$L_{b284}$
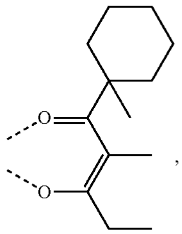
$L_{b285}$
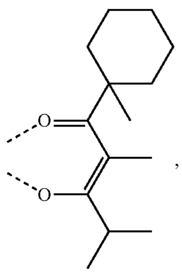
$L_{b286}$
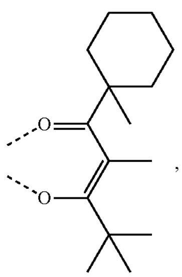
$L_{b287}$
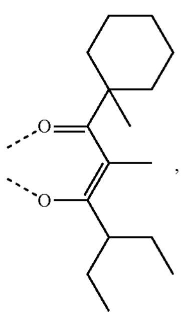
$L_{b288}$
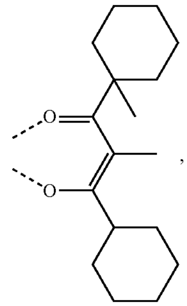
$L_{b289}$
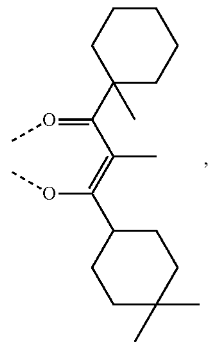
$L_{b290}$
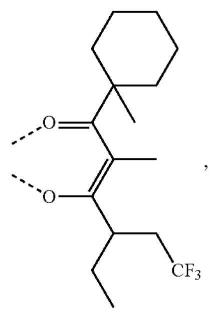
$L_{b291}$
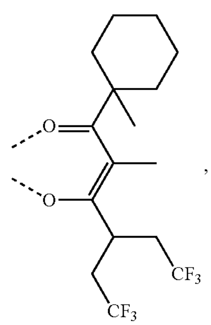
$L_{b292}$
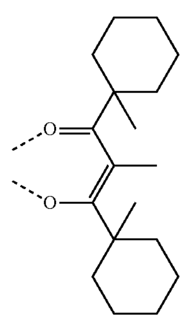

-continued
$L_{b293}$
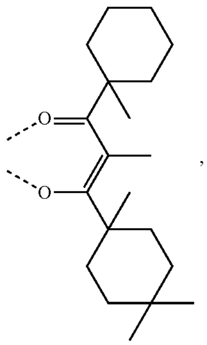
$L_{b294}$
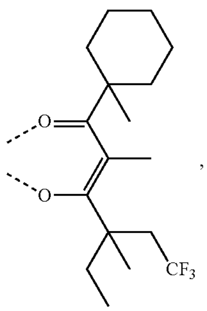
$L_{b295}$
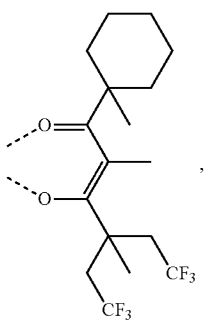
$L_{b296}$
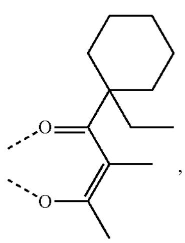
$L_{b297}$
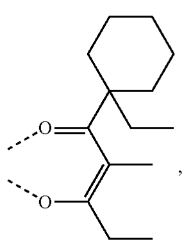
-continued
$L_{b298}$
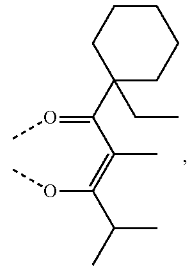
$L_{b299}$
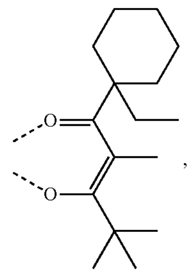
$L_{b300}$
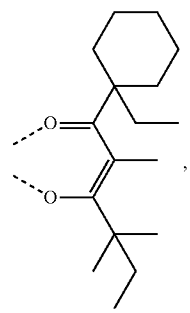
$L_{b301}$
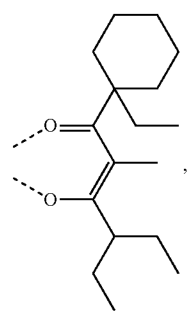
$L_{b302}$
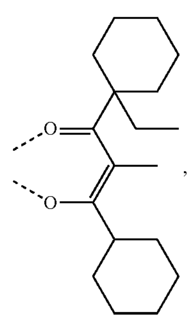

-continued
$L_{b303}$
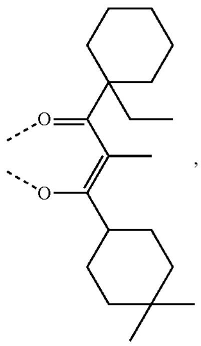
$L_{b304}$
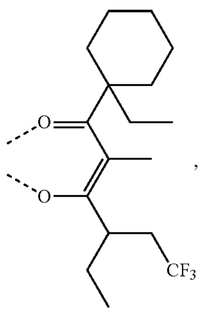
$L_{b305}$
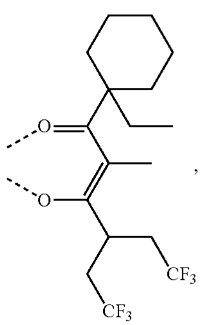
$L_{b306}$
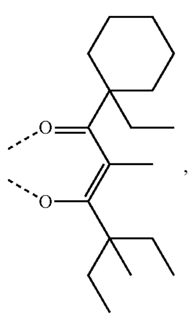
$L_{b307}$
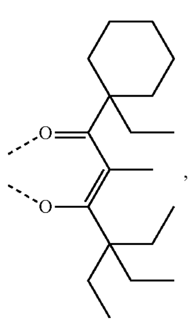
-continued
$L_{b308}$
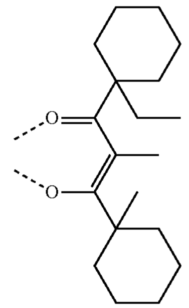
$L_{b309}$
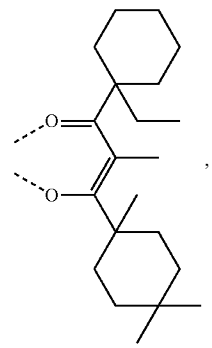
$L_{b310}$
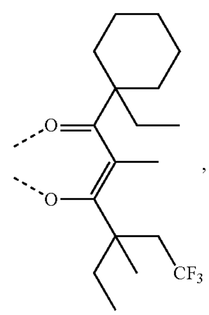
$L_{b311}$
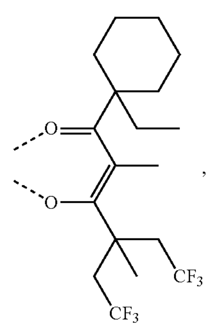
$L_{b312}$
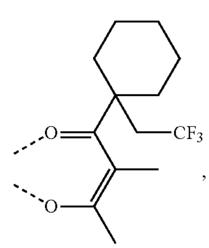

$L_{b313}$
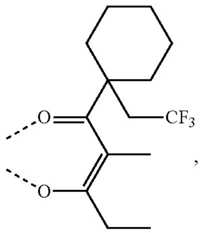
$L_{b314}$
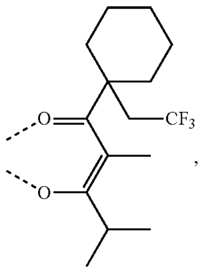
$L_{b315}$
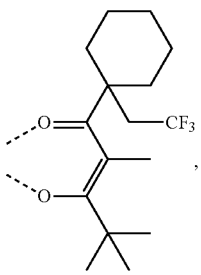
$L_{b316}$
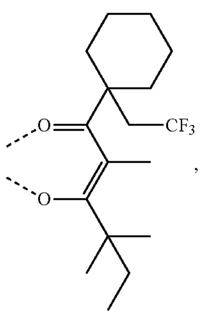
$L_{b317}$
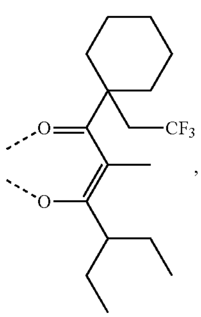
$L_{b318}$
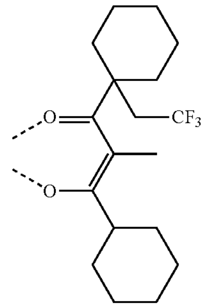
$L_{b319}$
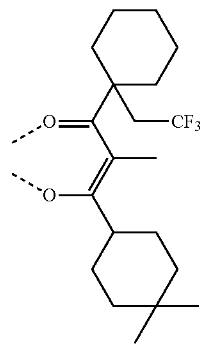
$L_{b320}$
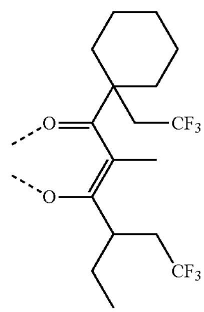
$L_{b321}$
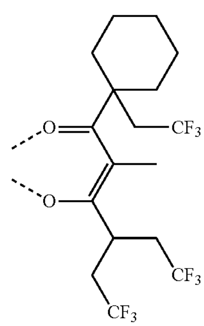
$L_{b322}$
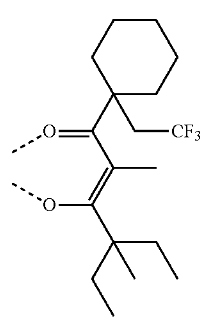

-continued
$L_{b323}$
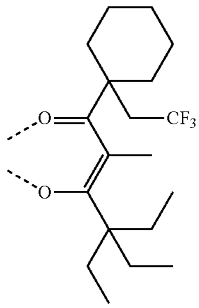
,
$L_{b324}$
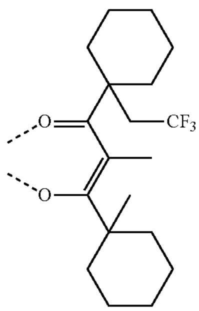
,
$L_{b325}$
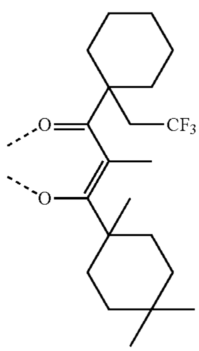
,
$L_{b326}$
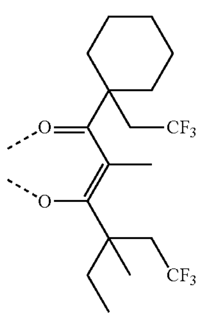
,
$L_{b327}$
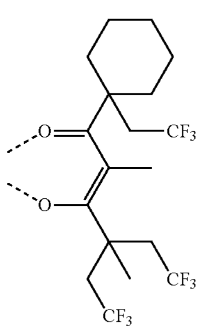
,
-continued
$L_{b328}$
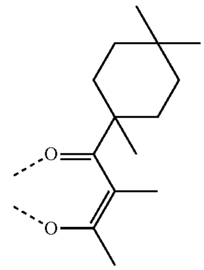
,
$L_{b329}$
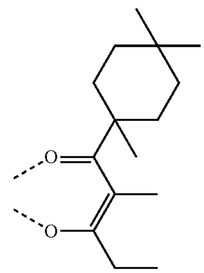
,
$L_{b330}$
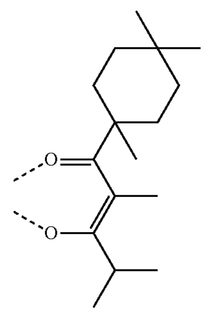
,
$L_{b331}$
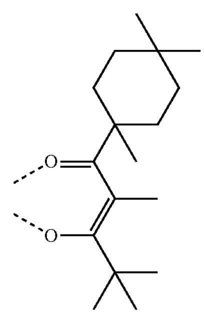
,
$L_{b332}$
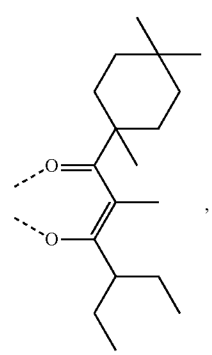
, -continued
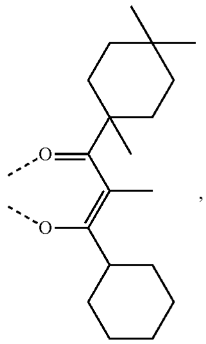
$L_{b333}$
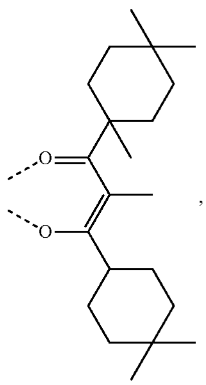
$L_{b334}$
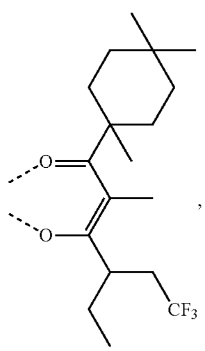
$L_{b335}$
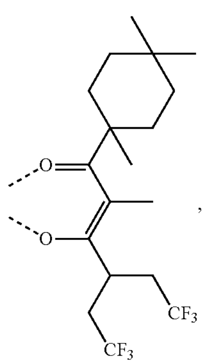
$L_{b336}$
-continued
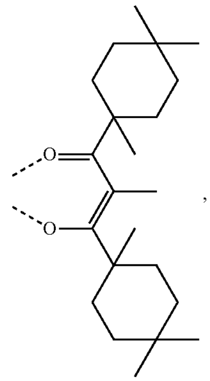
$L_{b337}$
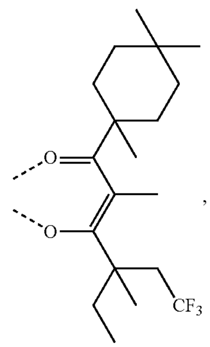
$L_{b338}$
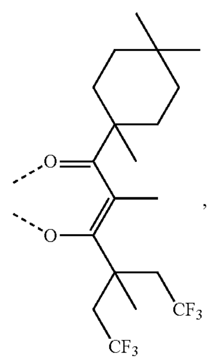
$L_{b339}$
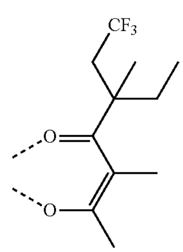
$L_{b340}$
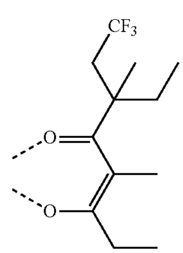
$L_{b341}$ -continued
$L_{b342}$
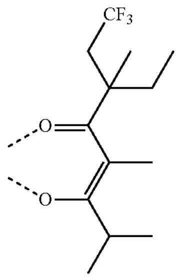
,
$L_{b343}$
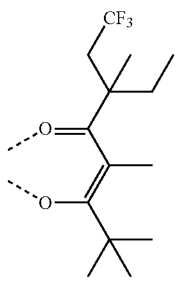
,
$L_{b344}$
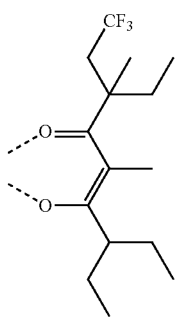
,
$L_{b345}$
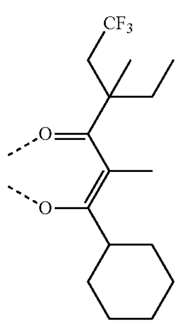
,
$L_{b346}$
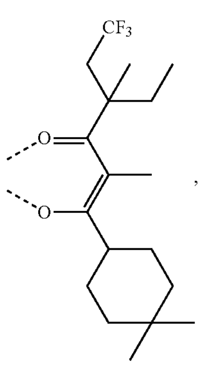
,
-continued
$L_{b347}$
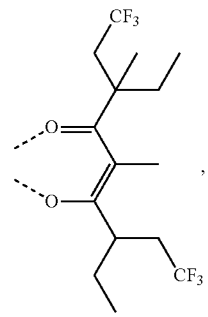
,
$L_{b348}$
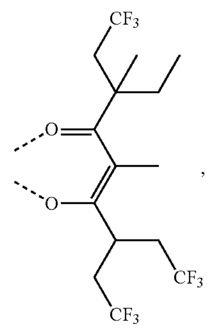
,
$L_{b349}$
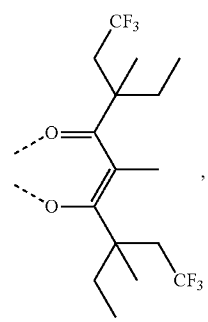
,
$L_{b350}$
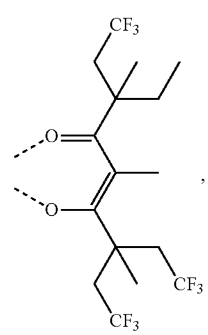
,
$L_{b351}$
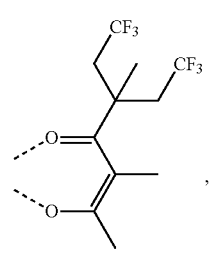
, $L_{b352}$
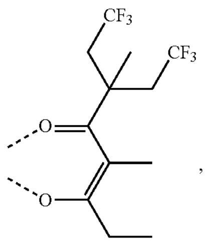
$L_{b353}$
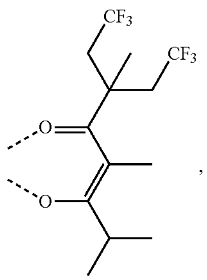
$L_{b354}$
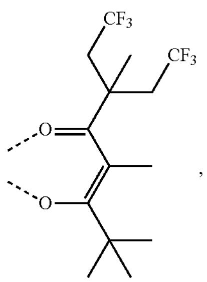
$L_{b355}$
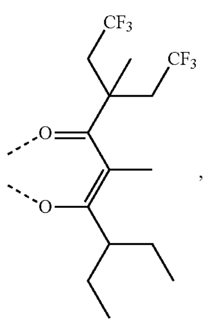
$L_{b356}$
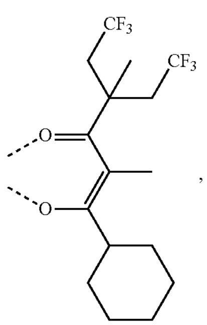
$L_{b357}$
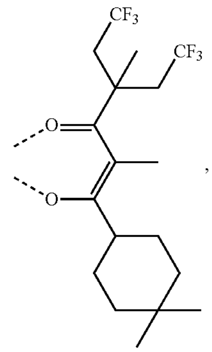
$L_{b358}$
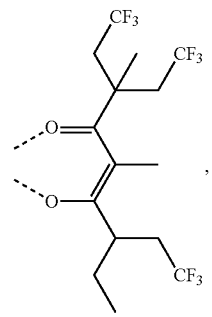
$L_{b359}$
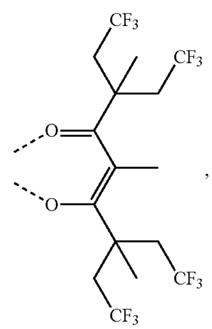
$L_{b360}$
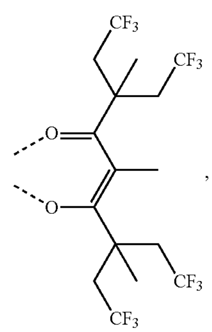
$L_{b361}$
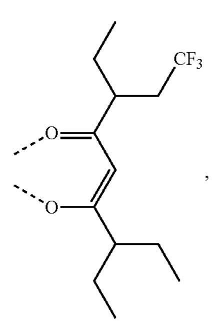

$L_{b362}$
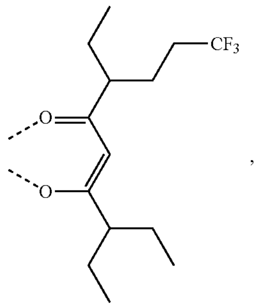
$L_{b363}$
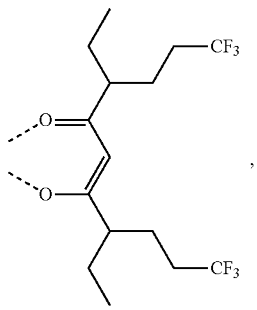
$L_{b364}$
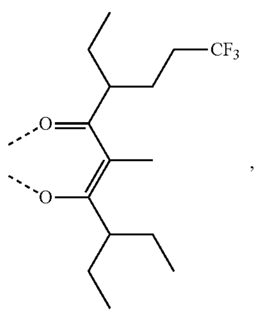
$L_{b365}$
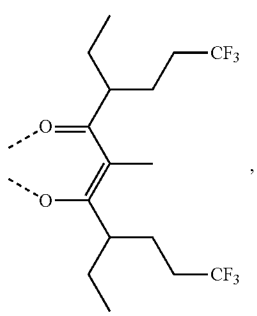
the ligand $L_c$ is any one selected from the group consisting of $L_{c1}$ to $L_{c99}$:
$L_{c1}$
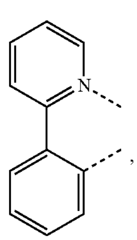
$L_{c2}$
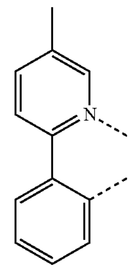
$L_{c3}$
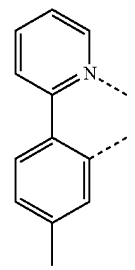
$L_{c4}$
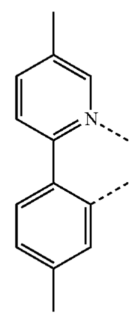
$L_{c5}$
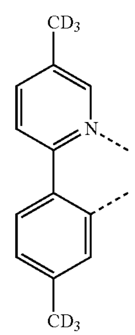
$L_{c6}$
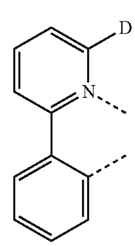

-continued
$L_{c7}$
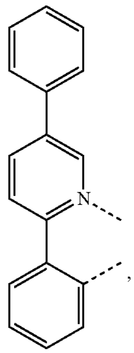
$L_{c8}$
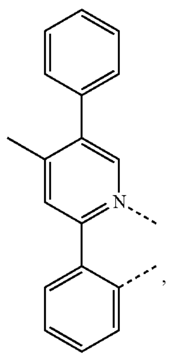
$L_{c9}$
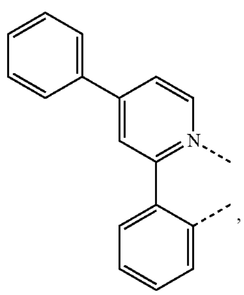
$L_{c10}$
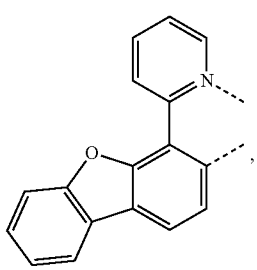
$L_{c11}$
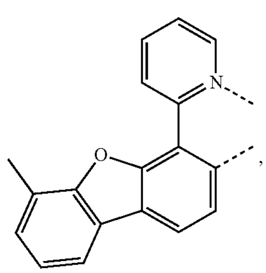
-continued
$L_{c12}$
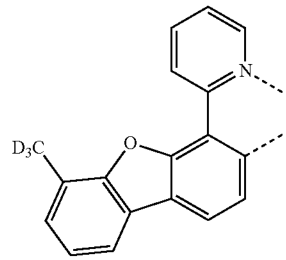
$L_{c13}$
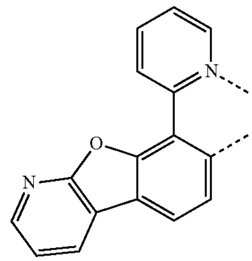
$L_{c14}$
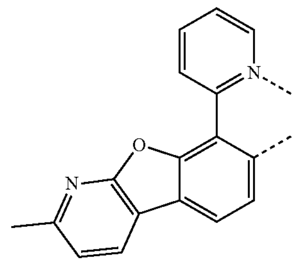
$L_{c15}$
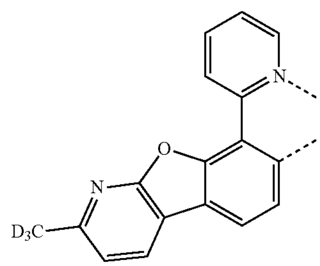
$L_{c16}$
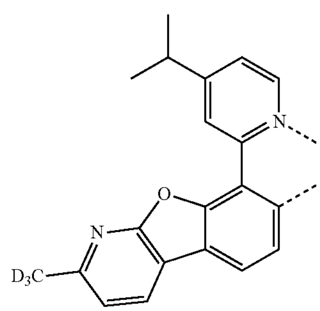

-continued
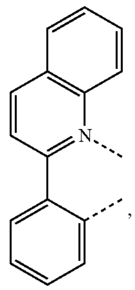
$L_{c17}$
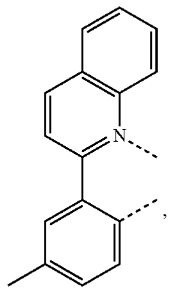
$L_{c18}$
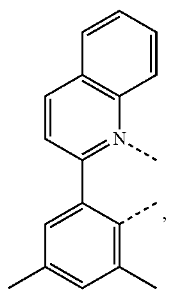
$L_{c19}$
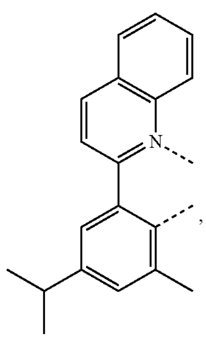
$L_{c20}$
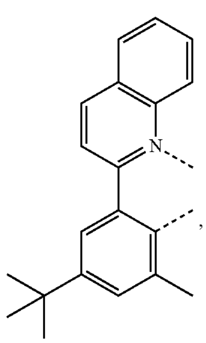
$L_{c21}$
-continued
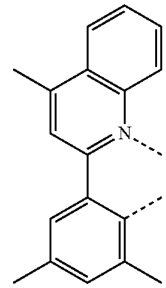
$L_{c22}$
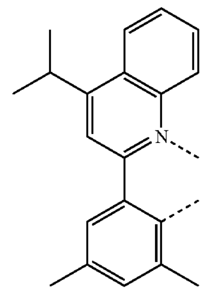
$L_{c23}$
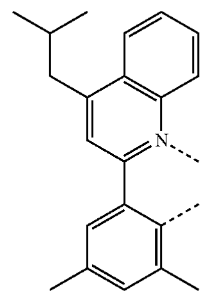
$L_{c24}$
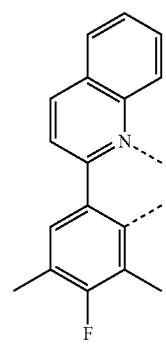
$L_{c25}$
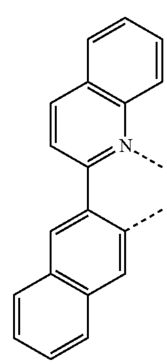
$L_{c26}$ -continued
$L_{c27}$
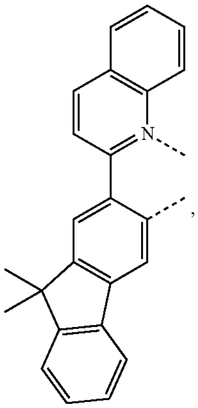
$L_{c28}$
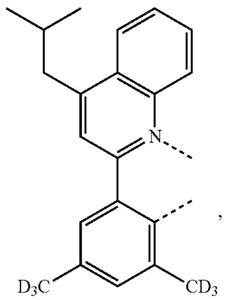
$L_{c29}$
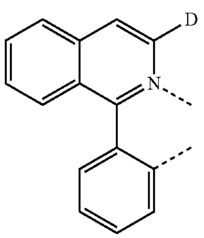
$L_{c30}$
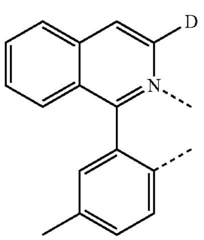
$L_{c31}$
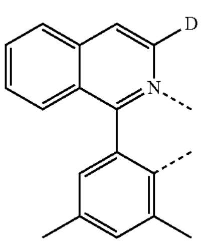
-continued
$L_{c32}$
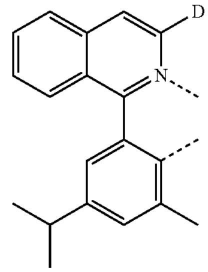
$L_{c33}$
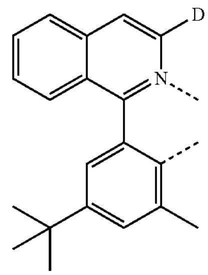
$L_{c34}$
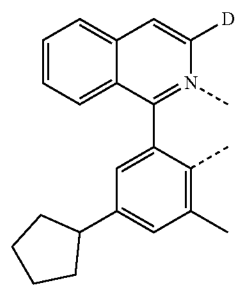
$L_{c35}$
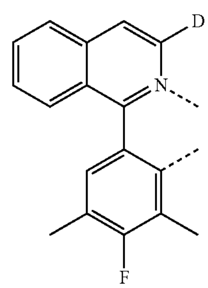
$L_{c36}$
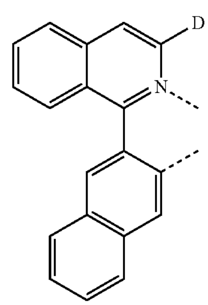

-continued
L$_{c37}$
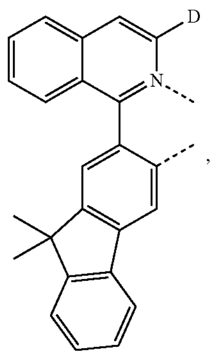
L$_{c38}$
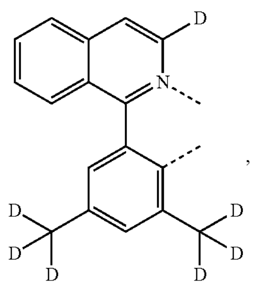
L$_{c39}$
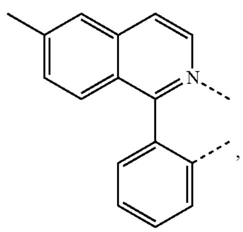
L$_{c40}$
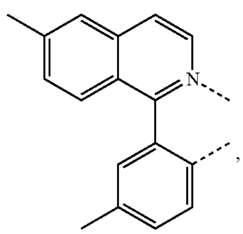
L$_{c41}$
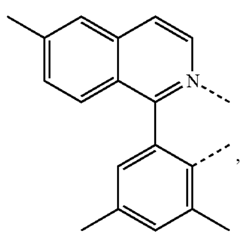
L$_{c42}$
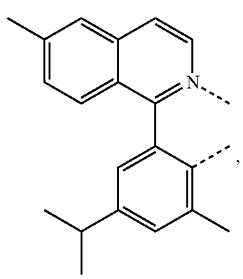
-continued
L$_{c43}$
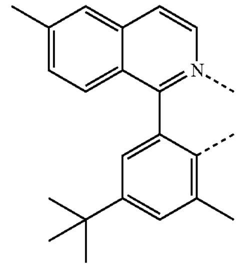
L$_{c44}$
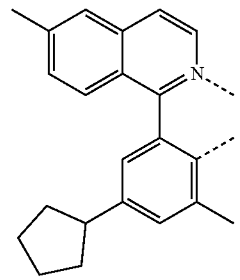
L$_{c45}$
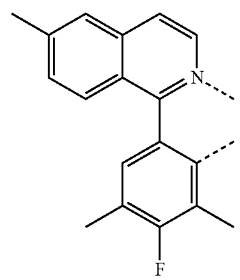
L$_{c46}$
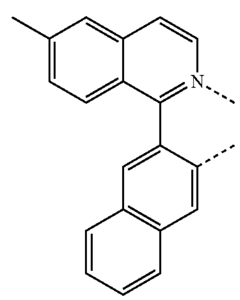
L$_{c47}$
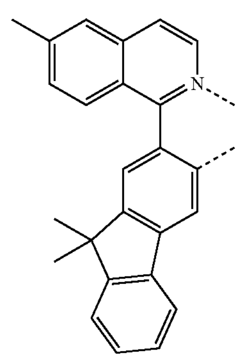

-continued
$L_{c48}$
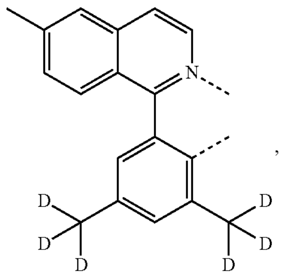
$L_{c49}$
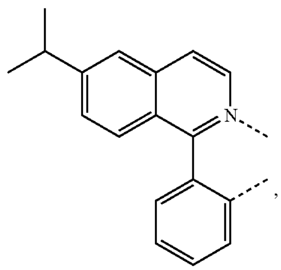
$L_{c50}$
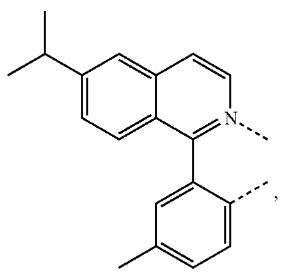
$L_{c51}$
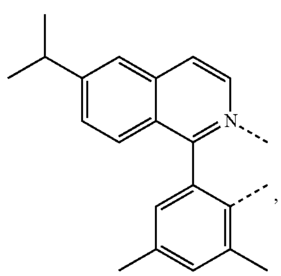
$L_{c52}$
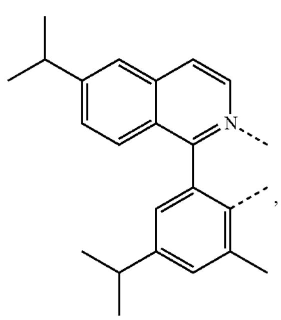
-continued
$L_{c53}$
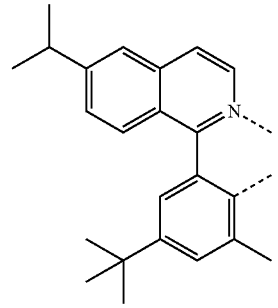
$L_{c54}$
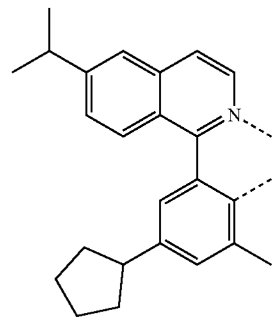
$L_{c55}$
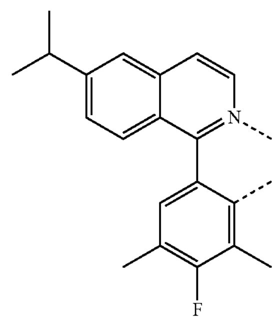
$L_{c56}$
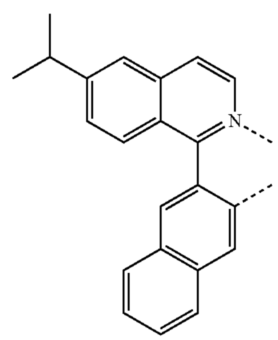

-continued
L$_{c57}$
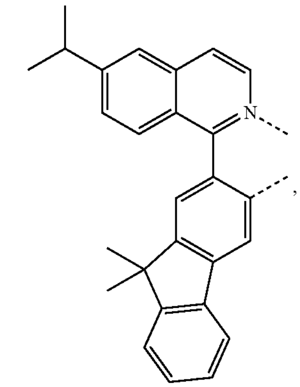
L$_{c58}$
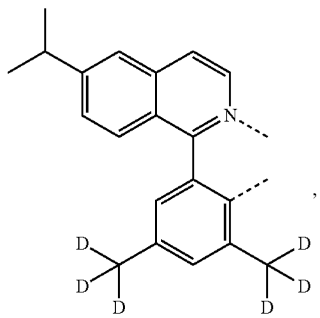
L$_{c59}$
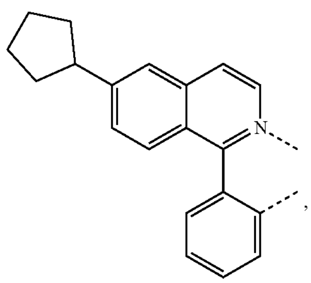
L$_{c60}$
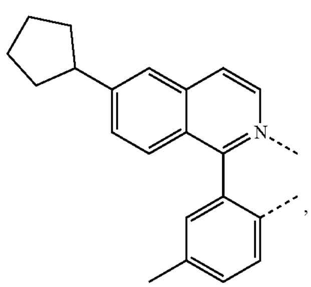
L$_{c61}$
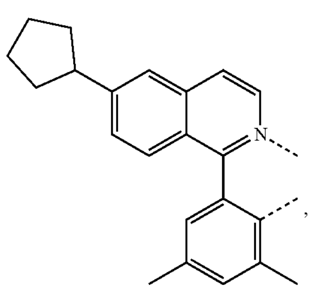
-continued
L$_{c62}$
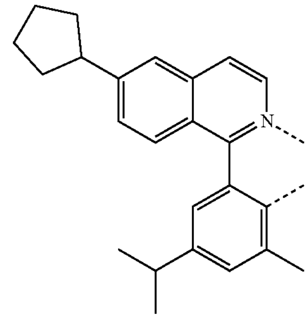
L$_{c63}$
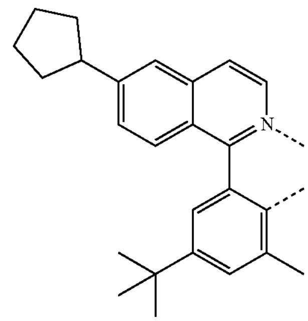
L$_{c64}$
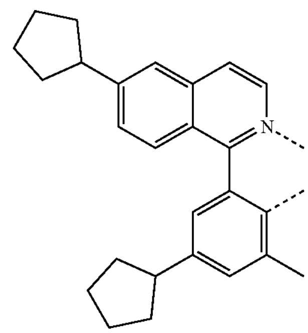
L$_{c65}$
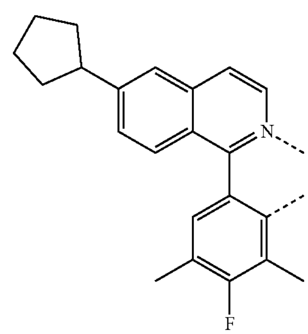

-continued
$L_{c66}$
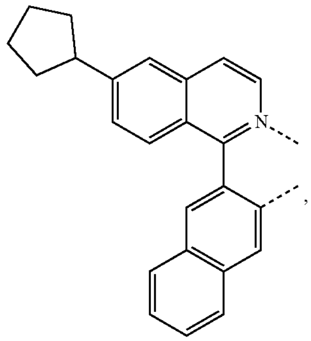
$L_{c67}$
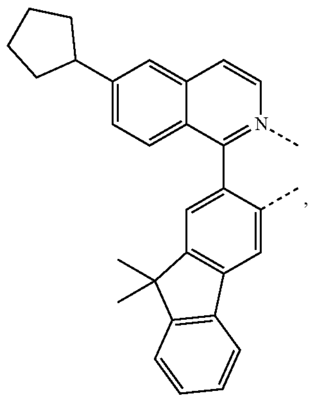
$L_{c68}$
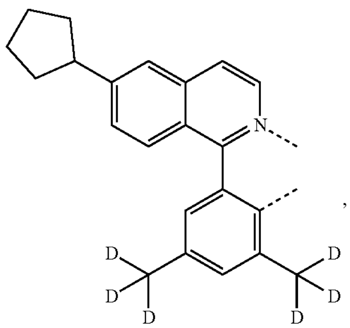
$L_{c69}$
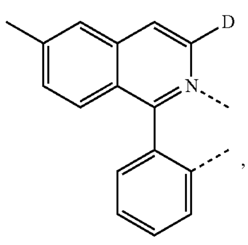
$L_{c70}$
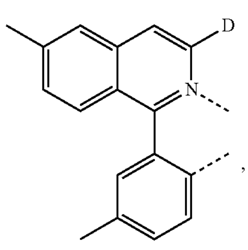
-continued
$L_{c71}$
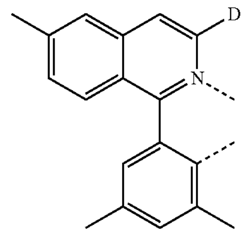
$L_{c72}$
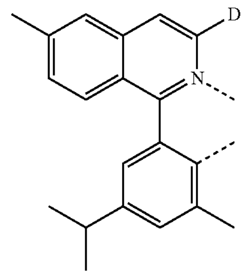
$L_{c73}$
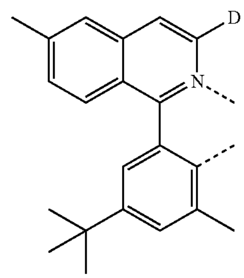
$L_{c74}$
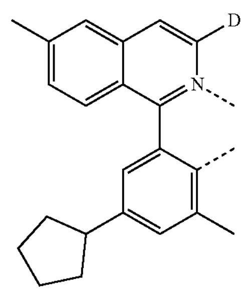
$L_{c75}$
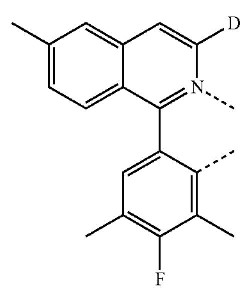

$L_{c76}$
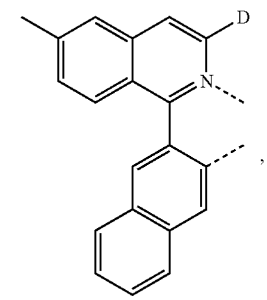
$L_{c77}$
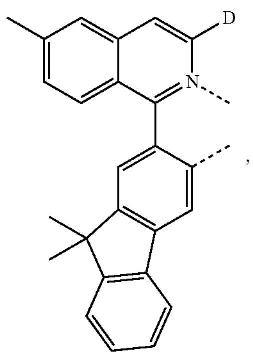
$L_{c78}$
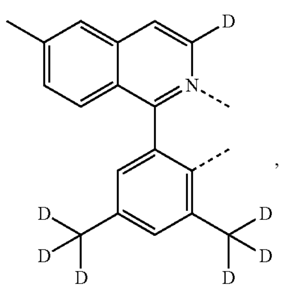
$L_{c79}$
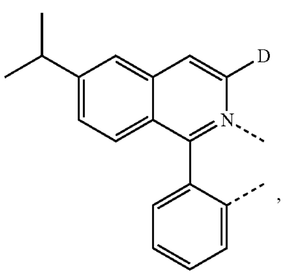
$L_{c80}$
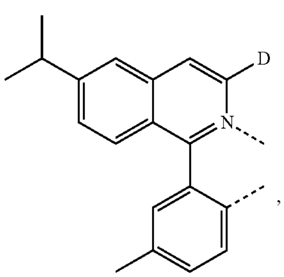
$L_{c81}$
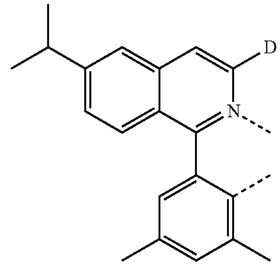
$L_{c82}$
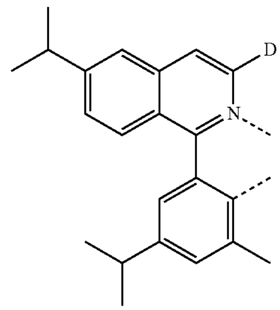
$L_{c83}$
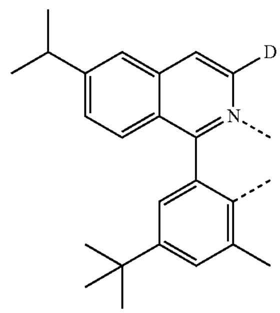
$L_{c84}$
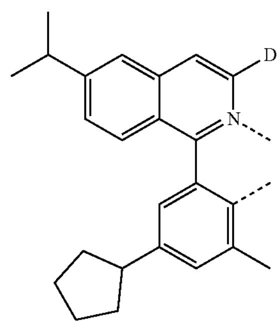
$L_{c85}$
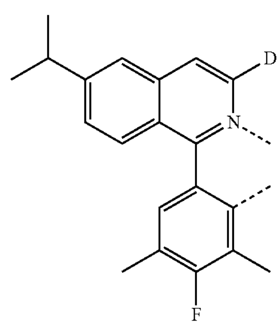

-continued
Lc86
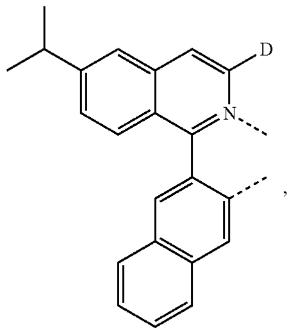
Lc87
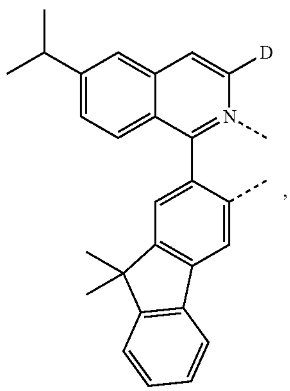
Lc88
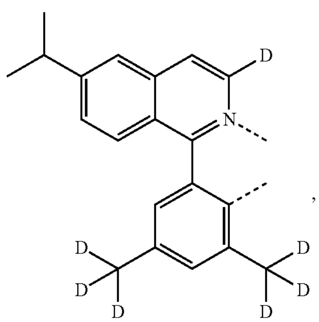
Lc89
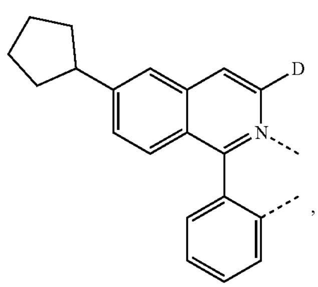
Lc90
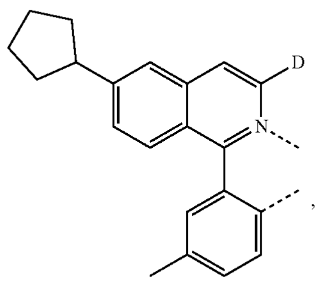
-continued
Lc91
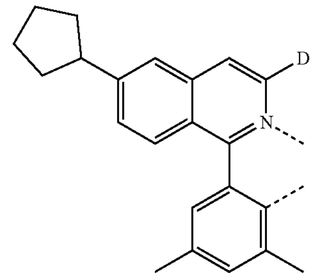
Lc92
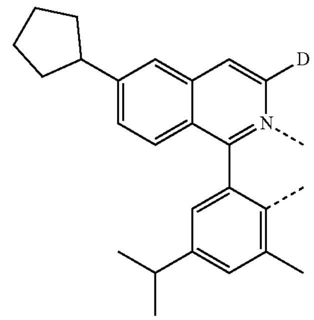
Lc93
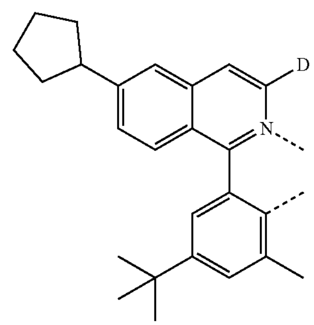
Lc94
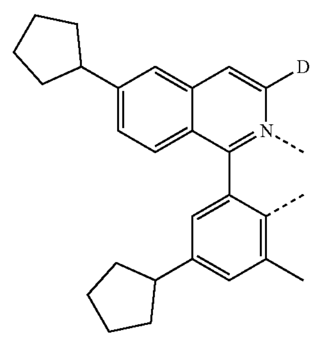
Lc95
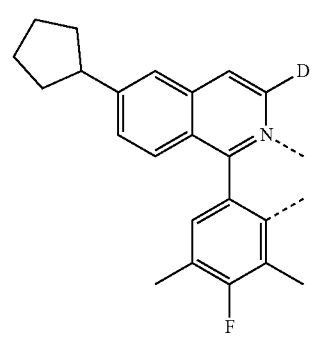

-continued
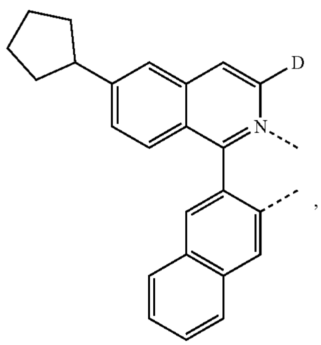
$L_{c96}$
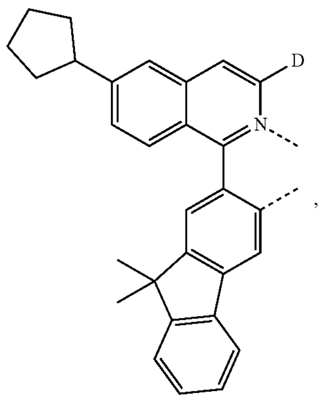
$L_{c97}$
-continued
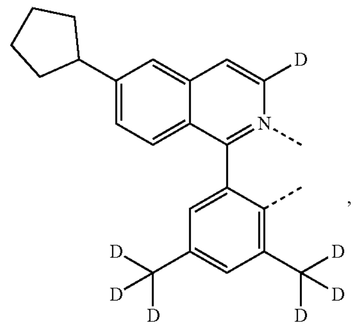
$L_{c98}$
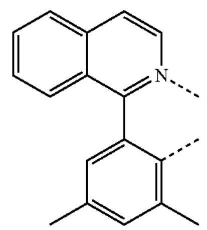
$L_{c99}$
16. The metal complex of claim 1, wherein the metal complex is selected from the group consisting of
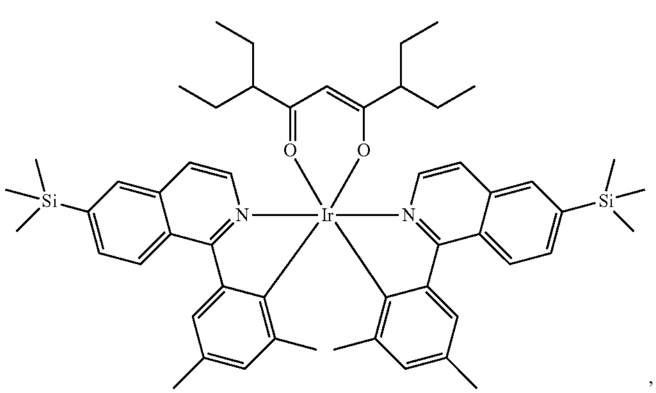
$Ir(L_{a3})_2(L_{b31})$ -continued
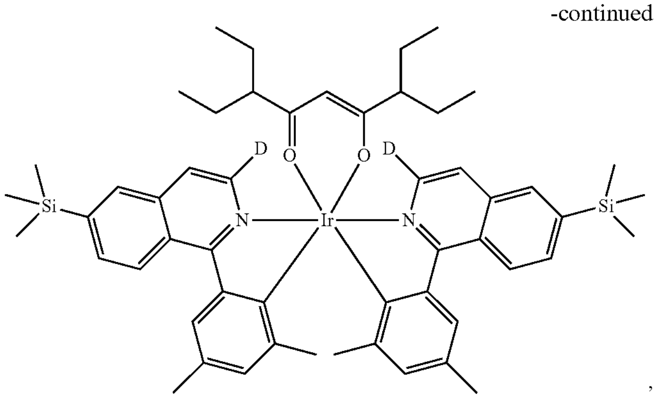
,
Ir(D—$L_{a3}$)$_2$($L_{b31}$)
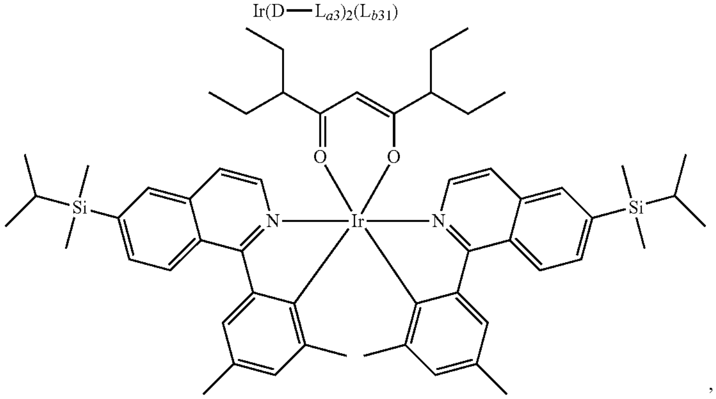
,
Ir($L_{a11}$)$_2$($L_{b31}$)
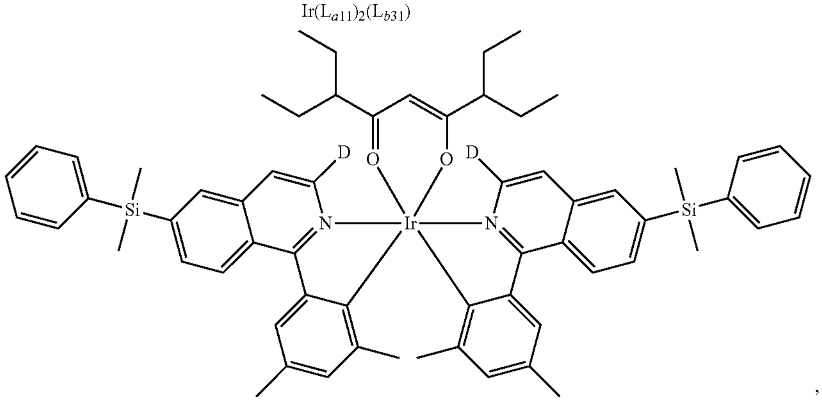
,
Ir(D—$L_{a54}$)$_2$($L_{b31}$)
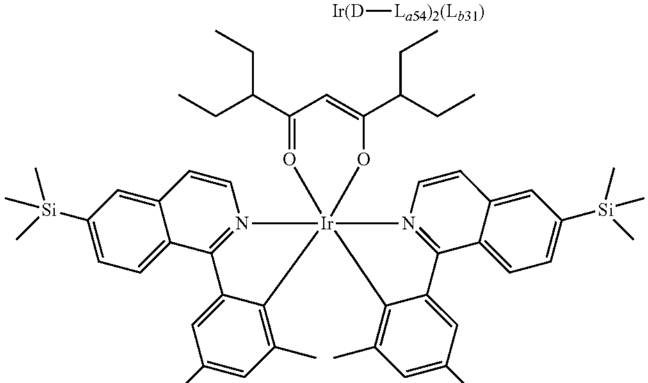

17. An electroluminescent device, comprising:

an anode, a cathode, and an organic layer disposed between the anode and the cathode, wherein the organic layer comprises the metal complex of claim 1.

18. The device of claim 17, wherein the organic layer is a light-emitting layer, and the metal complex is a light-emitting material; the organic layer further comprises a host material; the host material comprises at least one chemical group selected from the group consisting of: benzene, pyridine, pyrimidine, triazine, carbazole, azacarbazole, indolocarbazole, dibenzothiophene, aza-dibenzothiophene, dibenzofuran, azadibenzofuran, dibenzoselenophene, triphenylene, azatriphenylene, fluorene, silafluorene, naphthalene, quinoline, isoquinoline, quinazoline, quinoxaline, phenanthrene and azaphenanthrene, and combinations thereof.

19. The device of claim 17, wherein the device emits red light or white light.

20. A compound formulation, comprising the metal complex of claim 1.

21. The metal complex of claim 3, wherein $R_4$ is independently selected from the group consisting of: hydrogen, fluorine, methyl, ethyl, isopropyl, t-butyl, cyclopentyl, cyclohexyl, 2,2,2-trifluoroethyl, phenyl, 2,6-dimethylphenyl, and a nitrile group.

22. The metal complex of claim 1, wherein $R_1$, $R_2$ and $R_3$ are methyl.

23. The metal complex of claim 8, wherein $R_t$ is selected from hydrogen, deuterium or methyl, and $R_u$ to $R_z$ are each independently selected from hydrogen, deuterium, fluorine, methyl, ethyl, propyl, cyclobutyl, cyclopentyl, cyclohexyl, 3-methylbutyl, 3-ethylpentyl, trifluoromethyl or combinations thereof.

* * * * *